United States Patent [19]
Maeda et al.

[11] Patent Number: 5,994,735
[45] Date of Patent: *Nov. 30, 1999

[54] SEMICONDUCTOR DEVICE HAVING A VERTICAL SURROUND GATE METAL-OXIDE SEMICONDUCTOR FIELD EFFECT TRANSISTOR, AND MANUFACTURING METHOD THEREOF

[75] Inventors: Shigenobu Maeda; Yasuo Yamaguchi; Hirotada Kuriyama; Shigeto Maegawa, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/582,810

[22] Filed: Jan. 4, 1996

Related U.S. Application Data

[63] Continuation of application No. 08/238,084, May 4, 1994, abandoned.

[30] Foreign Application Priority Data

May 12, 1993 [JP] Japan ................................... 5-135430
Dec. 20, 1993 [JP] Japan ................................... 5-345126

[51] Int. Cl.$^6$ ........................... H01L 29/76; H01L 27/01; H01L 29/94; H01L 27/108
[52] U.S. Cl. ........................... 257/329; 257/330; 257/347; 257/350; 257/369; 257/401; 257/302; 257/306
[58] Field of Search ................................ 257/329, 330, 257/331, 332, 333, 334, 347, 350, 351, 369, 401, 296, 301, 302, 303, 304, 306, 311, 67, 68, 69, 71, 74, 903

[56] References Cited

U.S. PATENT DOCUMENTS

| | | | |
|---|---|---|---|
| 4,566,025 | 1/1986 | Jastrzebski et al. | 257/331 |
| 4,920,397 | 4/1990 | Ishijima | 257/334 |
| 5,016,070 | 5/1991 | Sundaresan | 257/331 |
| 5,214,296 | 5/1993 | Nakata et al. | 257/302 |
| 5,276,343 | 1/1994 | Kumagai et al. | 257/302 |
| 5,308,778 | 5/1994 | Fitch et al. | 437/40 |
| 5,336,917 | 8/1994 | Kohyama | 257/329 |
| 5,414,289 | 5/1995 | Fitch et al. | 257/329 |

FOREIGN PATENT DOCUMENTS

| | | | |
|---|---|---|---|
| 63-293874 | 11/1988 | Japan | 257/68 |
| 3-225873 | 10/1991 | Japan | 257/331 |

OTHER PUBLICATIONS

Impact of Surrounding Gate Transistor (SGT) For Ultra–High–Density LSI's, Hiroshi Takato et al., IEEE Transactions on Electron Devices, vol. 38, No. 3, Mar. 1991, pp. 573–578.

Silicon–On–Insulator "Gate–All–Around Device", J.P. Colinge et al., IEEE, 1990, pp. 25.4.1–25.4.4.

*Primary Examiner*—Steven H. Loke
*Attorney, Agent, or Firm*—McDermott, Will & Emery

[57] ABSTRACT

A field effect transistor occupying a small area and a semiconductor device using the same can be obtained. A gate electrode is provided on a substrate on which a source region is provided with a first interlayer insulating film interposed therebetween. The gate electrode is covered with a second interlayer insulating film. A contact hole for exposing a part of the surface of the source region is provided so as to penetrate through the first interlayer insulating film, the gate electrode, and the second interlayer insulating film. A sidewall surface of the contact hole is covered with a gate insulating film. A first semiconductor layer of a first conductivity type is provided on the surface of the source region in contact therewith up to the lower surface of the gate electrode. A channel semiconductor layer is provided on the surface of the first semiconductor layer up to the upper surface of the gate electrode. A second semiconductor layer of a first conductivity type serving as a drain region is provided on the channel semiconductor layer.

6 Claims, 98 Drawing Sheets

DRIVER TRANSISTOR PORTION    ACCESS TRANSISTOR PORTION

5,994,735

SEMICONDUCTOR DEVICE HAVING A VERTICAL SURROUND GATE METAL-OXIDE SEMICONDUCTOR FIELD EFFECT TRANSISTOR, AND MANUFACTURING METHOD THEREOF

This application is a continuation of application Ser. No. 08/238,084 filed May 4, 1994, now abandoned.

BACKGROUND OF THE INVENTION

1. Field of the Invention

The present invention generally relates to semiconductor devices, and more particularly, to a vertical surround gate metal-oxide semiconductor field-effect transistor (hereinafter referred to as "MOSFET"). The present invention further relates to a dynamic random access memory, an inverter circuit, and a static random access memory using such a vertical surround gate MOSFET. The present invention also relates to a method of manufacturing such a semiconductor device.

2. Description of the Background Art

FIG. 101 is a schematic diagram of a conventional planar type MOSFET. Referring to FIG. 101, a gate electrode 3 is provided on a P-type silicon substrate 1 with a gate insulating film 4 interposed therebetween. N-type source/drain regions 6a, 6b are provided on both sides of gate electrode 3 in the main surface of silicon substrate 1.

Operation of the conventional MOSFET will now be described. When a positive potential is applied to gate electrode 3, the following reaction occurs in the main surface of silicon substrate 1

$$B \rightarrow B^- + h^+$$

where B is boron, $B^-$ is a boron anion, and $h^+$ is a hole.

More specifically, when a positive potential is applied to gate electrode 3, boron is separated into boron anions and holes. Boron anions are attracted to gate electrode 3. On the other hand, holes repulse gate electrode 3 to escape in silicon substrate 1, which in turn generates a depletion layer 17 in the main surface of a channel region of silicon substrate 1. Depletion layer 17 is a region where neither electrons nor holes exist, that is, where no carriers serving to make a current flow exist.

As a positive potential applied to gate electrode 3 is increased, depletion layer 17 is enlarged and its width Wd is increased. However, increase of the width Wd of depletion layer 17 is limited. The width of depletion layer 17 is determined by an impurity concentration. The larger the impurity concentration, the narrower the width Wd of the depletion layer. The smaller the impurity concentration, the wider the width Wd. The maximum value of the width Wd of depletion layer 17 is called maximum depletion layer width.

When the width Wd of depletion layer 17 reaches the maximum depletion layer width, an inversion layer 18 is formed on the surface of the channel region, rendering source 6a/drain 6b conductive.

When the integration density of a semiconductor device is increased, an area occupied by the MOSFET needs to be small.

FIG. 102 is a perspective view extracting and illustrating main portions of the conventional vertical type surround gate MOSFET improved so that an area occupied by the MOSFET may be made small.

Referring to FIG. 102, gate electrode 3 surrounds a plug-shaped silicon 5 with gate insulating film 4 interposed therebetween. Source region 6a is provided at an upper end of plug-shaped silicon 5, and drain region 6b is provided at a lower end thereof. Drain region 6b is formed in the main surface of the silicon substrate.

Aluminum interconnections 10a, 10b, and 10c are connected to source region 6a, gate electrode 3, and drain region 6b, respectively.

When a positive potential is applied to gate electrode 3, an inversion layer is generated on the sidewall surface of the plug-shaped silicon, causing a current to flow from source region 6a to drain region 6b. In other words, the current flows in the direction perpendicular to the silicon substrate.

Comparison is now made between an area occupied by the planar type MOSFET and an area occupied by the vertical type surround gate MOSFET.

Let L be a gate length of the planar type MOSFET, and W be a channel width of the planar type MOSFET, referring to FIG. 101, an occupied area Splanar of the channel region is $$S\text{planar} = L \cdot W$$

On the other hand, in the case of the vertical type surround gate MOSFET, referring to FIG. 103 (which is a simplification of FIG. 102), when the radius of the channel region is R, the channel width W is $2\pi R$. An occupied area of the channel region is $$S\text{vertical} = \pi R^2 = W/4\pi$$

Therefore, when transistors having the gate length L equal to the channel width W are formed of a planar type MOSFET and a vertical type surround gate MOSFET, respectively, the ratio of respective occupied areas is $$S\text{vertical}/S\text{planar} = \frac{1}{4}\pi$$

More specifically, an occupied area of the vertical type surround gate MOSFET is  or less of that of the planar type MOSFET.

If occupied areas of both the vertical type surround gate MOSFET and the planar type MOSFET are made equal, it is possible to increase W in the vertical type surround gate MOSFET. This is a first advantage of the vertical type surround gate MOSFET.

Referring to FIGS. 102 and 103, in the vertical type surround gate MOSFET, it is possible to deplete the entire channel by decreasing the radius of channel plug 5. Therefore, the vertical type surround gate MOSFET has advantages the same as those of a conventional SOI (Silicon-On-Insulator) MOSFET. Detailed description thereof will be given hereinafter.

If the entire channel can be depleted, it is possible to suppress a subthreshold current (a leakage current in a weakly inverted state), which in turn improves a circuit characteristic.

A subthreshold coefficient S is expressed by the following expression:

$$S = \ln 10 \cdot kT/q \cdot (1 + Cd/Cox)$$

where k is a Boltzmann constant, T is an absolute temperature, q is an elementary electric charge, Cd is a depletion layer capacitance of the MOSFET, and Cox is a gate insulating film capacitance.

As is clear from the above equation, when Cd=0 holds, the subthreshold coefficient S takes the minimum value (1n10·kT/q=60 mV/dec).

FIG. 104 is a cross-sectional view of an SOIMOSFET. An SIO layer 15 is formed on a buried oxide film 16. Gate electrode 3 is formed on SOI layer 15 with gate insulating film 4 interposed therebetween. Source/drain regions 6a, 6b are formed on both sides of gate electrode 3 in the surface of SOI layer 15. In the figure, Wd is a depletion layer width, $t_{SOI}$ is the film thickness of SOI layer 15, and $t_{BOX}$ is the film thickness of buried oxide film 16.

When the entire SOI layer 15 is not depleted (that is, when Wd<$t_{SOI}$ holds), the depletion layer capacitance Cd of the SOIMOSFET is, similar to the case of the MOSFET shown in FIG. 101, expressed by the following equation:

$$Cd = \varepsilon_{si}/Wd$$

On the other hand, when the film thickness of buried oxide film 16 is sufficiently larger than that of SOI layer 15 ($t_{Box} \gg t_{SOI}$), and the entire SOI layer 15 is depleted (when it is in a fully depleted state, Wd≧$t_{SOI}$), the depletion layer capacitance Cd is substantially 0. In the case of the SOIMOSFET, it is possible to make the depletion layer capacitance Cd zero by adjusting the film thickness of SOI layer 15, thereby suppressing a subthreshold current.

The above-described advantage of the SOIMOSFET can be implemented in the vertical type surround gate MOSFET. More specifically, when the fully depleted state is implemented in the vertical type surround gate MOSFET, the depletion layer capacitance Cd is 0 similar to the case of the SOIMOSFET. Since electric power lines extend in the radial direction, the phenomenon of which is unique to the surround type MOSFET, the depletion layer capacitance Cd is smaller than that of the MOSFET shown in FIG. 101 even in the state of incomplete depletion.

The following equation shows the relation between the radius R and the depletion layer capacitance Cd of the vertical type surround gate MOSFET, and FIG. 105 shows the equation in the form of graph.

$$Cd = \frac{\varepsilon_{si}}{R \cdot \ln(R/(R - Wd))}$$

When R/Wd<1 holds, complete depletion of the channel can be implemented. Therefore, the depletion layer capacitance Cd is 0. Even if R/Wd>1 holds, the depletion layer capacitance Cd is smaller than that of a bulk MOSFET shown in FIG. 100.

As described above, in the vertical type surround gate MOSFET, it is possible to make the depletion layer capacitance Cd zero by adjusting the radius of channel plug 5, which in turn makes it possible to suppress the subthreshold current. As a result, the vertical type surround gate MOSFET has a second advantage of improving a circuit characteristic.

A third advantage of the vertical type surround gate MOSFET is that the entire channel plug can be made an inversion layer, thereby increasing a drain current.

As described above, the vertical type surround gate MOSFET has three advantages.

FIGS. 106 to 109 are partial cross-sectional views of a semiconductor device in respective steps of the manufacturing process of the conventional vertical type surround gate MOSFET.

Referring to FIG. 106, plug-shaped silicon 5 of the vertical type surround gate MOSFET is formed by aniso-tropically etching substrate 1. Plug-shaped silicon 5 is cylindrical when represented in a perspective view as shown in FIG. 111.

Referring to FIG. 107, gate insulating film 4 is deposited on substrate 1 so as to cover plug-shaped silicon 5. Then, impurity ions are implanted into the surface of substrate 1 through gate insulating film 4 to form source region 6a and drain region 6b.

Referring to FIG. 108, polysilicon 3 serving as a gate electrode is deposited on substrate 1.

Referring to FIGS. 108 and 109, polysilicon 3 is selectively etched to form gate electrode 3.

Referring to FIG. 110, an interlayer insulating film 2 is deposited on substrate 1 so as to cover gate electrode 3. A contact hole for exposing the surface of source region 6a, a contact hole for exposing a part of the surface of gate electrode 3, and a contact hole for exposing a part of the surface of drain region 6b are formed in interlayer insulating film 2. By connecting aluminum interconnections 10a, 10b, 10c to respective portions through these contact holes, the vertical type surround gate MOSFET shown in FIG. 102 is completed.

Although the conventional vertical type surround gate MOSFET had three advantages as described above, it also had the following problems.

Referring to FIG. 102, the diameter of plug-shaped silicon 5 must be made larger than a contact hole 8a so that aluminum interconnection 10a connected to drain region 6a and gate electrode 3 might not be short-circuited. Formation of large plug-shaped silicon 5 causes an area occupied by the device to increase. Formation of large plug-shaped silicon 5 also causes the channel plug not to be depleted completely, resulting in no inversion of the entire channel plug. Therefore, the conventional vertical type surround gate MOSFET was not able to fully enjoy the above-described three advantages.

SUMMARY OF THE INVENTION

One object of the present invention is to provide a vertical surround gate MOSFET improved so that an area occupied by the device can be substantially decreased.

Another object of the present invention is to provide a vertical type surround gate MOSFET improved so that a subthreshold current can be substantially suppressed, and that a circuit characteristic can be sufficiently enhanced.

Still another object of the present invention is to provide a vertical type surround gate MOSFET improved so that the entire channel portion can be made an inversion layer, and that a drain current can be substantially increased.

A further object of the present invention is to provide a dynamic random access memory using such a vertical type surround gate MOSFET.

A further object of the present invention is to provide an inverter circuit using such a vertical type surround gate MOSFET.

A further object of the present invention is to provide a static random access memory using such a vertical type surround gate MOSFET.

A further object of the present invention is to provide a method of manufacturing such a vertical type surround gate MOSFET.

According to a first aspect of the present invention, a semiconductor device controls a flow of majority carriers by a voltage applied to the gate. The semiconductor device includes a substrate having a main surface. A first conductive layer of a first conductivity type serving as one source/drain region is provided in the main surface of the substrate. A first interlayer insulating film is provided on the substrate. A gate electrode having an upper surface and a lower surface is provided on the first interlayer insulating film. A second interlayer insulating film is provided on the first interlayer insulating films so as to cover the gate electrode. A contact hole for exposing a part of the surface of the first conductive layer is provided so as to penetrate through the first interlayer insulating film, the gate electrode, and the second interlayer insulating film. A sidewall surface of the contact hole is covered with a gate insulating film. A first semiconductor layer of a first conductivity type is formed on the surface of the first conductive layer in contact therewith up to the lower surface of the gate electrode in the contact hole. A channel semiconductor layer is formed on the surface of the first semiconductor layer in contact therewith up to the upper surface of the gate electrode in the contact hole. A second semiconductor layer of a first conductivity type serving as the other source/drain region is provided on the surface of the channel semiconductor layer in contact therewith.

According to a second aspect of the present invention, a semiconductor device controls a flow of majority carriers by a voltage applied to the gate. The semiconductor device includes a substrate having a main surface. A first conductive layer of a first conductivity type serving as one source/drain region is provided in the main surface of the substrate. A first interlayer insulating film is provided on the substrate. A gate electrode having an upper surface and a lower surface is provided on the first interlayer insulating film. A second interlayer insulating film is provided on the first interlayer insulating film so as to cover the gate electrode. A contact hole for exposing a part of the surface of the first conductive layer is provided so as to penetrate through the first interlayer insulating film, the gate electrode, and the second interlayer insulating film. A sidewall surface of the contact hole is covered with a gate insulating film. A silicon thin film having a recessed portion in a portion of the contact hole is provided in contact with the first conductive layer so as to cover continuously the sidewall surface of the contact hole with the gate insulating film interposed therebetween. An insulating film is provided on the substrate so as to fill the recessed portion of the silicon thin film. The silicon thin film is divided into three portions of a cylindrical channel portion positioned at a portion surrounded by the gate electrode, a source region and a drain region sandwiching the channel portion *from upper and lower sides. The thickness of the silicon thin film in the channel portion is equal to or less than the maximum depletion layer width.

According to a third aspect of the present invention, a semiconductor device controls a flow of majority carriers by a voltage applied to the gate. The semiconductor device includes a substrate having a main surface. A first conductive layer of a first conductivity type serving as one source/drain region is provided in the main surface of the substrate. A first interlayer insulating film is provided on the substrate. A gate electrode having an upper surface and a lower surface is provided on the first interlayer insulating film. A second interlayer insulating film is provided on the first interlayer insulating film so as to cover the gate electrode. A contact hole for exposing a part of the surface of the first conductive layer is provided so as to penetrate through the first interlayer insulating film, the gate electrode, and the second interlayer insulating film. A sidewall surface of the contact hole is covered with a first gate insulating film. A silicon thin film is provided in contact with the first conductive layer so as to cover continuously an inner wall surface of the contact hole with the first gate insulating film interposed therebetween. The silicon thin film has a recessed portion having its bottom surface positioned below the lower surface of the gate electrode in the contact hole. The silicon thin film is divided into three portions of a cylindrical channel portion positioned at a portion surrounded by the first gate electrode, a source region and a drain region sandwiching the channel portion from upper and lower sides. The thickness of the silicon thin film in the channel portion is made equal to or less than the maximum depletion layer width. A second gate insulating film is provided on the substrate so as to cover the recessed portion of the silicon thin film. The semiconductor device further includes a second gate electrode filling the recessed portion of the silicon thin film so as to oppose the channel portion with the second gate insulting film interposed therebetween.

According to a fourth aspect of the present invention, a semiconductor device stores information by a gate transistor in a capacitor formed of a storage node, a capacitor insulating film, and a cell plate electrode, provided at a crossing point of a bit line and a word line. The semiconductor device includes a substrate having a main surface. A first impurity diffusion layer of a first conductivity type is provided in the main surface of the substrate by implantation of impurity of a first conductivity type. The first impurity diffusion layer serves as one source/drain region and also as the bit line. A first interlayer insulating film is provided on the substrate. A gate electrode having an upper surface and a lower surface is provided on the first interlayer insulating film. A second interlayer insulating film is provided on the first interlayer insulating film so as to cover the gate electrode. A contact hole for exposing a part of the surface of the first impurity diffusion layer is provided so as to penetrate through the first interlayer insulating film, the gate electrode, and the second interlayer insulating film. A sidewall surface of the contact hole is covered with a gate insulating film. A first semiconductor layer of a first conductivity type is formed on the surface of the first impurity diffusion layer in contact therewith up to the lower surface of the gate electrode in the contact hole. A channel semiconductor layer is formed on the surface of the first semiconductor layer in contact therewith up to the upper surface of the gate electrode in the contact hole. A second conductive layer of a first conductivity type is provided on the channel semiconductor layer in contact with the surface of the channel semiconductor layer. The second conductive layer serves as the other source/drain region and also as the storage node. A capacitor insulating film is provided on the second conductive layer. A cell plate electrode is provided on the storage node with the capacitor insulating film interposed therebetween.

According to a fifth aspect of the present invention, a semiconductor device stores information by a gate transistor in a capacitor formed of a storage node, a capacitor insulating film, and a cell plate electrode, provided at a crossing point of a bit line and a word line. The semiconductor device includes a substrate having a main surface. A first conductive layer of a first conductivity type serving as one source/drain region is provided in the main surface of the substrate. A first interlayer insulating film is provided on the substrate. A gate electrode having an upper surface and a lower surface is provided on the first interlayer insulating film. A second interlayer insulating film is provided on the first interlayer insulting film so as to cover the gate electrode. A contact hole for exposing a part of the surface of the first conductive layer is provided so as to penetrate through the first interlayer insulating film, the gate electrode, and the second interlayer insulating film. A sidewall surface of the contact hole is covered with a gate insulating film. A silicon thin film is provided in contact with the first conductive layer, so as to cover continuously the sidewall surface of the contact hole with the gate insulating film interposed therebetween. The silicon thin film includes a recessed portion having its bottom surface positioned below the lower surface of the gate electrode in the contact hole. The silicon thin film is divided into three portions of a cylindrical channel portion positioned at a portion surrounded by the gate electrode, one source/drain region positioned on the lower side and the other source/drain region positioned on the upper side, both sandwiching the channel portion from the opposite sides. The thickness of the silicon thin film in the channel portion is made equal to or less than the maximum depletion layer width. The other source/drain region is also used as a storage node. A capacitor insulating film is provided on the substrate so as to cover the recessed portion of the silicon thin film. The semiconductor device includes a cell plate electrode provided on the substrate so as to cover the silicon thin film with the capacitor insulating film interposed therebetween and to fill the recessed portion of the silicon thin film.

According to a sixth aspect of the present invention, a semiconductor device stores information by a gate transistor in a capacitor formed of a storage node, a capacitor insulating film, and a cell plate electrode, provided at a crossing point of a bit line and a word line. The semiconductor device includes a substrate having a main surface. A first conductive layer of a first conductivity type serving as one source/drain region is provided in the main surface of the substrate. A first interlayer insulating film is provided on the substrate. A gate electrode having an upper surface and a lower surface is provided on the first interlayer insulating film. A second interlayer insulating film is provided on the first interlayer insulating film so as to cover the gate electrode. A first contact hole for exposing a part of the surface of the first conductive layer is provided so as to penetrate through the first interlayer insulating film, the gate electrode, and the second interlayer insulating film. A sidewall surface of the first contact hole is covered with a gate insulating film. A silicon thin film is provided in contact with the first conductive layer so as to cover continuously an inner wall surface of the first contact hole with the gate insulating film interposed therebetween. The silicon thin film includes a recessed portion having its bottom surface positioned below the lower surface of the gate electrode in the first contact hole. The silicon thin film is divided into three portions of a cylindrical channel portion positioned at a portion surrounded by the gate electrode, one source/drain region positioned on the lower side and the other source/drain region positioned on the upper side, both sandwiching the channel portion from the opposite sides. The thickness of the silicon thin film in the channel portion is made equal to or less than the maximum depletion layer width. A third interlayer insulating film is provided on the substrate so as to cover the silicon thin film. A second contact hole for exposing a part of the surface of the other source/drain region is provided in the third interlayer insulating film. A storage node is provided in contact with the other source/drain region so as to cover an inner wall surface of the second contact hole. A capacitor insulating film is provided on the substrate so as to cover the surface of the storage node. A cell plate electrode is provided on the substrate opposite to the storage node with the capacitor insulating film interposed therebetween so as to fill the second contact hole.

According to a seventh aspect of the present invention, a semiconductor device inverts logics of an input signal and an output signal. The semiconductor device includes a substrate, and a conductive layer provided on the substrate. A first interlayer insulating film is provided on the substrate so as to cover the conductive layer. A gate electrode having an upper surface and a lower surface is provided on the first interlayer insulating film. A second interlayer insulating film is provided on the substrate so as to cover the gate electrode. A first contact hole for exposing one part of the surface of the conductive layer is provided so as to penetrate through the first interlayer insulating film, the gate electrode, and the second interlayer insulating film. A second contact hole for exposing another part of the surface of the conductive layer is provided so as to penetrate through the first interlayer insulating film, the gate electrode, and the second interlayer insulating film. An inner wall surface of the first contact hole is covered with a gate insulating film. An inner wall surface of the second contact hole is covered with a gate insulating film. A first $p^+$ semiconductor layer serving as one source/drain region is formed on the surface of the conductive layer in contact with the one part thereof up to the lower surface of the gate electrode in the first contact hole. An $n^-$ semiconductor layer is formed on the surface of the $p^+$ semiconductor layer in contact therewith up to the upper surface of the gate electrode in the first contact hole. A second $p^+$ semiconductor layer serving as the other source/drain region is provided on the $n^-$ semiconductor layer in contact therewith. A first $n^+$ semiconductor layer serving as one source/drain region is formed on the surface of the conductive layer in contact with the another part thereof up to the lower surface of the gate electrode in the second contact hole. A $p^-$ semiconductor layer is formed on the surface of the first $n^+$ semiconductor layer in contact therewith up to the upper surface of the gate electrode in the second contact hole. A second $n^+$ semiconductor layer serving as the other source/drain region is provided on the $p^-$ semiconductor layer in contact with the surface of the $p^-$ semiconductor layer.

According to an eighth aspect of the present invention, a semiconductor device inverts logics of an input signal and an output signal. The semiconductor device includes a semiconductor substrate having a main surface. A field oxide film is formed in the main surface of the semiconductor substrate. An $n^+$ impurity diffusion layer is provided in the main surface of the semiconductor substrate directly under the field oxide film. A gate electrode having an upper surface and a lower surface is provided on the field oxide film. An interlayer insulating film is provided on the semiconductor substrate so as to cover the gate electrode. A first contact hole for exposing one part of the surface of the $n^+$ impurity diffusion layer is provided so as to penetrate through the interlayer insulating film, the gate electrode, and the field oxide film. A second contact hole for exposing another part of the surface of the $n^+$ impurity diffusion layer is provided so as to penetrate through the interlayer insulating film, the gate electrode, and the field oxide film. An inner wall surface of the first contact hole is covered with the gate insulating film. An inner wall surface of the second contact hole is covered with a gate insulating film. A conductor film is provided in contact with the one part of the $n^+$ impurity diffusion layer in the first contact hole. A first $p^+$ semiconductor layer serving as one source/drain region is formed on the surface of the conductor film in contact therewith up to the lower surface of the gate electrode in the first contact hole. An $n^-$ semiconductor layer is formed on the surface of the first $p^+$ semiconductor layer in contact therewith up to the upper surface of the gate electrode in the first contact hole. A second $p^+$ semiconductor layer serving as the other source/drain region is provided on the $n^-$ semiconductor layer in contact therewith. A first n⁺ semiconductor layer serving as one source/drain region is formed on the surface of the n⁺ impurity diffusion layer in contact with the another part thereof up to the lower surface of the gate electrode in the second contact hole. A p⁻ semiconductor layer is formed on the surface of the first n⁺ semiconductor layer in contact therewith up to the upper surface of the gate electrode in the second contact hole. A second n⁺ semiconductor layer serving as the other source/drain region is provided on the p⁻ semiconductor layer in contact therewith.

According to a ninth aspect of the present invention, a semiconductor device inverts logics of an input signal and an output signal. The semiconductor device includes a semiconductor substrate having a main surface. A field oxide film is formed in the main surface of the semiconductor substrate. A p⁺ impurity diffusion layer and an n⁺ impurity diffusion layer are formed in the main surface of the semiconductor substrate with being separated from each other by the field oxide film. A first interlayer insulating film is provided on the semiconductor substrate. A gate electrode is provided on the first interlayer insulating film so as to cover the p⁺ impurity diffusion layer and the n⁺ impurity diffusion layer. A second interlayer insulating film is provided on the semiconductor substrate so as to cover the gate electrode. A first contact hole for exposing one part of the surface of the p⁺ impurity diffusion layer is provided so as to penetrate through the first interlayer insulating film, the gate electrode, and the second interlayer insulating film. A second contact hole for exposing one part of the surface of the n⁺ impurity diffusion layer is provided so as to penetrate through the first interlayer insulating film, the gate electrode, and the second interlayer insulating film. An inner wall surface of the first contact hole is covered with a gate insulating film. An inner wall surface of the second contact hole is covered with a gate insulating film. A first p⁺ semiconductor layer serving as one source/drain region is provided on the surface of the p⁺ impurity diffusion layer in contact therewith up to the lower surface of the gate electrode in the first contact hole. An n⁻ semiconductor layer is formed on the surface of the first p⁺ semiconductor layer in contact therewith up to the upper surface of the gate electrode in the first contact hole. A second p⁺ semiconductor layer serving as the other source/drain region is provided on the n⁻ semiconductor layer. A first n⁺ semiconductor layer serving as one source/drain region is formed on the surface of the n⁺ impurity diffusion layer in contact therewith up to the lower surface of the gate electrode in the second contact hole. A p⁻ semiconductor layer is formed on the surface of the first n⁺ semiconductor layer in contact therewith up to the upper surface of the gate electrode in the second contact hole. A second n⁺ semiconductor layer serving as the other source/drain region is provided on the p⁻ semiconductor layer in contact therewith. An end portion of the second p⁺ semiconductor layer and an end portion of the second n⁺ semiconductor layer are in contact with each other at an upper portion of the field oxide film. The semiconductor device further includes a connection member electrically connecting the surface of the second p⁺ semiconductor layer and the surface of the second n⁺ semiconductor layer.

According to a tenth aspect of the present invention, a semiconductor device serves as a logic circuit in a cooperative operation of a first transistor and a second transistor. The semiconductor device includes a substrate, and an SiO₂ layer provided on the substrate. A semiconductor layer having an upper surface and a lower surface is provided on the SiO₂ layer. A gate electrode of the first transistor is provided on the semiconductor layer with an insulating film interposed therebetween. The semiconductor device includes a pair of source/drain regions of the first transistor provided in the semiconductor layer and spaced from each other on the opposite sides of the gate electrode. A contact hole for exposing one part of the surface of the substrate is provided at a position distant from the gate electrode of the first transistor so as to penetrate through one of the source/drain regions and the SiO₂ layer. An inner wall surface of the contact hole is covered with a gate insulating film of the second transistor. One source/drain layer of the second transistor is formed on the surface of the substrate in contact therewith up to the lower surface of the semiconductor layer in the contact hole. A channel layer of the second transistor is formed on the surface of the one source/drain layer of the second transistor in contact therewith up to the upper surface of the semiconductor layer in the contact hole. The other source/drain layer of the second transistor is provided on the channel layer of the second transistor in contact therewith.

According to an eleventh aspect of the present invention, a semiconductor device inverts logics of an input signal and an output signal in a cooperative operation of a first transistor and a second transistor. The semiconductor device includes a substrate and a first insulating film provided on the substrate. A gate electrode of the first transistor having an upper surface and a lower surface is provided on the first insulating film. A second insulating film is provided on the substrate so as to cover the gate electrode of the first transistor. A contact hole for exposing one part of the surface of the substrate is provided so as to penetrate through the gate electrode of the first transistor and the second insulating film. One source/drain layer of the second transistor is provided in the main surface of the substrate directly under the contact hole. An inner wall surface of the contact hole is covered with a gate insulating film of the second transistor. A channel layer of the second transistor is formed on the surface of the one source/drain layer of the second transistor in contact therewith up to the upper surface of the gate electrode in the contact hole. The other source/drain layer of the second transistor is provided on the channel layer of the second transistor in contact therewith.

According to a twelfth aspect of the present invention, a semiconductor device stores information in a cooperative operation of four transistors. The semiconductor device includes a flip-flop formed using two inverter circuits according to the ninth aspect, and two transistors.

According to a thirteenth aspect of the present invention, a semiconductor device stores information in a cooperative operation of four transistors. The semiconductor device is characterized in that a transistor according to the first aspect of the present invention is used as an access transistor.

According to a fourteenth aspect of the present invention, a semiconductor device stores information in a cooperative operation of four transistors. The semiconductor device is characterized in that transistors according to the first aspect of the present invention are used as an access transistor and a load transistor.

In a method of manufacturing a semiconductor device according to a fifteenth aspect of the present invention, a first conductive layer is formed including impurity of a first conductivity type and serving as one source/drain region in the main surface of a substrate. A first interlayer insulating film is formed on the substrate. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode, and the second interlayer insulating film into the surface of the first conductive layer. A sidewall surface of the contact hole is covered with a gate insulating film. A semiconductor layer is formed on the substrate in contact with the surface of the first conductive layer so as to fill the contact hole. Impurity of a first conductivity type is implanted into the surface of the semiconductor layer. The impurity implanted into the surface of the semiconductor layer is diffused in the semiconductor layer, and the impurity included in the first conductive layer is diffused from the first conductive layer to the semiconductor layer, whereby the other source/drain region and a channel region sandwiched by the other source/drain region and the one source/drain region are formed in the semiconductor layer.

According to a method of manufacturing a semiconductor device in accordance with a sixteenth aspect of the present invention, a semiconductor device controlling a flow of majority carriers by a voltage applied to the gate is manufactured. A silicon nitride film is formed on the surface of a substrate. A first conductive layer including impurity of a first conductivity type and serving as one source/drain region is formed in the main surface of the substrate by implanting impurity into the surface of the substrate through the silicon nitride film. A first interlayer insulating film is formed on the substrate so as to cover the silicon nitride film. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode, and the second interlayer insulating film into the surface of the silicon nitride film. A sidewall surface of the contact hole is oxidized to form a gate insulating film. An exposed surface of the silicon nitride film is etched for exposure of the surface of the first conductive layer. A semiconductor layer is formed on the substrate in contact with the surface of the exposed first conductive layer so as to fill the contact hole. Impurity of a first conductivity type is implanted into the surface of the semiconductor layer. The impurity implanted into the surface of the semiconductor layer is diffused in the semiconductor layer, and the impurity included in the first conductive layer is diffused from the first conductive layer to the semiconductor layer, whereby the other source/drain region and a channel region sandwiched by the other source/drain region and the one source/drain region are formed in the semiconductor layer.

A method of manufacturing a semiconductor device according to a seventeenth aspect of the present invention relates to a method of manufacturing a semiconductor device controlling a flow of majority carriers by a voltage applied to the gate. A first source/drain drawing-out electrode is formed in the main surface of the substrate for drawing out a source/drain electrode to an external terminal. A first interlayer insulating film, a gate electrode and a second interlayer insulating film are sequentially deposited on the substrate. A contact hole is formed penetrating through the first interlayer insulating film, the gate electrode and the second interlayer insulating film for exposing one part of the surface of the first source/drain drawing-out electrode. An inner wall surface of the contact hole is covered with a gate insulating film. A first epitaxial silicon layer including impurity of a first conductivity type, a second epitaxial silicon layer including impurity of a second conductivity type, and a third epitaxial silicon layer including impurity of a first conductivity type are sequentially formed in the contact hole. A second source/drain drawing-out electrode is formed on the third epitaxial silicon layer.

A method of manufacturing a semiconductor device according to an eighteenth aspect of the present invention relates to a method of manufacturing a semiconductor device controlling a flow of majority carriers by a voltage applied to the gate. Formed in the main surface of a substrate is a first conductive layer including impurity of a first conductivity type and serving as one source/drain region. A first interlayer insulating film is formed on the substrate. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode, and the second interlayer insulating film into the surface of the first conductive layer. A sidewall surface of the contact wall is covered with a gate insulating film. A semiconductor film is formed on the substrate so as to cover the surface of the first conductive layer and an inner wall surface of the contact wall. Impurity of a first conductivity type is implanted into the surface of the semiconductor film by a rotational ion implantation method. The impurity implanted into the surface of the semiconductor film is diffused in the semiconductor film, and the impurity included in the first conductive layer is diffused from the first conductive layer to the semiconductor film, whereby the other source/drain region and a channel region sandwiched by the other source/drain region and the one source/drain region are formed in the semiconductor film. An insulating film fills the contact hole in contact with the semiconductor film.

A method of manufacturing a semiconductor device according to a nineteenth aspect of the present invention relates to a method of manufacturing a semiconductor device controlling a flow of majority carriers by a voltage applied to the gate. Formed in the main surface of the substrate is a first conductive layer including impurity of a first conductivity type and serving as one source/drain region. A first interlayer insulating film is formed on the substrate. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode, and the second interlayer insulating film into the surface of the first conductive layer. A sidewall surface of the contact hole is covered with a gate insulating film. A semiconductor film is formed on the substrate so as to cover the surface of the first conductive layer and an inner wall surface of the contact hole. A first insulating film is formed on the sidewall surface of the contact hole with the semiconductor film interposed therebetween. Impurity of a first conductivity type is implanted into the surface of the semiconductor film in a direction perpendicular to the substrate with the first insulating film used as a mask. The impurity implanted into the surface of the semiconductor film is diffused in the semiconductor film, and the impurity included in the first conductive layer is diffused from the first conductive layer to the semiconductor film, whereby the other source/drain region and a channel region sandwiched by the other source/drain region and the one source/drain region are formed in the semiconductor film. A second insulating film fills the contact hole with the first insulating film and the semiconductor film interposed therebetween.

A method of manufacturing a semiconductor device according to a twentieth aspect of the present invention relates to a method of manufacturing a semiconductor device controlling a flow of majority carriers by a voltage applied to the gate. Formed in the main surface of the substrate is a first conductive layer including impurity of a first conductivity type and serving as one source/drain region. A first interlayer insulating film is formed on the substrate. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode and the second interlayer insulating film into the surface of the first conductive layer. A sidewall surface of the contact wall is covered with a gate insulating film. A semiconductor film is formed on the substrate so as to cover the surface of the first conductive layer and an inner wall surface of the contact hole. An insulating film fills the contact hole in contact with the semiconductor film. Impurity of a first conductivity type is implanted into the surface of the semiconductor film. The impurity implanted into the surface of the semiconductor film is diffused in the semiconductor film, and the impurity included in the first conductive layer is diffused from the first conductive layer to the semiconductor film, whereby the other source/drain region and a channel region sandwiched by the other source/drain region and the one source/drain are formed in the semiconductor film.

A method of manufacturing a semiconductor device according to a twenty-first aspect of the present invention relates to a method of manufacturing a semiconductor device controlling a flow of majority carriers by a voltage applied to the gate. Formed in the main surface of a substrate is a first conductive layer including impurity of a first conductivity type and serving as one source/drain region. A first interlayer insulating film is formed on the substrate. A first gate electrode having an upper surface and a lower surface is formed on the first interlayer insulating film. A second interlayer insulating film is formed on the substrate so as to cover the first gate electrode. A contact hole is formed penetrating through the first interlayer insulating film, the first gate electrode, and the second interlayer insulating film into the surface of the first conductive layer. A sidewall surface of the contact hole is covered with a first gate insulating film. A semiconductor film is formed in contact with the surface of the first conductive layer so as to cover an inner wall surface of the contact hole with the first gate insulating film interposed therebetween. Formed in the semiconductor film are one source/drain region in contact with the first conductive layer, a channel region connected to the one source/drain region, and the other source/drain region connected to the channel region. A second gate insulating film covering an inner wall surface of the contact hole is formed on the substrate with the semiconductor film interposed therebetween. A second gate electrode fills the contact hole so as to oppose the semiconductor film with the second gate insulating film interposed therebetween.

A method of manufacturing a semiconductor device according to a twenty-second aspect of the present invention relates to a method of manufacturing a semiconductor device controlling a flow of majority carriers by a voltage applied to the gate. Formed in the main surface of a substrate is a first conductive layer including impurity of a first conductivity type and serving as one source/drain region. A first interlayer insulating film is formed on the substrate. A gate electrode having an upper surface and a lower surface is formed on the first interlayer insulating film. A second interlayer insulating film is formed on the substrate so as to cover the gate electrode. A contact hole is formed penetrating through the first interlayer insulating film, the gate electrode and the second interlayer insulating film into the surface of the first conductive layer. A sidewall surface of the contact hole is covered with a gate insulating film. A semiconductor layer is formed on the substrate so as to fill the contact hole. One source/drain region of a first conductivity type connected to the first conductive layer is formed in the semiconductor layer. A channel region of a second conductivity type connected to the one source/drain region is formed in the semiconductor layer. A region of a low concentration of the other source/drain region of a first conductivity type connected to the channel region is formed in the semiconductor layer. A region of a high concentration of the other source/drain region of a first conductivity type is formed in the semiconductor layer so as to be connected to the region of a low concentration.

The semiconductor device according to the first aspect of the present invention occupies a small area since a vertical type surround gate is employed.

In the semiconductor device according to the second aspect of the present invention, it is possible to completely deplete the entire channel since the thickness of the silicon thin film in the channel is equal to or less than the maximum depletion layer width or less.

In the semiconductor device according to the third aspect of the present invention, it is possible to reduce an off current of a transistor and to improve an on current of the transistor since the device includes two gate electrodes.

In the semiconductor device according to the fourth aspect of the present invention, that is, in a dynamic random access memory, an area occupied by the DRAM is small since a contact hole transistor is used.

In the semiconductor device according to the fifth and sixth aspects of the present invention, that is, in a DRAM, an area occupied by the DRAM is small since a contact hole transistor is used.

In the inverter circuit according to the seventh aspect of the present invention, an area occupied by the inverter circuit is small since a contact hole transistor is used.

In the inverter circuit according to the eighth aspect of the present invention, the surface of the semiconductor substrate can be effectively used since the inverter circuit is formed on the field oxide film.

In the inverter circuit according to the ninth aspect of the present invention, contact is easily made and an area occupied by the inverter circuit is small since Vout is provided at the upper portion of the substrate.

In the logic circuit according to the tenth aspect of the present invention, an area occupied by the logic circuit is small since an SOI transistor and a contact hole transistor are used to form the inverter circuit.

In the inverter circuit according to the eleventh aspect of the present invention, an area occupied by the inverter circuit can be made small since an MOS transistor and a contact hole transistor are combined to form the inverter circuit.

In the semiconductor device according to the twelfth, thirteenth, and fourteenth aspects of the present invention, a static random access memory occupying a small area can be obtained.

According to the method of manufacturing a semiconductor device of the fifteenth aspect of the present invention, the impurity implanted into the surface of the semiconductor layer is diffused in the semiconductor layer and the impurity included in the first conductive layer is diffused from the first conductive layer to the semiconductor layer, whereby the other source/drain region and a channel region sandwiched by the other source/drain region and the one source/drain region are formed in the semiconductor layer. Therefore, the source/drain region and the channel region can be formed simultaneously by one time thermal diffusion.

According to the method of manufacturing a semiconductor device of the sixteenth aspect of the present invention, since the gate insulating film is formed by oxidation of the sidewall surface of the contact hole, the method of forming the gate insulating film can be facilitated.

According to the method of manufacturing a semiconductor device of the seventeenth aspect of the present invention, since the channel region is formed by epitaxial growth, crystallization of the channel region is enhanced, which in turn improves the transistor characteristics. Since the conductivity type of the semiconductor can be changed by only changing gas at the time of growth of an epitaxial layer, the process can be simplified.

According to the method of manufacturing a semiconductor device of the eighteenth aspect of the present invention, since impurity of a first conductivity type is implanted into the surface of the semiconductor film by a rotational ion implantation method, the impurity can be implanted into the inner wall surface of the contact hole.

According to the method of manufacturing a semiconductor of the nineteenth aspect of the present invention, since impurity of a first conductivity type is implanted into the surface of the semiconductor film with the first insulating film used as a mask in a direction perpendicular to the substrate, the impurity is not implanted into the channel portion even if the implantation angle is slightly offset. As a result, a leakage current between source and drain is not generated.

According to the method of manufacturing a semiconductor device of the twentieth aspect of the present invention, impurity of a first conductivity type is implanted into the surface of the semiconductor film after filling the contact hole with the insulating film in contact with the semiconductor film. Then, the impurity implanted into the surface of the semiconductor film is diffused in the semiconductor film to form the other source/drain region. Therefore, the impurity is not implanted into the bottom portion of the semiconductor film. As a result, the impurity is not diffused into the channel region by heat treatment to be applied later, not causing the short channel effect. Leakage current between source and drain is not generated.

According to the method of manufacturing a semiconductor device of the twenty-first aspect of the present invention, since a transistor having two gate electrodes can be formed, it is possible to reduce the off current of the transistor and to improve the on current of the transistor.

According to the method of manufacturing a semiconductor device of the twenty-second aspect of the present invention, since the source/drain, the channel, the LDD portion are formed by high energy ion implantation, the formation can be facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description of embodiments of the present invention will be given hereinafter with reference to the drawings.

Embodiment 1

(Embodiment 1A)

Figure 1:
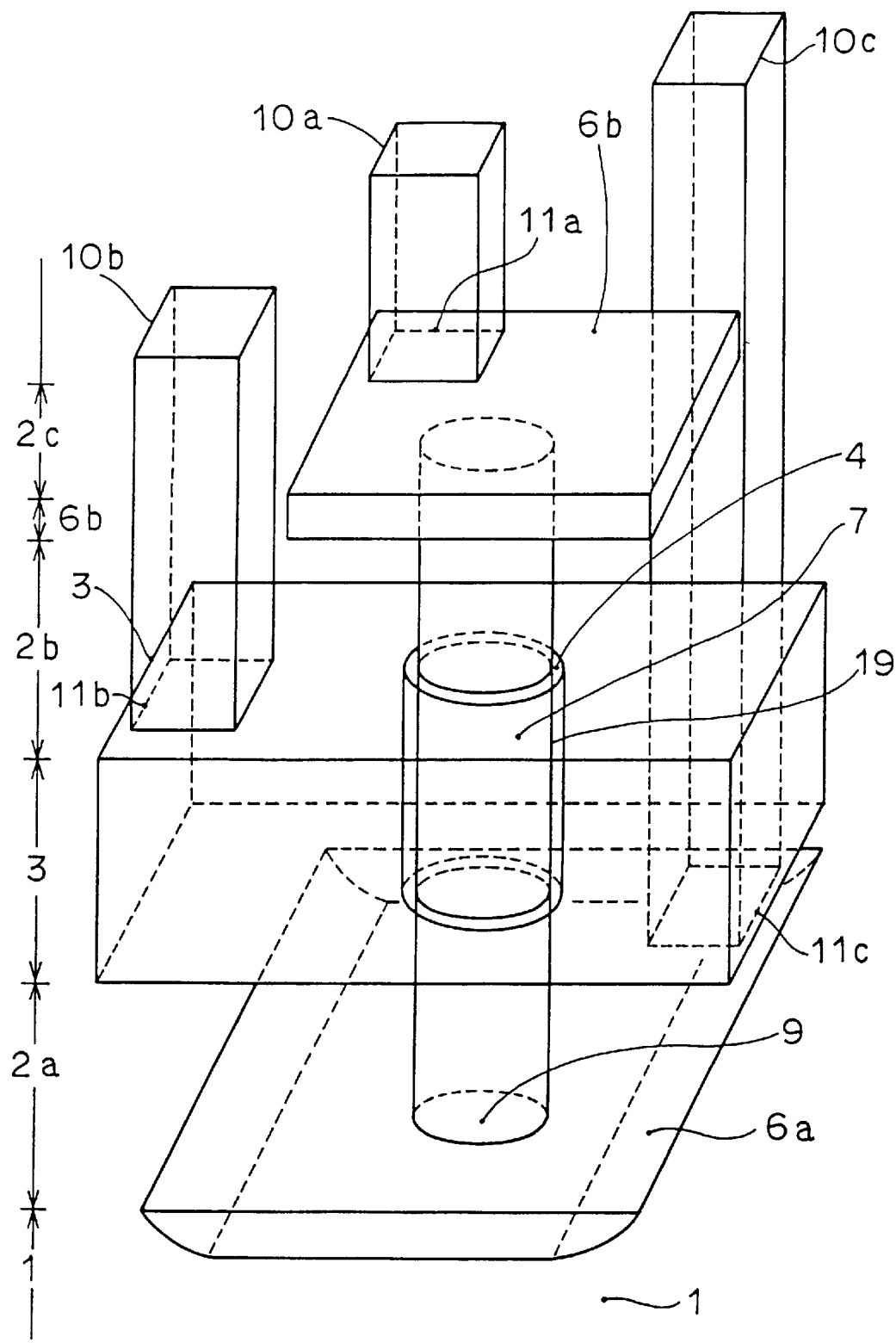
FIG. 1 is a perspective view of a vertical type surround gate field effect transistor (contact hole transistor) according to one embodiment of the present invention.
Figure 2:
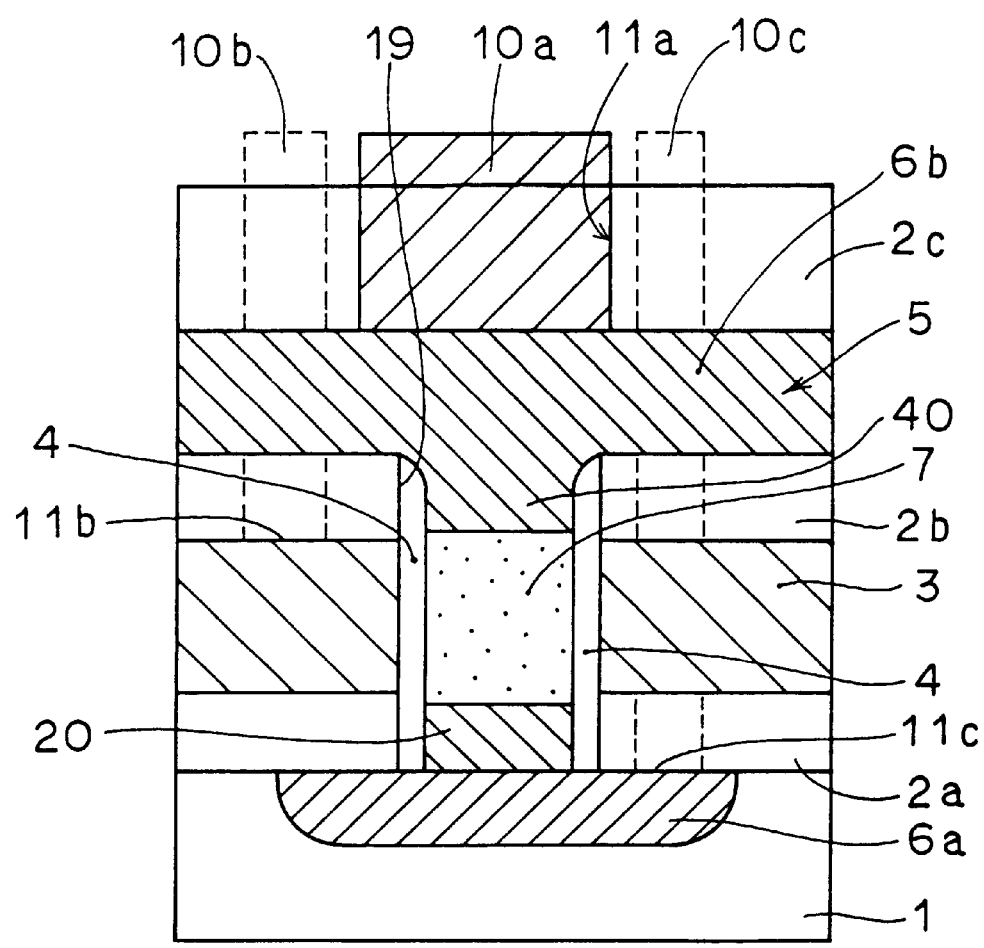
FIG. 2 is a cross sectional view showing the contact hole transistor shown in FIG. 1.

FIG. 1 is a perspective view extracting and illustrating main portions of a vertical type surround gate MOSFET according to one embodiment of the present invention. FIG. 2 is a cross sectional view of the vertical type surround gate MOSFET according to this embodiment.

Referring to these figures, the MOSFET includes a substrate 1. Although the case is shown here where an ordinary silicon substrate is used as substrate 1, an SOI substrate may be used. A source region 6a is provided in the main surface of substrate 1. In the case of a P-channel transistor, P-type impurities are implanted in source region 6a. A first interlayer insulating film 2a is provided on substrate 1. A gate electrode 3 having an upper end surface substantially parallel to the surface of the substrate is provided on first interlayer insulating film 2a. A second interlayer insulating film 2b is provided on first interlayer insulating film 2a so as to cover gate electrode 3. A contact hole 19 for exposing a part of the surface of source region 6a is provided so as to penetrate through first interlayer insulating film 2a, gate electrode 3, and second interlayer insulating film 2b. A sidewall surface of contact hole 19 is covered with a gate insulating film 4. A first P-type semiconductor layer 20 is provided in contact hole 19 on the surface of source region 6a in contact therewith up to the lower surface of gate electrode 3. A channel semiconductor layer 7 is provided in contact hole 19 on the surface of first semiconductor layer 20 in contact therewith up to the upper surface of gate electrode 3. A second P-type semiconductor layer 5 serving as a drain region 6b is provided on the surface of channel semiconductor layer 7 in contact therewith.

A third interlayer insulating film 2c is provided on the substrate so as to cover drain region 6b. A connection hole 11a for exposing a part of the surface of drain region 6b is provided in third interlayer insulating film 2c. An aluminum electrode 10a is connected to drain region 6b through connection hole 11a. The diameter of channel semiconductor layer 7 (hereinafter referred to as a "channel portion 7") is made smaller than the hole diameter of connection hole 11a. Channel portion 7 is cylindrical, with the radius equal to or less than the maximum depletion layer width.

Figure 3A:
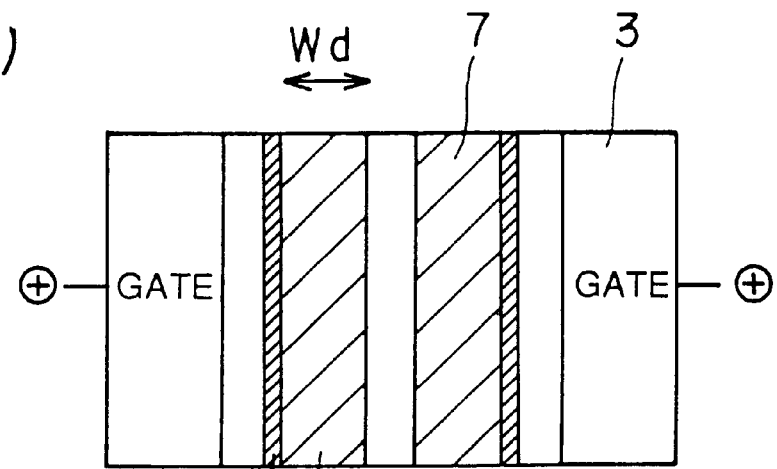
FIGS. 3(a) and 3(b) are diagrams for explaining operation of the contact hole transistor according to the present invention.
Figure 3B:
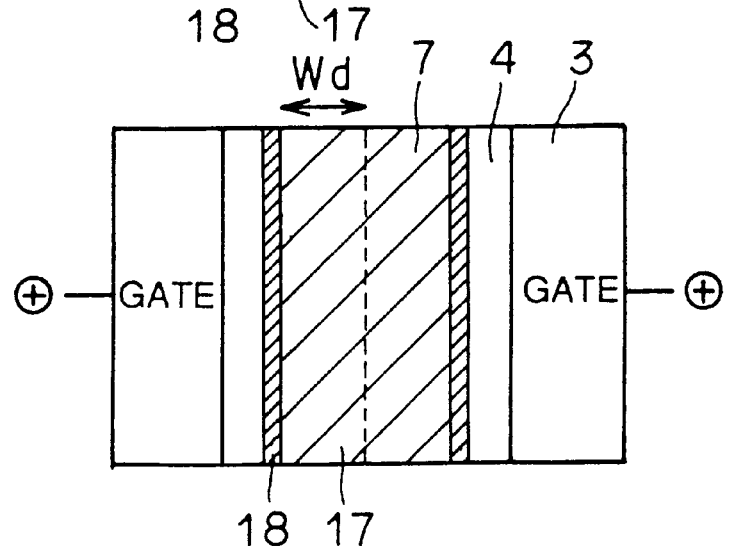

FIGS. 3(a) and 3(b) is a cross sectional view of channel portion 7. FIG. 3(a) schematically shows the case where the radius of channel portion 7 is larger than the maximum depletion layer width, and FIG. 3(b) schematically shows the case where the radius of channel portion 7 is smaller than the maximum depletion layer width.

Referring to FIG. 3(b), when a voltage is applied to gate electrode 3, a depletion layer 17 extends inwardly from a sidewall surface of channel portion 7. The radius of channel portion 7 is smaller than the maximum depletion layer width. When a depletion layer width Wd reaches a value of the radius of channel portion 7, depletion layer 17 can no longer extend. As a result, an inversion layer 18 is immediately formed on the sidewall surface of channel portion 7. More specifically, when the radius of channel portion 7 is smaller than the maximum depletion layer width, a speed increases at which inversion layer 18 is formed. Conversely, as shown in FIG. 3(a), when the radius of channel portion 7 is larger than the maximum depletion layer width, it takes time for the width Wd of depletion layer 17 to reach the maximum depletion layer width, resulting in decrease of a speed at which inversion layer 18 is formed.

FIGS. 4 to 12 are partial cross sectional views of a semiconductor device in respective steps in order of a method of manufacturing the MOSFET (hereinafter referred to as a "contact hole transistor") shown in FIG. 2.

Figure 4:
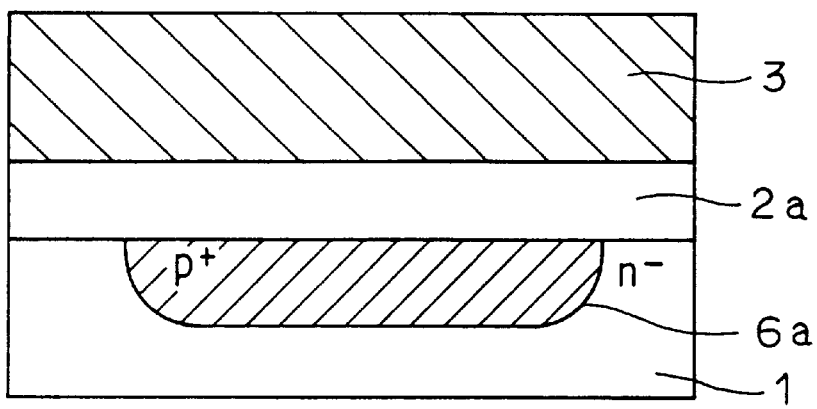
FIGS. 4 to 12 are partial cross sectional views of a semiconductor device in the first to the ninth steps of a method of manufacturing the contact hole transistor according to Embodiment 1A of the present invention.

Referring to FIG. 4, source region 6a is formed by implanting impurities into the main surface of substrate 1. In the case of the P-channel transistor, P-type impurities such as boron, are implanted under the condition of implantation energy of 10 keV and a concentration of $5 \times 10^{15}/cm^2$. Interlayer insulating film 2a of a thickness of 2000 Å is formed on substrate 1. Polysilicon of the film thickness of 1000 Å is deposited on interlayer insulating film 2a to form gate electrode 3.

Figure 5:
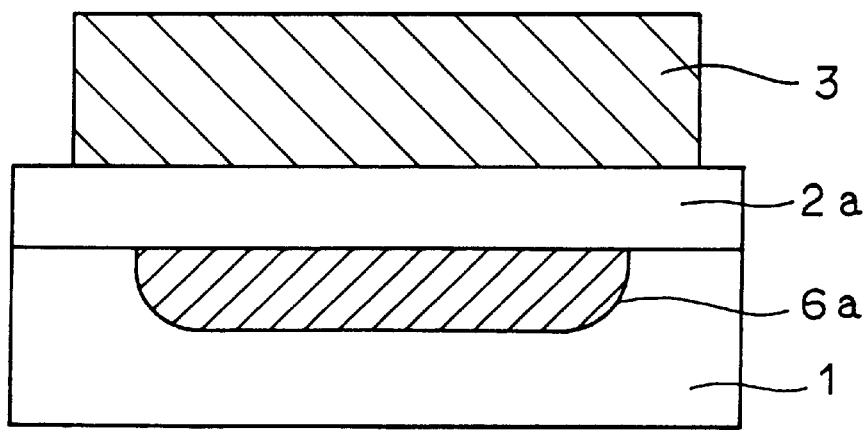
Figure 6:
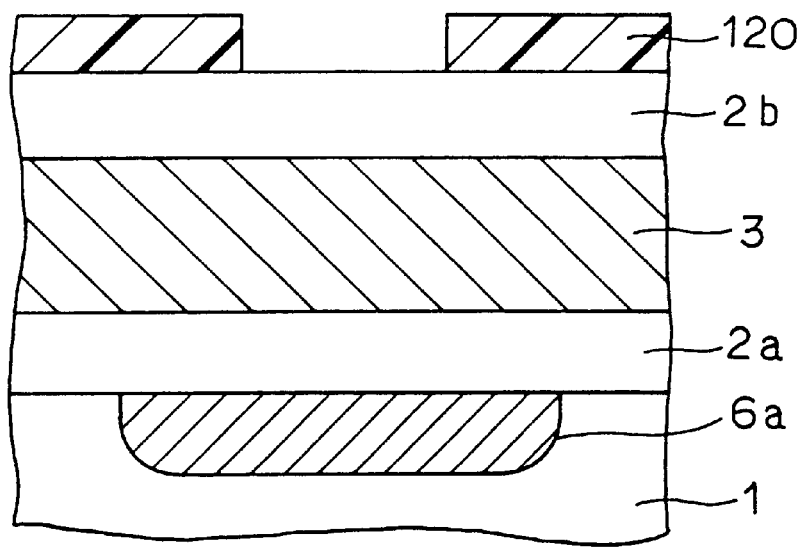

Referring to FIG. 5, gate electrode 3 is patterned into a predetermined shape. Referring to FIG. 6, interlayer insulating film 2b of a thickness of 2000 Å is deposited so as to cover gate electrode 3. A resist pattern 120 having an opening 120a at a predetermined position is formed on interlayer insulating film 2b.

Figure 7:
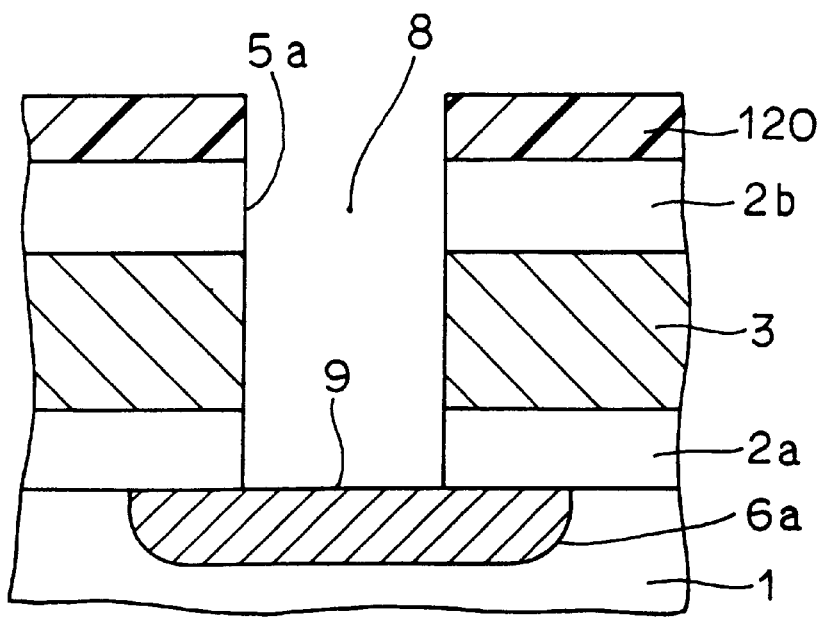

Referring to FIG. 7, a contact hole 5a penetrating through first interlayer insulating film 2a, gate electrode 3, and second interlayer insulating film 2b to reach the surface of source region 6a is formed by photolithography and anisotropic etching with resist pattern 120 used as a mask. The radius of contact hole 5a is, for example, 0.25 μm.

Figure 8:
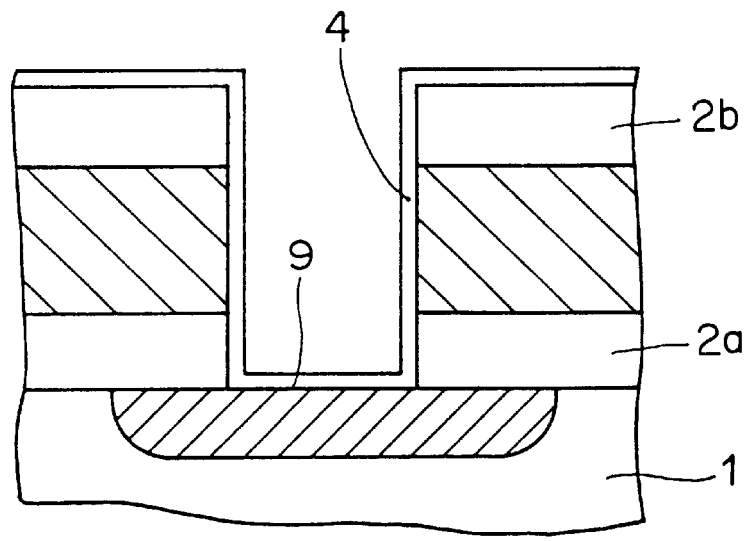

Referring to FIG. 8, gate insulating film 4 of a thickness of 200 Å is deposited so as to cover a bottom portion 9 and the sidewall surface of contact hole 5a. Gate insulating film 4 may be formed by oxidizing the sidewall surface of contact hole 5a.

Figure 9:
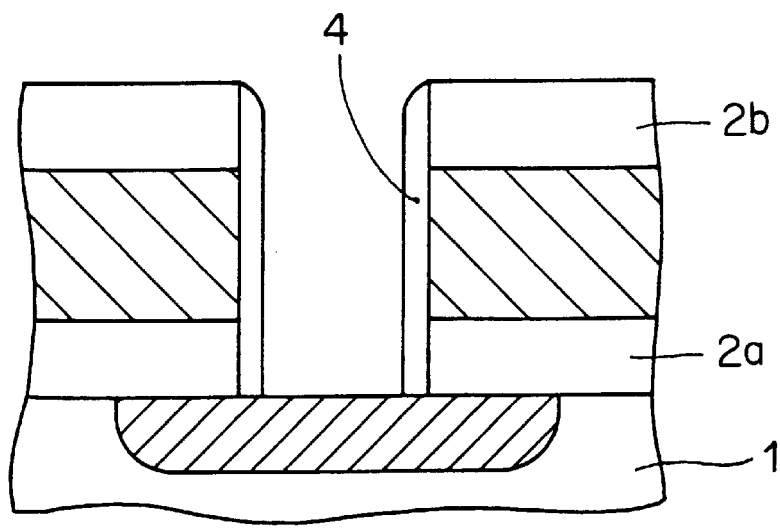

Referring to FIGS. 8 and 9, gate insulating film 4 on bottom portion 9 of the contact hole is removed by anisotropic dry etching.

Figure 10:
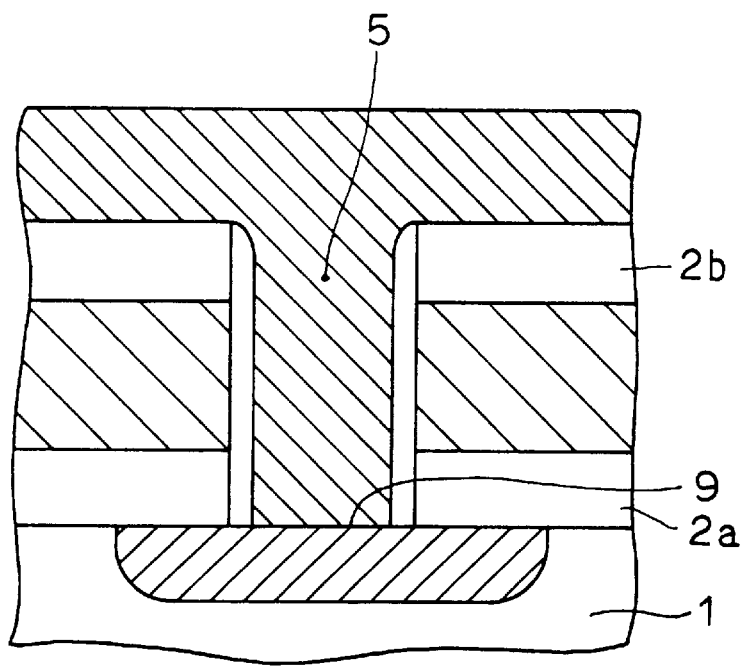

Referring to FIGS. 9 and 10, amorphous silicon 5 of a thickness of 3000 Å is deposited on substrate 1 so as to fill contact hole 5a. If the film thickness of amorphous silicon 5 is made larger than the radius (R=0.25 μm=2500 Å) of contact hole 5a, amorphous silicon can completely fill contact hole 5a.

An LPCVD method using $SiH_4$ gas or $Si_2H_6$ gas is employed as a method of forming amorphous silicon 5. When amorphous silicon is deposited at a temperature of approximately 400°°C. to 600°°C. and annealed at a temperature of approximately 600°°C., a crystal in the same orientation as that of substrate 1 grows in the surface of bottom portion 9 of the contact hole. As will be described later, the channel portion is mono-crystallized. When impurities are introduced in the channel portion, doping gas (for example, $PH_3$, $AsH_3$ when the channel is intended to be of $N^-$ type, and $B_2H_6$ when the channel is intended to be of $P^-$ type) is mixed in the above-described gas to deposit the above-described amorphous silicon.

Figure 11:
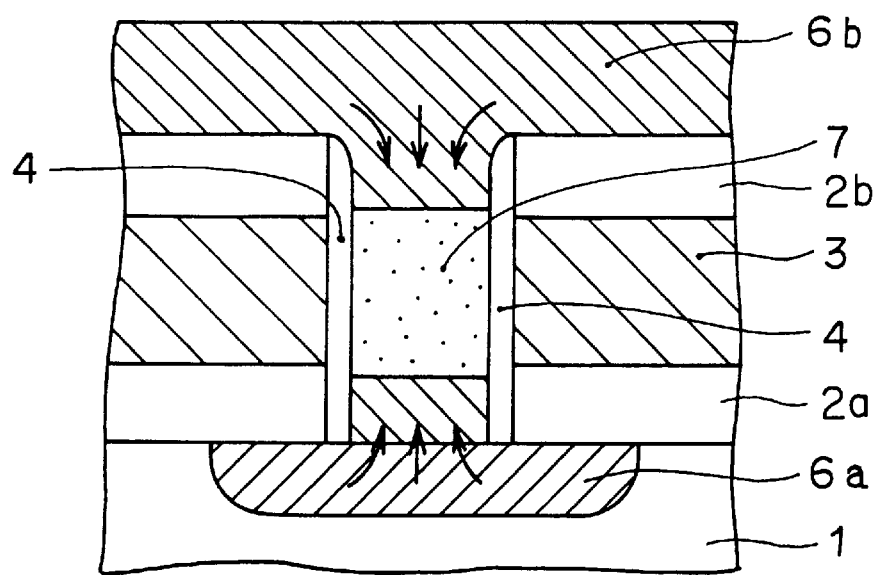

Referring to FIGS. 10 and 11, impurities are implanted into the surface of amorphous silicon 5 to form drain region 6b. In the case of P-channel, P-type impurities such as boron, are implanted under the condition of implantation energy of 80 keV and a concentration of $5 \times 10^{15}/cm^2$. After heat treatment at 850°°C. for approximately 30 minutes, impurities are diffused from source region 6a into amorphous silicon 5, and from drain region 6b into amorphus silicon 5, as shown by arrows. By changing the temperature and the time of heat treatment or the thickness of interlayer insulating films 2a, 2b, distribution of impurities between channel and source, and between channel and drain can be changed.

Figure 12:
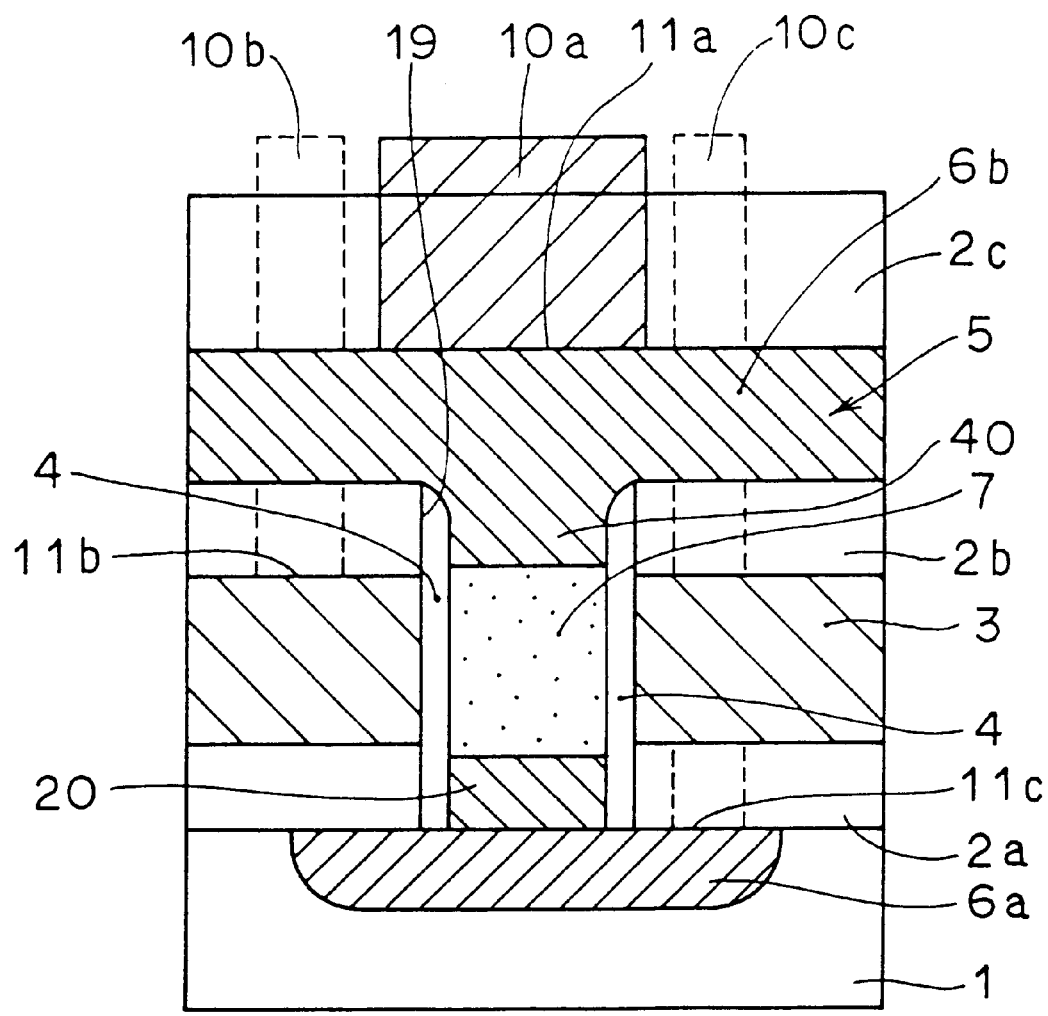

Referring to FIGS. 11 and 12, third interlayer insulating film 2c is formed on substrate 1. Contact holes connecting to gate electrode 3, source region 6a, and drain region 6b, respectively, are formed in interlayer insulating film 3. Formation of aluminum interconnections 10a, 10b, 10c in respective contact holes completes a contact hole transistor.

In the above-described embodiment, the case where the shape of the contact hole is circle was taken as an example with reference to FIG. 1. However, the present invention is not limited thereto. More specifically, the shape of the contact hole may be rectangular as shown in FIG. 13(b), or L-shaped as shown in FIG. 13(c). When the radius (R) of the largest inscribed circle inscribing to these polygons is at most the maximum depletion layer width, it is possible to deplete the entire channel.

Figure 13A:
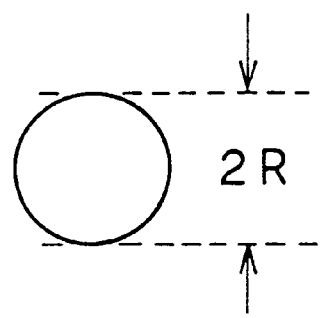
FIGS. 13(a)–13(c) are diagrams showing various manners of a shape of a contact hole used in the contact hole transistor of the present invention.
Figure 13B:
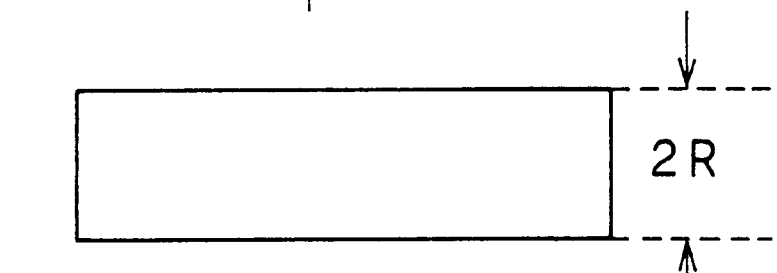
Figure 13C:
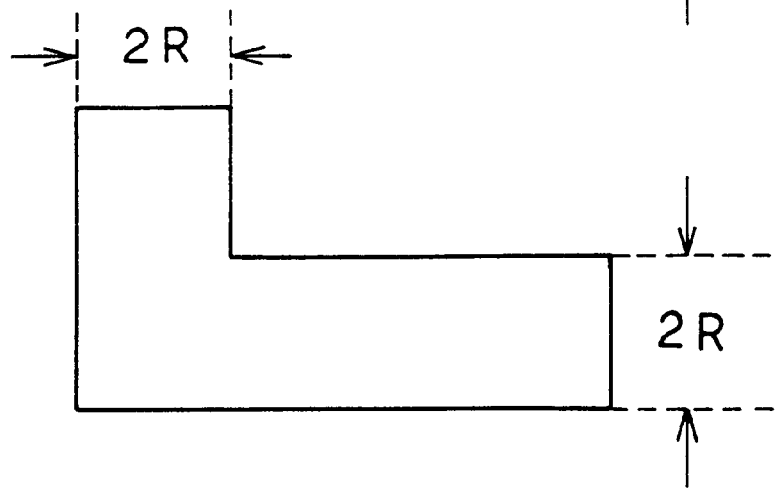

FIG. 13(a) shows a shape of the contact hole shown in FIG. 1. If the radius (R) of the contact hole is made equal to or less than the maximum depletion layer width, the entire channel can be depleted.

(Embodiment 1B)

This embodiment shows a more preferred manner of Embodiment 1A. The same process as shown in FIGS. 4 and 5 is first carried out.

Figure 112:
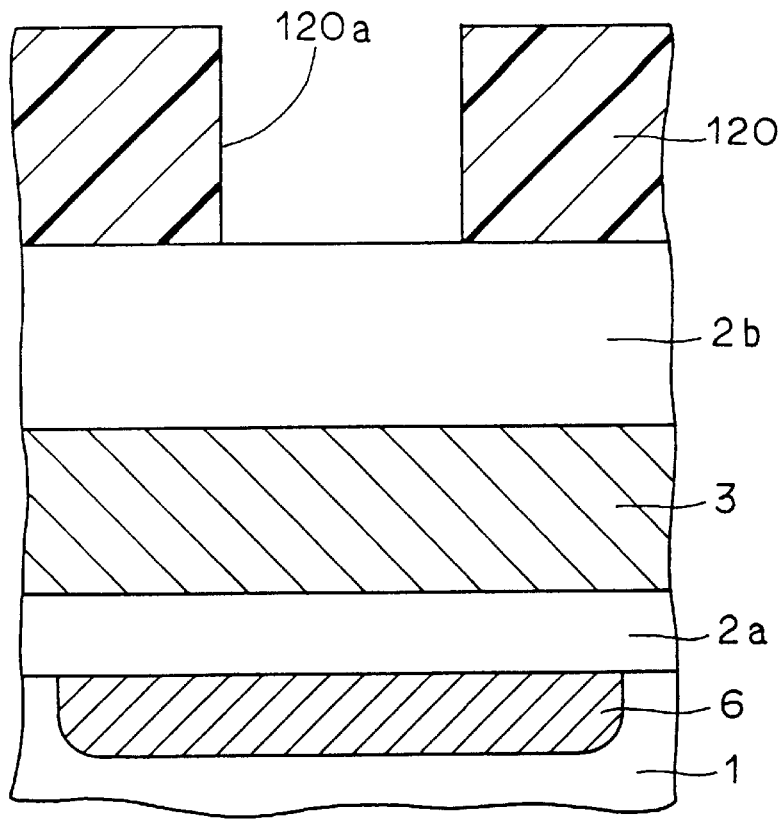
FIGS. 112 to 115 are partial cross sectional views of a semiconductor device in the first to the fourth steps of the main portion of a method of manufacturing a contact hole transistor according to Embodiment 1B of the present invention.

Referring to FIG. 112, second interlayer insulating film 2b is formed so as to cover gate electrode 3. Second interlayer insulating film 2b is deposited a little thicker than the case of Embodiment 1A. Resist pattern 120 having opening portion 120a is formed on second interlayer insulating film 2b at a predetermined portion.

Figure 113:
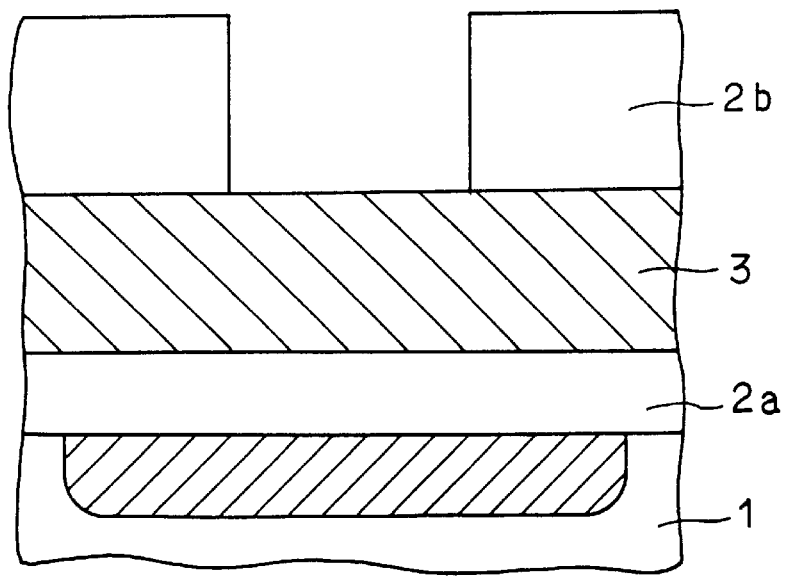

Referring to FIGS. 112 and 113, with resist pattern 120 used as a mask, second interlayer insulating film 2b is etched. Then, resist pattern 120 is removed.

Figure 114:
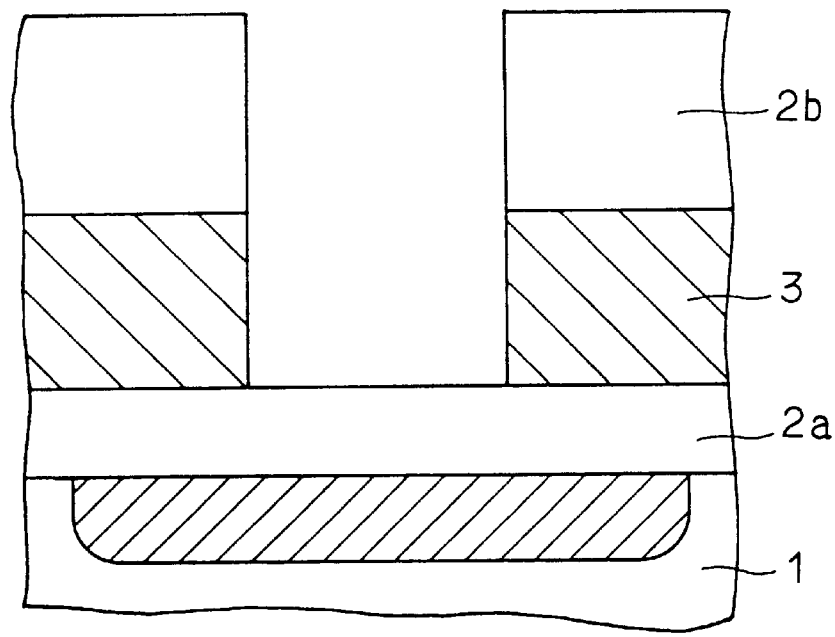

Referring to FIG. 114, gate electrode 3 is patterned with the etched second interlayer insulating film 2b used as a mask.

Figure 115:
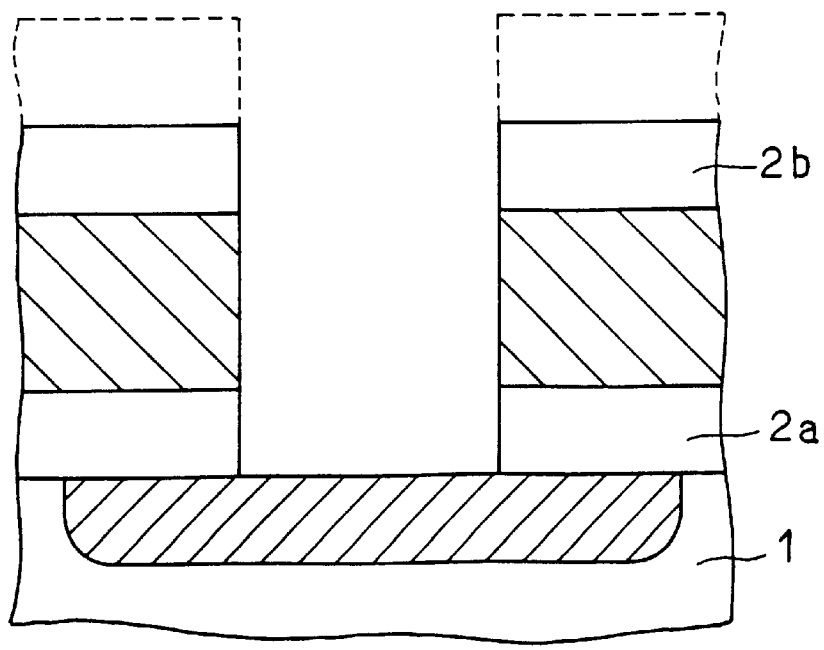

Referring to FIG. 115, first interlayer insulating film 2a is etched for exposure of the bottom of the contact hole. At this time, second interlayer insulating film 2b is etched simultaneously with etching of first interlayer insulating film 2a (a portion shown by a dotted line represents the etched second interlayer insulating film). Therefore, the thickness of second interlayer insulating film 2b and the thickness of first interlayer insulating film 2a must satisfy the following relation.

the thickness of second interlayer insulating film 2b=the thickness of the finished second interlayer insulating film 2b+the thickness of first interlayer insulating film 2a+α

In the above equation, +α is the amount of overetching for reliable exposure of the bottom of the contact hole.

By being thus structured, the thickness of second interlayer insulating film 2b will not become too small.

Embodiment 2

(Embodiment 2A)

FIGS. 14 to 21 are partial cross sectional views of a semiconductor device in respective steps in order of another method of manufacturing the contact hole transistor shown in FIG. 2.

Figure 14:
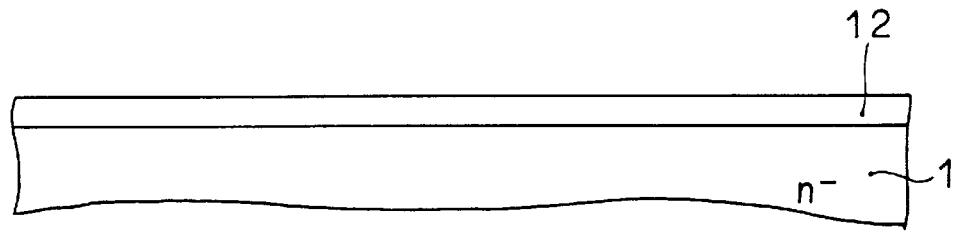
FIGS. 14 to 21 are partial cross sectional views of a semiconductor device in the first to the eighth steps of a method of manufacturing the contact hole transistor according to Embodiment 2A of the present invention.

Referring to FIG. 14, a silicon nitride film 12 of a thickness of 500 Å is deposited on n⁻ type substrate 1.

Figure 15:

Referring to FIGS. 14 and 15, silicon nitride film 12 is patterned into a predetermined shape.

Figure 16:
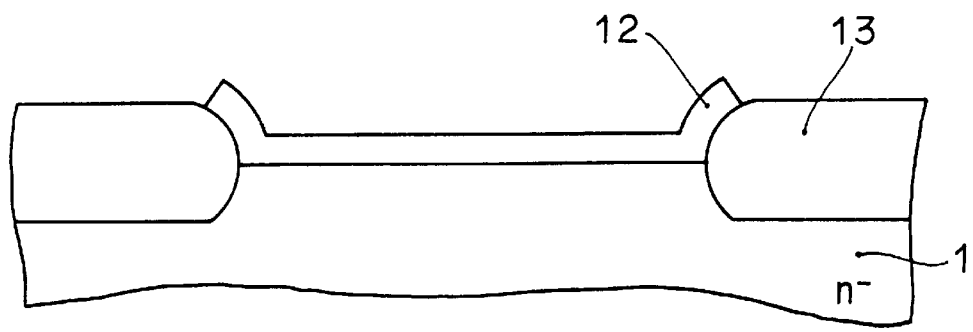

Referring to FIGS. 15 and 16, a portion not covered with silicon nitride film 12 is oxidized to form an isolation oxide film 13 on the main surface of substrate 1.

Figure 17:
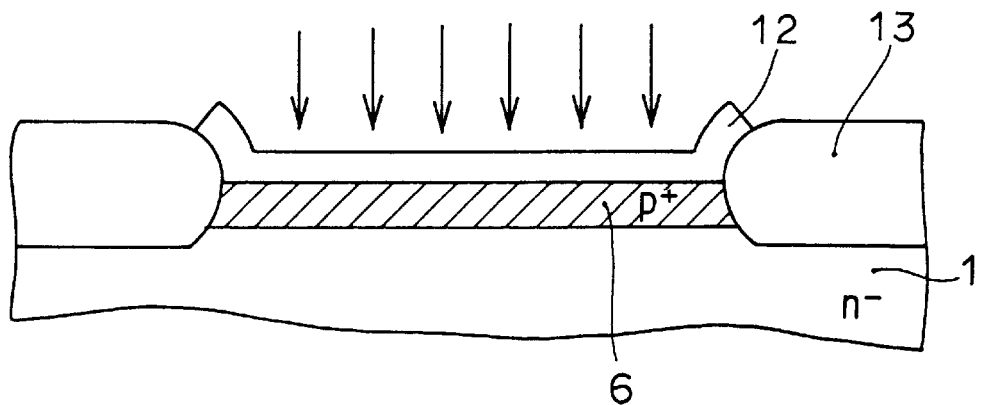

Referring to FIG. 17, impurities are implanted into the main surface of substrate 1 through silicon nitride film 12 to form a source region 6.

Figure 18:
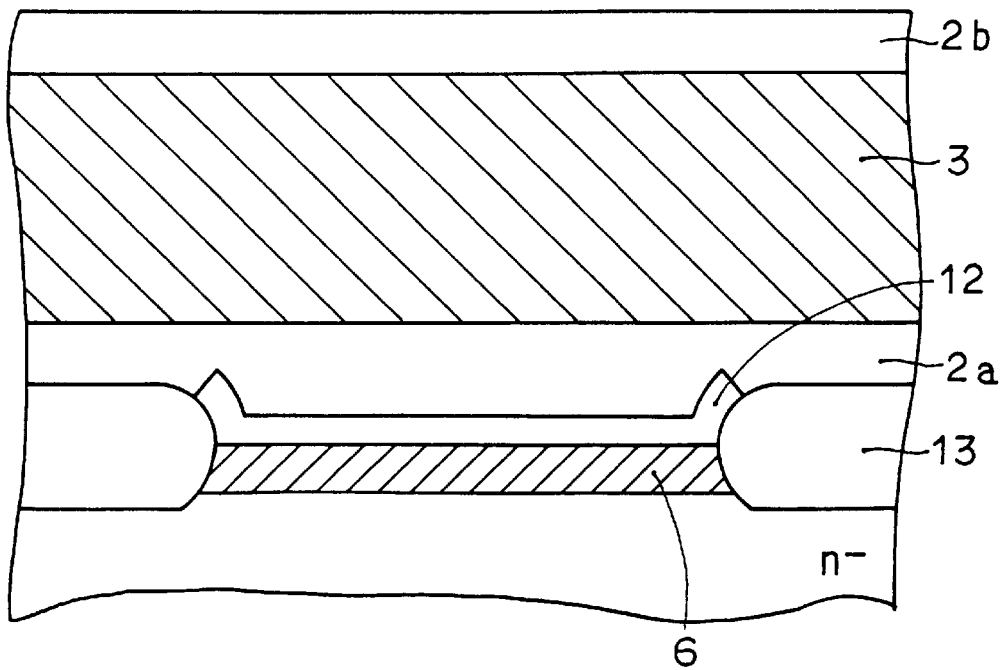

Referring to FIG. 18, first interlayer insulating film 2a of a thickness of 200 Å is deposited on substrate 1 so as to cover silicon nitride film 12 and isolation oxide film 13.

Polysilicon is deposited 500 Å on first interlayer insulating film 2a. By patterning the polysilicon, gate electrode 3 is formed. Second interlayer insulating film 2b of a thickness of 2000 Å is deposited on substrate 1 so as to cover gate electrode 3.

Figure 19:
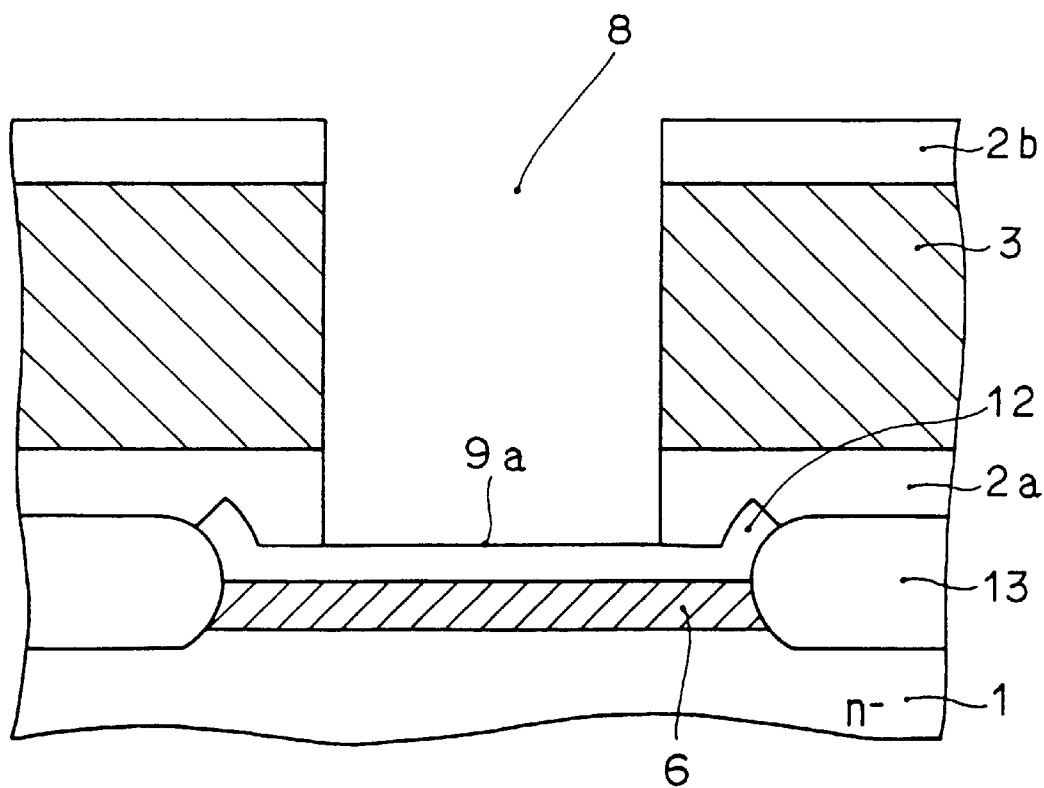

Referring to FIG. 19, a contact hole 8 is formed penetrating through first interlayer insulating film 2a, gate electrode 3, and second interlayer insulating film 2b for exposing a surface 9a of silicon nitride film 12.

Figure 20:
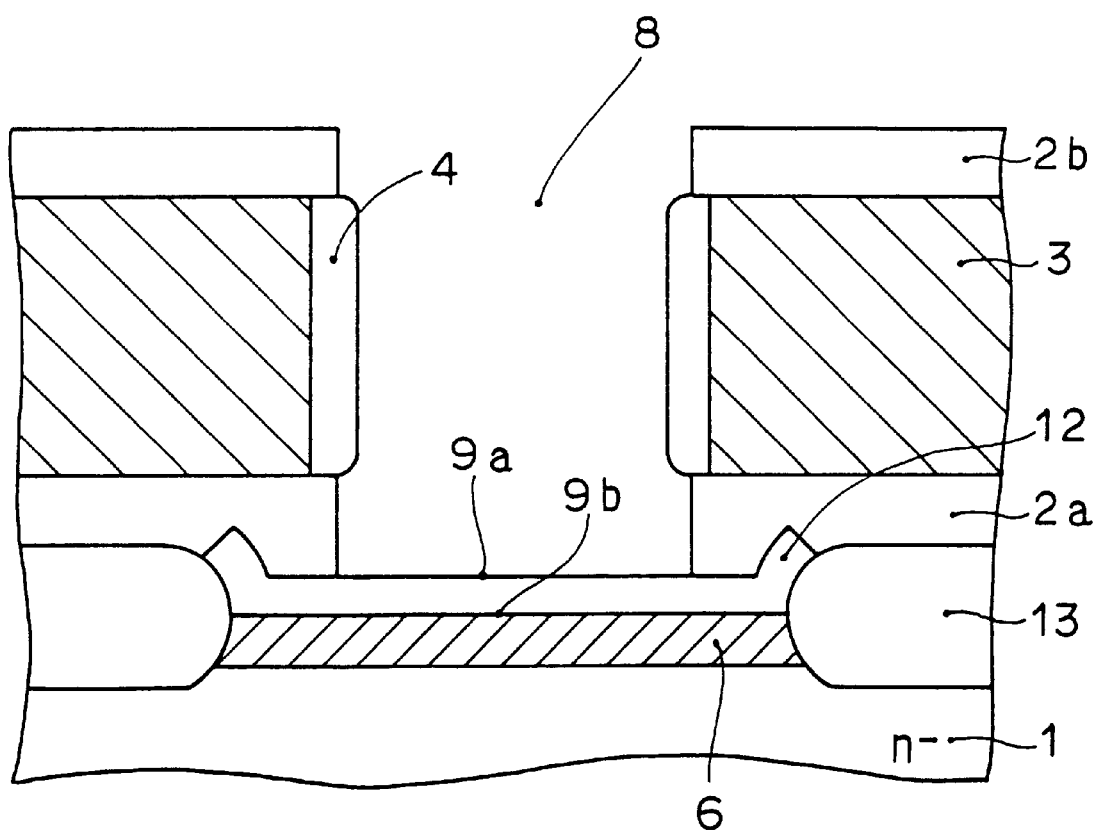

Referring to FIG. 20, by oxidizing a sidewall surface of contact hole 8, gate insulating film 4 is formed. Since the gate insulating film is formed by thermal oxidation of the sidewall surface of the contact hole, formation of the gate insulating film is easy. A surface 9b of the substrate (silicon substrate) is not oxidized since silicon nitride film 12 is formed thereon.

Figure 21:
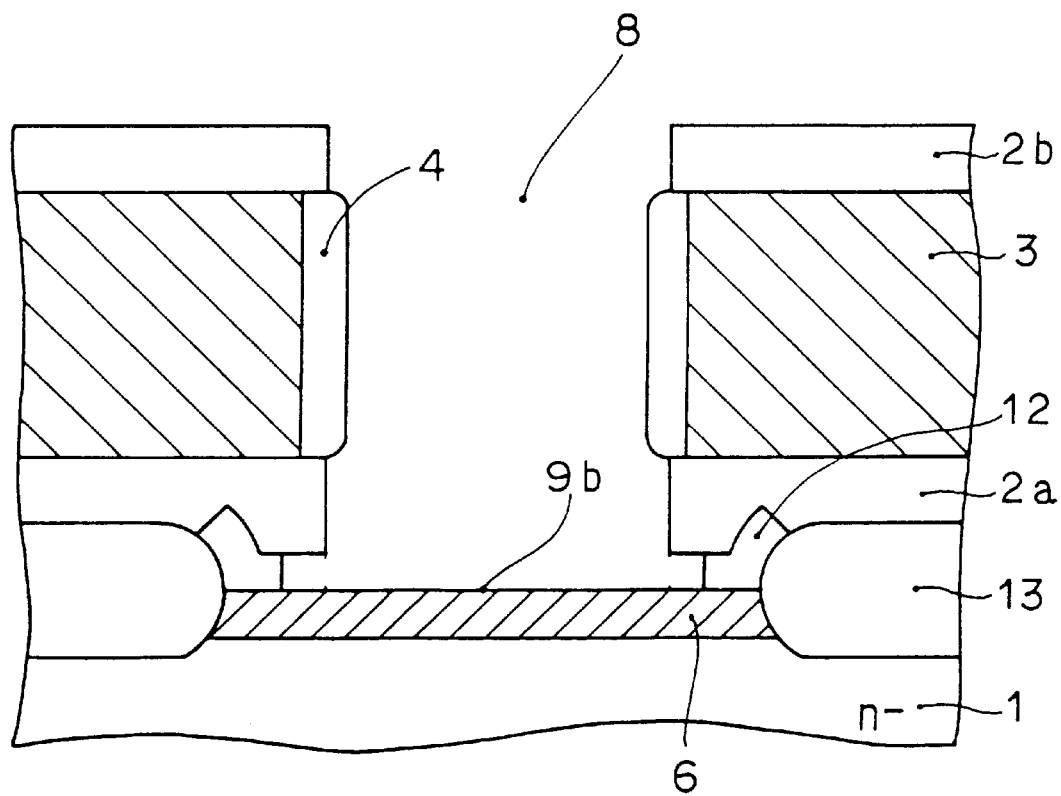

Referring to FIGS. 20 and 21, silicon nitride film 12 is removed. A method of removing silicon nitride film 12 includes a method of removing the same with hot phosphoric acid and a method of removing the same by dry etching. The method of removing silicon nitride film 12 with hot phosphoric acid is wet etching. Referring to FIG. 21, when silicon nitride film 12 is selectively removed to expose the surface of substrate 1, damage to substrate 1 can be minimized. As a result, when the contact hole is filled with amorphous silicon, and the amorphous silicon is grown in a solid state, it is possible to grow a crystal having fewer defects than the case of the method shown in Embodiment 1. By carrying out the process similar to that shown in FIGS. 10 to 12, a contact hole transistor is completed.

(Embodiment 2B)

This embodiment is another manner of Embodiment 2A.

Figure 116:
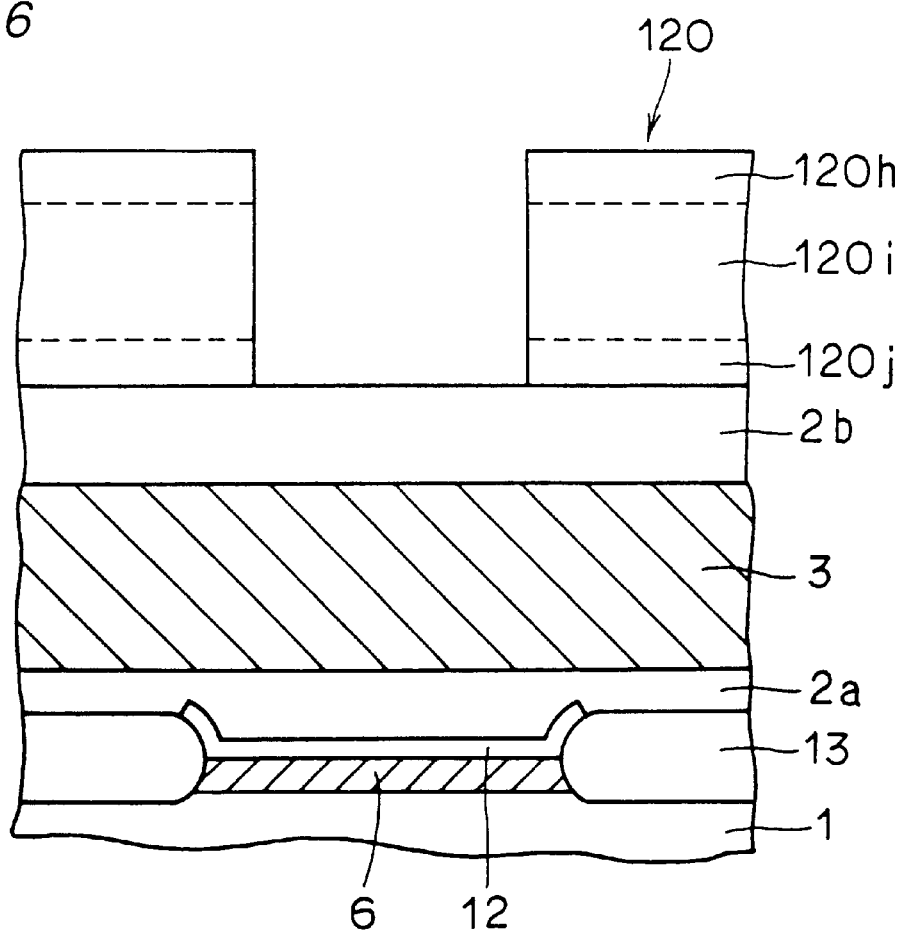
FIG. 116 is a diagram showing a portion which requires improvement of Embodiment 2A.

In Embodiment 2A, referring to FIG. 116, in patterning first interlayer insulating film 2a, gate electrode 3, and second interlayer insulating film 2b, three layers of second interlayer insulating film 2b, gate electrode 3, and first interlayer insulating film 2a are sequentially etched with resist pattern 120 used as a mask. In etching respective layers, resist pattern 120 is also etched gradually. In the figure, 120h is a portion which is etched at the time of etching of second interlayer insulating film 2b, 120i is a portion which is etched at the time of etching of gate electrode 3, and 120j is a portion which is etched at the time of etching of first interlayer insulating film 2a. Therefore, when first interlayer insulating film 2a is finally etched, resist pattern 120 is very small in thickness. Therefore, resist pattern 120 is completely etched because of unstable factors such as variation of etching and variation of the thickness of resist, causing second interlayer insulating film 2b which should not be etched to be etched.

Embodiment 2B is for eliminating the above-described problem.

The process shown in FIGS. 14 to 17 is first carried out.

Figure 117:
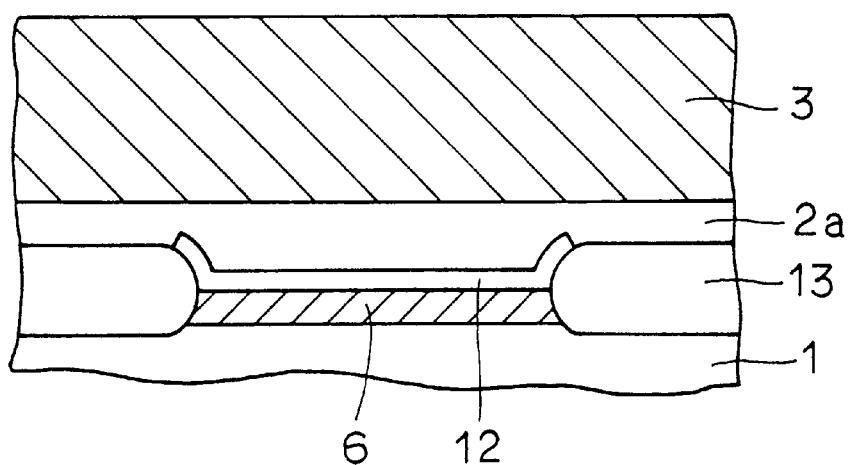
FIGS. 117 to 122 are partial cross sectional views of a semiconductor device in the first to the sixth steps of the main portion of a method of manufacturing a contact hole transistor according to Embodiment 2B of the present invention.

Referring to FIG. 117, gate electrode 3 is formed on first interlayer insulating film 2a.

Figure 118:
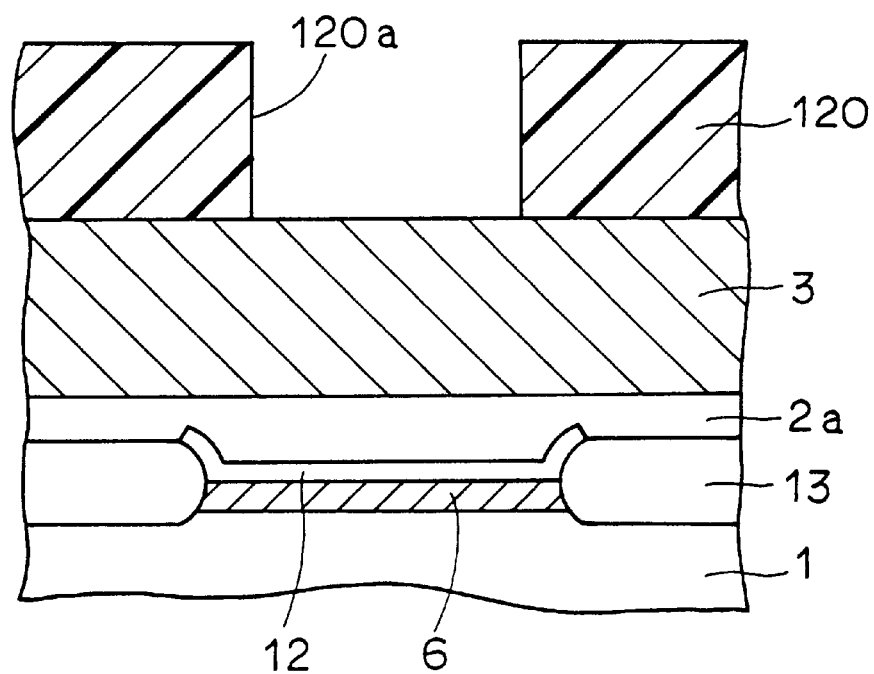

Referring to FIG. 118, resist pattern 120 having opening 120a at a predetermined position is formed on gate electrode 3. Gate electrode 3 is etched with resist pattern 120 used as a mask. Then, resist pattern 120 is removed.

Figure 119:
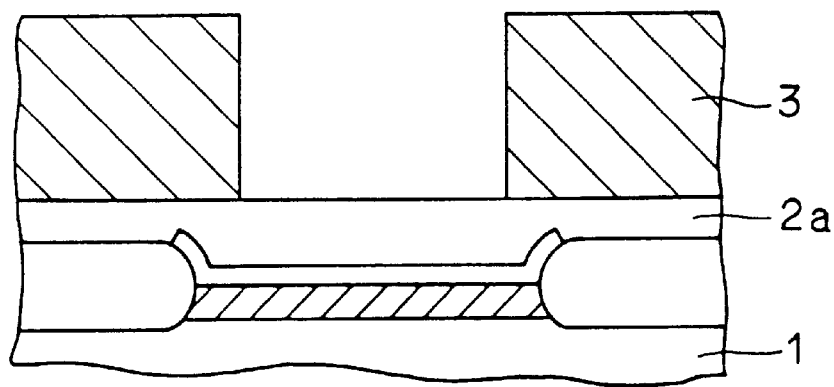
Figure 120:
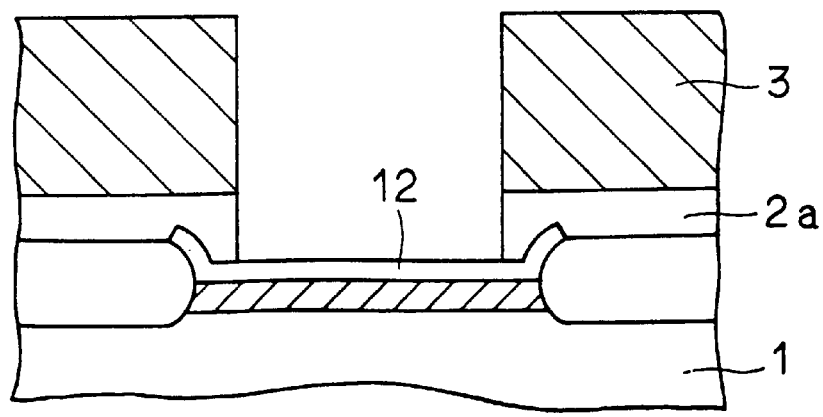

Referring to FIGS. 119 and 120, with gate electrode 3 used as a mask, first interlayer insulating film 2a is etched to expose the surface of silicon nitride film 12.

Figure 121:
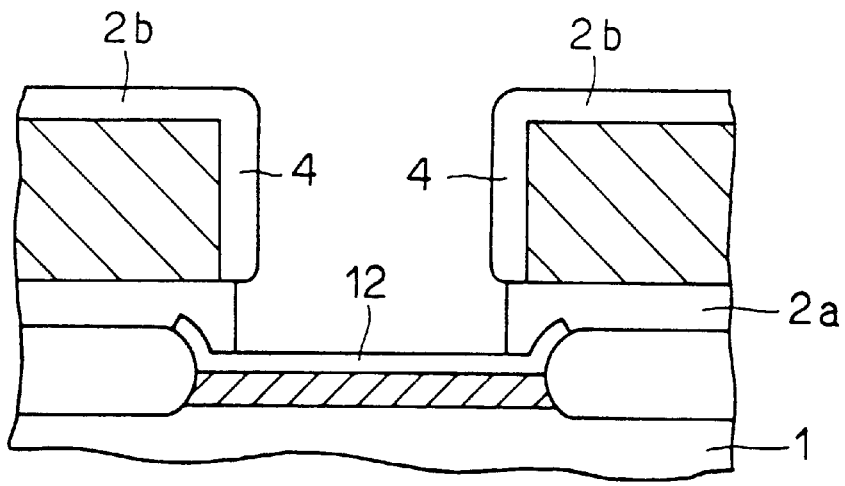

Referring to FIG. 121, by annealing in the oxidizing atmosphere ($O_2$ or water vapor), the surface of gate electrode 3 is oxidized for formation of gate insulating film 4 and second interlayer insulating film 2b.

Figure 122:
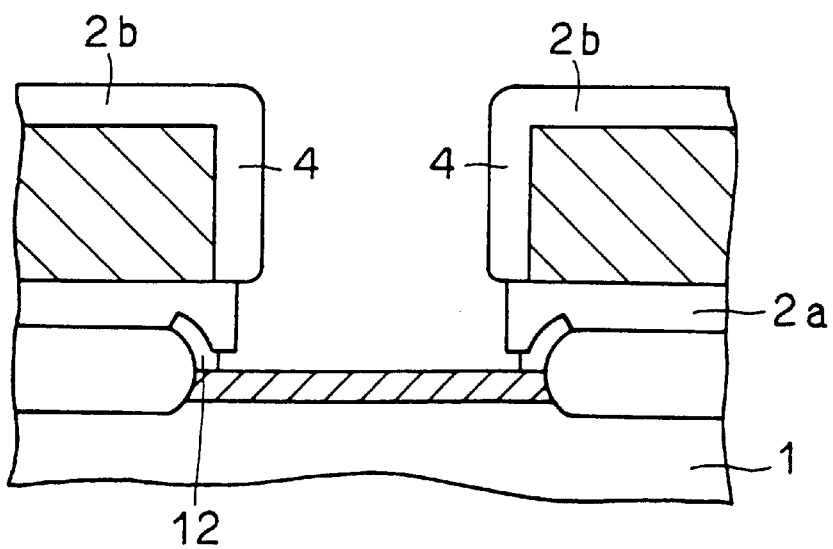

Referring to FIG. 122, silicon nitride film 12 at the bottom portion of the contact hole is removed by hot phosphorus.

The similar process as that shown in FIGS. 10 to 12 is carried out to complete the semiconductor device.

Embodiment 3

This embodiment relates to a further method of manufacturing the contact hole transistor shown in FIG. 2. FIGS. 22 to 27 are partial cross sectional views of a semiconductor device in respective steps in order of the manufacturing method thereof.

Figure 22:
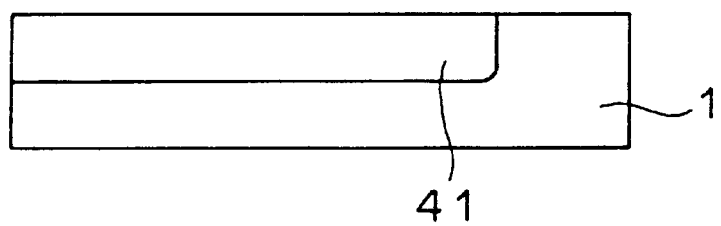
FIGS. 22 to 27 are partial cross sectional views of a semiconductor device in the first to the sixth steps of a further method of manufacturing the contact hole transistor of the present invention.

Referring to FIG. 22, a source drawing-out electrode 41 for drawing out a source electrode to an external terminal is formed on substrate (silicon substrate) 1 by ion implantation and heat treatment carried out thereafter. Source drawing-out electrode 41 has a conductivity type the same as that of a source region to be described later.

Figure 23:
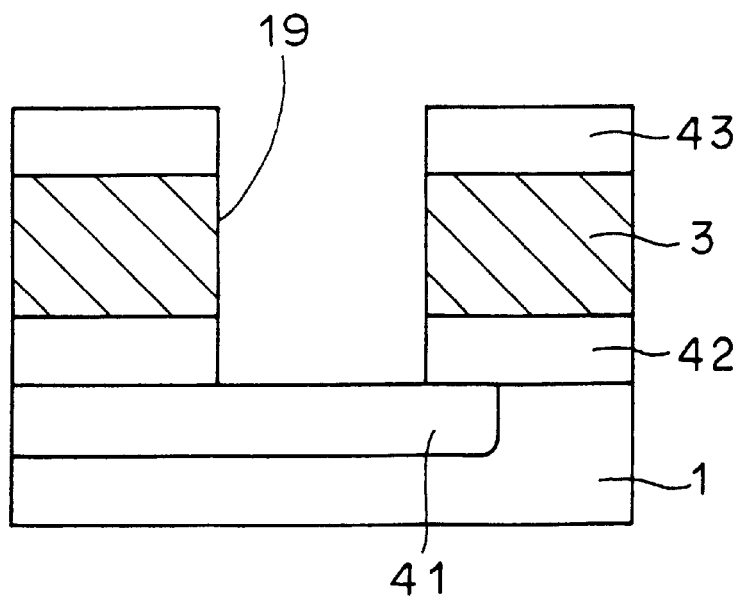

Referring to FIG. 23, a first interlayer insulating film 42, gate electrode 3 of poly-crystalline silicon, and a second interlayer insulating film 43 are sequentially deposited on substrate 1. Then, contact hole 19 penetrating through first interlayer insulating film 42, gate electrode 3, and second interlayer insulating film 43 is formed by reactive ion etching by a photolithography process.

Figure 24:
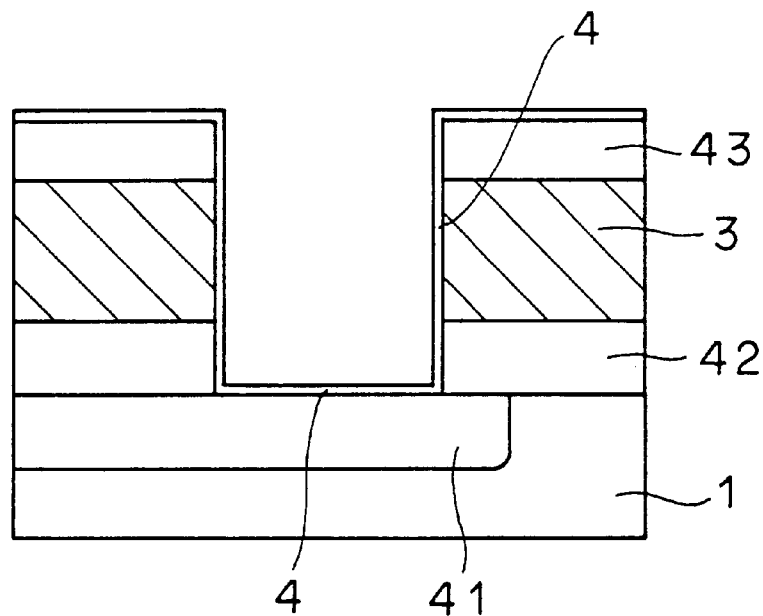

Referring to FIG. 24, gate insulating film 4 covering an inner wall surface of contact hole 19 is formed with, for example, a CVD method.

Figure 25:
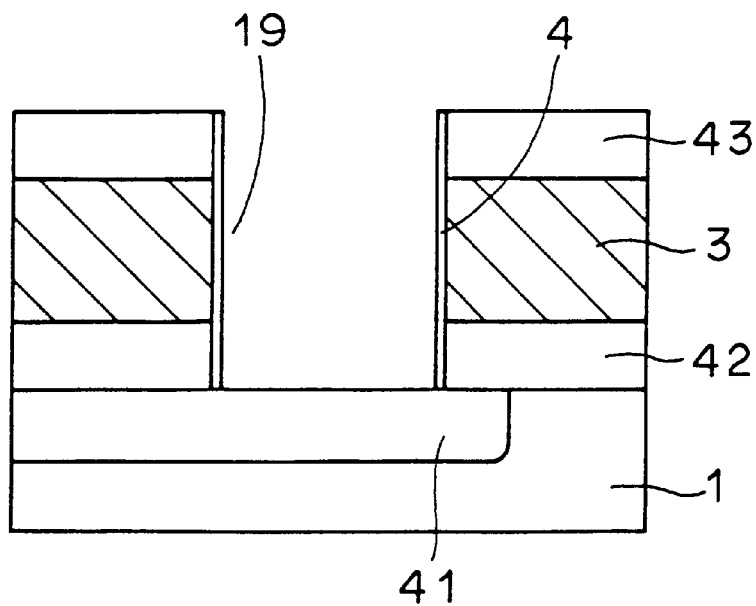

Referring to FIG. 25, gate insulating film 4 is selectively etched by using anisotropic properties of reactive ion etching to leave gate insulating film 4 only on the sidewall of contact hole 19.

Substrate 1 is heat-treated at a temperature of approximately 900°°C. under reduced pressure in hydrogen. By this heat treatment, a natural oxide film grown in the surface of substrate 1 is reduced, sublimated and removed to expose a clean surface of substrate 1.

Figure 26:
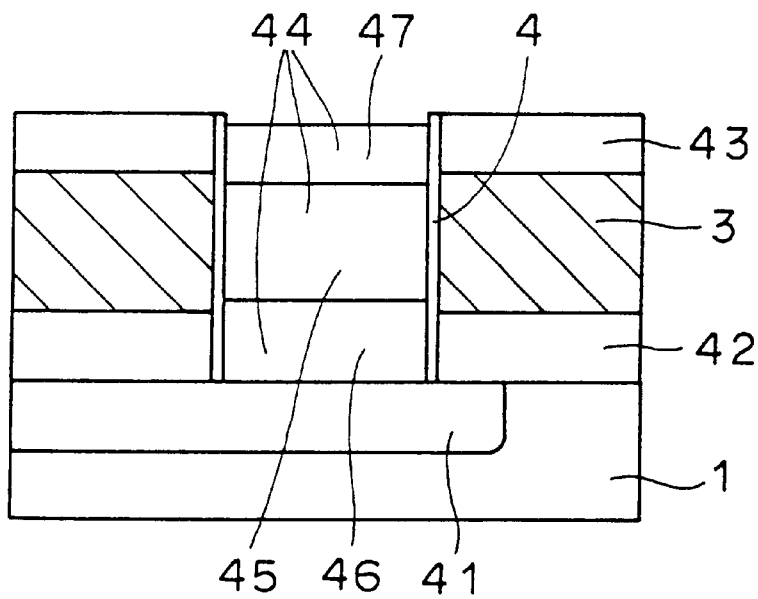

Referring to FIG. 26, an epitaxial Si layer 44 is grown on the clean surface of substrate 1 with a CVD method (900°°C., 80 Torr) using dichlorosilane. At this time, a source region 46 is first formed by introduction of n-type impurities such as phosphorus, then a channel region 45 is formed by introduction of p-type impurities such as boron, and then a drain region 47 is formed by introduction of n-type impurities to constitute a vertical type MOS transistor.

Figure 27:
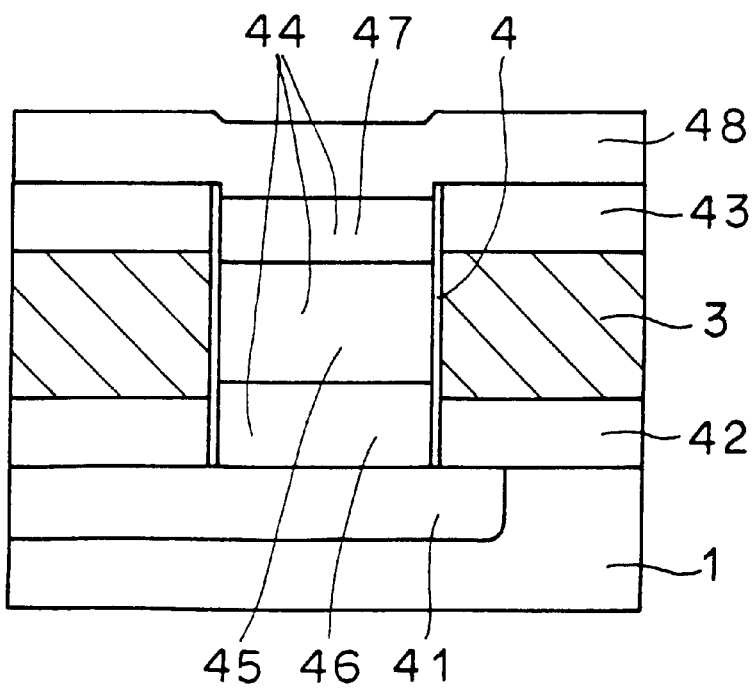

Referring to FIG. 27, a drain drawing-out region 48 for drawing out drain region 47 of the vertical type MOS transistor outside is formed on drain region 47. Then, by carrying out the process similar to that shown in FIG. 12, the contact hole transistor as shown in FIG. 2 is completed.

The film thickness of epitaxial layer 44 will now be described.

The film thicknesses of source region 46 and drain region 47 correspond to the film thicknesses of first interlayer insulating film 42 and second interlayer insulating film 43, respectively. First interlayer insulating film 42 must have a thickness large enough to withstand the voltage difference between gate and source. Second interlayer insulating film 43 must have a thickness large enough to withstand the voltage difference between gate and drain. For example, when a drive voltage is 5V, if an insulation breakdown voltage of the interlayer insulating film is 7MV/cm, the film thickness of approximately 700 Å or more is required. Therefore, the thickness of source region 46 and drain region 47 must be 700 Å or more. The thickness of channel region 45 must be large enough to withstand a necessary breakdown voltage between source and drain. For example, when a drive voltage is 5V, approximately 0.6 $\mu$m or more is required. Therefore, as a conclusion, the thickness of epitaxial layer 44 must be approximately 0.8 $\mu$m or more.

A further detailed description will now be given of a method of forming source region 46, channel region 45, and drain region 47.

Source region 46 is formed by epitaxial growth at a temperature of 900°°C. at a vacuum level of 80 Torr for 1 to 10 minutes by using a mixed gas of $PH_3$ gas added to $SiH_2Cl_2$ gas and $H_2$ gas. The amount of $PH_3$ gas is adjusted so that the phosphorus concentration of the epitaxially grown silicon layer is $10^{20}$ to $10^{22}$ atomscm$^{-3}$.

Channel region 45 is formed by epitaxial growth under the same condition as described above by using a mixed gas of $B_2H_6$ gas added to $SiH_2Cl_2$ gas and $H_2$ gas. The amount of addition of $B_2H_6$ gas is adjusted so that the boron concentration is $10^{15}$ to $10^{17}$ atomscm$^{-3}$.

Drain region 47 is formed with a method similar to that of source region 46. Times required for epitaxial growth are 1 to 10 minutes (46), 10 to 100 minutes (45), and 1 to 10 minutes (47), respectively.

Drain drawing-out region 48 shown in FIG. 27 is formed by depositing a phosphorus doped polysilicon film up to a thickness of 1000 Å with a low pressure CVD method at a temperature of 500°°C. to 700°°C. to pattern the polysilicon film by photolithography and etching.

According to this embodiment, since the channel region is formed by epitaxial growth, crystal properties of the channel region is improved, which in turn improving the transistor characteristic. Since conductivity types of the semiconductor can be changed only by changing gas at the time of growth of epitaxial layer 44, the process can be simplified.

Embodiment 4

This embodiment is a further improvement of the contact hole transistor shown in FIG. 2.

Figure 28:
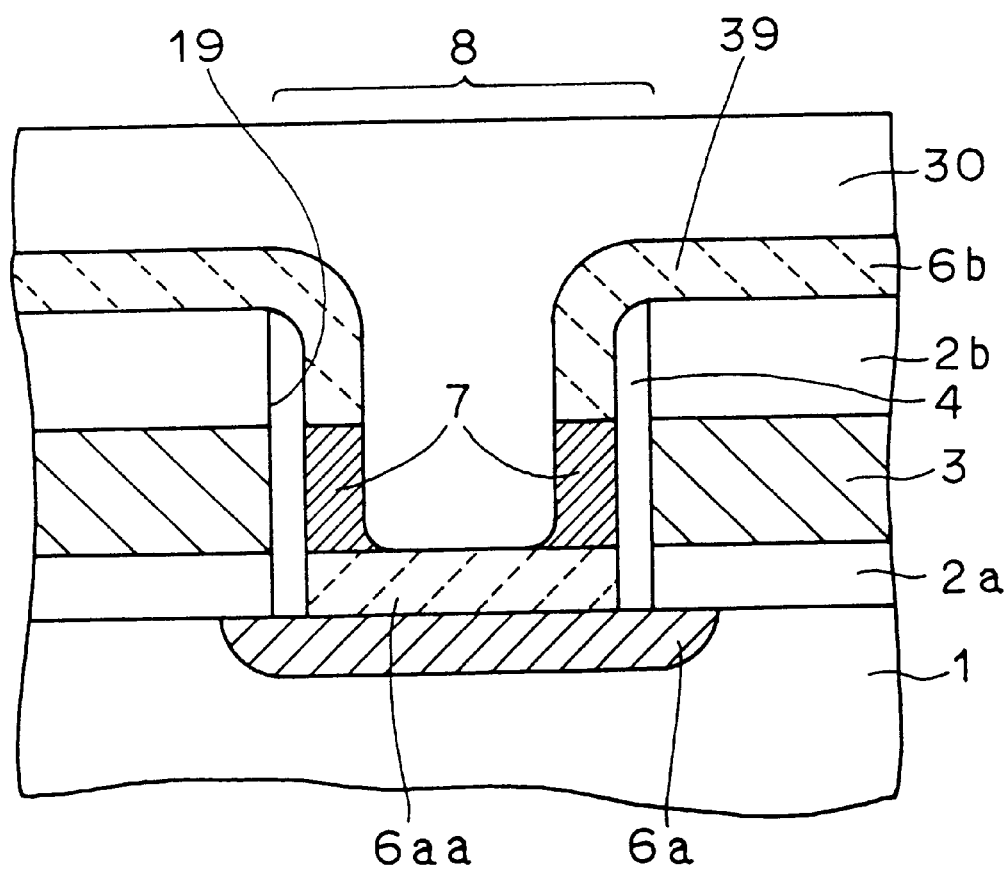
FIG. 28 is a cross sectional view of a contact hole transistor according to a further embodiment of the contact hole transistor of the present invention.

FIG. 28 is a cross sectional view of a contact hole transistor according to Embodiment 4. First impurity diffusion layer 6a serving as one source/drain region is provided in the main surface of substrate 1. First interlayer insulating film 2a is provided on substrate 1. Gate electrode 3 is provided on first interlayer insulating film 2a. Second interlayer insulating film 2b is provided on first interlayer insulating film 2a so as to cover gate electrode 3. Contact hole 19 for exposing a part of the surface of first impurity diffusion layer 6a is provided so as to penetrate through first interlayer insulating film 2a, gate electrode 3, and second interlayer insulating film 2b. A sidewall surface of contact hole 19 is covered with gate insulating film 4. The transistor includes a silicon thin film 39 having a recessed portion in contact hole 19, provided in contact with first impurity diffusion layer 6a and covering continuously the sidewall surface of contact hole 19 with gate insulating film 4 interposed therebetween. An insulating film 30 is provided on substrate 1 so as to fill the recessed portion of silicon thin film 39. Silicon thin film 39 is divided into three portions of cylindrical channel region 7 positioned at a portion surrounded by gate electrode 3, a source region 6aa and drain region 6b sandwiching channel region 7 from upper and lower sides. The thickness of silicon thin film 39 in channel region 7 is equal to or less than the maximum depletion layer width.

In the contact hole transistor according to Embodiment 1, that is, shown in FIG. 2, when the radius of contact hole 19 is 0.3 µm or more, for example, the radius of channel portion 7 of the transistor becomes too large, making it difficult to completely deplete channel portion 7 when the transistor is turned on. When an N channel transistor is considered, for example, the depletion layer extends from the outer side surface of cylindrical channel portion 7 as the gate voltage changes from negative to positive. Since the radius of channel portion 7 is large, an inversion layer is formed on the outer side surface of channel portion 7 before channel portion 7 has been completely depleted. More specifically, the transistor is operated in a state where channel portion 7 is not completely depleted. Therefore, the original characteristic is lost that the threshold coefficient is small.

On the other hand, in Embodiment 4, a transistor 8 is formed by depositing thin silicon film 39 (for example, 100 Å) covering an inner wall surface of contact hole 19. Since channel portion 7 is small in thickness, complete depletion of channel portion 7 is easily achieved. More specifically, as the gate voltage changes from negative to positive, a depletion layer extends inwardly from the outer surface of channel portion 7. At this time, since the thickness of channel portion 7 is small, the depletion layer reaches insulating film 30 at a portion where the gate voltage is low. In this state, depletion layer capacitance Cd of the channel becomes identical to a capacitance of a capacitance of the depleted silicon film and a capacitance of insulating film 30 which are series-coupled to each other, which in turn rapidly decreases depletion layer capacitance Cd of the channel. Since the subthreshold coefficient becomes small as depletion layer capacitance Cd decreases, the subthreshold coefficient rapidly becomes small at the time when the depletion layer reaches insulating film 30.

A drain current (off current) in the off state of the transistor is proportional to a junction area of the drain. The junction area of the drain is made smaller in a structure in which the sidewall surface of contact hole 19 is covered with a silicon thin film than in a structure in which contact hole 19 has a channel portion therein (one shown in FIG. 2), which in turn decreases the off current more.

Embodiment 5

This embodiment relates to a method of manufacturing the contact hole transistor shown in FIG. 28. First, the process identical to that shown in FIGS. 4 to 9, which was described regarding to Embodiment 1, is carried out.

Figure 29A:
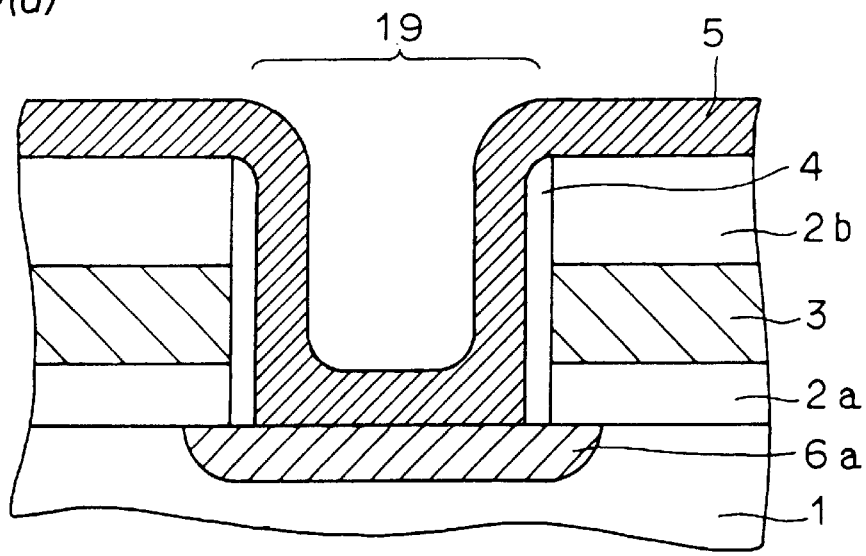
FIGS. 29(a) to 32 are partial cross sectional views of a semiconductor device in the first to the fourth steps of a further method of manufacturing the contact hole transistor shown in FIG. 28.

Referring to FIG. 29(a), amorphous silicon film 5 of 100 Å is deposited on substrate 1 so as to cover the inner wall surface of contact hole 19.

Figure 29B:
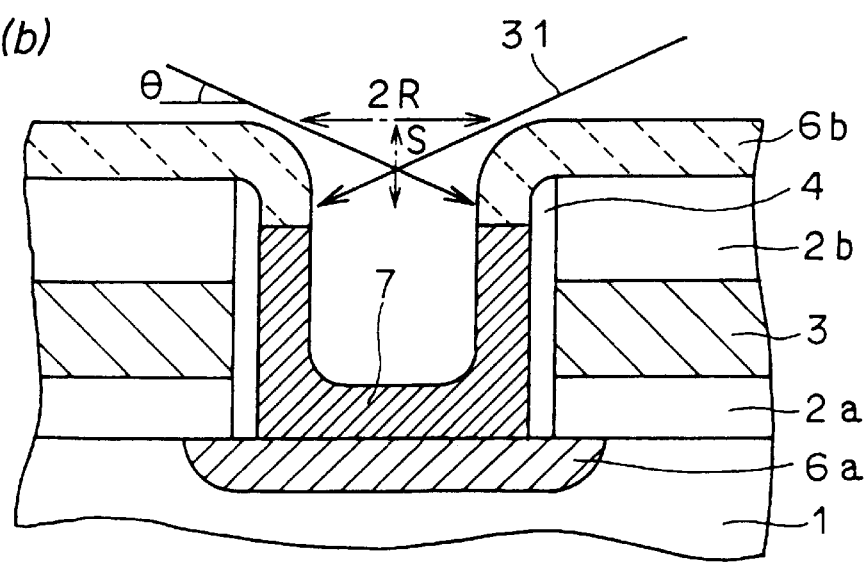

Referring to FIG. 29(b), arsenic ions 31 are rotationally implanted into the surface of amorphous silicon film 5 at a tilt angle of θ. The implantation conditions are, for example, implantation energy of 10 keV, and a concentration of $5 \times 10^{15}$ atoms/cm$^2$.

Let a dimension in the vertical direction of a portion into which arsenic ions are implanted be S, and the diameter of contact hole 19 be 2R, the following expression holds:

$\tan \theta = S/2R$

By determining θ, the dimension S in the vertical direction of the portion (6b) into which arsenic ions are implanted is determined.

Then, heat treatment is carried out to cause heat diffusion of impurity ions. More specifically, implanted arsenic diffuses in the vertical direction in amorphous silicon film 5, and diffuses from source region 6a into amorphous silicon film 5, causing source region 6a and drain region 6b to approach gate electrode 3.

Then, a silicon oxide film having a thickness of 3000 Å is deposited in contact hole 19 with a CVD method, whereby the contact hole transistor shown in FIG. 28 is completed.

Embodiment 6

This embodiment relates to another method of manufacturing the contact hole transistor shown in FIG. 28.

Figure 30:
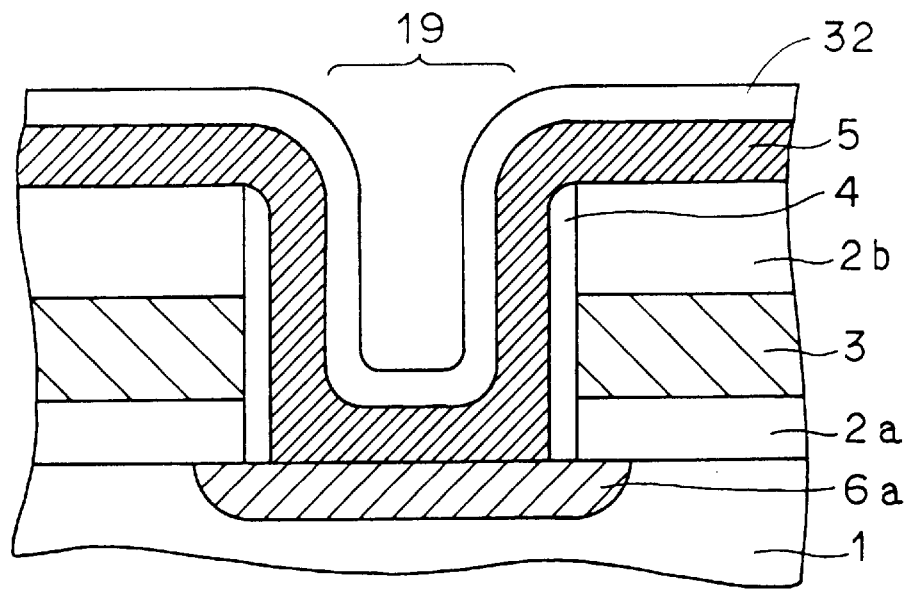
Figure 31:
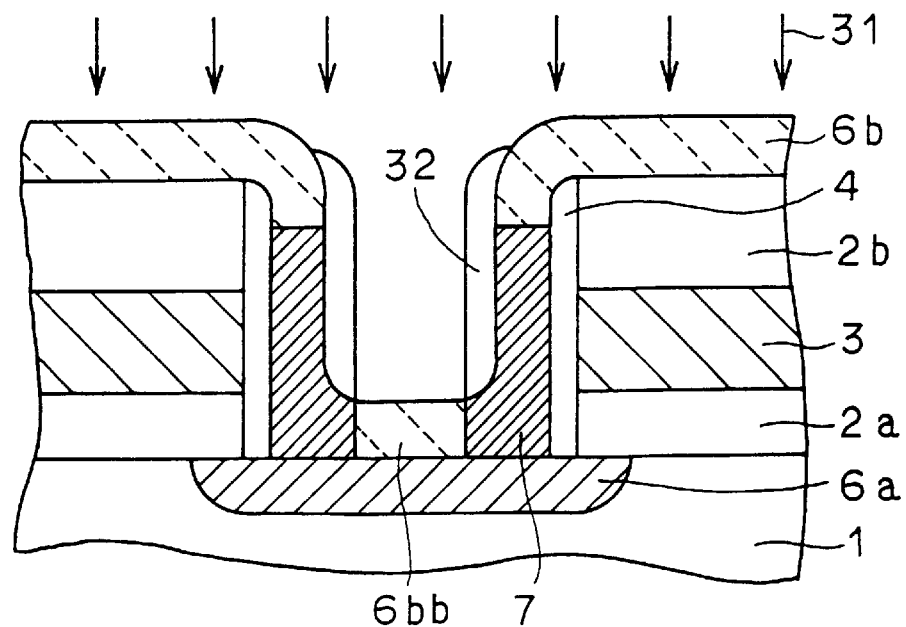
Figure 32:
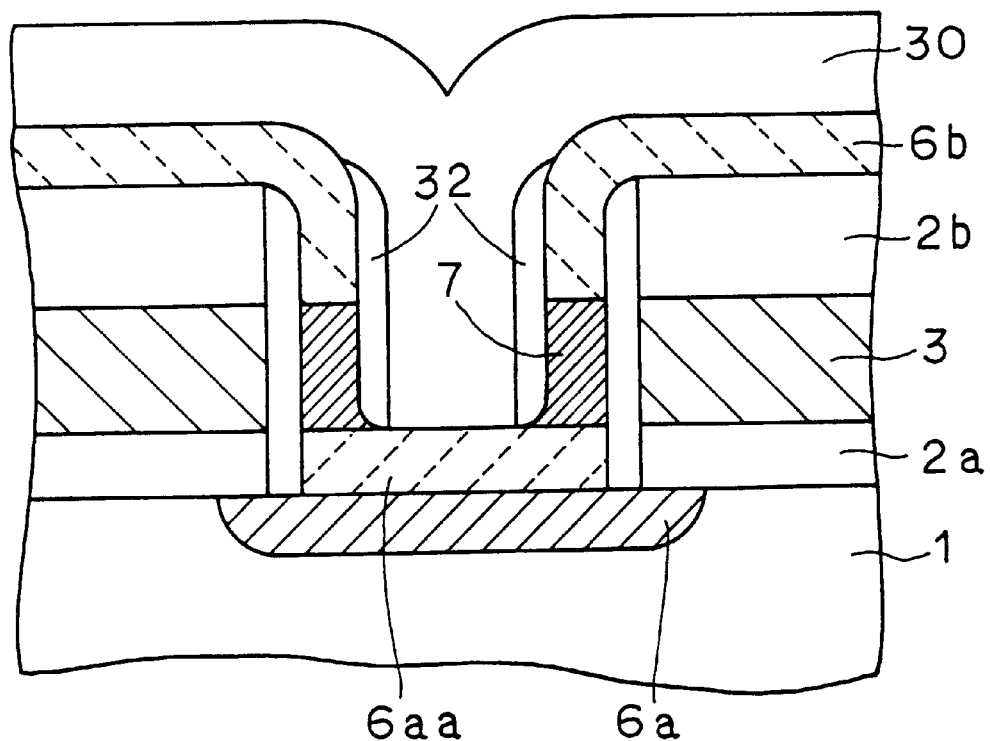

FIGS. 30 to 32 are partial cross sectional views of a semiconductor device in respective main steps of the manufacturing method according to Embodiment 6.

In this embodiment, similar to the case of Embodiment 5, the process up to the step shown in FIG. 29 is first carried out.

Referring to FIG. 30, a silicon oxide film 32 of a thickness of 500 Å is deposited on amorphus silicon film 5 with a CVD method.

Referring to FIG. 31, silicon oxide film 32 is anisotropically etched so that silicon oxide film 32 is left on the inner wall surface of contact hole 19. Then, arsenic ions 31 are implanted perpendicularly with respect to substrate 1 to form an implantation region (6b, 6bb). The implantation conditions are an acceleration voltage of 30 keV and a dose rate of $1 \times 10^{15}$ atoms/cm$^{-2}$. Silicon oxide film 32 left on the sidewall surface of contact hole 19 prevents arsenic ions for source/drain formation from being implanted into channel portion 7. When there exists no silicon oxide film 32, if the direction of implantation of arsenic ions 31 is completely perpendicular to substrate 1, arsenic is not implanted into channel portion 7. Even slight deviation of the implantation angle causes arsenic to be implanted into channel portion 7. As a result, a leakage current between source and drain is generated. Silicon oxide film 32 is provided for prevention thereof.

Then, by thermally diffusing impurities, source 6aa and drain region 6b are formed which are regions into which impurities are implanted. Deposition of silicon oxide film 32 of a thickness of 3000 Å in the contact hole with a CVD method completes the contact hole transistor.

According to this method, it is possible to manufacture a contact hole transistor without carrying out oblique rotational ion implantation.

Embodiment 7

Figure 33:
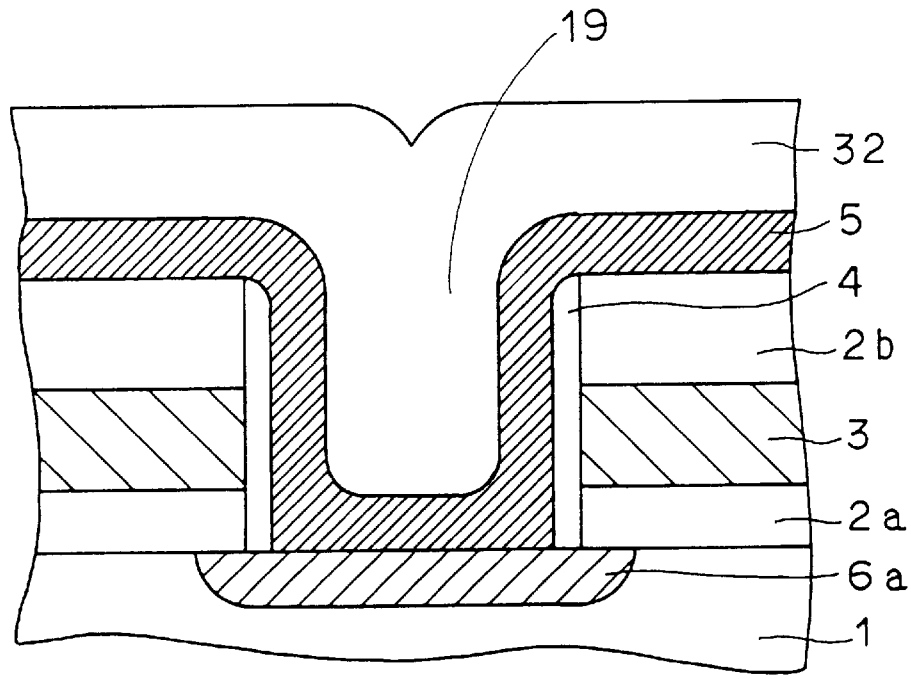
FIGS. 33 to 35 are partial cross sectional views of a semiconductor device in the first to the third steps of a further method of manufacturing the contact hole transistor shown in FIG. 28.
Figure 34:
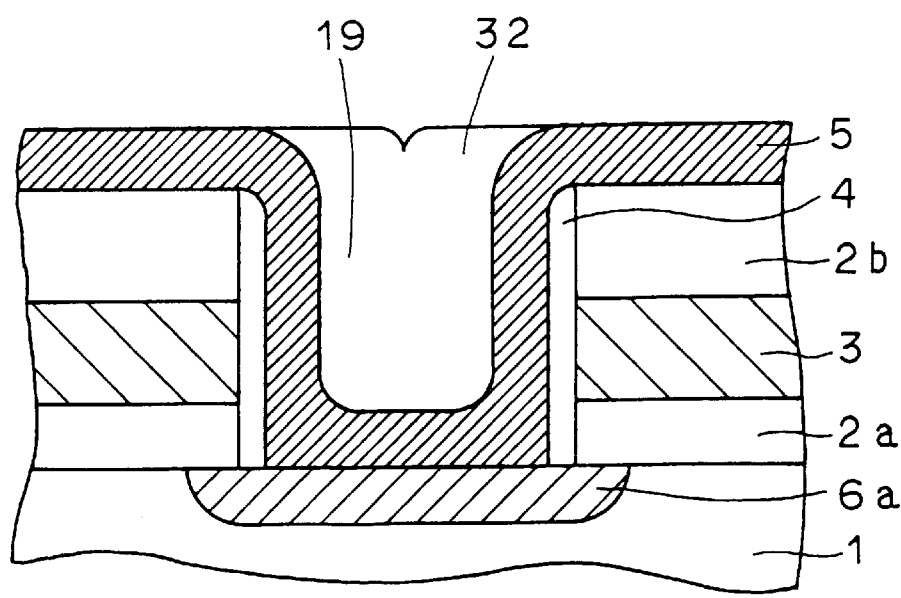
Figure 35:
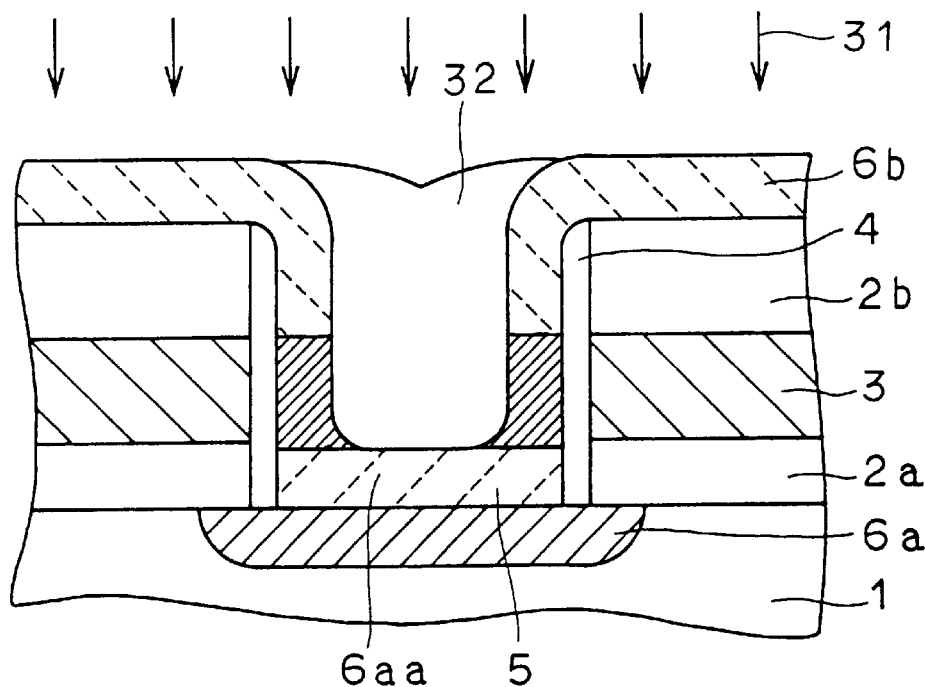

This embodiment relates to still another method of manufacturing the contact hole transistor shown in FIG. 28. FIGS. 33 to 35 are partial cross sectional views of a semiconductor device in respective main steps of the manufacturing method according to this embodiment.

Similar to Embodiment 6, the process up to the step shown in FIG. 29 is carried out.

Referring to FIG. 33, silicon oxide film 32 of a thickness of 3000 Å is deposited on amorphous silicon film 5 with a CVD method so as to fill contact hole 19.

Referring to FIGS. 33 and 34, silicon oxide film 32 is anisotropically etched to leave silicon oxide film 32 only in contact hole 19.

Referring to FIG. 35, when arsenic (10 keV, 5×10$^{15}$ atoms/cm$^2$) is implanted into the entire surface of substrate 1, an implantation layer (6b) of arsenic is formed only in the upper portion of amorphous silicon film 5.

Then, heat treatment is applied. Arsenic diffuses from the impurity layer (6a) into amorphous silicon film 5, which in turn causes formation of a diffusion layer (6a) as well as diffusion of arsenic in the implantation layer (6b) into the vicinity of gate electrode 3. The contact hole transistor is thus completed.

Figure 36:
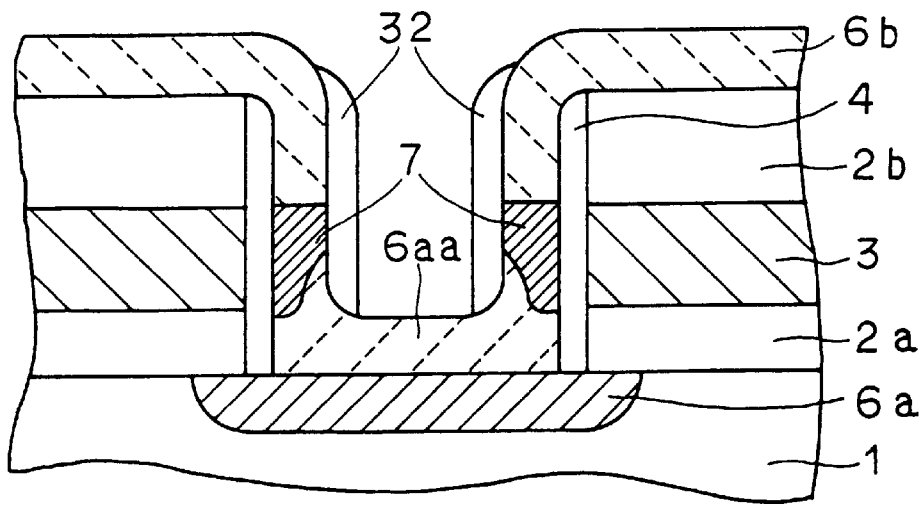
FIG. 36 is a diagram showing problems of a manufacturing method according to Embodiment 6.

In the method shown in Embodiment 6, referring to FIG. 31, arsenic is implanted into the bottom portion of amorphous silicon film 5, and an implantation region (6bb) is formed. Referring to FIG. 36, in such an implantation region (6bb), arsenic diffuses into channel portion 7 by heat treatment applied later, sometimes causing short channel effects and a leakage between source and drain. Therefore, it is preferred that the implantation region (6bb) shown in FIG. 31 does not exist. In this embodiment, referring to FIG. 35, since silicon oxide film 32 is large in thickness, arsenic is not implanted into the bottom portion of the amorphous silicon film at the time of implantation of arsenic.

Therefore, this embodiment is effective in the case where later heat treatment is carried out at a high temperature (approximately 850° C. or more).

However, in this embodiment, silicon oxide film 32 serving as a mask of implantation must have a thickness large enough to fill contact hole 19 (in this case, approximately 3000 Å or more). In the case of Embodiment 6, the silicon oxide film has only to have a thickness of 1000 Å or less. Therefore, if later heat treatment is carried out at a low temperature (approximately 800° C. or less), Embodiment 6 is more excellent than this embodiment.

Embodiment 8

Figure 37:
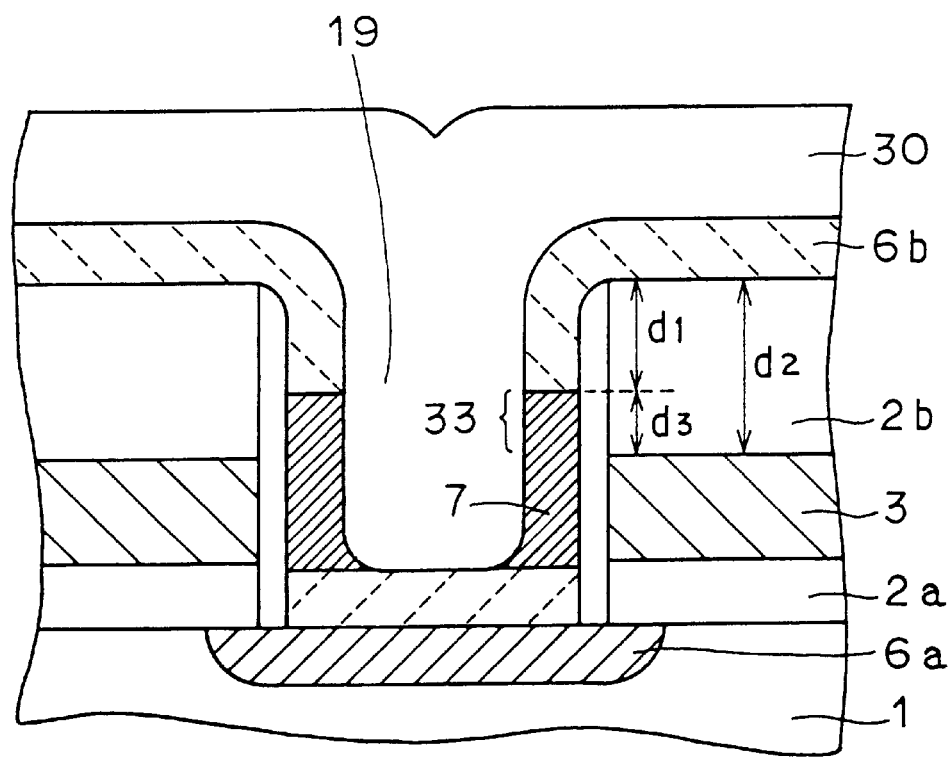
FIG. 37 is a cross sectional view of a contact hole transistor according to a further embodiment of the present invention.

FIG. 37 is a cross sectional view of a contact hole transistor according to Embodiment 8.

The contact hole transistor according to this embodiment is improved so that a source/drain current (off current) in an off state of the transistor is reduced. Since the contact hole transistor according to this embodiment is the same as the contact hole transistor shown in FIG. 28 excluding the following points, the same reference characters denote corresponding portions, and description thereof will not be repeated. The contact hole transistor according to Embodiment 8 is different from the contact hole transistor shown in FIG. 28 in that the upper end of channel portion 7 is higher than the upper surface of gate electrode 3.

Since the end portion of drain 6b is spaced apart from gate electrode 3, the off current is reduced. Following is a method of manufacturing a contact hole transistor of such a structure.

Referring to FIG. 37, by appropriately setting a thickness d$_2$ of second interlayer insulating film 2b, it is possible to set the distance (offset length (d$_3$)) between the end portion of drain region 6b and the upper end of gate electrode 3 to a desired value. For example, if drain region 6b enters contact hole 8 by 0.1 μm (the distance d$_1$ in FIG. 37), the offset length d$_3$ can be set to 0.1 μm by setting d$_2$ to 0.2 μm.

In the conventional planar type transistor, the offset length sometimes varied due to deviation of mask alignment or the like since the source/drain portion was formed with a mask alignment method. However, in this embodiment, the offset length d$_3$ of a stable dimension can be obtained since the offset length d$_3$ is determined by the spread d$_1$ of drain region 6b determined by the implantation angle of boron for formation of drain region 6b and the thermal diffusion length and the thickness d$_2$ of interlayer insulating film 2b.

In the above-described embodiment, the case where the offset length d$_3$ is increased by making the upper end of channel portion 7 higher than the upper surface of gate electrode 3 was described. However, the present invention is not limited thereto. The similar effects can be implemented by making the lower end of channel portion 7 lower than the lower surface of gate electrode 3. In this case, the offset length can be controlled by adjusting the thickness of first interlayer insulating film 2a.

Embodiment 9

Figure 38:
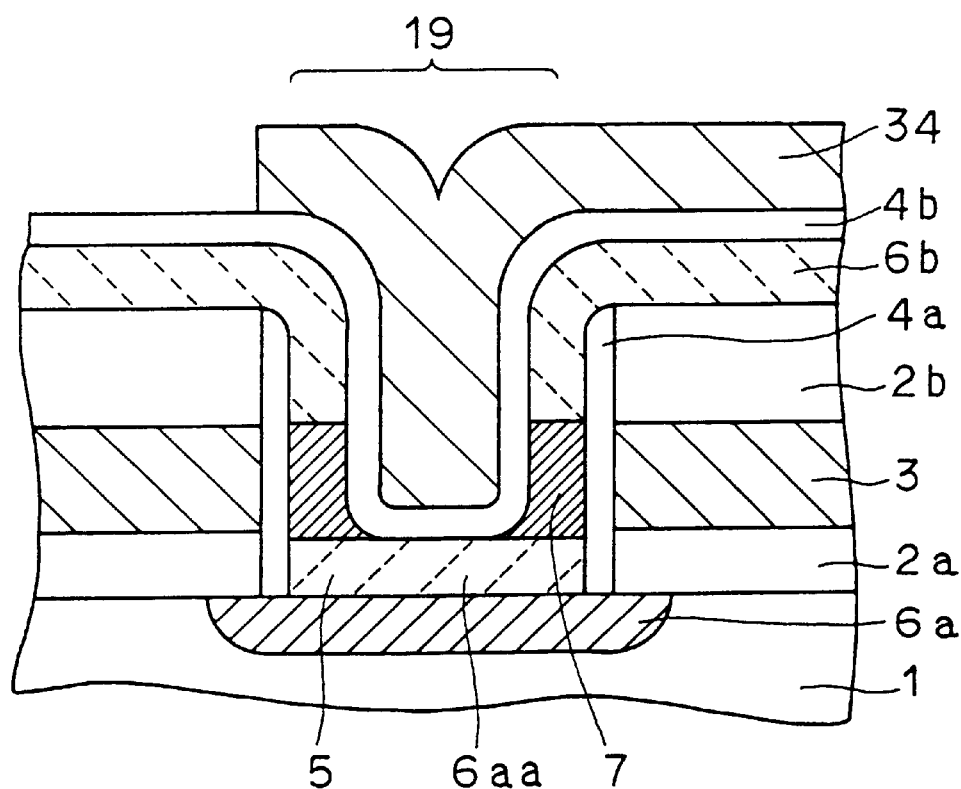
FIG. 38 is a cross sectional view of a contact hole transistor according to a further embodiment of the present invention.

FIG. 38 is a cross sectional view of a contact hole transistor according to a further embodiment of the present invention. Referring to FIG. 38, the contact hole transistor includes substrate 1. Although the case is shown here where an ordinary silicon substrate is used as substrate 1, an SOI substrate may be used. Impurities of a first conductivity type are implanted into the main surface of substrate 1, and first impurity diffusion layer 6a serving as one source/drain region is provided. First interlayer insulating film 2a is provided on substrate 1. Gate electrode 3 having an upper end surface substantially parallel to the surface of substrate 1 is provided on first interlayer insulating film 2a. Second interlayer insulating film 2b is provided on first interlayer insulating film 2a so as to cover gate electrode 3. Contact hole 19 for exposing a part of first impurity diffusion layer 6a is provided so as to penetrate through first interlayer insulating film 2a, gate electrode 3, and second interlayer insulting film 2b. A sidewall surface of contact hole 19 is covered with a gate insulating film 4a. The contact hole transistor of this embodiment includes a silicon thin film 5 provided in contact with first impurity diffusion layer 6a so as to cover continuously an inner wall surface of contact hole 19 with gate insulating film 4a interposed therebetween, and having a recessed portion having its bottom surface positioned at or lower than the lower surface of gate electrode 3 in contact hole 19. Silicon thin film 5 is divided into three portions of cylindrical channel portion 7 positioned at a portion surrounded by gate electrode 3 and source region 6aa and drain region 6b sandwiching channel portion 7 from upper and lower sides. The thickness of silicon thin film 5 in channel portion 7 is double of the maximum depletion layer width or less. The contact hole transistor of this embodiment further includes a second gate insulating film 4b provided on substrate 1 so as to cover the recessed portion of silicon thin film 5. A second gate electrode 34 opposing channel portion 7 with second gate insulating film 4b interposed therebetween fills the recessed portion of silicon thin film 5.

Since the contact hole transistor according to this embodiment has two gate electrodes 3, 34, it is possible to reduce the off current of the transistor and to improve the on current of the transistor. Description will now be given of a method of manufacturing the contact hole transistor shown in FIG. 38.

Similar to the case of Embodiment 5, the process up to the step shown in FIG. 30 is first carried out. Then, referring to FIG. 38, the recessed portion (19) of the silicon thin film is covered with a silicon oxide film of a thickness of 50 to 500 Å serving as second gate insulating film 4b. The silicon oxide film is formed by deposition with a CVD method. A phosphorus doped polysilicon film (the thickness of 100 to 4000 Å) serving as second gate electrode 34 is deposited in the recessed portion (19) with a CVD method. The polysilicon film (34) is processed into a desired pattern by using a lithography method and an etching method. Then, heat treatment is applied at a temperature of 700° C. to 1000° C. Arsenic diffuses from the arsenic diffusion layer (6a) serving as the source region and the arsenic diffusion layer (6b) serving as the drain region to the vicinity of gate electrode 3. The contact hole transistor having two gate electrodes 3, 34 is thus completed.

Gate insulating film 4b may be a silicon oxide film formed by thermal oxidization of the surface of the silicon thin film (6aa+7+6b). If formation of gate insulating film 4b carried out after formation of source/drain, or formation of gate electrode 34 carried out with a CVD method is carried out at a temperature of 400° C. or more, the final thermal treatment is not always required.

Embodiment 10

Figure 39:
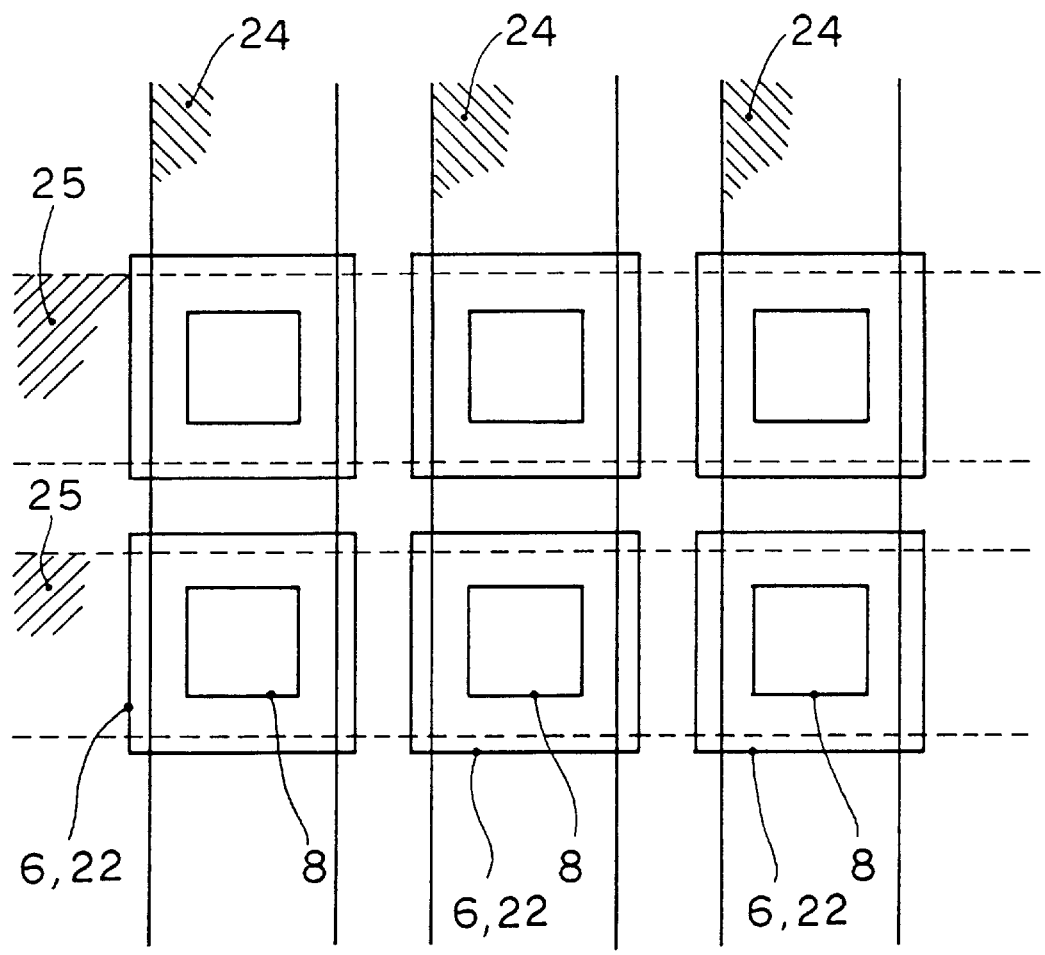
FIG. 39 is a pattern layout diagram of a DRAM cell according to Embodiment 10.
Figure 40:
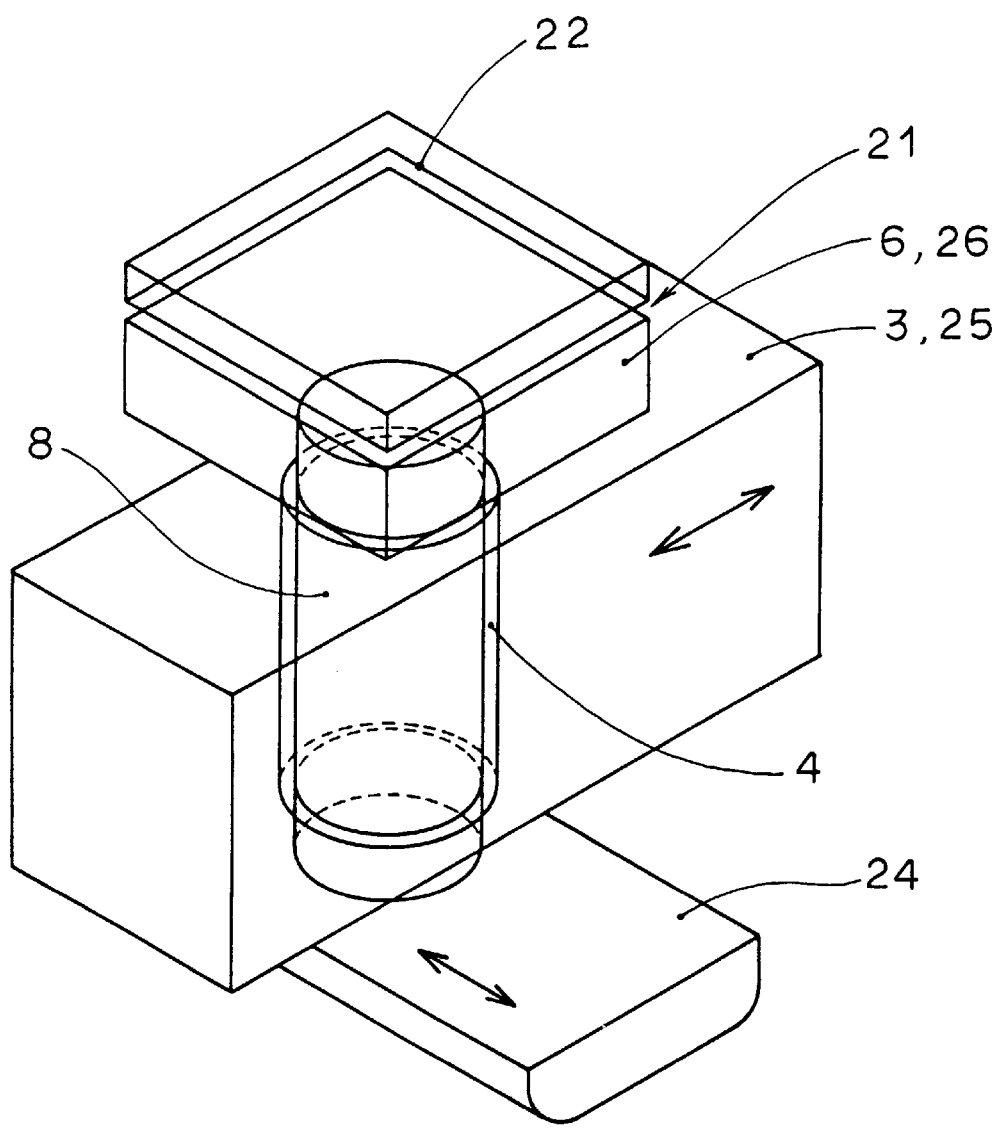
FIG. 40 is a perspective view showing in three dimensions one cell of the DRAM shown in FIG. 39.
Figure 41:
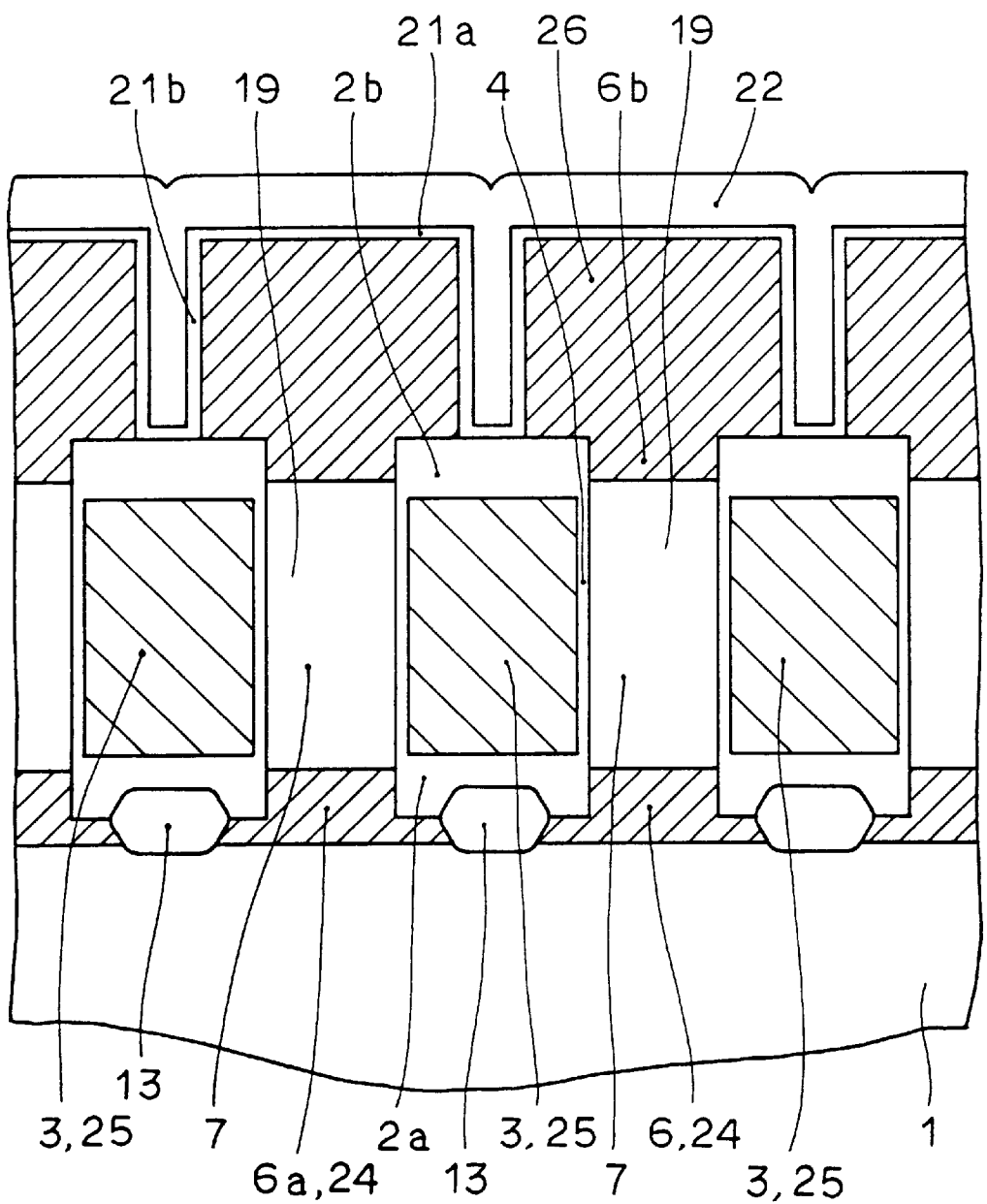
FIG. 41 is a cross sectional view of the DRAM cell shown in FIG. 39.
Figure 42:
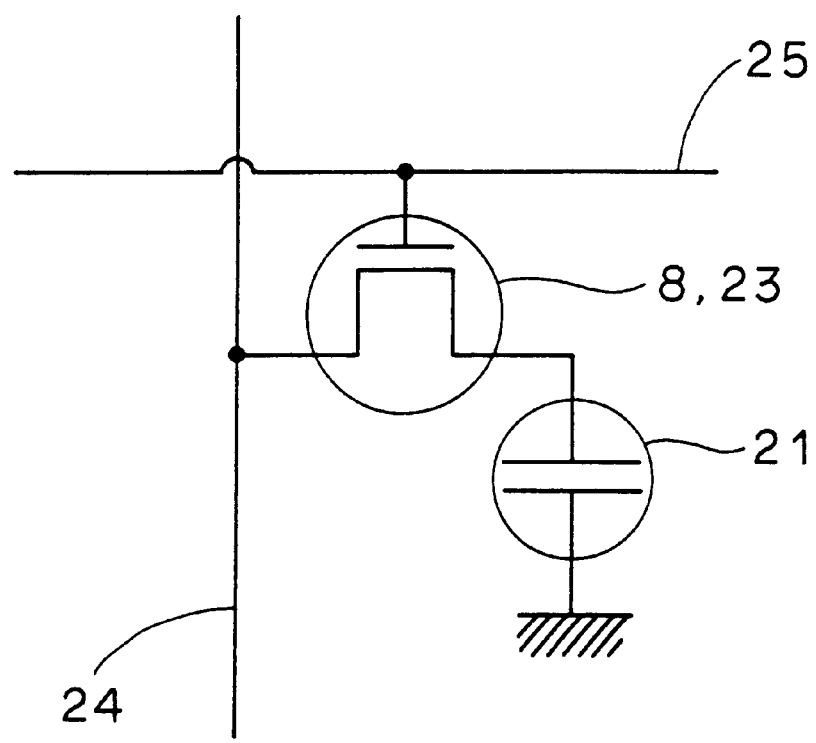
FIG. 42 is an equivalent circuit diagram of the DRAM cell shown in FIG. 39.

FIG. 39 is a layout diagram of a pattern of a DRAM cell using a contact hole transistor according to the present invention. In FIG. 39, only two cells in the vertical direction and three cells in the horizontal direction are shown. FIG. 40 is a perspective view illustrating one DRAM cell shown in FIG. 39 in three dimensions. FIG. 41 is a cross sectional view of the DRAM cell shown in FIG. 39. FIG. 42 is an equivalent circuit diagram of the DRAM cell shown in FIG. 39.

Referring to these figures, a semiconductor memory device according to this embodiment is a dynamic random access memory for storing information by contact hole transistor 8 in a capacitor provided at a crossing point of a bit line 24 and a word line 25 and formed of a storage node 26, a capacitor insulating film 21, and a cell plate electrode 22 opposing the capacitor.

The semiconductor memory device includes a substrate (not shown). Impurities of a first conductivity type are implanted into the main surface of the substrate to provide an impurity diffusion layer serving as one source/drain region 6a and also as bit line 24. First interlayer insulating film 2a is formed on the substrate. Gate electrode 3 having an upper end surface substantially parallel to the surface of the substrate is provided on first interlayer insulating film 2a. Second interlayer insulating film 2b is provided on first interlayer insulating film 2a so as to cover gate electrode 3. Contact hole 19 for exposing a part of the surface of an impurity diffusion layer (6, 24) is provided so as to penetrate through first interlayer insulating film 2a, gate electrode 3, and second interlayer insulating film 2b. A sidewall surface of contact hole 19 is covered with gate insulating film 4. A first semiconductor layer of a first conductivity type is provided in contact hole 19 on the surface of the impurity diffusion layer (6a, 24) in contact therewith up to the lower surface of gate electrode 3. Channel semiconductor layer 7 is provided in contact hole 19 on the surface of the first semiconductor layer in contact therewith up to the upper surface of gate electrode 3. A second conductive layer of a first conductivity type serving as drain region 6b and also as storage node 26 is provided on the channel semiconductor layer (7) in contact therewith. A capacitor insulating film 21a is provided so as to cover the second conductive layer (6b, 26). A cell plate electrode 22 is provided on storage node 26 with capacitor insulating film 21a interposed therebetween.

Contact hole transistor 8 is formed with the manufacturing method described in Embodiment 1. Bit line 24 is first formed as a source electrode of contact hole transistor 8 by implanting impurities into the main surface of substrate 1.

As is clear from FIG. 39, bit line 24 is shared among cells arranged in the longitudinal direction. Bit line 24 is separated from another bit line 24 by an LOCOS film 13. Gate electrode 3 is used as word line 25. As is clear from FIG. 39, word line 25 is shared among cells arranged in the lateral direction. Drain region 6, patterned as shown in FIG. 39, is also used as storage node 26.

Referring to FIG. 40, if an insulating film having a high dielectric constant such as a silicon nitride film, PZT, $Ta_2O_5$ is used as capacitor insulating film 21, the capacitor capacitance is increased.

Referring to FIG. 41, since capacitor insulating film 21 is formed so as to cover the outer surface of storage node 26, the capacitor capacitance can be increased by the capacitance of the sidewall of the storage node.

Referring to FIG. 42, when contact hole transistor 8 is an N-channel transistor, by bringing word line 25 into a high level, it is possible to write information of bit line 24 in capacitor 21, or to read out information stored in capacitor 21. When contact hole transistor 8 is a P-channel transistor, by bringing word line 25 into a low level, it is possible to write information of bit line 24 in capacitor 21, or to read out information stored in capacitor 21.

Since contact hole transistor 8 is used as an access transistor of a DRAM cell, a current flows in two directions. Therefore, a source region and a drain region are changeable depending on the directions of the current. For convenience of description, an electrode closer to the substrate is called source in this specification.

Embodiment 11

Figure 43:
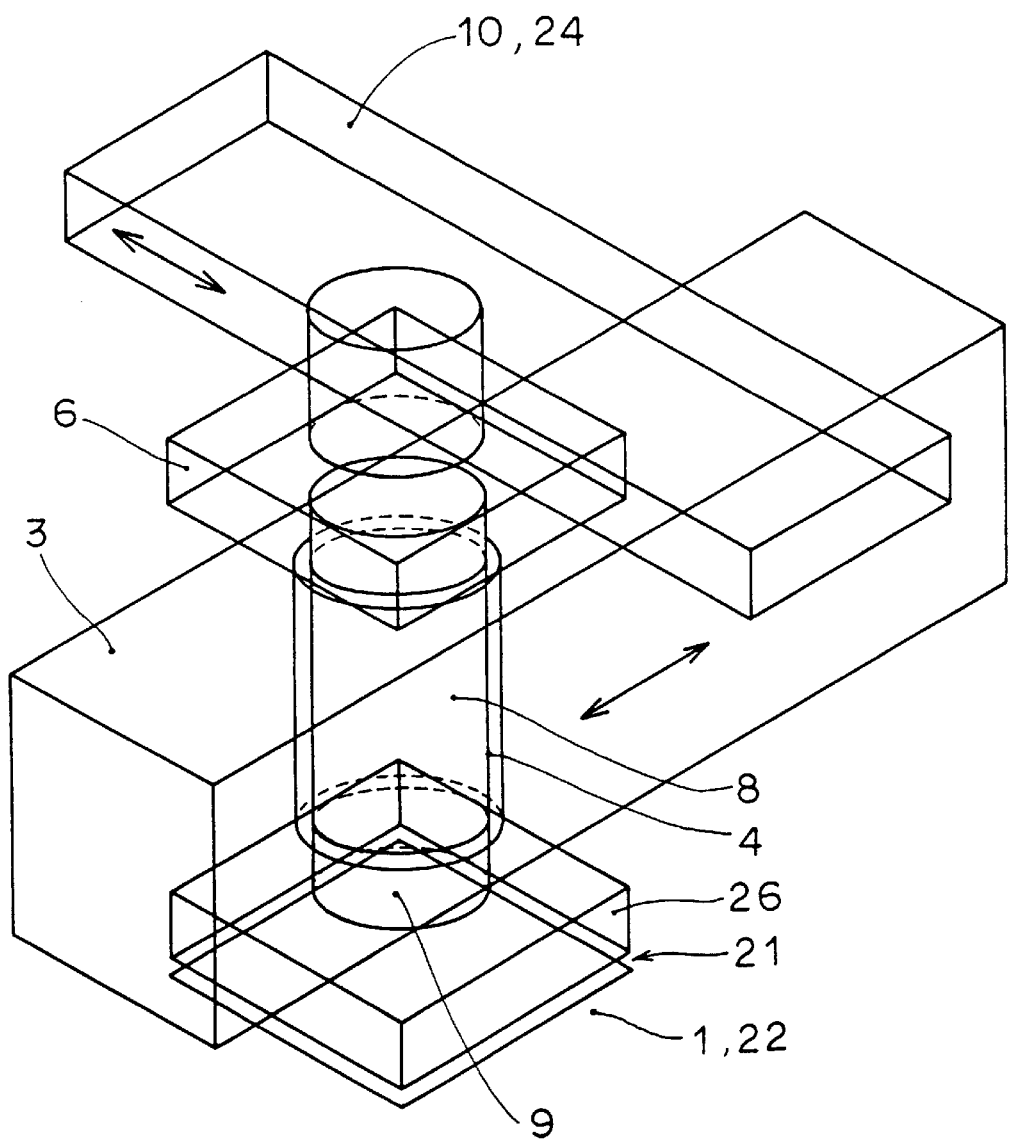
FIG. 43 is a perspective view of a DRAM cell according to Embodiment 11.

FIG. 43 is a perspective view of a DRAM cell according to Embodiment 11. This embodiment is characterized in that a capacitor is formed on the side of substrate 1. Contact hole transistor 8 is provided in gate electrode 3. Storage node 26 is connected to bottom portion 9 of contact hole transistor 8. Cell plate electrode 22 opposes storage node 26 with capacitor insulating film 21 interposed therebetween. Source/drain region 6 is connected to an upper portion of contact hole transistor 8. Bit line 24 serving as aluminum interconnection 10 is connected to source/drain region 6.

According to this embodiment, capacitor insulating film 21 is formed on substrate 1. Then, storage node 26 (polysilicon) is formed on capacitor insulating film 21. Contact hole transistor 8 is formed on storage node 26. Therefore, according to this method, it is not possible to form monocrystalline contact hole transistor 8 in the same orientation as that of substrate 1. However, if a solid phase growth method is used, polysilicon of a large grain can be formed. Therefore, it is possible to form the channel region of the contact hole transistor with one crystal. In this case, it is desired that the entire storage node 26, or portion 9 connecting to the source region of the contact hole transistor, is monocrystallized with a solid phase growth method or the like. When an SOI substrate is used as the substrate, it is possible to form a monocrystalline contact hole transistor in the same orientation as that of the substrate (orientation of the SOI layer).

Embodiment 12

Figure 44:
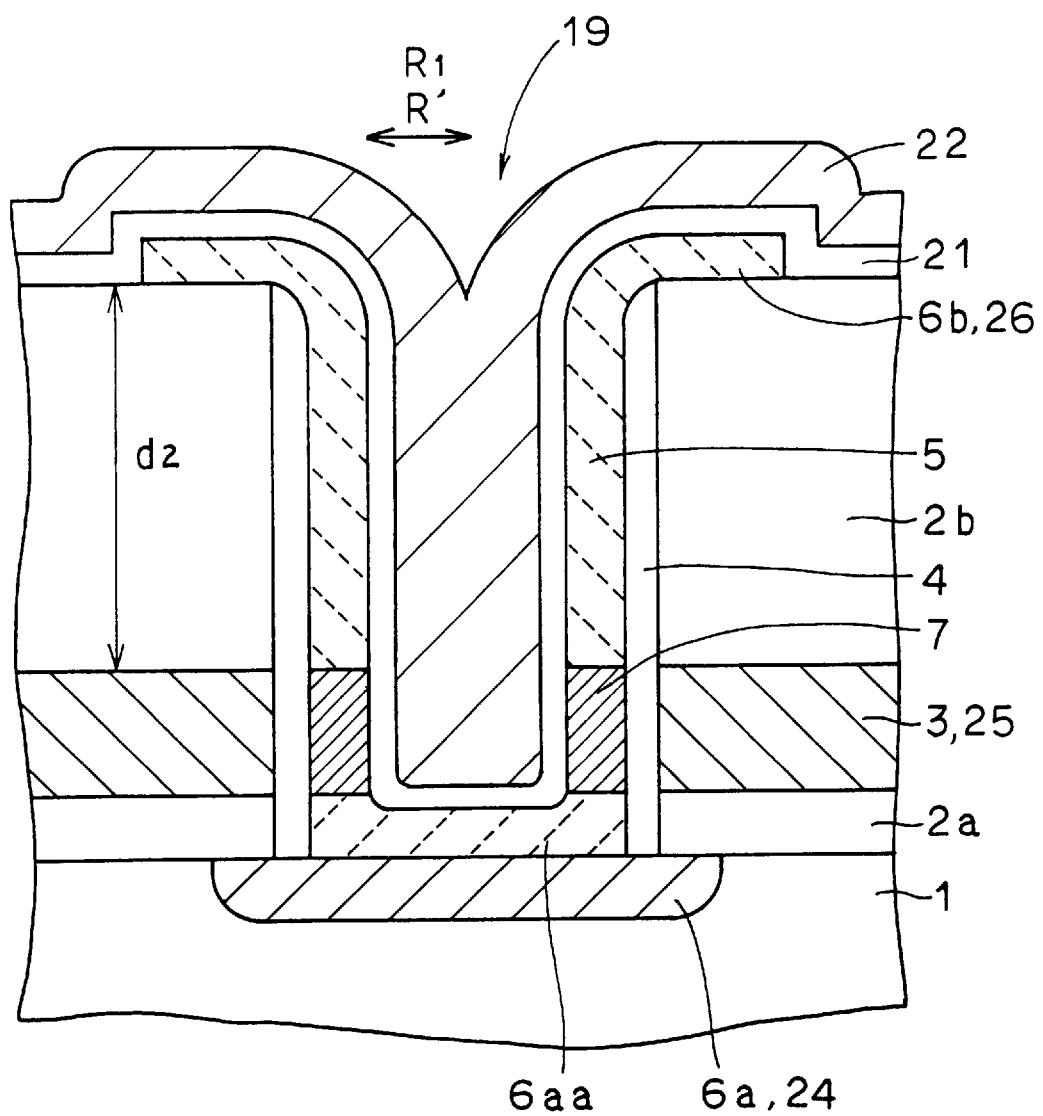
FIG. 44 is a cross sectional view of a DRAM cell according to Embodiment 12.

FIG. 44 is a cross sectional view of a DRAM cell according to Embodiment 12. The DRAM cell shown in FIG. 44 is fabricated by using the contact hole transistor shown in FIG. 28.

The DRAM according to this embodiment includes semiconductor substrate 1. First impurity diffusion layer 6a serving as a source region having impurities of a first conductivity type implanted therein is provided in the main surface of semiconductor substrate 1. First interlayer insulating film 2a is formed on semiconductor substrate 1. Gate electrode 3 (word line 25) having an upper surface substantially parallel to the surface of semiconductor substrate 1 is provided on first interlayer insulating film 2a. Second interlayer insulating film 2b is provided on first interlayer insulating film 2a so as to cover gate electrode 3. Contact hole 19 for exposing a part of the surface of first impurity diffusion layer 6a is provided so as to penetrate through first interlayer insulating film 2a, gate electrode 3, and second interlayer insulating film 2b. A sidewall surface of contact hole 19 is covered with gate insulating film 4. The DRAM includes silicon thin film 5 provided in contact with first impurity diffusion layer 6a so as to cover continuously the inner wall surface of contact hole 19 with gate insulating film 4 interposed therebetween, and having a recessed portion having its bottom portion positioned at or lower than the lower surface of gate electrode 3 in contact hole 19.

The silicon thin film is divided into three portions of cylindrical channel portion 7 positioned at a portion surrounded by gate electrode 3, source region 6aa positioned on the lower side and drain region 6b positioned on the upper side sandwiching channel portion 7 from opposite sides. The thickness of the silicon thin film in channel portion 7 is equal to or less than the maximum depletion layer width. Drain region 6b is also used as storage node 26.

The DRAM further includes capacitor insulating film 21 provided on substrate 1 so as to cover silicon thin film 5. Cell plate electrode 22 is provided on substrate 1 with capacitor insulating film 21 interposed therebetween so as to cover silicon thin film 5 and fill the recessed portion.

In this embodiment, as described above, source region 6a, gate electrode 3, and drain region 6b serve as bit line 24, word line 25, and storage node 26, respectively.

More specifically, an access transistor, one component of the DRAM cell, is configured of source region 6aa, channel portion 7, drain region 6b, gate electrode 3, and gate insulating film 4. A capacitor serving as another component of the DRAM cell is formed of electrodes shown by reference characters 22 and 6b, and insulating film 21.

The capacitor capacitance, which is one important performance of the DRAM cell, can be improved by making the thickness of second interlayer insulating film 2b larger, that is, by forming deeper contact hole 19.

When the thickness of second interlayer insulting film 2b is $d_2$, the internal diameter of drain region 6b in contact hole 19 is $R_1$, and the thickness of capacitor insulating film 21 is t, a capacitor capacitance Cs is given by the following equation:

$$Cs = \frac{\varepsilon}{t} \times d_2 \times 2\pi \times R_1$$

In the above equation, $\varepsilon$ is a dielectric constant of the gate insulating film. From the standpoint of the intensity level, the value of $R_1$ cannot be increased. Therefore, the capacitor capacitance Cs can be increased by making t smaller or $d_2$ larger.

The above method of manufacturing a cell is quite similar to the manufacturing method of Embodiment 6. However, the former is different from the latter in that the second gate insulating film is used as capacitor insulating film 21. It is preferred that the thickness of capacitor insulating film 21 is made as small as possible. The thickness of capacitor insulating film 21 is preferably 50 to 200 Å. In addition, the second gate electrode of Embodiment 6 is used as cell plate electrode 22 in this embodiment.

Embodiment 13

This embodiment is a modification of Embodiment 12.

In the DRAM of Embodiment 12, that is, the DRAM shown in FIG. 44, cell plate electrode 22 extends in channel portion 7. In such a DRAM, cell plate electrode 22 is usually fixed to the ground potential. Therefore, the transistor characteristic is deteriorated compared to the case where only silicon oxide film 30 exists in channel portion 7 as Embodiment 1. More specifically, an electrode of the ground potential exists near channel portion 7 with very thin capacitor insulating film 21 interposed therebetween, causing the depletion layer capacitance Cd of the channel to increase. As a result, the subthreshold coefficient is made large. Therefore, when this problem is critical and must be solved, a DRAM cell according to Embodiment 13 to be described hereinafter is more advantageous although the number of manufacturing steps increases.

Figure 45:
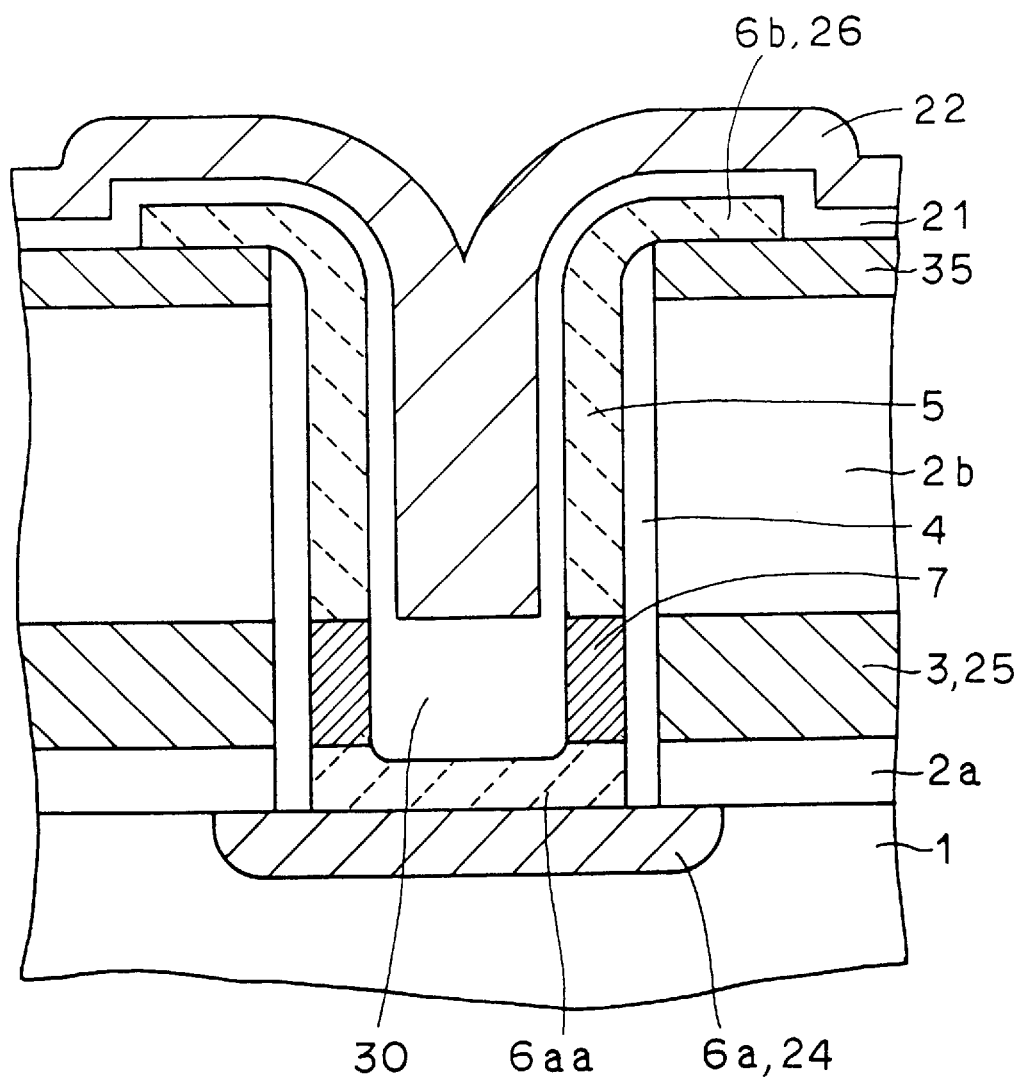
FIG. 45 is a cross sectional view of a DRAM cell according to Embodiment 13.

FIG. 45 is a cross sectional view of the DRAM according to Embodiment 13.

Referring to FIG. 45, silicon oxide film 30 fills the recessed portion of the silicon thin film up to the upper surface of gate electrode 3. Cell plate electrode 22 is provided on silicon oxide film 30 in contact therewith. Because of such a structure, the access transistor obtains transistor characteristics equivalent to those of the structure shown in Embodiment 1.

FIGS. 46 to 49 are partial cross sectional views of the semiconductor device in main steps in order of the manufacturing method of the semiconductor memory device shown in FIG. 45.

Figure 46:
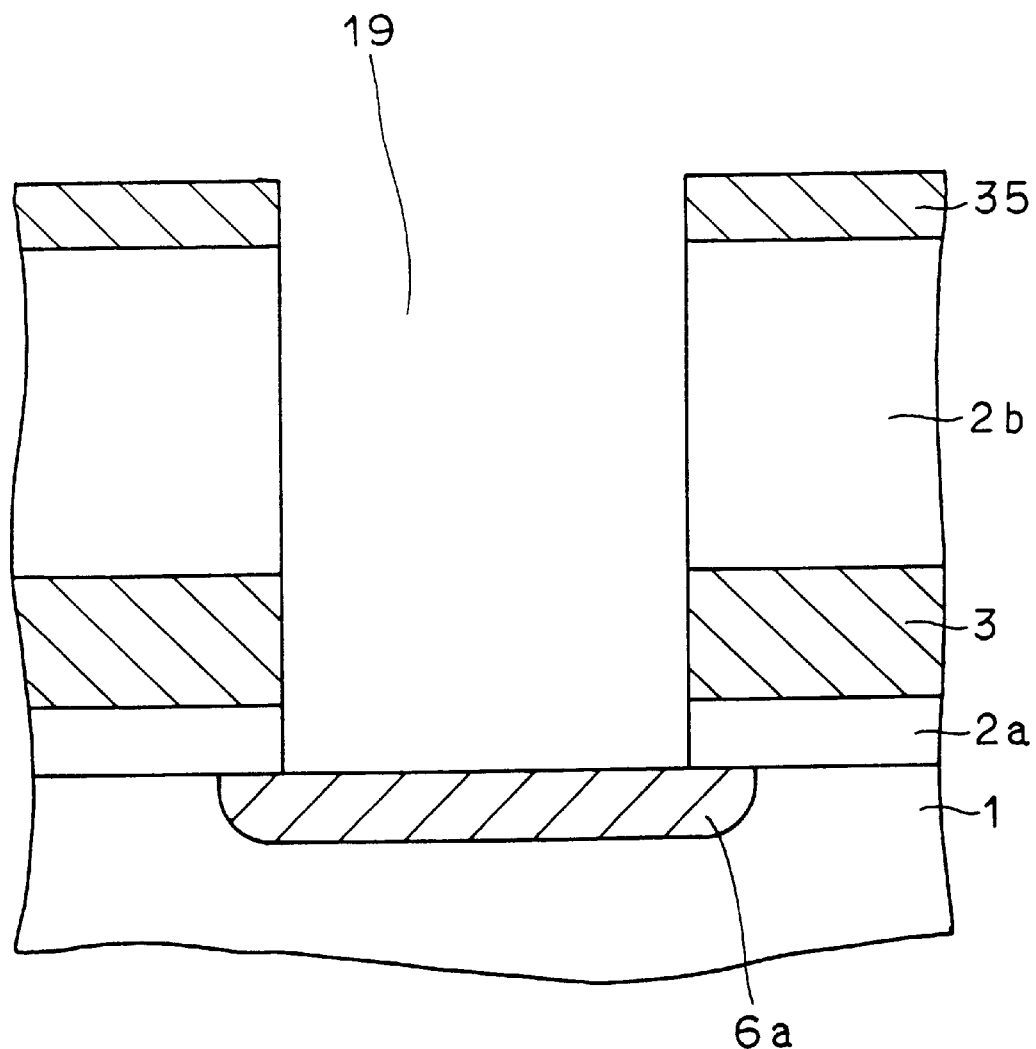
FIGS. 46 to 49 are partial cross sectional views of a semiconductor device in the first to the fourth steps of a method of manufacturing a semiconductor memory device shown in FIG. 45.
Figure 47:
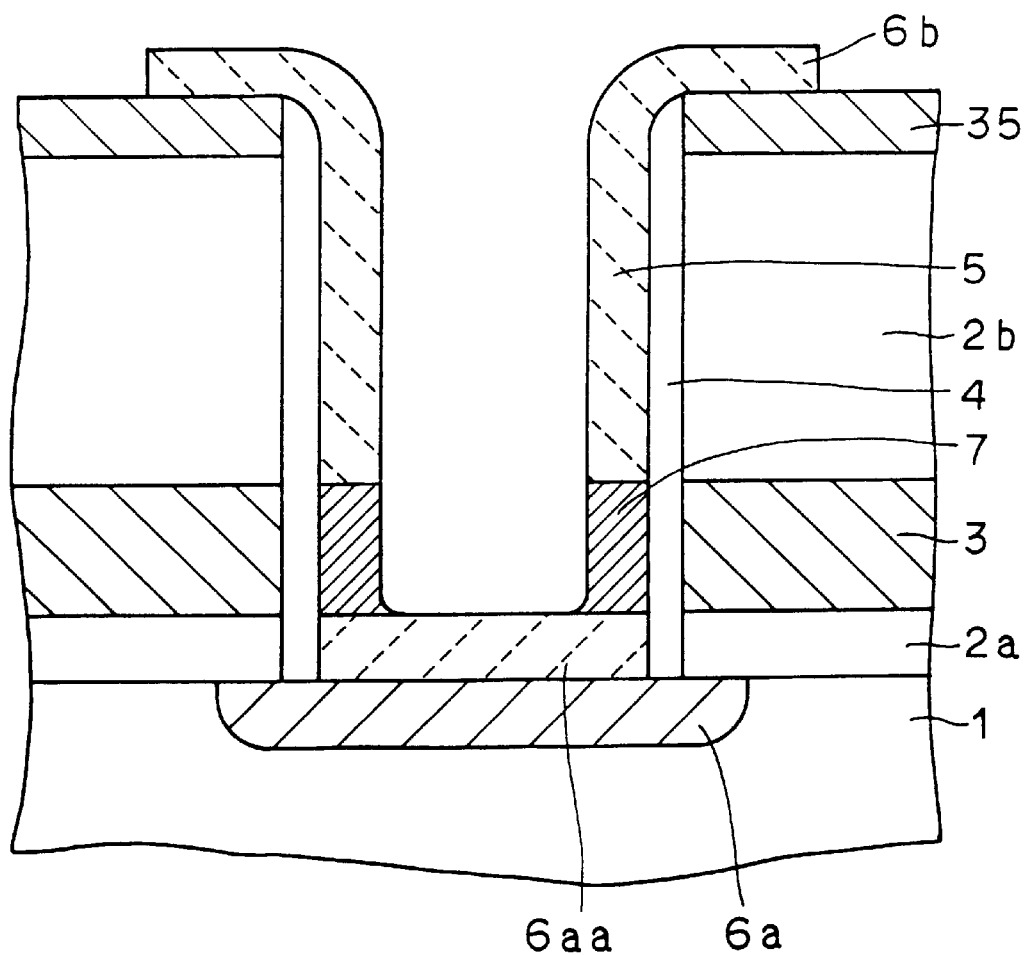

Referring to FIG. 46, impurities of a first conductivity type are implanted into the main surface of substrate 1 to form a first impurity diffusion layer serving as source region 6a. First interlayer insulating film 2a is formed on semiconductor substrate 1. Gate electrode 3 having an upper surface substantially parallel to the surface of semiconductor substrate 1 is formed on first interlayer insulating film 2a. Second interlayer insulating film 2b is formed on first interlayer insulating film 2a so as to cover gate electrode 3. A silicon nitride film 35 of a thickness of 100 to 500 Å is deposited on second interlayer insulating film 2b with a reduced pressure CVD method. Contact hole 19 for exposing a part of the surface of source region 6a is formed so as to penetrate through first interlayer insulating film 2a, gate electrode 3, second interlayer insulating film 2b, and silicon nitride film 35 by using a lithography method and an etching method. The purpose of formation of silicon nitride film 35 will be described later.

Then, a sidewall surface of contact hole 19 is covered with gate insulating film 4. Silicon thin film 5 is formed in contact with source region 6a, so as to cover continuously an inner wall surface of contact hole 19 with gate insulating film 4 interposed therebetween. Silicon thin film 5 is formed so as to have a recessed portion having its bottom portion positioned at or lower than the lower surface of gate electrode 3. Impurity ions are selectively implanted into silicon thin film 5 to form source region 6aa, drain region 6b, and channel portion 7.

Figure 48:
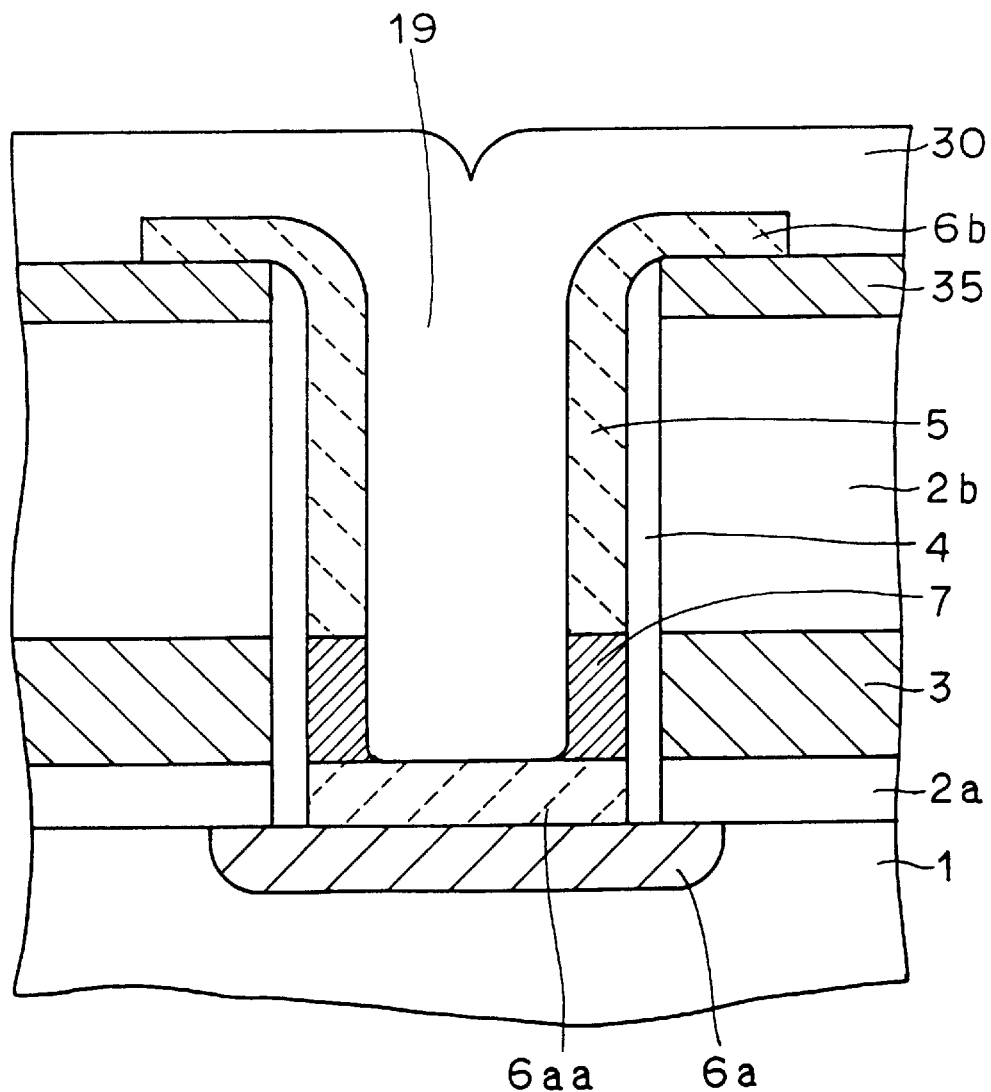

Referring to FIG. 48, silicon oxide film 30 having a thickness (3000 to 5000 Å) large enough to completely fill contact hole 19 is deposited on semiconductor substrate 1 with a CVD method.

Figure 49:
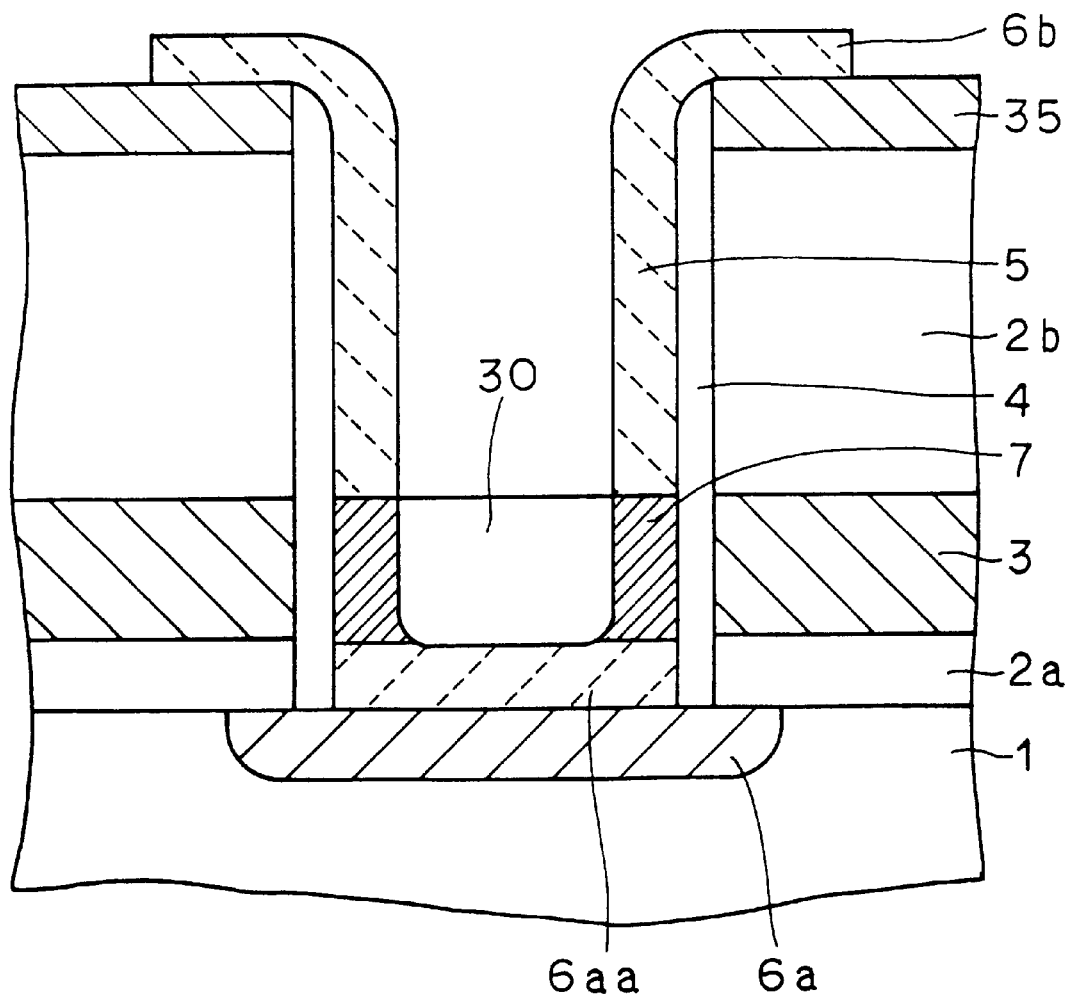

Referring to FIG. 49, silicon oxide film 30 is etched back so as to be left only in contact hole 19 with an anisotropic etching method such as reactive ion etching. Silicon oxide film 30 is etched back until the upper end surface of silicon oxide film 30 is positioned at the upper surface of gate electrode 3. In this step of etching back, presence of silicon nitride film 35 prevents second interlayer insulating film 2b from being etched.

When the surface of silicon oxide film 30 is much higher than the upper surface of gate electrode 3, the capacitor area is decreased, which in turn lowers the capacitor capacitance. Therefore, it is desired that the surface of silicon oxide film 30 is flush with the upper end of channel portion 7.

Referring to FIG. 45, silicon oxide film 21 serving as a capacitor insulating film is deposited 50 to 200 Å. Then, polysilicon 22 into which phosphorus is doped is deposited approximately 500 to 3000 Å. By patterning polysilicon 22 into cell plate electrode 22, the semiconductor memory device shown in FIG. 45 is completed. It should be noted that polysilicon 22 does not have to fill contact hole 8 completely.

Embodiment 14

Figure 50:
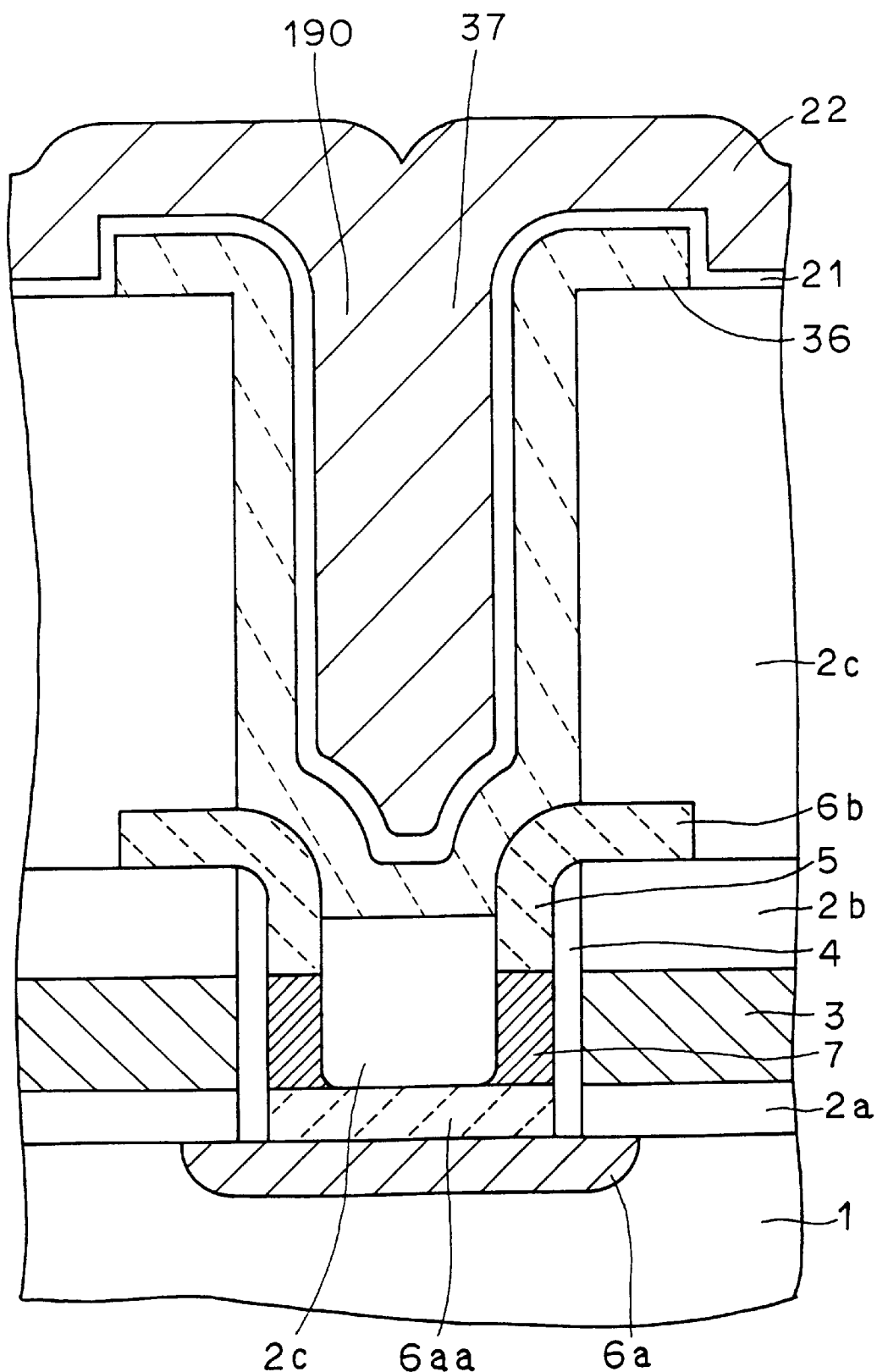
FIG. 50 is a cross sectional view of a DRAM cell according to Embodiment 14.

FIG. 50 is a cross sectional view of a DRAM cell according to Embodiment 14. This embodiment is an improvement of the DRAM cell shown in FIG. 45. In the DRAM cell shown in FIG. 45, second interlayer insulating film 2b must be made large in thickness, and contact hole 8 must be made deep in order to increase the capacitor capacitance Cs. However, since drain portion 6b of the access transistor is formed with an oblique rotational implantation method, the deeper contact hole 8, the more difficult it is to determine the lower end of drain portion 6b. In such a case, the DRAM cell according to this embodiment is advantageous.

Referring to FIG. 50, a third interlayer insulating film 2c is formed on semiconductor substrate 1 so as to fill the recessed portion of silicon thin film 5. A second contact hole 190 is provided in third interlayer insulating film 2c for exposing a part of the surface of drain portion 6b. A storage node 36 is provided on semiconductor substrate 1 in contact with drain portion 6b and covering an inner wall surface of second contact hole 190. Capacitor insulating film 21 is provided on semiconductor substrate 1 so as to cover the surface of storage node 36. Cell plate electrode 22 is provided on semiconductor substrate 1 so as to oppose storage node 36 with capacitor insulating film 21 interposed therebetween and to fill second contact hole 190.

It is preferred that the thickness of third interlayer insulating film 2c is 0.1 to 2 µm. The thickness of the phosphorus doped polysilicon film for formation of storage node 36 is preferably 500 to 2000 Å.

Figure 51:
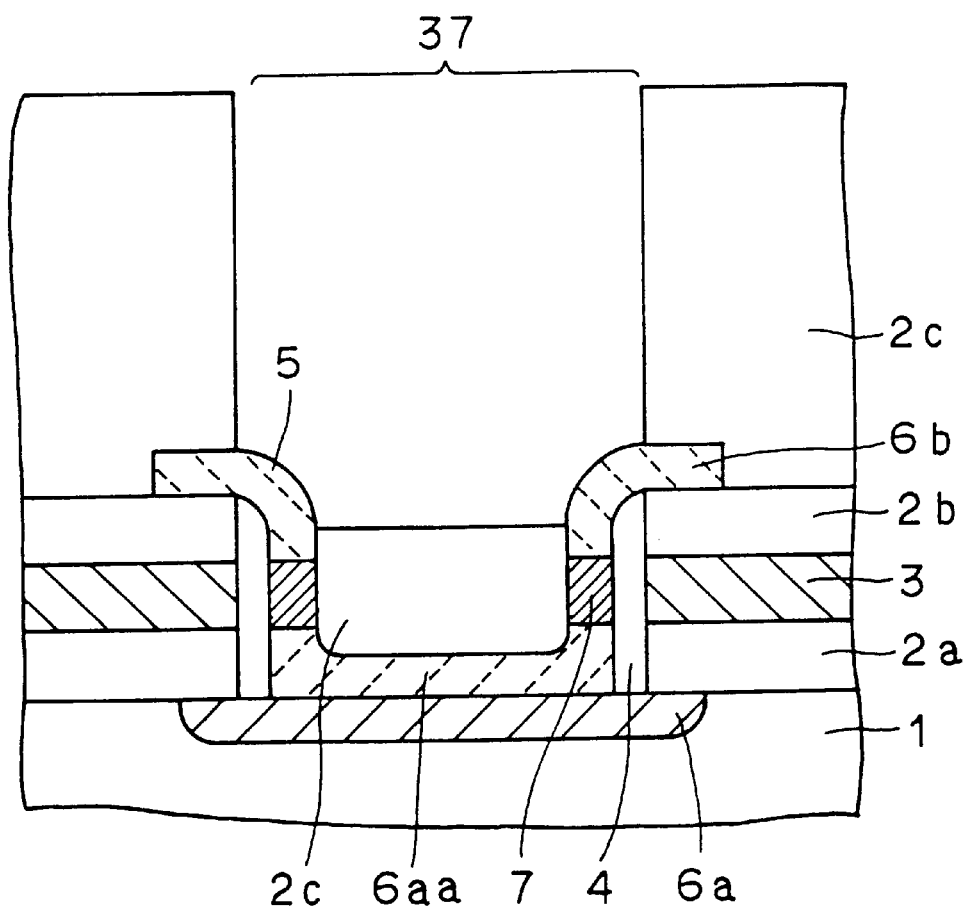
FIGS. 51 and 52 are partial cross sectional views of a semiconductor device in the first and the second steps of a main parts of a method of manufacturing the DRAM cell shown in FIG. 50.
Figure 52:
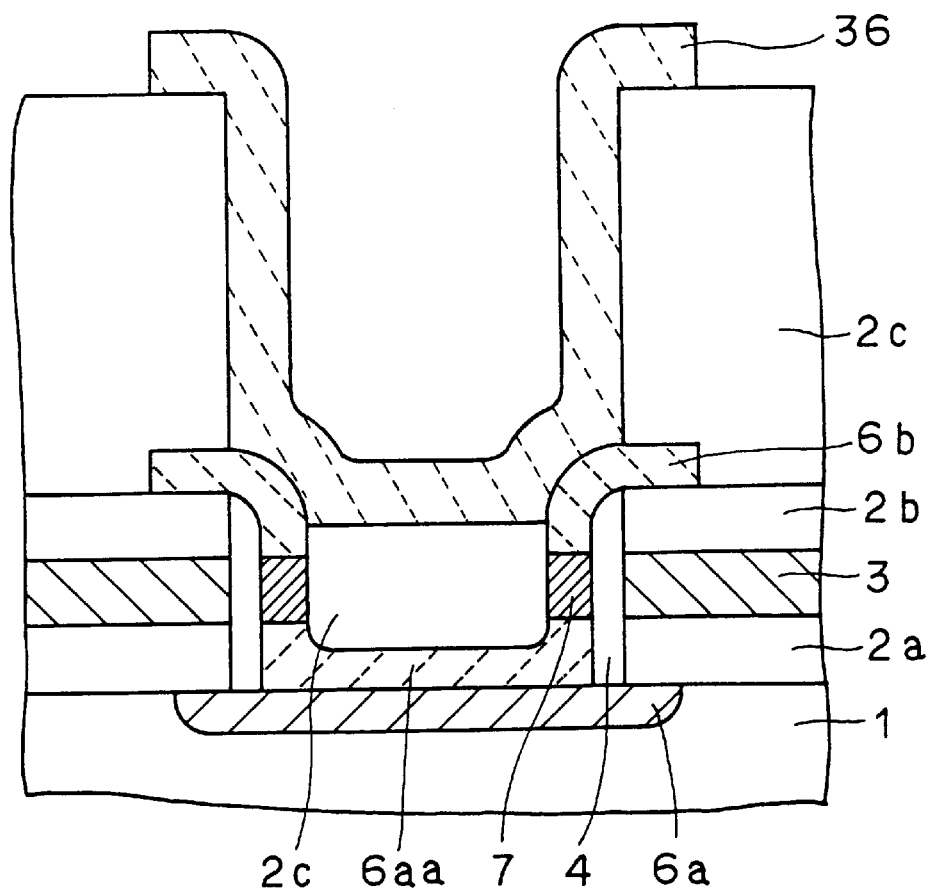

FIGS. 51 and 52 are partial cross sectional views of a semiconductor device in respective main steps of a method of manufacturing the DRAM cell shown in FIG. 50.

Referring to FIG. 51, after formation of silicon thin film 5 according to Embodiment 5, third interlayer insulating film 2c is formed on semiconductor substrate 1 so as to cover silicon thin film 5. Third interlayer insulating film 2c is deposited approximately 1.0 to 2.0 µm on semiconductor substrate 1 with a CVD method. A second contact hole 37 for exposing a part of the surface of drain portion 6b is formed in third interlayer insulating film 2c with a lithography method and an etching method. At this time, the etching time is adjusted so as to leave third interlayer insulating film 2c in the transistor.

Since the capacitor capacitance of the DRAM cell is determined by the thickness of third interlayer insulating film 2c, it is preferred that the third interlayer insulating film is deposited as thick as possible.

Referring to FIG. 52, storage node 36 is formed on semiconductor substrate 1 in contact with drain portion 6b and covering an inner wall surface of second contact hole 37. Storage node 36 is formed by depositing a polysilicon film into which phosphorus is doped with a CVD method, and then patterning the polysilicon film with a lithography method and an etching method.

Returning to FIG. 50, a silicon oxide film serving as capacitor insulating film 21 is deposited 50 to 200 Å with a CVD method. Then a polysilicon film to which phosphorus is doped serving as cell plate electrode 22 is deposited approximately 1000 to 3000 Å on semiconductor substrate 1 with a CVD method so as to oppose storage node 36 with capacitor insulating film 21 interposed therebetween and to fill second contact hole 37. By etching the polysilicon film into a predetermined shape, cell plate electrode 22 is formed.

Embodiment 15

Figures 53A, 53B:
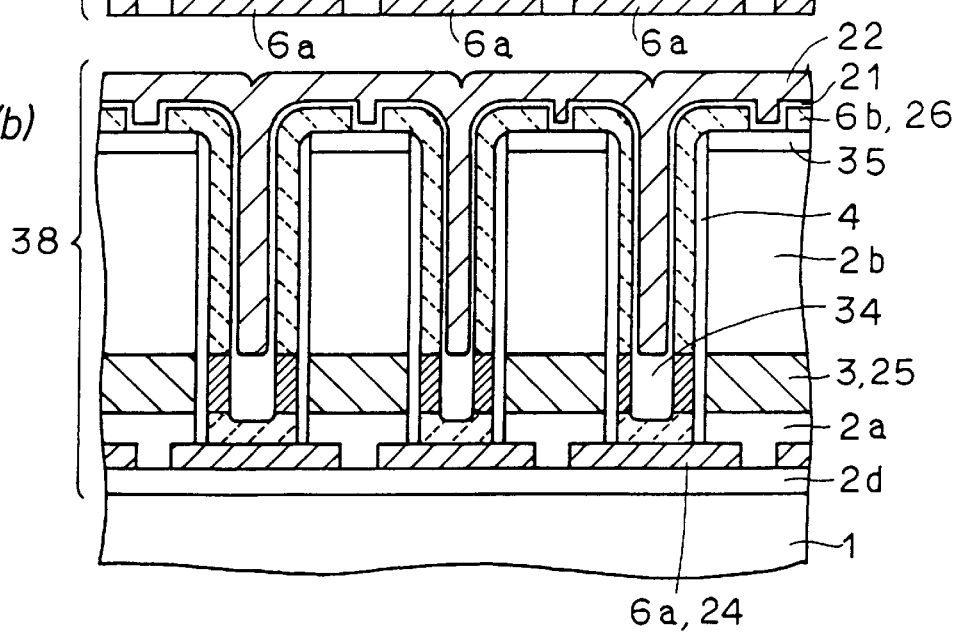
FIGS. 53(a) and 53(b) are cross sectional views of a DRAM cell according to Embodiment 15.

This embodiment relates to a device improved so as to further enhance an integration density of a DRAM cell. FIG. 53 is a cross sectional view of a DRAM cell according to this embodiment. In FIG. 53, a plurality of DRAM cells shown in FIG. 45 arranged in the lateral direction are stacked in two layers.

In the semiconductor memory device according to this embodiment, the DRAM cell shown in FIG. 45 is not used as it is. The semiconductor memory device is characterized in that source region 6a is formed of N type polysilicon. Formation of source region 6a of polysilicon makes it possible to stack the DRAM cells in multi-layers.

Source region 6a is formed as follows. A silicon oxide film 2d is deposited on silicon substrate 1. A polysilicon film into which phosphorus is doped is deposited on silicon oxide film 2d with a CVD method. By patterning the polysilicon film, a region (6a, 24) serving as both a bit line and the source of the transistor is formed.

The DRAM cells are stacked in multi-layers by repeating the steps of manufacturing the DRAM cell a plurality of times. However, the multi-layered structure may be formed by affixing a plurality of one layer cell arrays.

Embodiment 16

Figure 54:
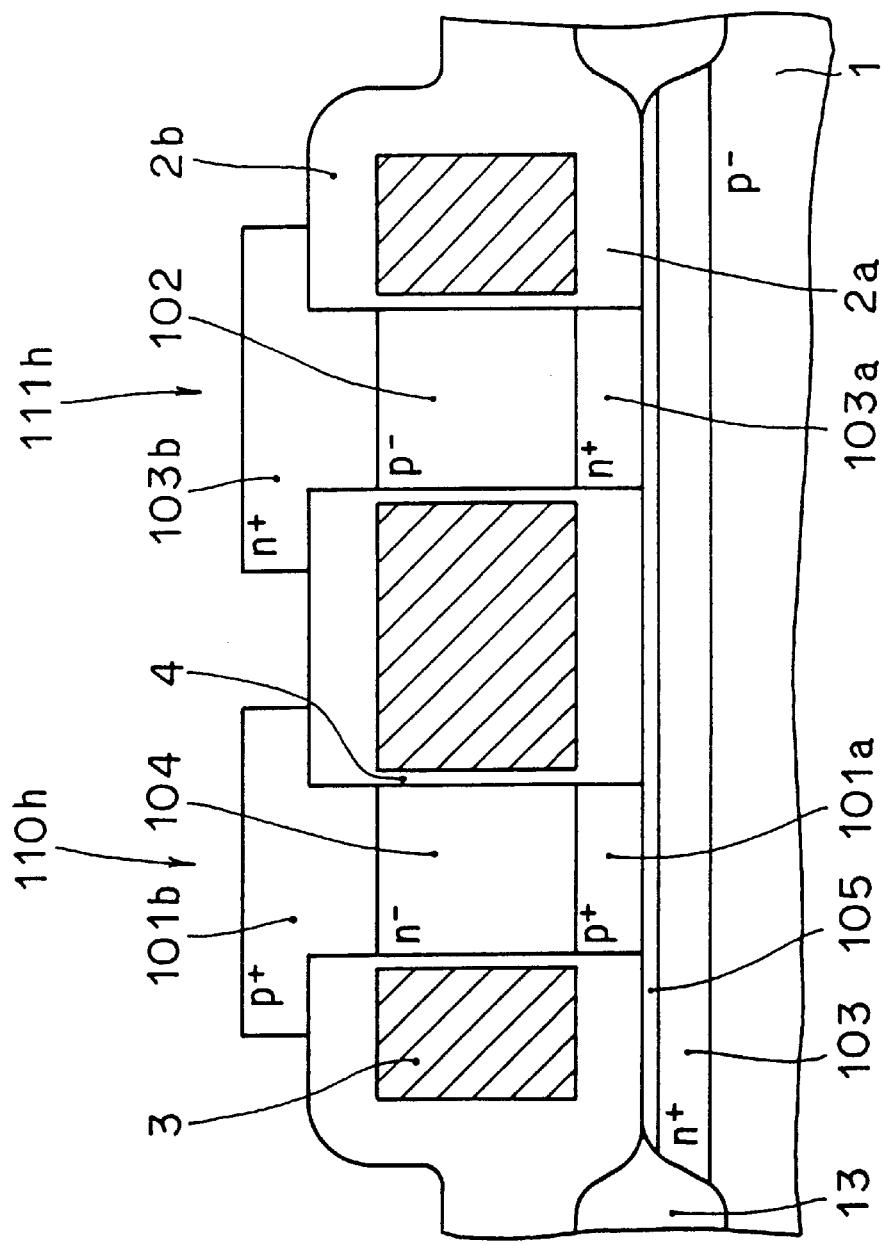
FIG. 54 is a cross sectional view of an inverter circuit according to Embodiment 16.
Figure 55:
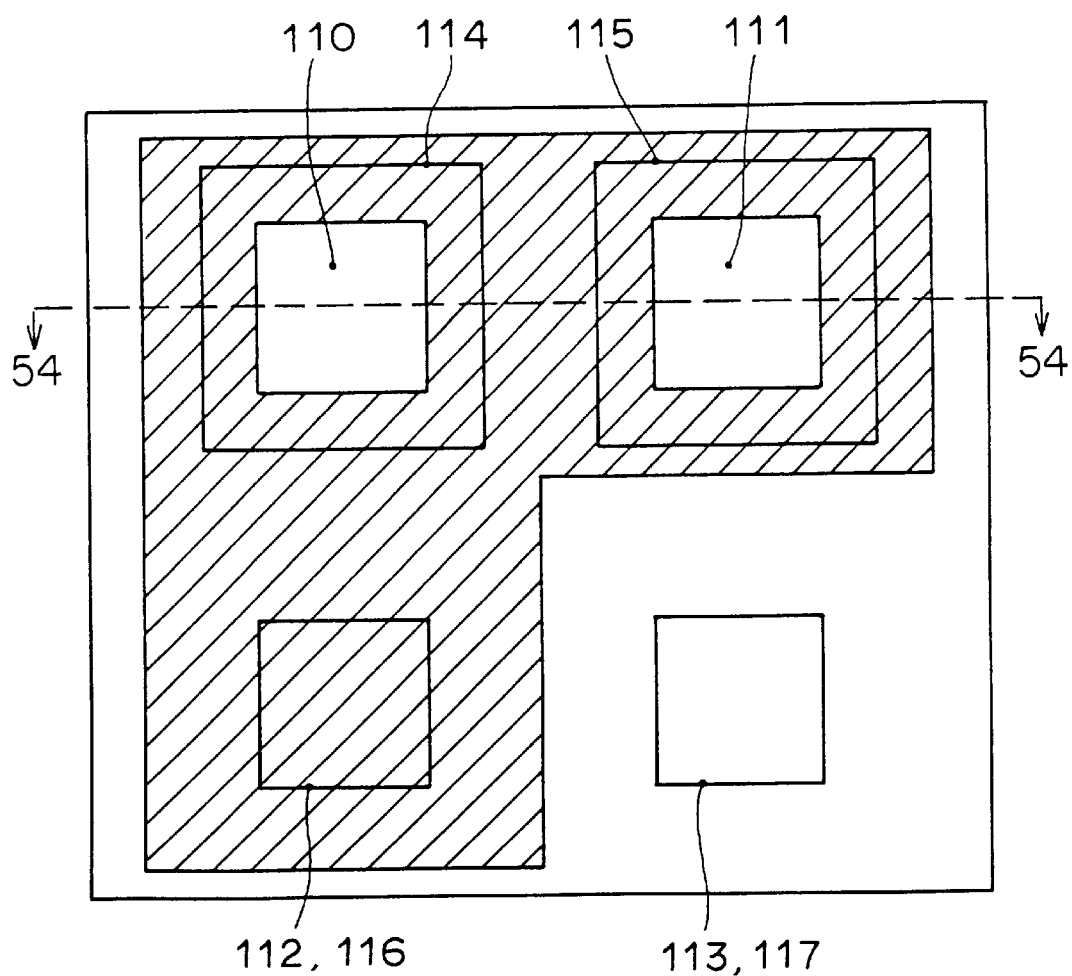
FIG. 55 is a plan view of the inverter circuit according to Embodiment 16.
Figure 56:
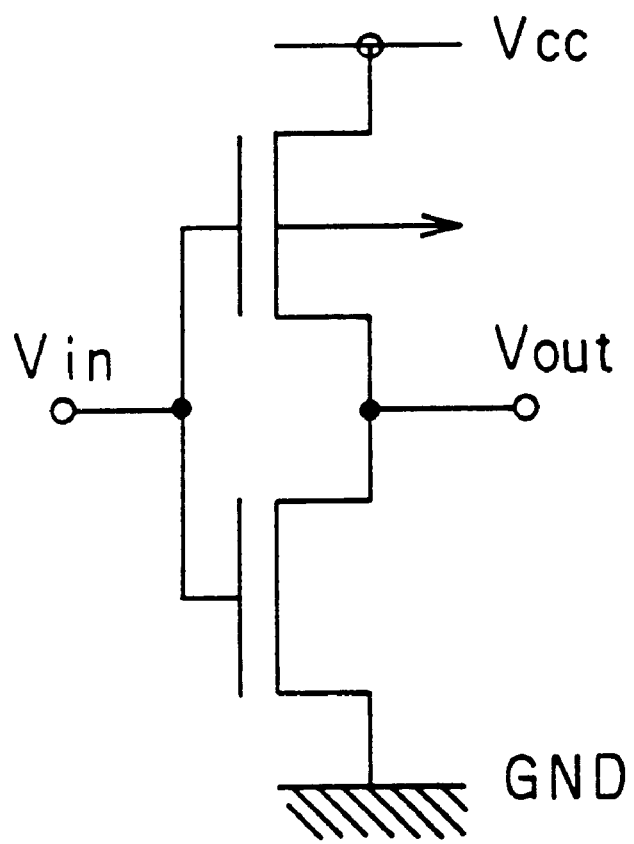
FIG. 56 is an equivalent circuit diagram of the inverter circuit according to Embodiment 16.

This embodiment relates to an inverter circuit using two contact hole transistors. FIG. 54 is a cross sectional view of an inverter circuit according to Embodiment 16. FIG. 55 is a plan view thereof. FIG. 54 is a cross sectional view taken along the line I—I in FIG. 55. FIG. 56 is an equivalent circuit diagram of a CMOS type inverter circuit.

Referring to FIG. 54, the CMOS type inverter circuit according to this embodiment includes p⁻ type semiconductor substrate 1. An n⁺ impurity diffusion layer 103 is formed in the main surface of semiconductor substrate 1. A titanium silicide film 105 is formed on semiconductor substrate 1. First interlayer insulating film 2a is formed on semiconductor substrate 1 so as to cover titanium silicide film 105. Gate electrode 3 having an upper surface and a lower surface is provided on first interlayer insulating film 2a. Second interlayer insulating film 2b is provided on first interlayer insulating film 2a so as to cover gate electrode 3. A first contact hole 110h for exposing one part of the surface of titanium silicide film 105 is provided so as to penetrate through first interlayer insulating film 2a, gate electrode 3, and second interlayer insulating film 2b. A second contact hole 111h for exposing another part of the surface of titanium silicide film 105 is provided so as to penetrate through first interlayer insulating film 2a, gate electrode 3, and second interlayer insulating film 2b. An inner wall surface of first contact hole 110h is covered with gate insulating film 4. An inner wall surface of second contact hole 111h is covered with gate insulating film 4. A first p$^+$ semiconductor layer 101a serving as one source/drain region is deposited on the surface of titanium silicide film 105 in contact therewith up to the lower surface of gate electrode 3 in first contact hole 110h. An n$^-$ semiconductor layer 104 is deposited on the surface of first p$^+$ semiconductor layer 101a in contact therewith up to the upper surface of gate electrode 3 in first contact hole 110h. A second p$^+$ semiconductor layer 101b serving as the other source/drain region is provided on n$^-$ semiconductor layer 104 in contact therewith.

A first n$^+$ semiconductor layer 103a serving as one source/drain region is deposited on the surface of titanium silicide film 105 in contact therewith up to the lower surface of gate electrode 3 in second contact hole 111h. A p$^-$ semiconductor layer 102 is deposited on the surface of first n$^+$ semiconductor layer 103a in contact therewith up to the upper surface of gate electrode 3 in second contact hole 111h. A second n$^+$ semiconductor layer 103b serving as the other source/drain region is provided on p$^-$ semiconductor layer 102 in contact therewith. In FIG. 55, a portion denoted by reference characters 113, 117 is a contact portion.

Referring to FIGS. 56 and 54, operations of the CMOS inverter will be described. An input signal $V_{IN}$ enters the gates of both transistors. When $V_{IN}$ is high in potential, the nMOS is in an ON state, the pMOS is in an OFF state, and $V_{OUT}$ is low in potential ("0"). Conversely, when $V_{IN}$ is low in potential, the nMOS is in an OFF state, the pMOS is in an ON state, and $V_{OUT}$ is high in potential.

Figure 57:
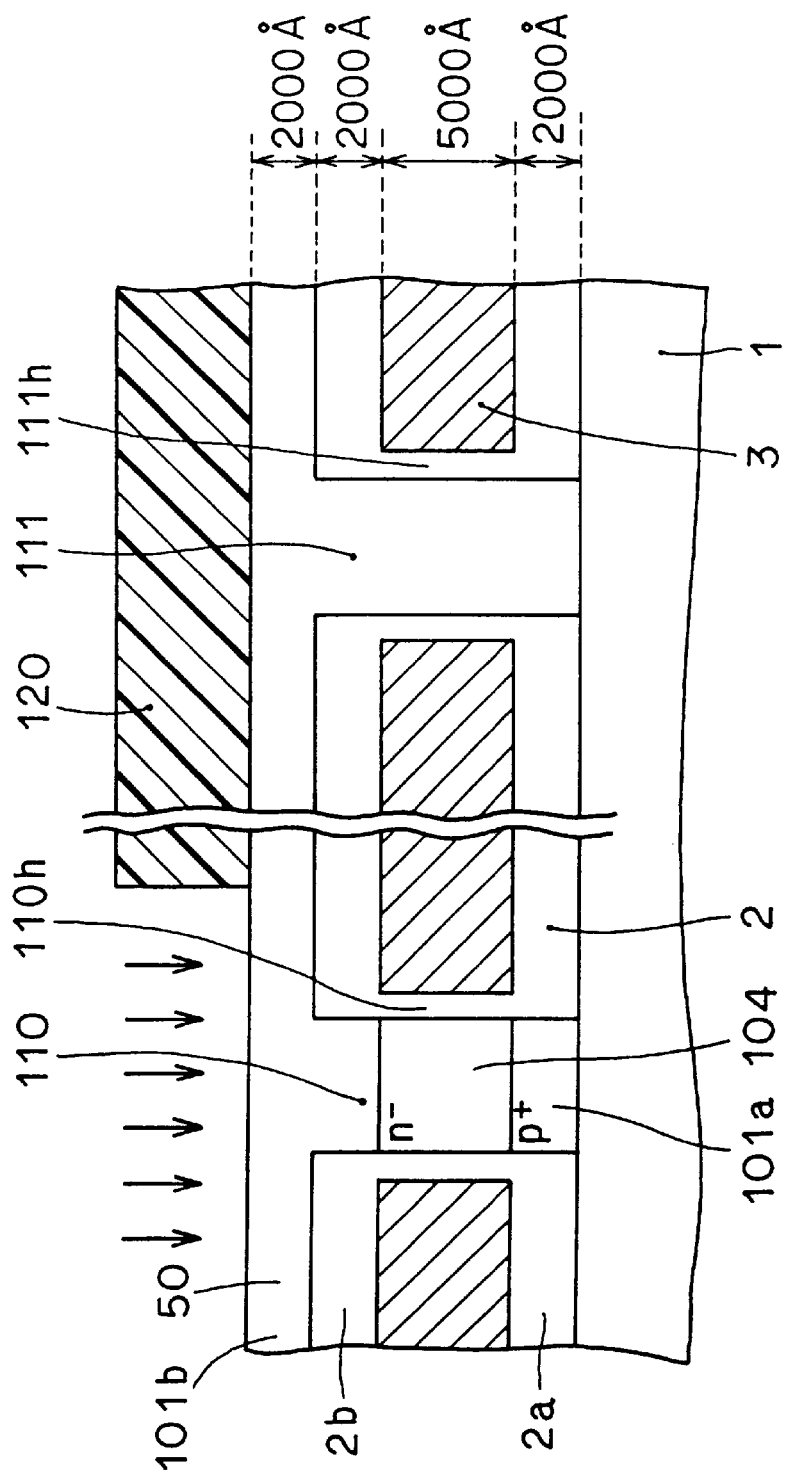
FIGS. 57 and 58 are partial cross sectional views of a semiconductor device in the first and the second steps of a method of manufacturing the inverter circuit shown in FIG. 54.
Figure 58:
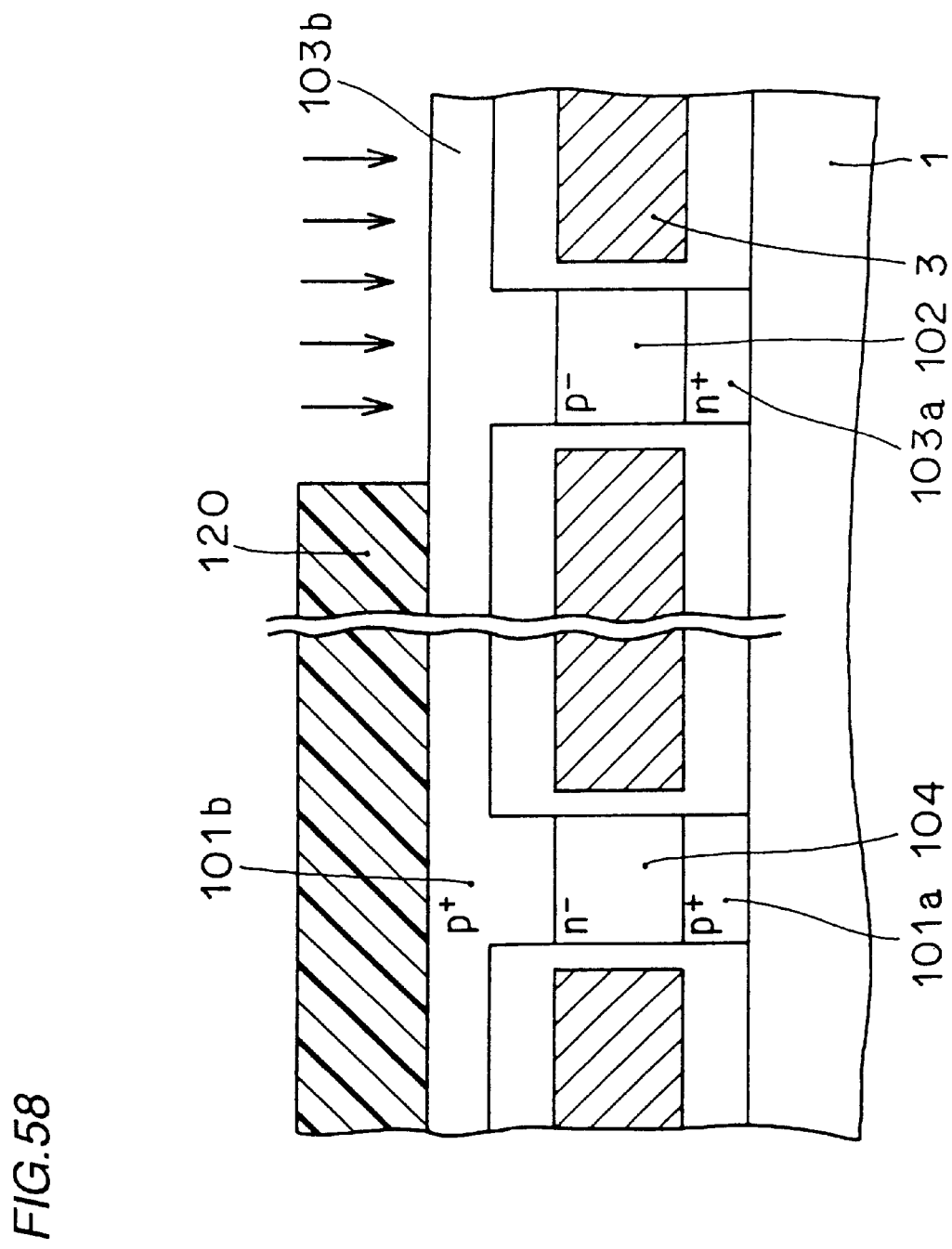

FIGS. 57 and 58 are partial sectional views of a semiconductor device in respective steps of main portions of a method of manufacturing the inverter circuit shown in FIG. 54.

Referring to FIG. 57, first interlayer insulating film 2a is formed on semiconductor substrate 1. Gate electrode 3 having an upper surface and a lower surface is formed on first interlayer insulating film 2a. Second interlayer insulating film 2b is formed so as to cover gate electrode 3. First contact hole 110h for exposing one part of semiconductor substrate 1 is formed so as to penetrate through first interlayer insulating film 2a, gate electrode 3, and second interlayer insulating film 2b.

Second contact hole 111h for exposing another part of the surface of semiconductor substrate 1 is formed so as to penetrate through first interlayer insulating film 2a, gate electrode 3, and second interlayer insulating film 2b. An inner wall surface of first contact hole 110h is covered with gate insulating film 4. An inner wall surface of second contact hole 111h is covered with gate insulating film 4.

Amorphous silicon is deposited on semiconductor substrate 1 so as to fill first contact hole 110h and second contact hole 111h, to form a silicon plug 50. A portion on which an N-channel transistor is to be formed is covered with resist 120, and a portion on which a P-channel transistor is to be formed is exposed. By implanting impurity ions under the conditions shown in Table 1 with resist 120 used as a mask, first p$^+$ semiconductor layer 101a, n$^-$ semiconductor layer 104, and second p$^+$ semiconductor layer 101b are formed.

TABLE 1

| | | Implanted Impurity | Implantation Voltage | Implantation Depth | Implantation Amount |
|---|---|---|---|---|---|
| Pch | p$^+$ source (lower) | boron | 550 keV | 11000 Å | 1 × 10$^{15}$/cm$^2$ |
| | n$^-$ | phosphorous | 500 keV | 6200 Å | 1 × 10$^{12}$/cm$^2$ |
| | p$^+$ drain (upper) | boron | 65 keV | 2000 Å | 1 × 10$^{15}$/cm$^2$ |
| Nch | n$^+$ source (lower) | phosphorous | 1 MeV | 11000 Å | 1 × 10$^{15}$/cm$^2$ |
| | p$^-$ | boron | 250 keV | 6200 Å | 1 × 10$^{12}$/cm$^2$ |
| | n$^+$ drain (upper) | phosphorous | 160 keV | 2000 Å | 1 × 10$^{15}$/cm$^2$ |

According to this embodiment, although impurity ions are also introduced into second interlayer insulating film 2b, they do not affect operations of the transistors. Impurity is also introduced into gate electrode 3. However, since gate electrode 3 already includes impurity of a high concentration, introduction of impurities will not cause any problems.

Referring to FIG. 58, a portion on which the P-channel transistor is to be formed is covered with resist 120. A portion on which the N-channel transistor is 2 to be formed is exposed. By implanting impurity ions under the conditions shown in Table 1 with resist 120 used as a mask, first n$^+$ semiconductor layer 103a, p$^-$ semiconductor layer 102, and second n$^+$ semiconductor layer 103b are sequentially formed.

By using the above-described method, it is possible to form the P-channel contact hole transistor and the N-channel contact hole transistor in a fewer steps. It should be noted that either the P-channel transistor or the N-channel transistor may be formed first. The amounts of implantation are standards. By changing amounts of impurity in n$^-$, p$^-$ regions, it is possible to change the threshold of the contact hole transistor.

Figure 59:
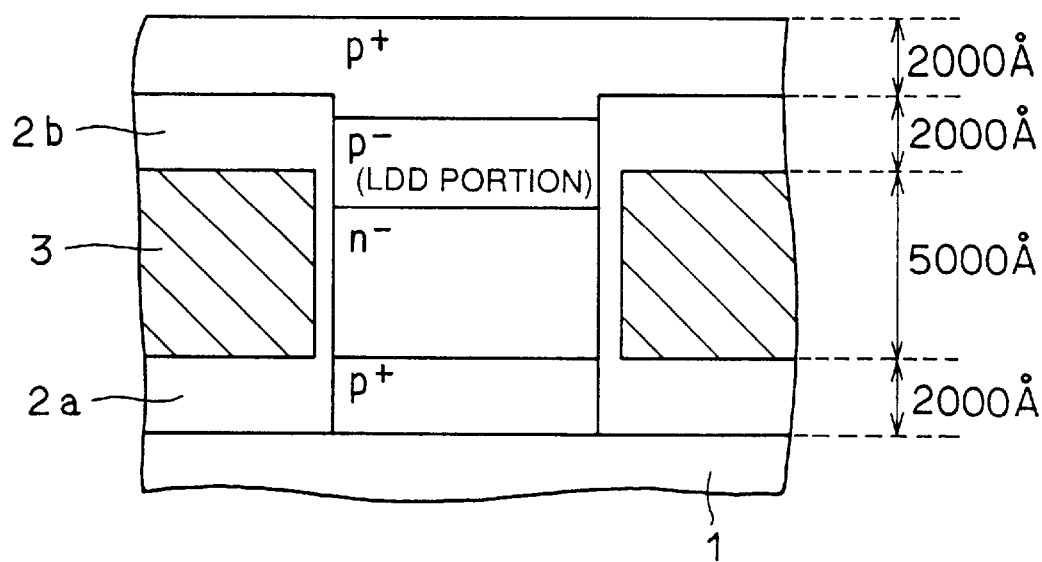
FIG. 59 is a cross sectional view of a semiconductor device according to a modification of Embodiment 16.

If impurity ions are implanted under the conditions shown in Table 2, it is also possible to form a contact hole transistor of an LDD structure shown in FIG. 59.

TABLE 2

| | Implanted Impurity | Implantation Voltage | Implantation Depth | Implantation Amount |
|---|---|---|---|---|
| p$^+$ source (lower) | boron | 550 keV | 11000 Å | 1 × 10$^{15}$/cm$^2$ |
| n$^-$ | phosphorous | 600 keV | 7200Å | 1 × 10$^{12}$/cm$^2$ |
| p$^+$ LDD portion | boron | 140 keV | 4000Å | 1 × 10$^{13}$/cm$^2$ |
| p$^+$ drain (upper) | boron | 65 MeV | 2000Å | 1 × 10$^{15}$/cm$^2$ |

Figure 60:
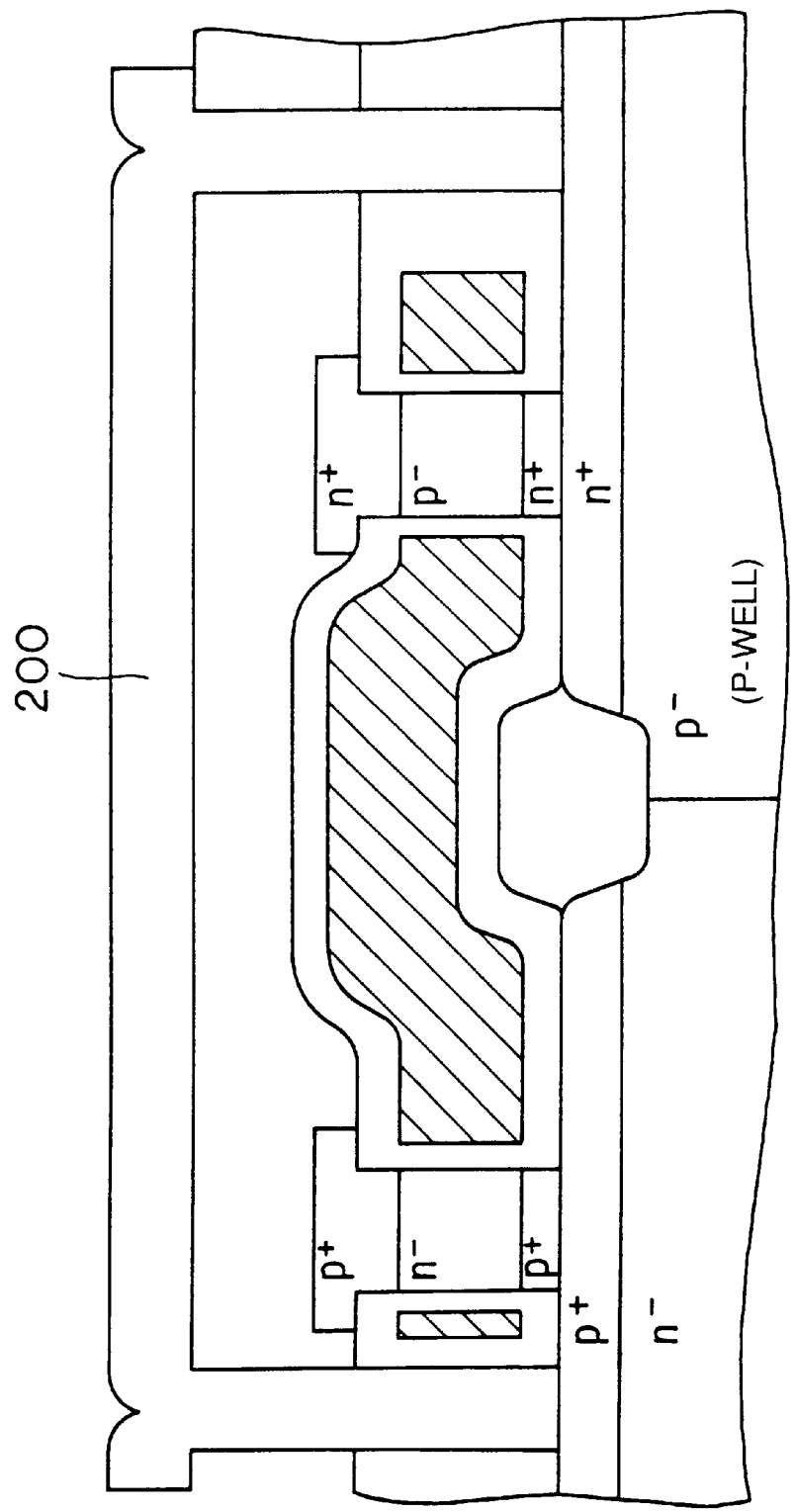
FIG. 60 is a diagram showing another modification of the inverter circuit according to Embodiment 16.
Figure 61:
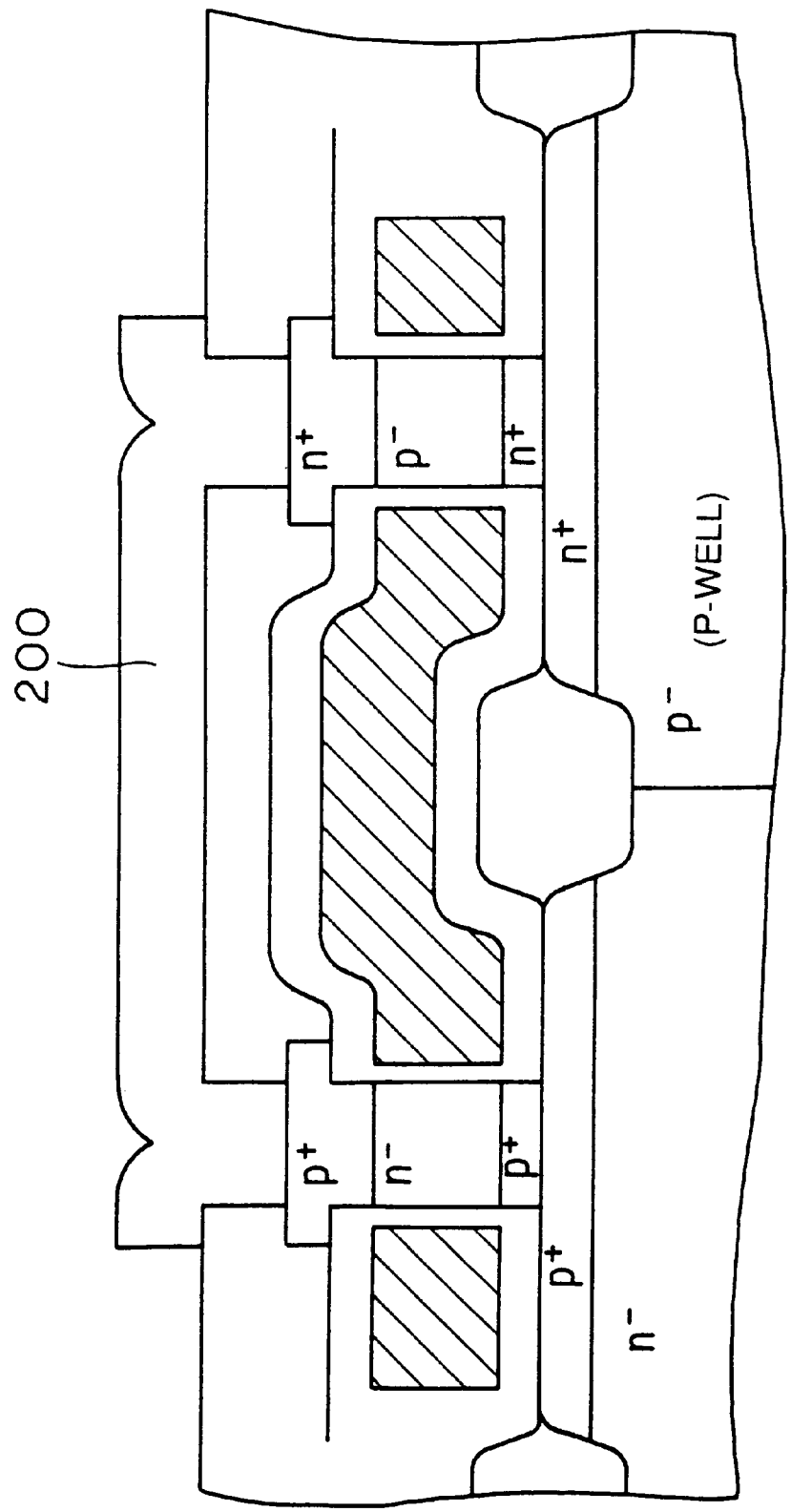
FIG. 61 is a cross sectional view of a still another modification of the inverter circuit according to Embodiment 16.

In Embodiment 16, it is necessary to connect drains of P-channel transistor 104 and N-channel transistor 102 through semiconductor substrate 1. Therefore, titanium silicide is formed in the surface of the substrate, thereby preventing P-N junction. The present invention is not limited to titanium silicide, but other silicide, titanium nitride, metals may be formed. Although the case where drains are connected through the substrate was shown in the above-described embodiment, the present invention is not limited thereto. As shown in FIGS. 60 and 61, drains may be connected through an aluminum interconnection 200.

Figure 62:
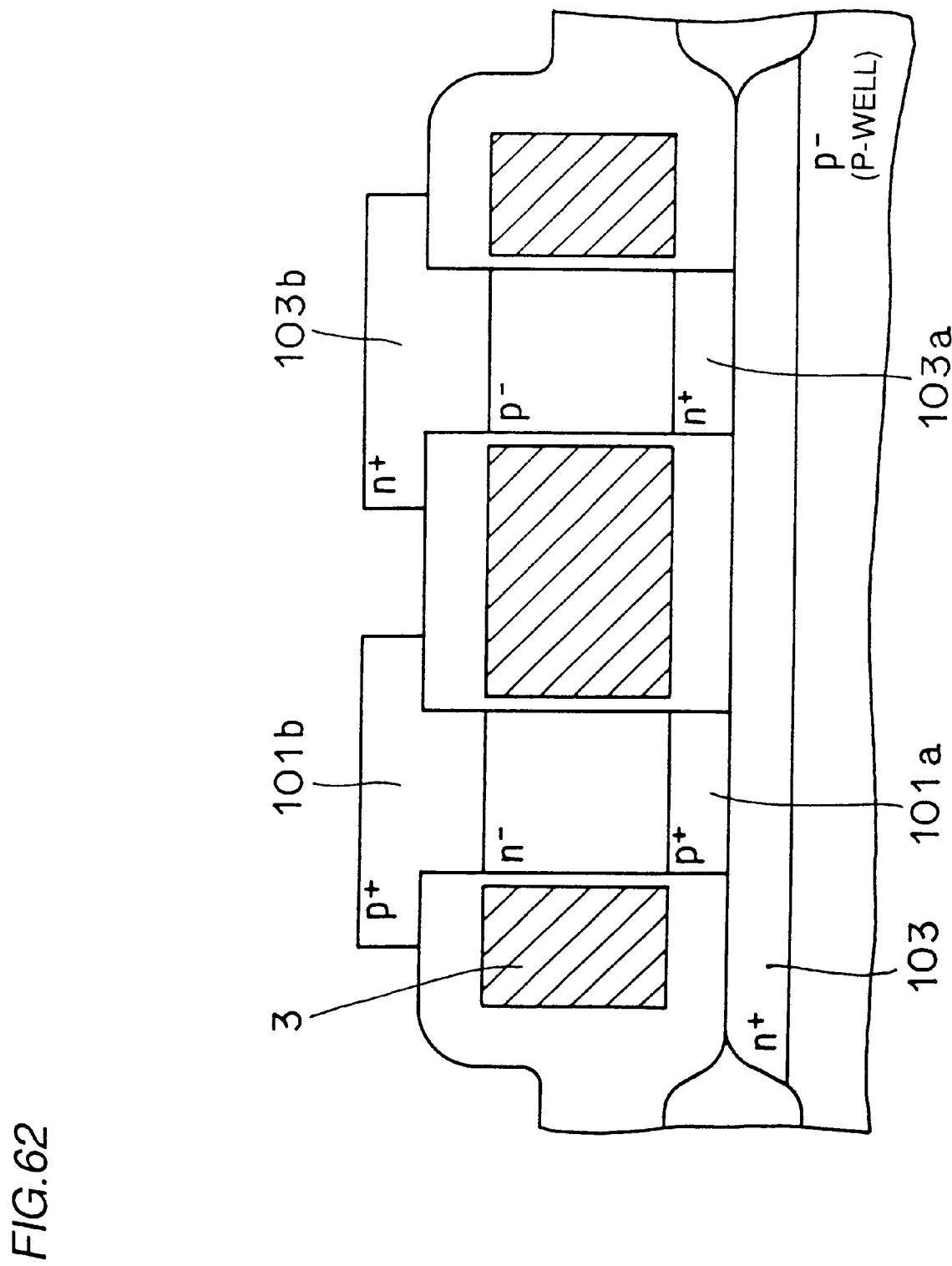
FIG. 62 is a cross sectional view of a device of a further modification of the inverter circuit according to Embodiment 16.

Although the case where titanium silicide is formed in the surface of the substrate was shown in the above embodiment, there is a case where titanium silicide need not be formed in the surface of the semiconductor substrate as shown in FIG. 62. Referring to FIG. 62, a P-N junction is formed between first $p^+$ semiconductor layer 101a and first $n^+$ semiconductor layer 103a. However, the titanium silicide layer is not needed when the power supply voltage is large and the voltage drop (approximately 0.5 to 1.0 V) caused by the P-N junction is not problematic in operation.

Embodiment 17

Figure 63:
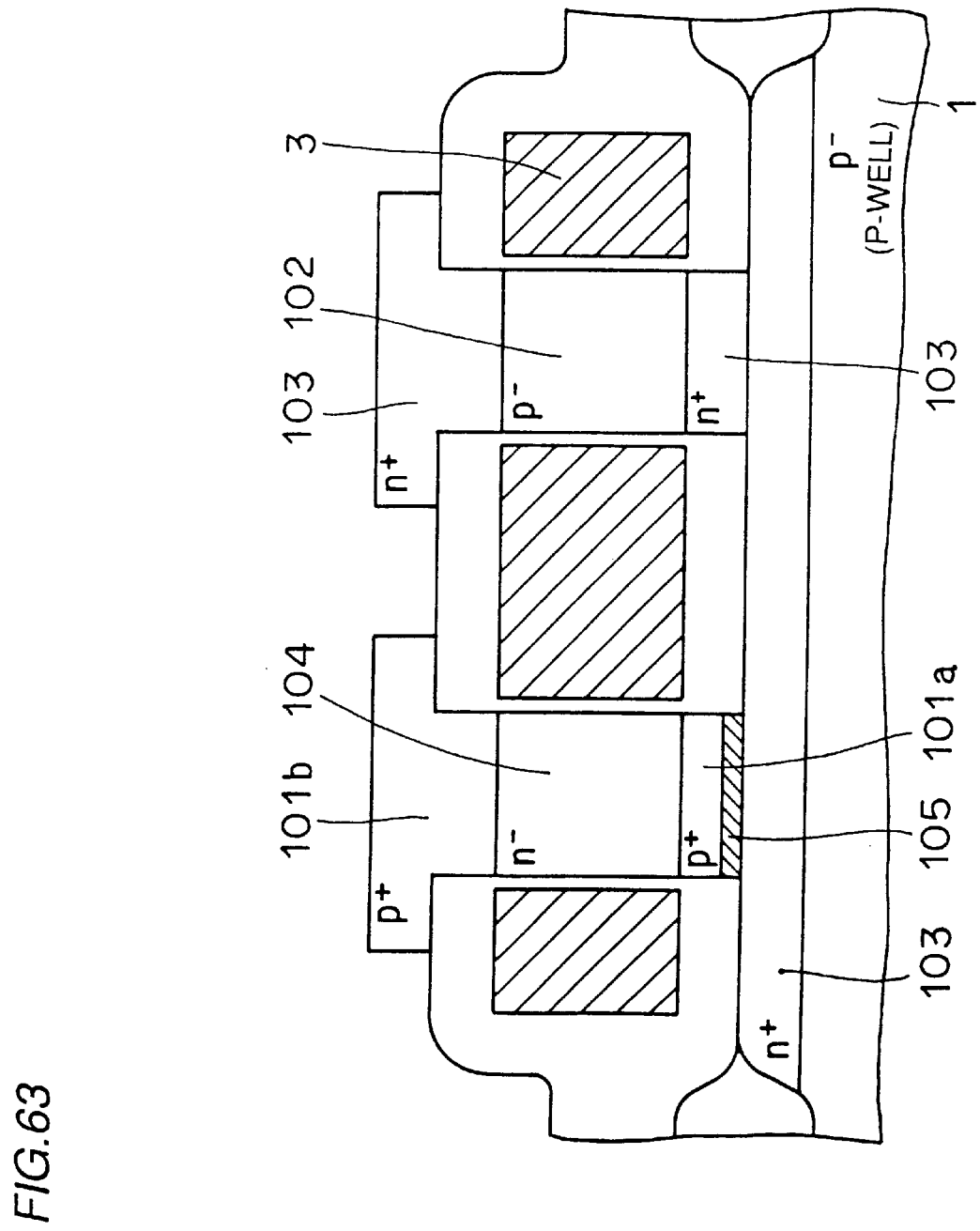
FIG. 63 is a cross sectional view of an inverter circuit according to Embodiment 17.

FIG. 63 is a sectional view of the inverter circuit according to Embodiment 17.

This embodiment is characterized in that silicide 105 is formed between $n^+$ region 103 and first $p^+$ semiconductor layer 101a in order to prevent P-N junction therebetween. When the connection interconnection layer (103) of the substrate is of P-type, silicide is formed on the side of the N-channel transistor.

FIGS. 64 to 67 are sectional views of a semiconductor device in respective steps of main portions of a method of manufacturing the inverter circuit shown in FIG. 63.

Figure 64:
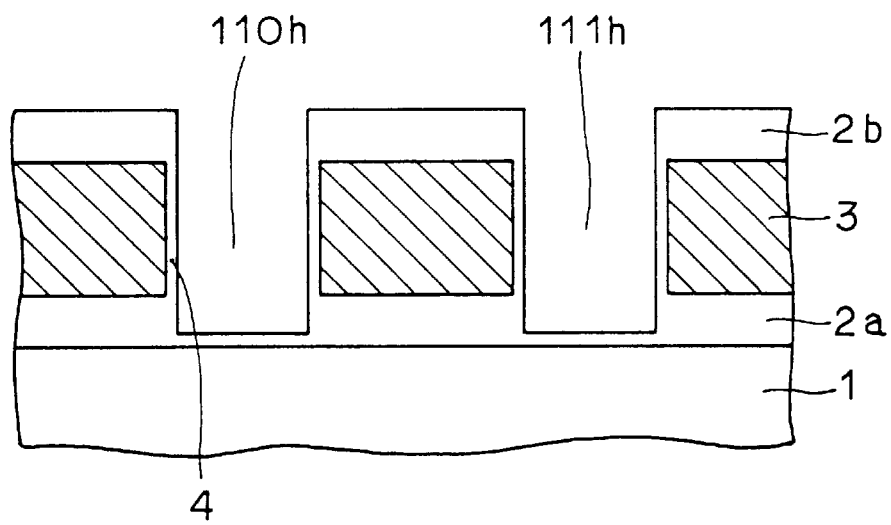
FIGS. 64 to 67 are cross sectional views of a semiconductor device in the first to the fourth steps of a method of manufacturing the inverter circuit shown in FIG. 63.

Referring to FIG. 64, first interlayer insulating film 2a, gate electrode 3, and second interlayer insulating film 2b are sequentially formed on $n^+$ semiconductor substrate 1. First contact hole 110h for exposing one part of the surface of semiconductor substrate 1 is formed so as to penetrate through first interlayer insulating film 2a, gate electrode 3, and second interlayer insulating film 2b. Second contact hole 111h for exposing another part of the surface of semiconductor substrate 1 is formed so as to penetrate through first interlayer insulating film 2a, gate electrode 3, and second interlayer insulating film 2b. Inner wall surfaces of first contact hole 110h and second contact hole 111h are covered with gate insulating film 4.

Figure 65:
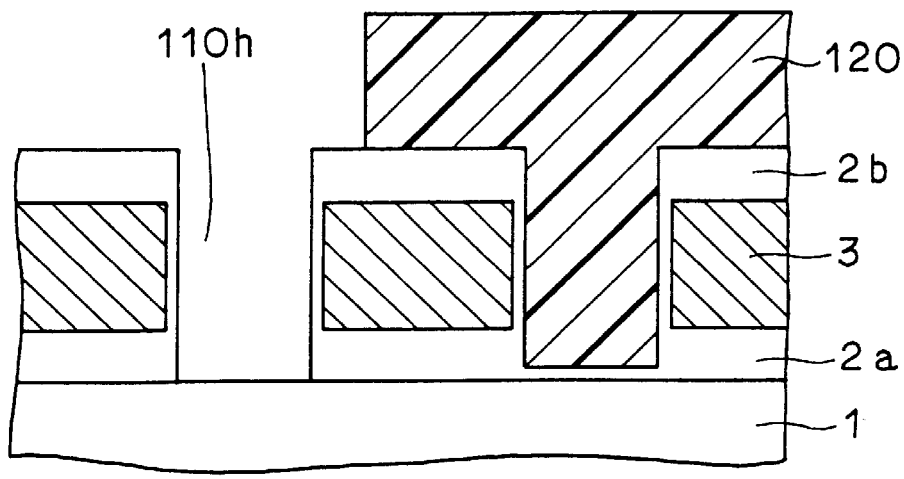

Referring to FIG. 65, second contact hole 111h is covered with resist 120. The bottom portion of first contact hole 110h is etched with a dry etching method to expose the surface of semiconductor substrate 1. Then, resist 120 is removed.

Figure 66:
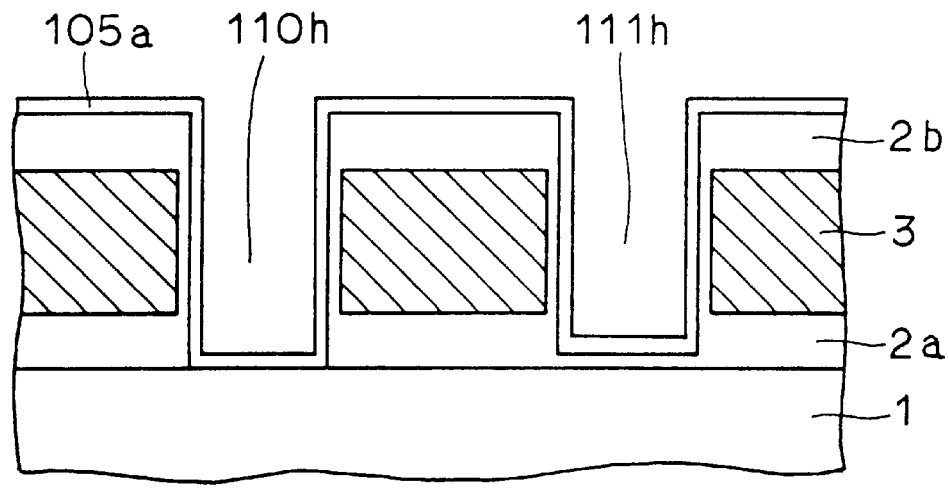

Referring to FIG. 66, with a sputtering method or the like, a titanium film 105a is deposited approximately 500 Å on semiconductor substrate 1 so as to cover inner wall surfaces of first contact hole 110h and second contact hole 111h.

Figure 67:
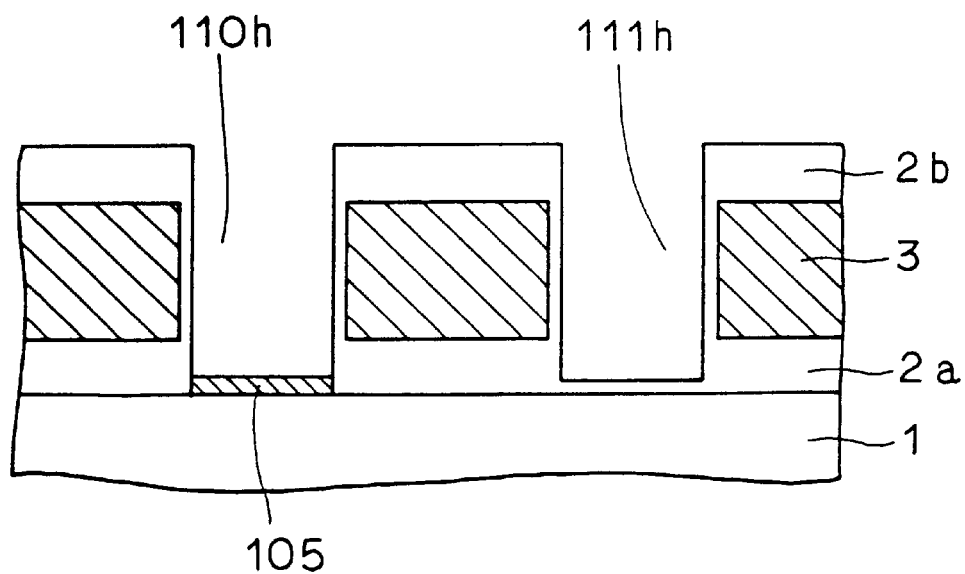

Referring to FIG. 67, lamp annealing is carried out at a temperature of 650° C. to 700° C. under nitrogen atmosphere for several ten seconds. Titanium and silicon react to form titanium silicide layer 105 at the bottom of first contact hole 110h, that is, at a portion where silicon contacts titanium. Then, by treatment with sulfuric acid, titanium which does not react with silicon is removed. Lamp annealing is carried out at approximately 800° C. under nitrogen atmosphere for several ten seconds so that the ratio of titanium and silicon becomes 1:2 ($TiSi_2$). As described above, it is possible to form titanium silicide layer 105 only at the bottom of first contact hole 110h. By carrying out the same steps as those shown in FIGS. 57 and 58 after removing the oxide film at the bottom of second contact hole 111h, the inverter circuit shown in FIG. 63 is completed.

Embodiment 18

Figure 68:
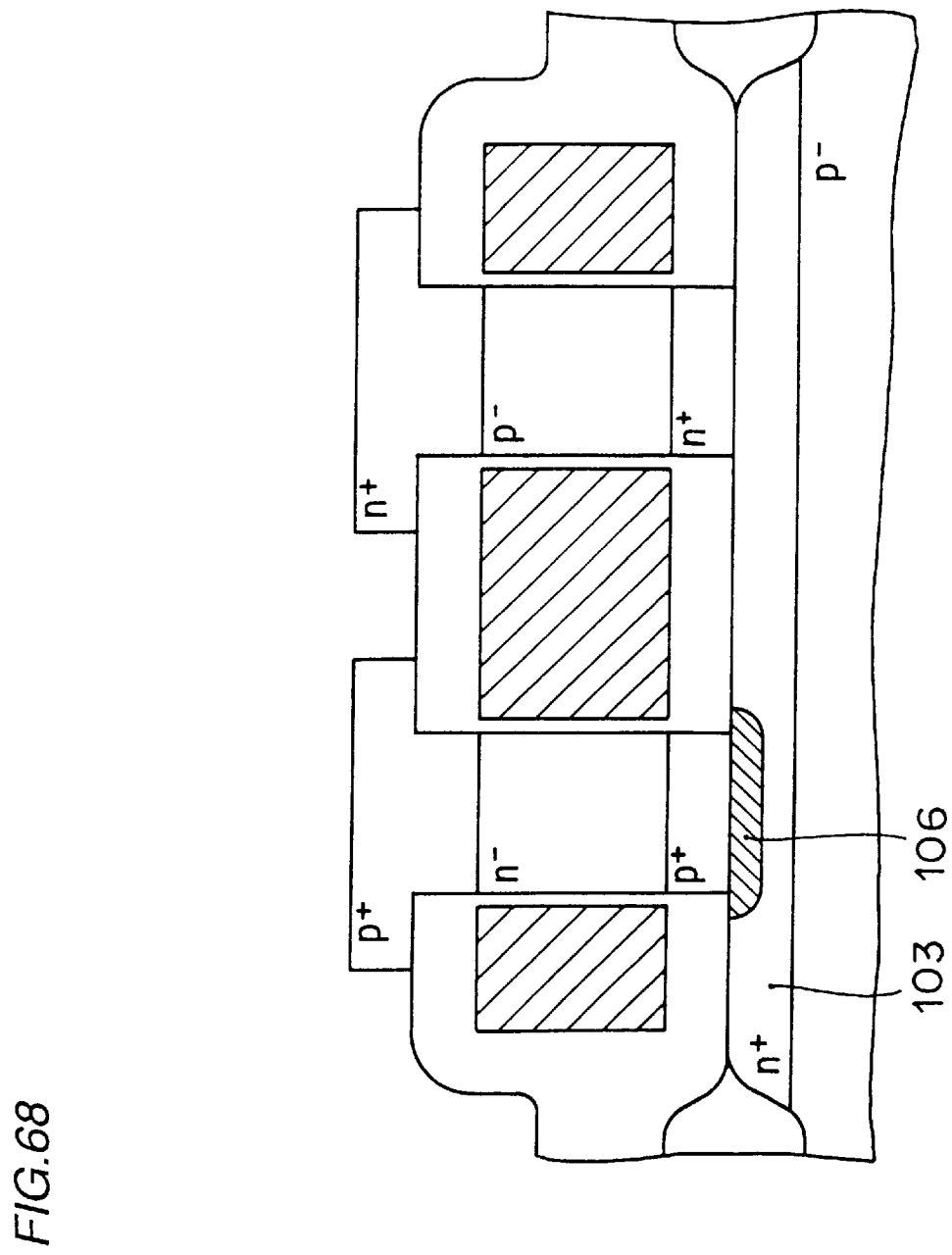
FIG. 68 is a cross sectional view of an inverter circuit according to Embodiment 18.

FIG. 68 is a sectional view of an inverter circuit according to a further embodiment of the present invention.

Referring to FIG. 68, an $n^{++}$ region 106 of a high concentration is formed at the bottom of the P-channel contact hole transistor. The width of the depletion layer formed in the junction portion is made narrow, whereby a high electric field is applied. By thus structured, a current flows through the P-N junction by occurrence of a tunneling current.

Embodiment 19

Figure 69:
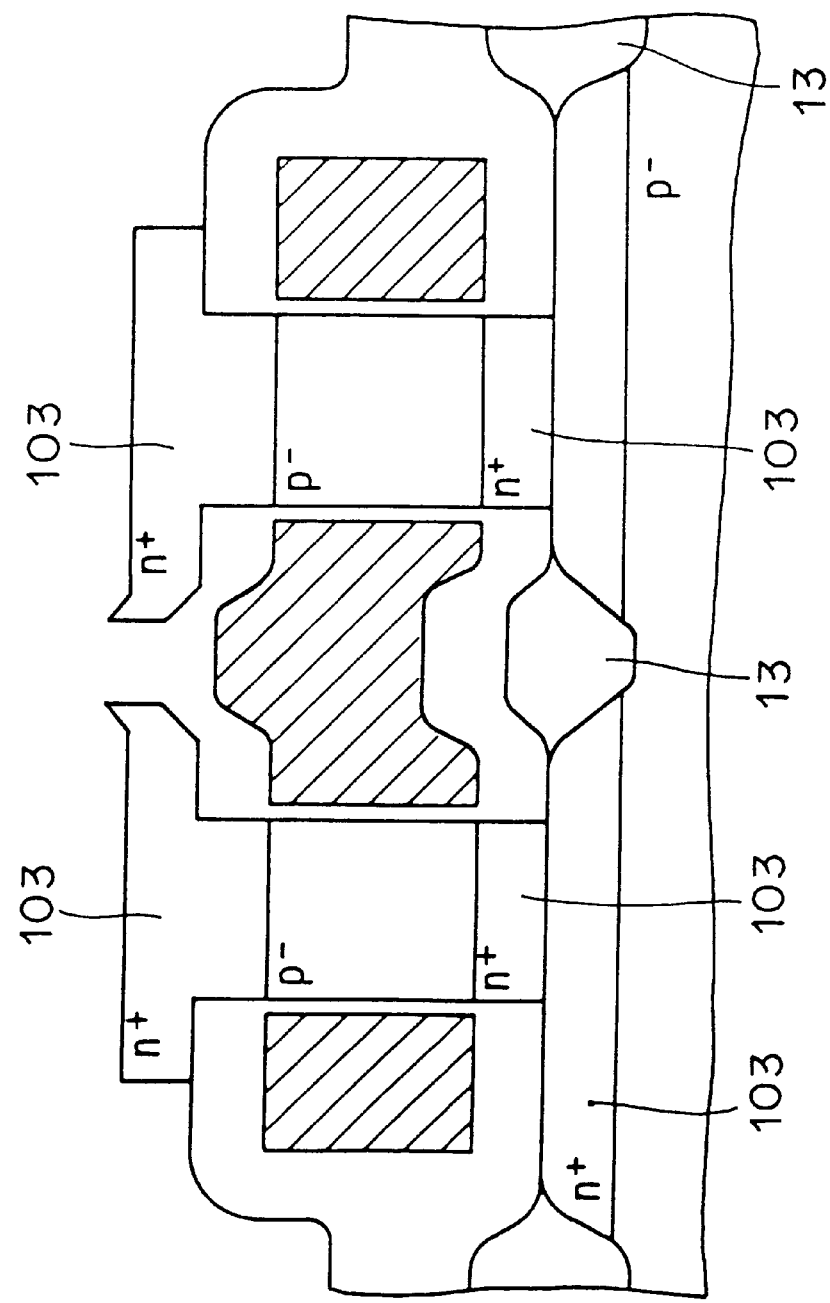
FIG. 69 is a cross sectional view of a semiconductor device according to Embodiment 19.

FIG. 69 is a sectional view of a semiconductor device according to a further embodiment of the present invention. Two N-channel contact hole transistors are formed on semiconductor substrate 1. The two transistors are connected by semiconductor substrate 1. An array of contact hole transistors arranged similar to that of the DRAM cells shown in FIG. 41 is formed with $n^+$ region 103 formed in the main surface of semiconductor substrate 1 used as a bit line.

Embodiment 20

Figure 70:
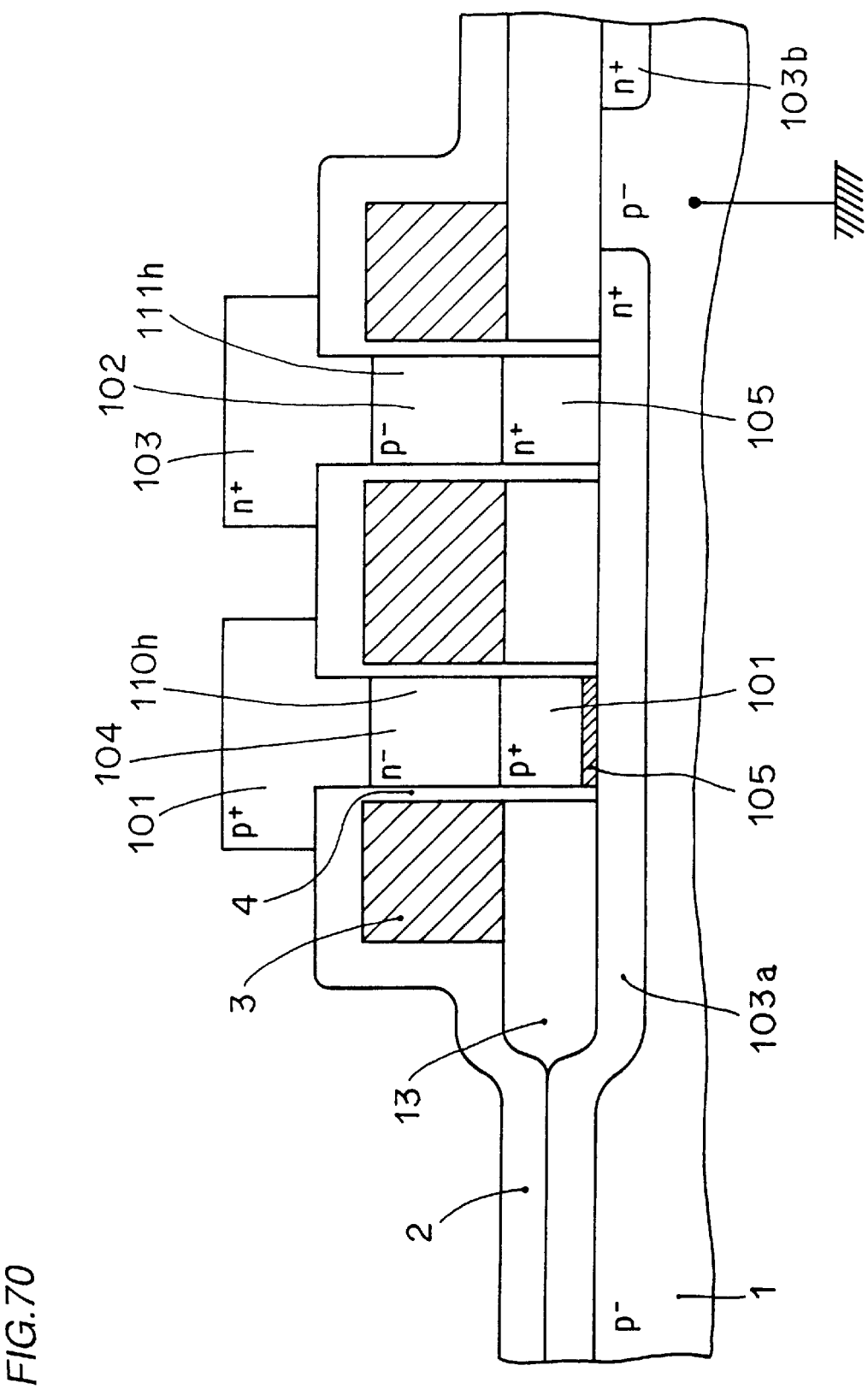
FIG. 70 is a cross sectional view of an inverter circuit according to Embodiment 20.

FIG. 70 is a sectional view of a further embodiment of an inverter circuit using a contact hole transistor. In this embodiment, an inverter circuit is formed on isolation oxide film 13.

The device of this embodiment includes $p^-$ semiconductor substrate 1 having a main surface. Field oxide film 13 is formed in the main surface of semiconductor substrate 1. $n^+$ impurity diffusion layer 103a is formed in the main surface of semiconductor substrate 1 and directly below field oxide film 13. Gate electrode 3 having an upper surface and a lower surface is provided on field oxide film 13. Interlayer insulating film 2 is provided on the semiconductor substrate so as to cover gate electrode 3. First contact hole 110h for exposing one part of the surface of $n^+$ impurity diffusion layer 103a is provided so as to penetrate through interlayer insulating film 2, gate electrode 3, and field oxide film 13. Second contact hole 111h for exposing another part of the surface of $n^+$ impurity diffusion layer 103a is provided so as to penetrate through interlayer insulating film 2, gate electrode 3, and field oxide film 13. An inner wall surface of first contact hole 110h is covered with gate insulating film 4. An inner wall surface of second contact hole 111h is covered with gate insulating film 4. A conductor film 105 of titanium silicide, other silicide, titanium nitride, metal or the like is provided in contact with the surface of $n^+$ impurity diffusion layer 103a in first contact hole 110h. First $p^+$ semiconductor layer 101 serving as one source/drain region is deposited on the surface of conductor film 105 in contact therewith up to the lower surface of gate electrode 3 in first contact hole 110h. $n^-$ semiconductor 104 is deposited on the surface of first $p^+$ semiconductor layer 101 in contact therewith up to the upper surface of gate electrode 3 in first contact hole 110h. Second $p^+$ semiconductor layer 101 serving as the other source/drain region is deposited on $n^-$ semiconductor layer 104 in contact therewith. First $n^+$ semiconductor layer 103 serving as one source/drain region is deposited on the surface of $n^+$ impurity diffusion layer 103a in contact therewith up to the lower surface of gate electrode 3 in second contact hole 111h. $p^-$ semiconductor layer 102 is deposited on the surface of first $n^+$ semiconductor layer 103 in contact therewith up to upper surface of gate electrode 3 in second contact hole 111h. Second $n^+$ semiconductor layer 103 serving as the other source/drain region is provided on $p^-$ semiconductor layer 102 in contact therewith.

Conventionally, the portion over isolation oxide film 13 is not used. Therefore, by forming an inverter circuit on isolation oxide film 13, the surface of the semiconductor substrate can be used effectively.

Figure 71:
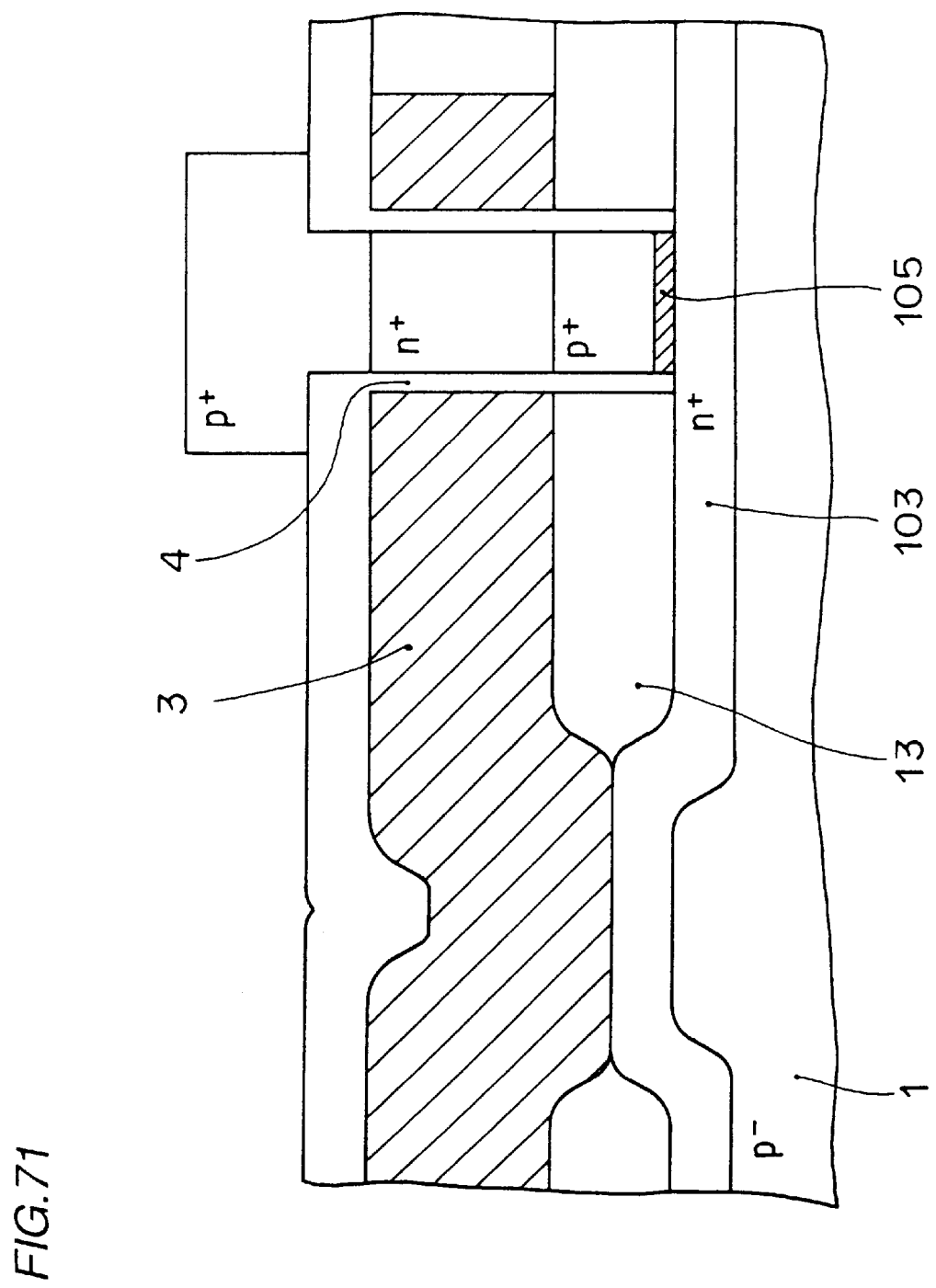
FIG. 71 is a cross sectional view of an inverter circuit according to a modification of Embodiment 20.

In the above-described inverter circuit, as shown in FIG. 71, gate electrode 3 could be connected to $n^+$ interconnection layer 103 in a portion where isolation oxide film 13 is not formed.

Embodiment 21

Figure 72:
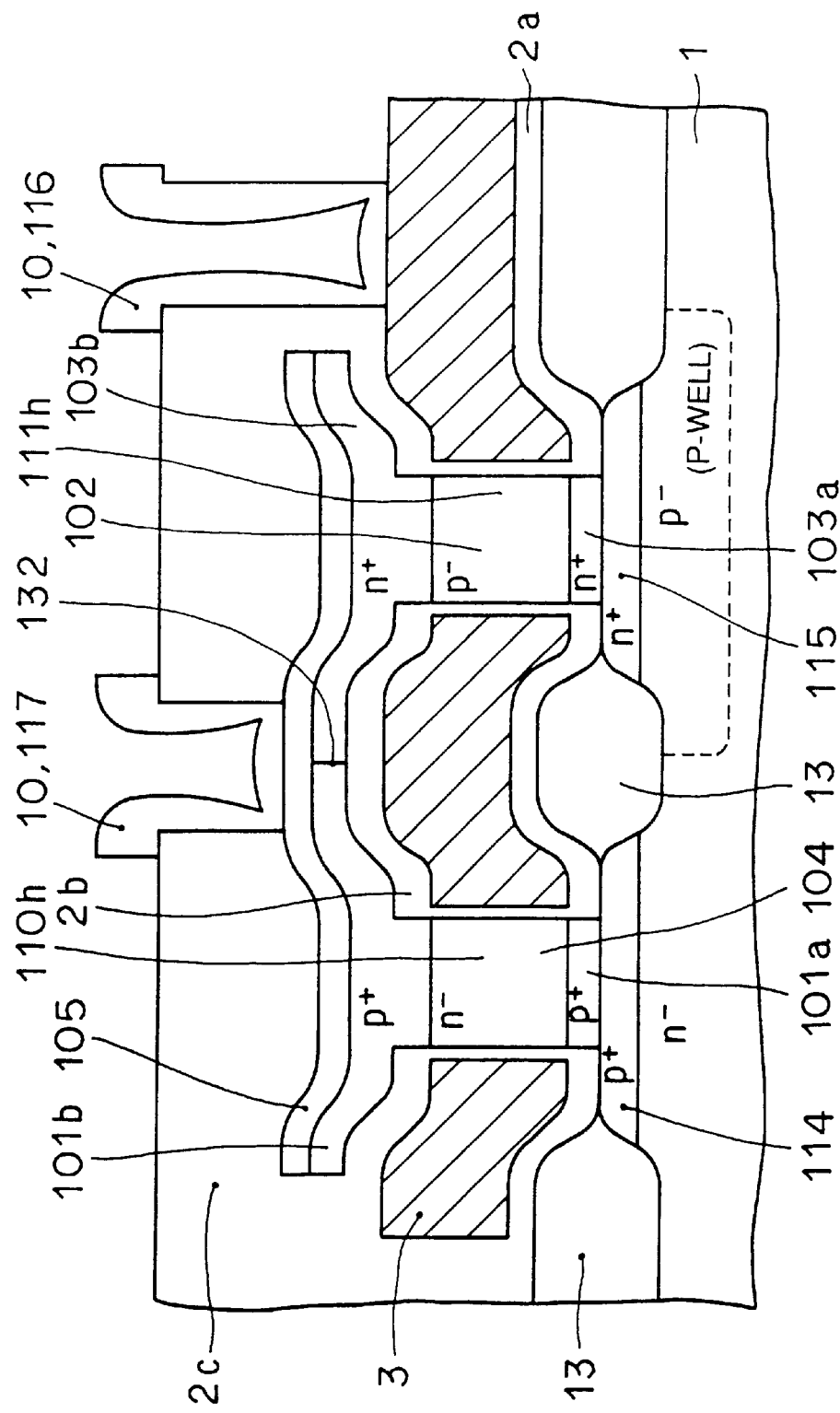
FIG. 72 is a cross sectional view of an inverter circuit according to Embodiment 21.
Figure 73:
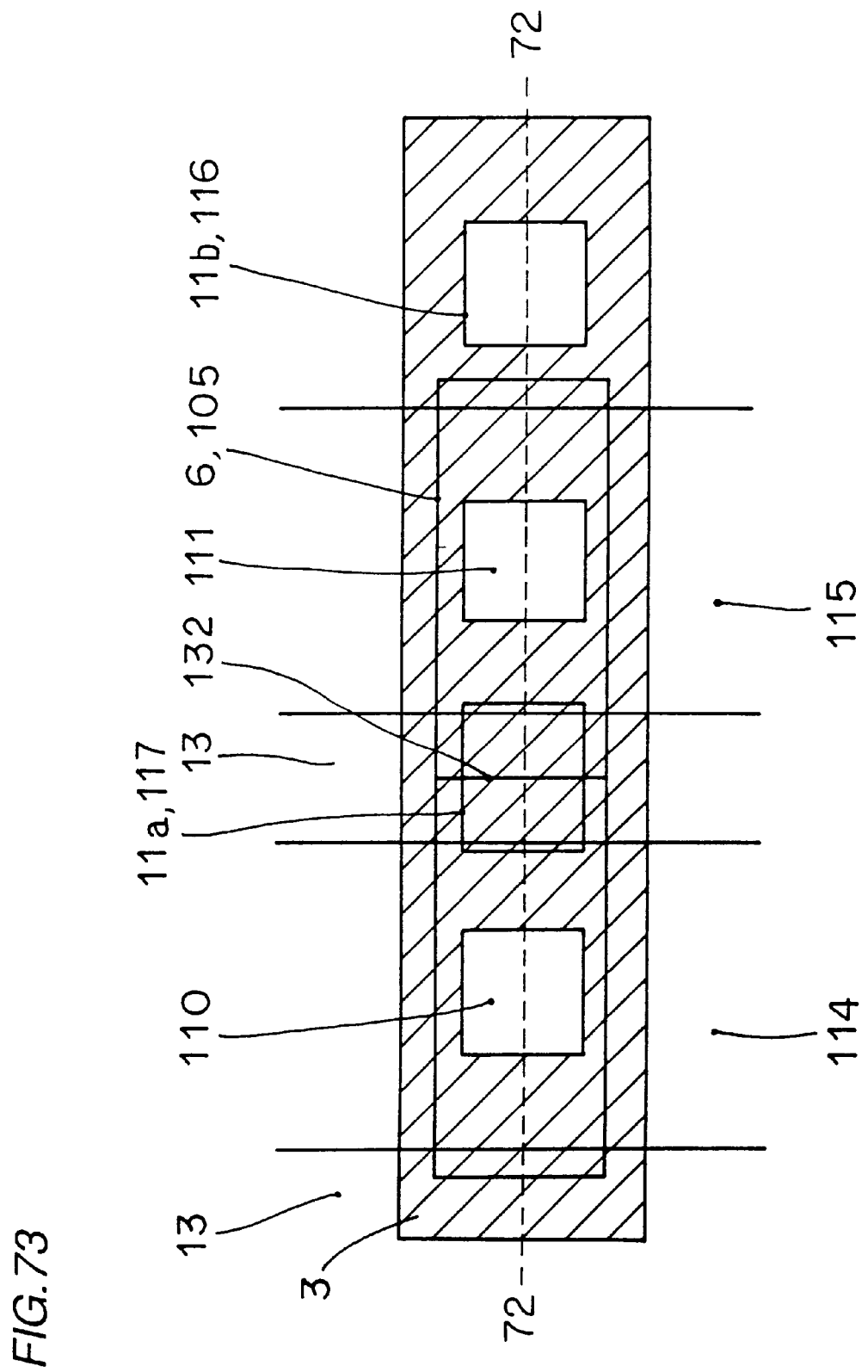
FIG. 73 is a plan view of the inverter circuit according to Embodiment 21.

FIG. 72 is a sectional view of a contact hole transistor on isolation oxide film 13 according to Embodiment 21. FIG. 73 is a plan view thereof. FIG. 72 is a sectional view taken along the line B—B of FIG. 73.

Referring to FIG. 72, the semiconductor device includes substrate 1 having a main surface. Field oxide film 13 is provided in the main surface of semiconductor substrate 1. $p^+$ impurity diffusion layer 114 and $n^+$ impurity diffusion layer 115 are formed in the main surface of semiconductor substrate 1 with being separated from each other by field oxide film 13. First interlayer insulating film 2a is provided on semiconductor substrate 1. Gate electrode 3 is provided on first interlayer insulating film 2a so as to cover $p^+$ impurity diffusion layer 114 and $n^+$ impurity diffusion layer 115. Second interlayer insulating film 2b is provided on semiconductor substrate 1 so as to cover gate electrode 3. First contact hole 110h for exposing one part of the surface of $p^+$ impurity diffusion layer 114 is provided so as to penetrate through first interlayer insulating film 2a, gate electrode 3, and second interlayer insulating film 2b. Second contact hole 111h for exposing one part of the surface of $n^+$ impurity diffusion layer 115 is provided so as to penetrate through first interlayer insulating film 2a, gate electrode 3, and second interlayer insulating film 2b. An inner wall surface of first contact hole 110h is covered with gate insulating film 4. An inner wall surface of second contact hole 111h is covered with gate insulating film 4. First $p^+$ semiconductor layer 101a serving as one source/drain region is deposited on the surface of $p^+$ impurity diffusion layer 114 in contact therewith up to the lower surface of gate electrode 3 in first contact hole 110h. $n^-$ semiconductor layer 104 is deposited on the surface of first $p^+$ semiconductor layer 101a in contact therewith up to the upper surface of gate electrode 3 in first contact hole 110h. Second $p^+$ semiconductor layer 101b serving as the other source/drain region is provided on $n^-$ semiconductor layer 104.

First $n^+$ semiconductor layer 103a serving as the other source/drain region is deposited on the surface of $n^+$ impurity diffusion layer 115 in contact therewith up to the lower surface of gate electrode 3 in second contact hole 111h. $p^-$ semiconductor layer 102 is deposited on the surface of first $n^+$ semiconductor layer 103a in contact therewith up to the upper surface of gate electrode 3 in second contact hole 111h. Second $n^+$ semiconductor layer 103b serving as the other source/drain region is provided on $p^-$ semiconductor layer 102 in contact therewith.

An end portion of second $p^+$ semiconductor layer 101b and an end portion of second $n^+$ semiconductor layer 103b are in contact with each other by a P-N junction 132 on the field oxide film. The device includes titanium silicide film 105 electrically connecting the surface of second $p^+$ semiconductor layer 101b and the surface of second $n^+$ semiconductor layer 103b. Third interlayer insulating film 2c is provided so as to cover titanium silicide film 105. A contact hole for exposing one part of the surface of titanium silicide film 105 is formed in third interlayer insulating film 2c. Through this contact hole, an aluminum interconnection 10 for a $V_{OUT}$ 117 is connected to titanium silicide film 105.

In the inverter circuit shown in Embodiment 16, since $V_{OUT}$ was provided on the side of the substrate, it was necessary to provide contact portion 113, 117 next to the body of the inverter, referring to FIG. 55. On the other hand, since Vcc 114, GND 115 are provided on the side of the substrate, and $V_{OUT}$ 117 is provided on the substrate, it is possible to configure an inverter circuit occupying a relatively small area.

Although the case where titanium silicide film 105 is formed as a connection member in the above embodiment, the film may be of other silicide or metal. If the contact hole is formed across P-N junction portion 132 between $p^+$ portion 101b and $n^+$ portion 103b as shown in FIG. 72, and an aluminum interconnection 10 is formed in the contact hole, the P-N junction disappears even without titanium silicide film 105. As shown in FIG. 60, drains may be connected by an aluminum interconnection in another place.

Embodiment 22

In this embodiment, a flip-flop is formed by using two inverter circuits shown in FIG. 72 to be applied to an SRAM cell.

Figure 74:
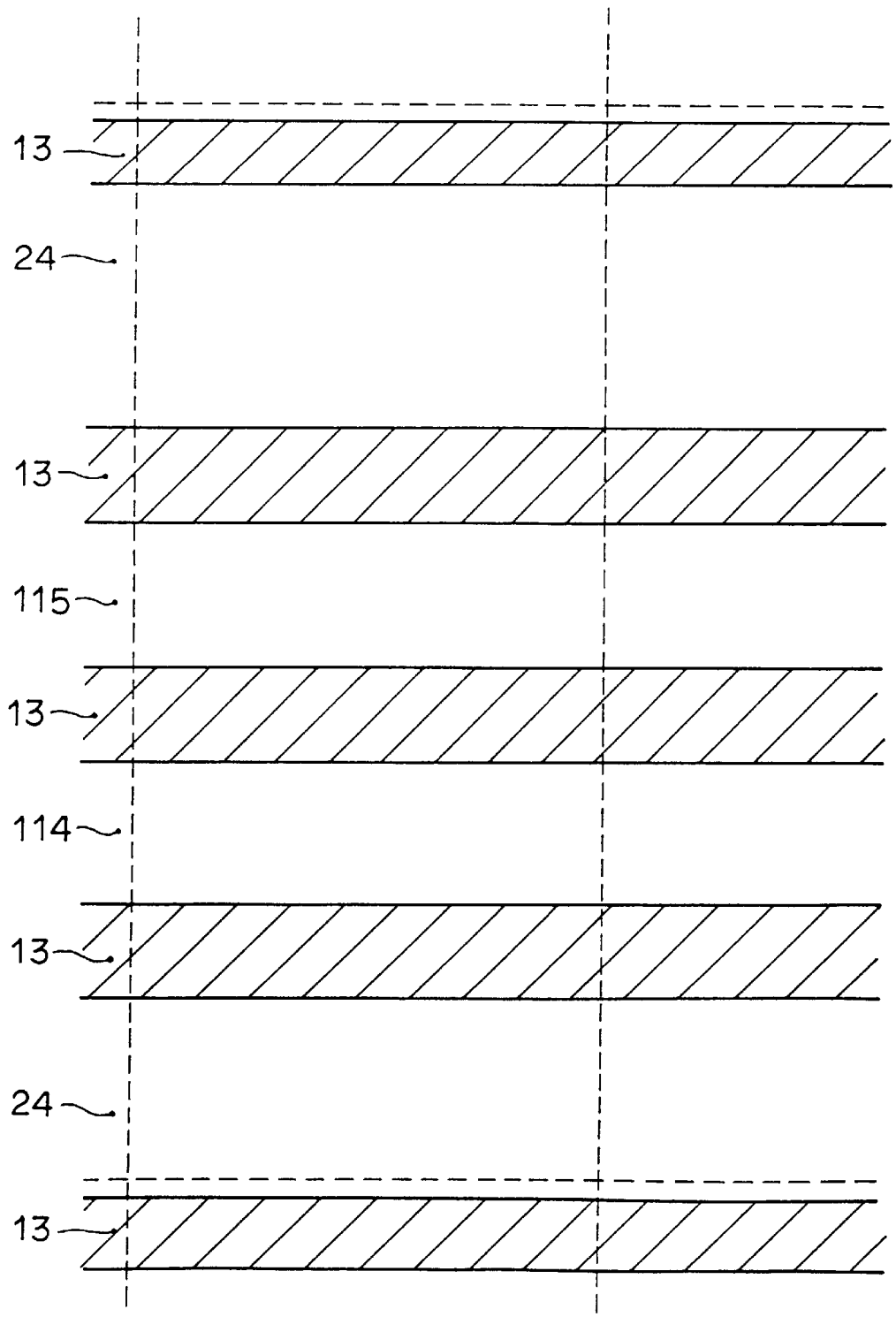
FIG. 74 is a layout diagram of the first layer of an SRAM cell according to Embodiment 22.
Figure 75:
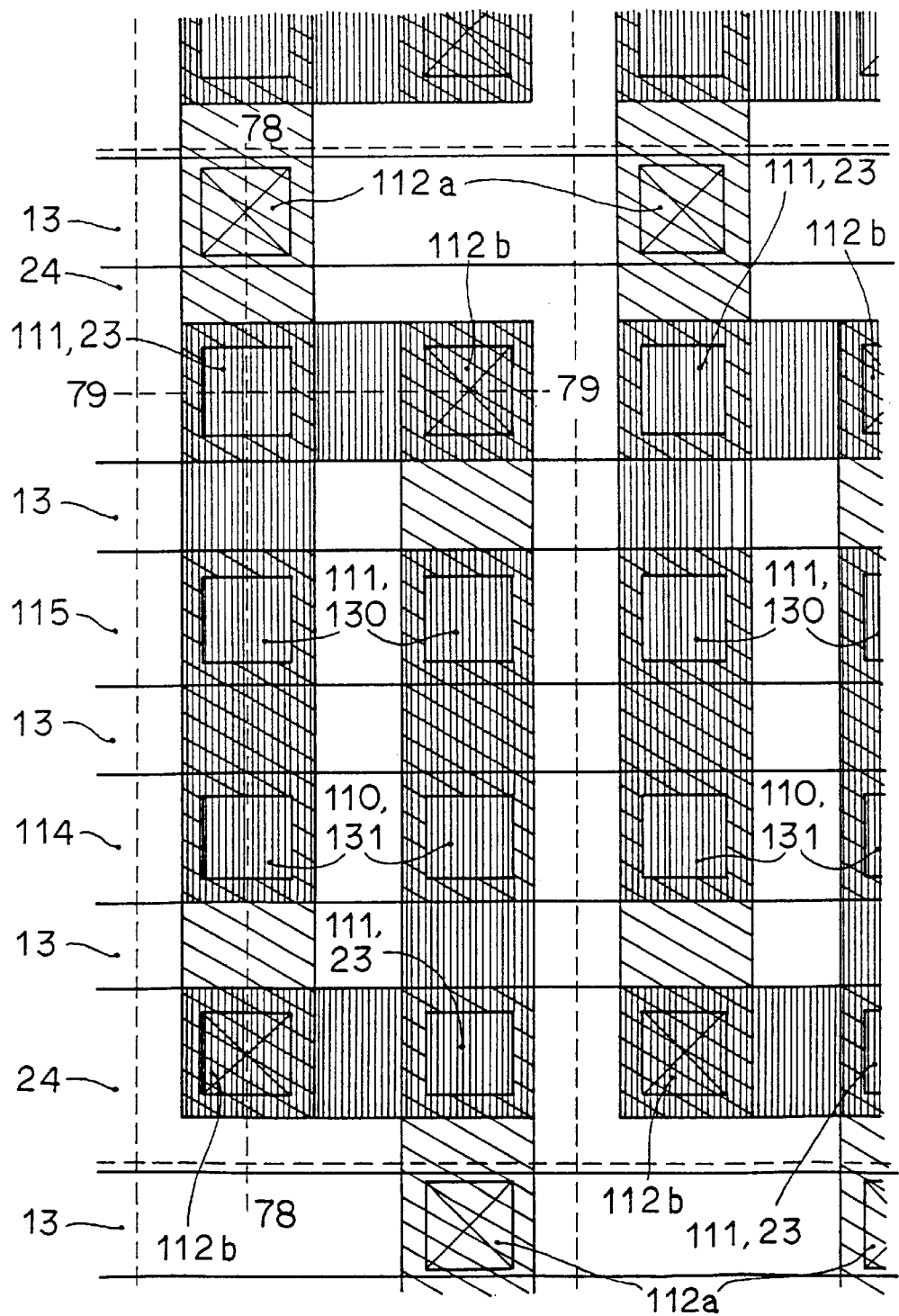
FIG. 75 is a layout diagram of the second layer of the SRAM cell according to Embodiment 22.
Figure 76:
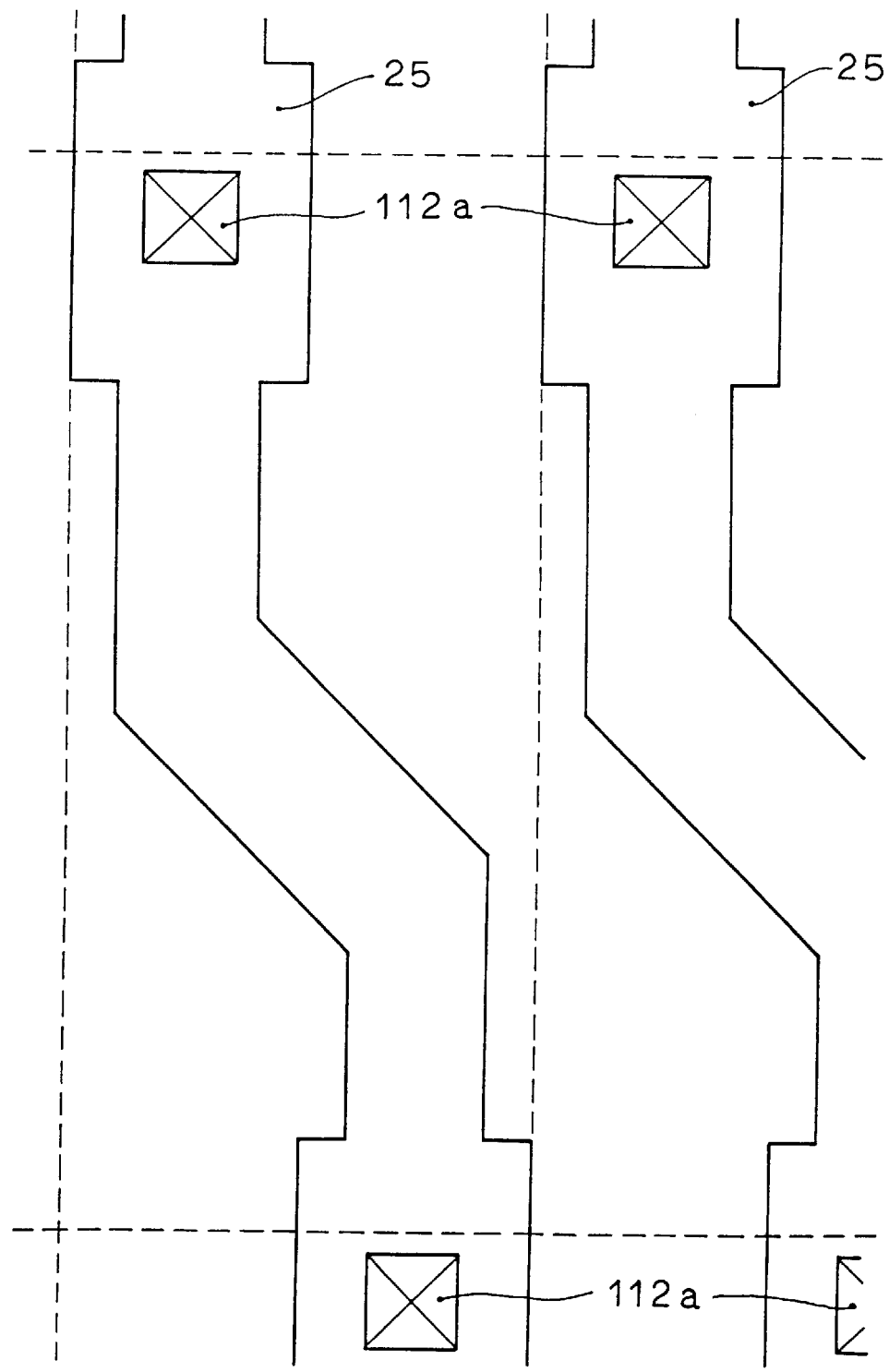
FIG. 76 is a layout diagram of the third layer of the SRAM cell according to Embodiment 22.
Figure 77:
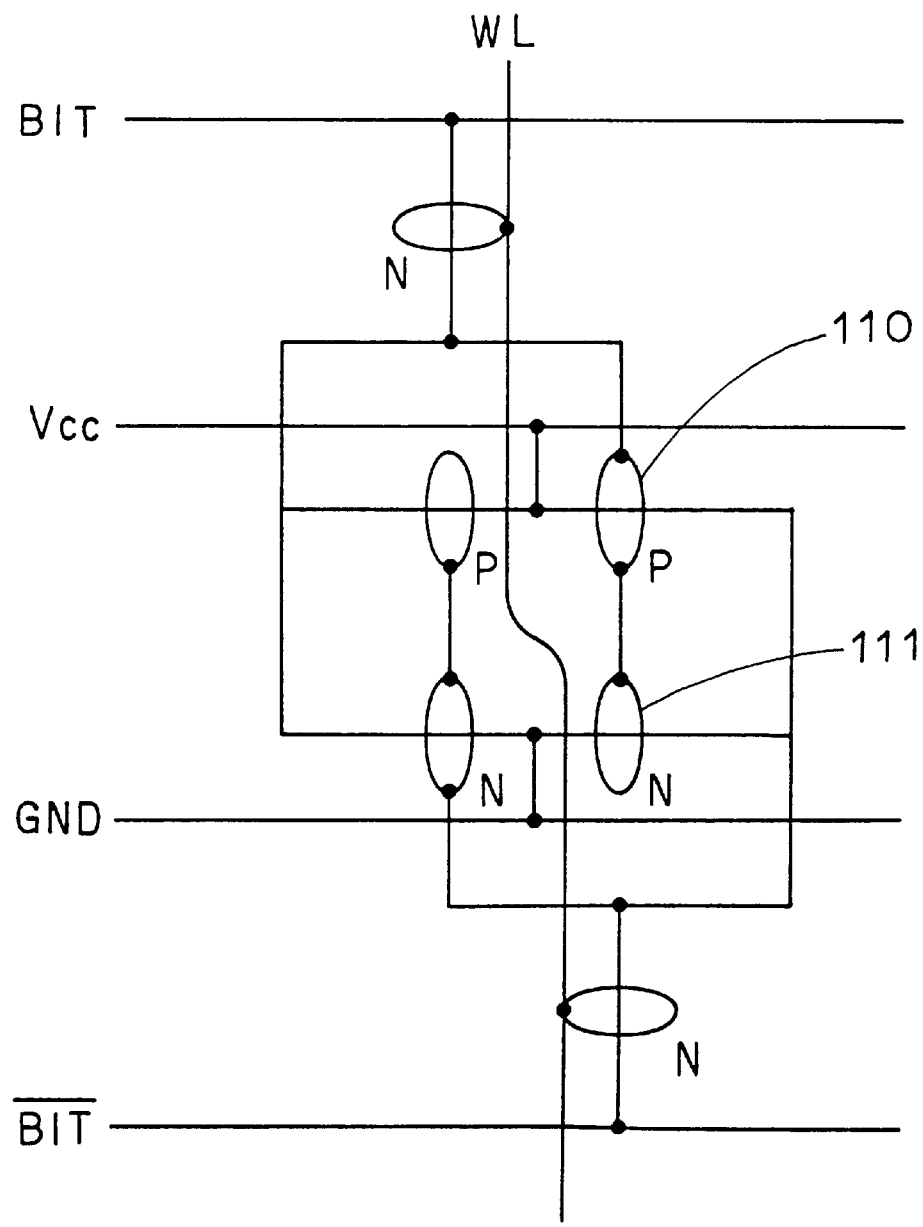
FIG. 77 is an equivalent circuit diagram of the SRAM cell according to Embodiment 22.
Figure 78:
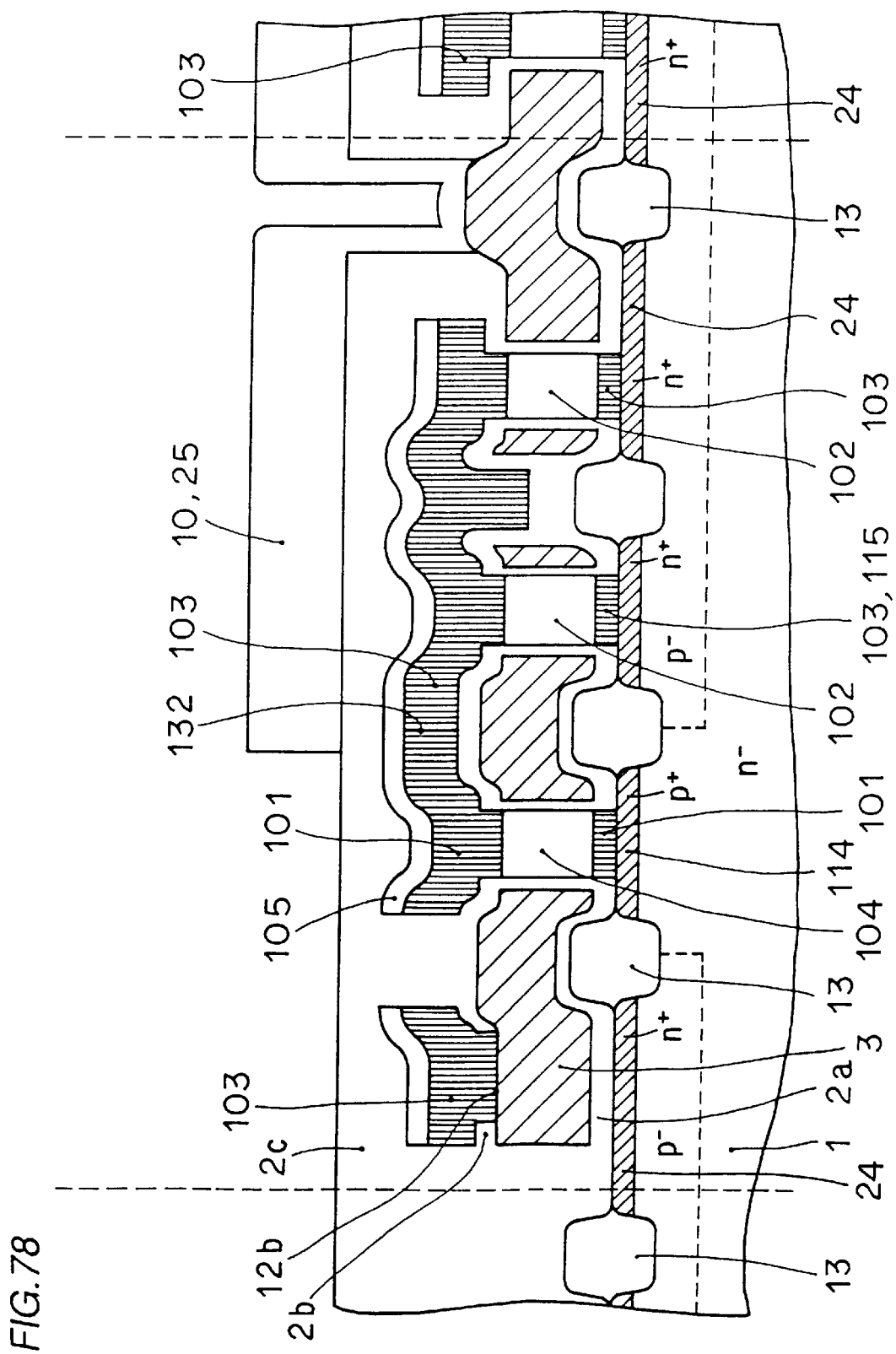
FIG. 78 is a cross sectional view taken along the line D—D in FIG. 75.
Figure 79:
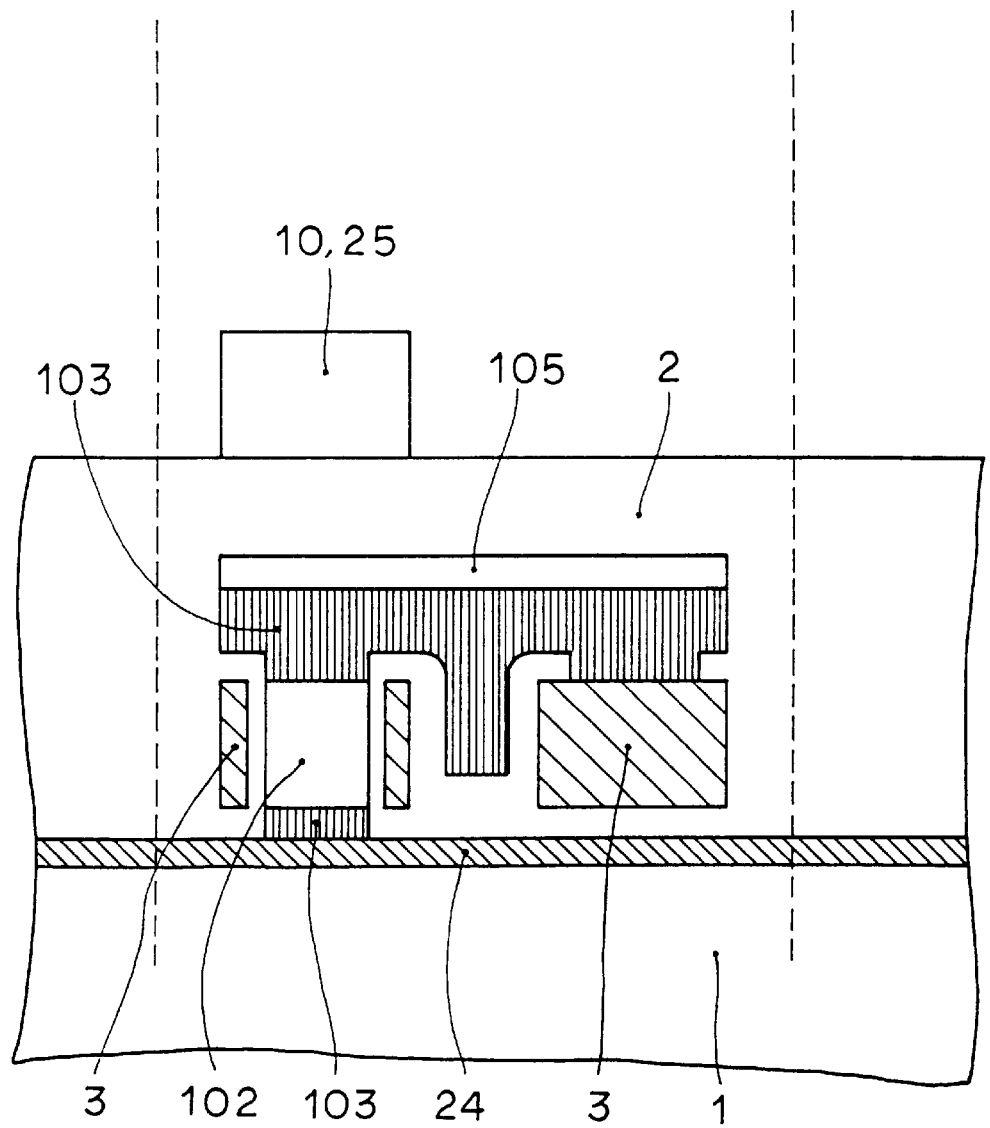
FIG. 79 is a cross sectional view taken along the line C—C in FIG. 75.

FIGS. 74 to 76 are layout diagrams of an SRAM cell. FIG. 77 is an equivalent circuit diagram of the SRAM cell. FIG. 79 is a sectional view taken along the line C—C in FIG. 75. FIG. 78 is a sectional view taken along the line D—D in FIG. 75.

FIG. 74 shows a bit line/$\overline{\text{bit line}}$ 24, a Vcc line 114, and a GND line 115 separated by isolation oxide film 13 formed on the substrate. Bit line 24 and GND line 115 are of n type, and Vcc line 114 is of p type.

The layout shown in FIG. 75 is to be formed on the layout shown in FIG. 74. In FIG. 75, a hatched portion is a portion of a gate electrode of a contact hole transistor. A portion indicated by vertical lines is a portion to serve as a storage node. Driver transistor 130 and access transistor 23 are respectively formed of N channel contact hole transistors 111. Load transistor 131 is formed of P-channel contact hole transistor 110. Reference character 112a denotes a contact of an aluminum interconnection to a gate electrode portion. The aluminum interconnection is a word line. Reference character 112b denotes a contact of the storage node to the gate electrode portion, which forms a cross couple.

FIG. 76 is a layout of an aluminum interconnection to be formed on the layout shown in FIG. 75. Reference character 25 denotes a word line.

These cell layouts are arranged in the lateral direction by parallel movement and arranged in the vertical direction by up/down reversion.

In an equivalent circuit shown in FIG. 77, contact hole transistors 110, 111 are shown by circles, in which a channel portion penetrates through the gate.

The device having sections shown in FIGS. 78 and 79 can be manufactured by a method similar to the case of the device shown in FIG. 72.

Referring to these figures, driver transistor 130 and access transistor 23 are exactly the same in size. In order to stabilize the memory cell, access transistor 23 may be made a little smaller, or the gate insulating film of access transistor 23 may be made thicker.

FIG. 80 shows a method of increasing the thickness of the gate insulating film of the access transistor.

Figure 80A:
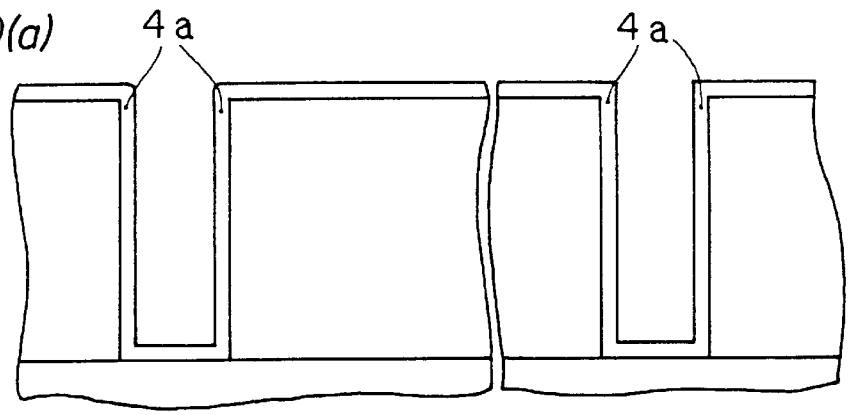
FIG. 80 is a cross sectional view showing a method of forming a gate insulating film of an access transistor large in thickness.
Figure 80B:
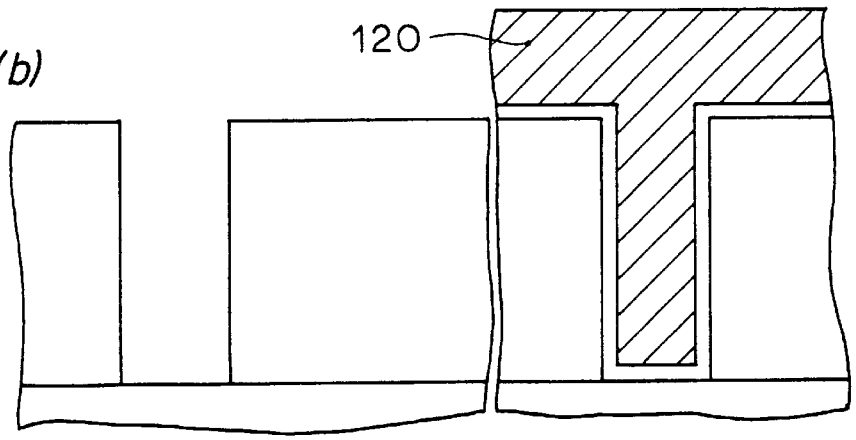

Referring to FIG. 80(a), gate insulating film 4a is deposited on both transistors. Referring to FIG. 80(b), with only a portion of the access transistor (right in the figure) covered with resist 120, the gate insulating film of only a portion of the driver transistor (left in the figure) is removed by wet etching. Then, resist 120 is removed.

Figure 80C:
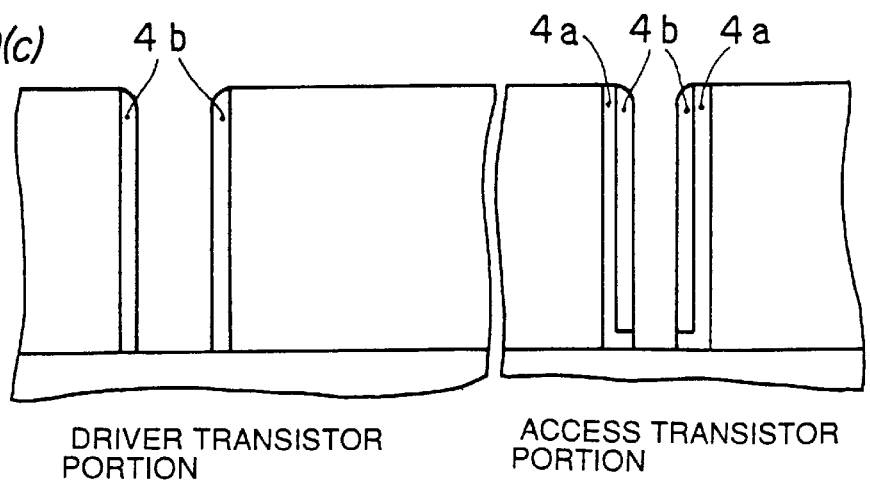

Referring to FIG. 80(c), gate insulating film 4b is again deposited on the entire surface. Then, anisotropic etching is carried out. A device having only the gate insulating film of the access transistor increased in thickness can be obtained.

In FIG. 80, the gate electrode or the like is not shown.

Description will be given of a method of forming contact 112b of gate electrode 3 shown in FIG. 78. Contact 112b is simultaneously formed at the time of formation of the contact hole transistor. Since it is necessary to form a contact hole reaching the surface of substrate 1 in the portion of the transistor, second interlayer insulating film 2b is etched, gate electrode 3 is etched, and then first interlayer insulating film 2a is etched. On the contrary, since only second interlayer insulating film 2b may be etched in the portion of contact 112b, the portion of contact 112b must be covered with resist when etching of second interlayer insulating film 2b is completed. The resist may be removed after completion of opening of the transistor portion.

In the figure, reference character 101 denotes a $p^+$ region, 102 a $p^-$ region, 103 an $n^+$ region, 104 an $n^-$ region, 105 a titanium silicide film, 106 an $n^{++}$ region, 110 a P-channel contact hole transistor, 111 an N-channel contact hole transistor, 112 a contact to the gate electrode, 113 a contact to the substrate, 114 Vcc, 115 GND, 116 $V_{IN}$, 117 $V_{OUT}$, 120 resist, 130 a driver transistor, 131 a load transistor, and 132 denotes a P-N junction.

Embodiment 23

Figure 81:
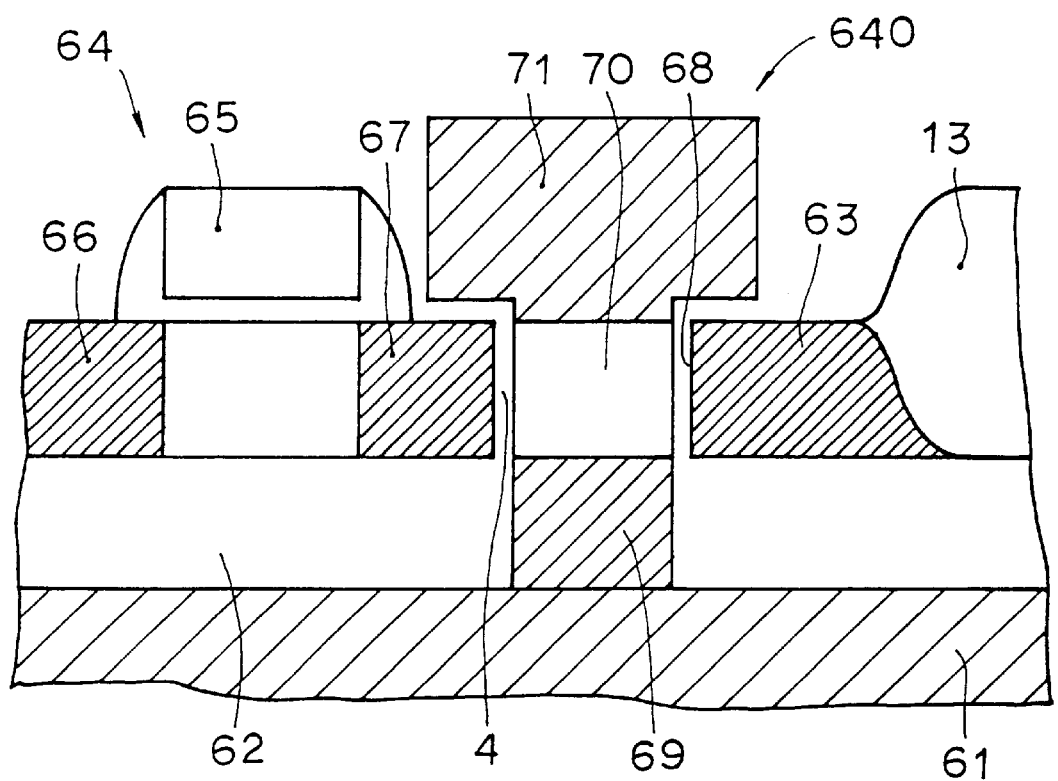
FIG. 81 is a cross sectional view of a logic circuit according to Embodiment 23.
Figure 82:
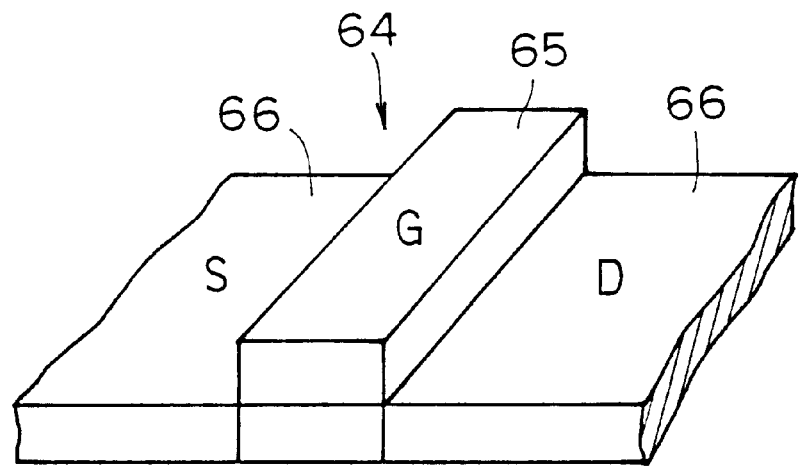
FIG. 82 is a perspective view of a portion of an SOI transistor of the logic circuit shown in FIG. 81.
Figure 83:
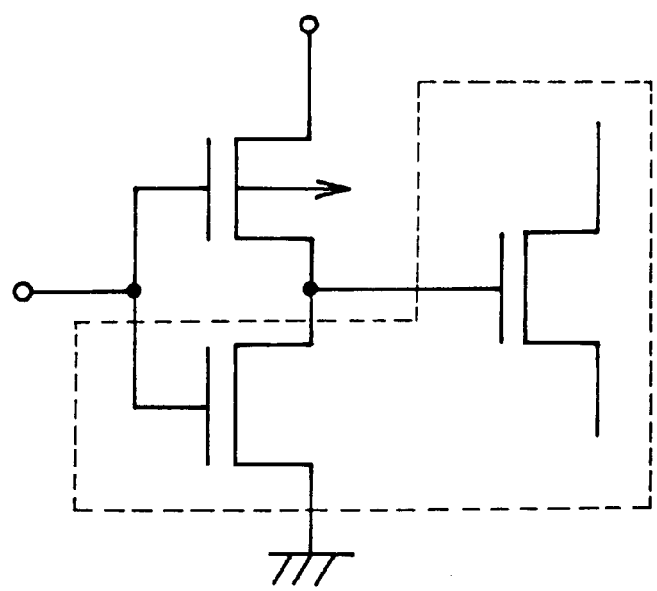
FIG. 83 is an equivalent circuit diagram of the logic circuit according to Embodiment 23.

This embodiment shown in FIG. 81 relates to a logic circuit formed by combination of an SOI transistor 64 with a contact hole transistor 640. FIG. 82 is a perspective view of SOI transistor 64. FIG. 83 is an equivalent circuit diagram of the logic circuit shown in FIG. 81. The device includes a silicon substrate 61. An $SiO_2$ layer 62 is provided on silicon substrate 61. A semiconductor layer 63 having an upper surface and a lower surface is provided on $SiO_2$ layer 62. Field oxide film 13 is provided in semiconductor layer 63. A gate electrode 65 of SOI transistor 64 is provided on semiconductor layer 63. In semiconductor layer 63, provided is a pair of a source layer 66 and a drain layer 67 for the SOI transistor formed separately from each other on opposite sides of gate electrode 65. A contact hole 68 for exposing one part of the surface of silicon substrate 61 is provided so as to penetrate through drain layer 67 and $SiO_2$ layer 62. An inner wall surface of contact hole 68 is covered with gate insulating film 4. A source layer 69 for the contact hole transistor is deposited on the surface of substrate 61 in contact therewith up to the lower surface of semiconductor layer 63 in contact hole 68. A channel layer 70 for the contact hole transistor is deposited on the surface of source layer 69 for the contact hole transistor in contact therewith up to the upper surface of semiconductor layer 63 in contact hole 68. A drain layer 71 for the contact hole transistor is provided on channel layer 70 in contact therewith.

FIG. 83 is an equivalent circuit diagram of the logic circuit shown in FIG. 81. The logic circuit shown in FIG. 81 corresponds to a portion enclosed by a dotted line in FIG. 83.

According to this embodiment, connection between the SOI transistor and the contact hole transistor is facilitated, and a logic circuit occupying a small area can be formed.

Embodiment 24

This embodiment relates to a further embodiment of the inverter circuit formed by combination of an MOS transistor and a contact hole transistor.

Figure 84:
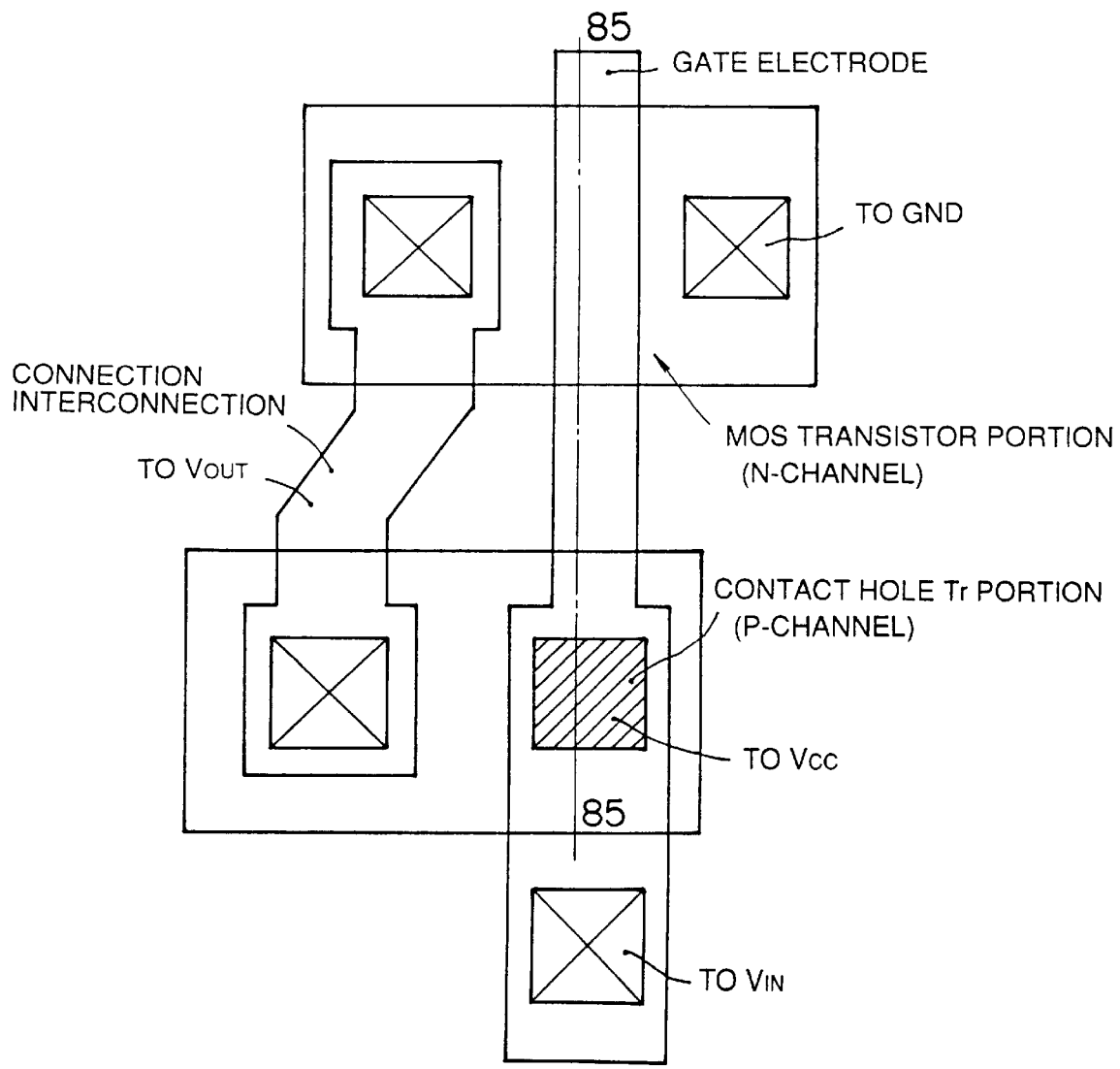
FIG. 84 is a pattern layout diagram of an inverter circuit according to Embodiment 24.
Figure 85:
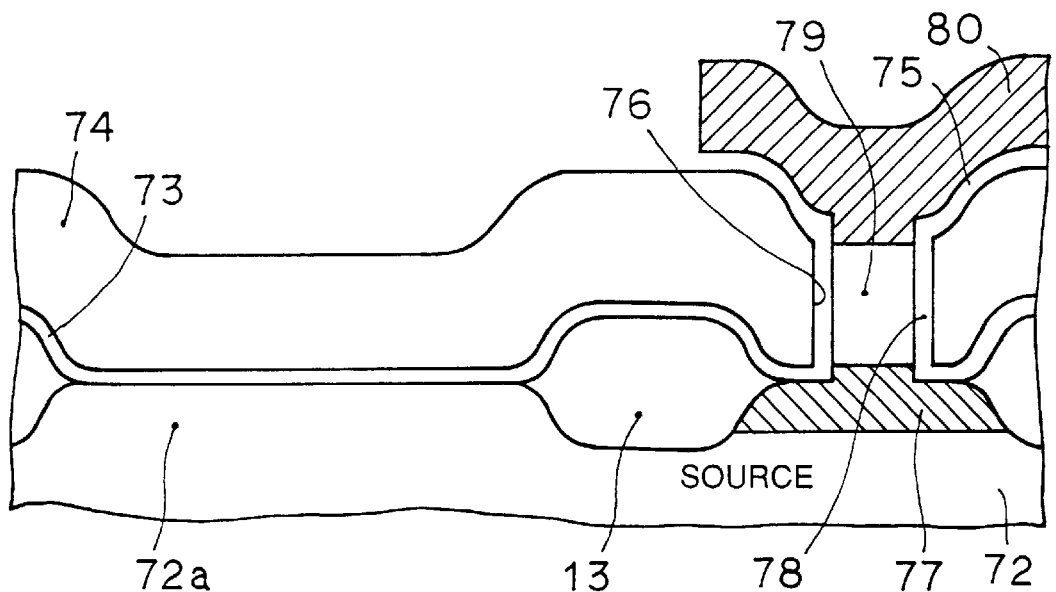
FIG. 85 is a cross sectional view taken along the line A—A in FIG. 4.
Figure 86:
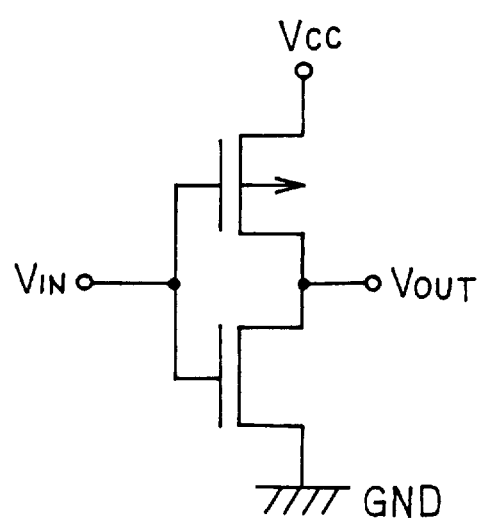
FIG. 86 is an equivalent circuit diagram of the inverter circuit according to Embodiment 24.

FIG. 84 is a pattern layout diagram of an inverter circuit according to this embodiment. FIG. 85 is a cross sectional view taken along the line A—A in FIG. 84. FIG. 86 is an equivalent circuit diagram of the inverter circuit according to this embodiment.

The inverter circuit according to this embodiment includes a substrate 72. Field oxide film 13 is provided in the main surface of substrate 72. A channel 72a of the MOS transistor is provided in the main surface of substrate 72. A first insulating film 73 is provided on substrate 72. A gate electrode 74 for the MOS transistor having an upper surface and a lower surface is provided on first insulating film 73. A second insulating film 75 is provided on substrate 72 so as to cover gate electrode 74 for the MOS transistor. A contact hole 76 for exposing one part of the surface of substrate 72 is provided so as to penetrate through first insulating film 73, gate electrode 74, and second insulating film 75. A source layer 77 for the contact hole transistor is provided in the main surface of substrate 72 and directly below contact hole 76. An inner wall surface of contact hole 76 is covered with a gate insulating film 78. A channel layer 79 for the contact hole transistor is deposited on the surface of source layer 77 in contact therewith up to the upper surface of gate electrode 74 in contact hole 76. A drain layer 80 for the contact hole transistor is provided on channel layer 79 in contact therewith. According to this embodiment, it is also possible to easily form an inverter circuit, and to reduce an area occupied by the inverter circuit.

Figure 87:
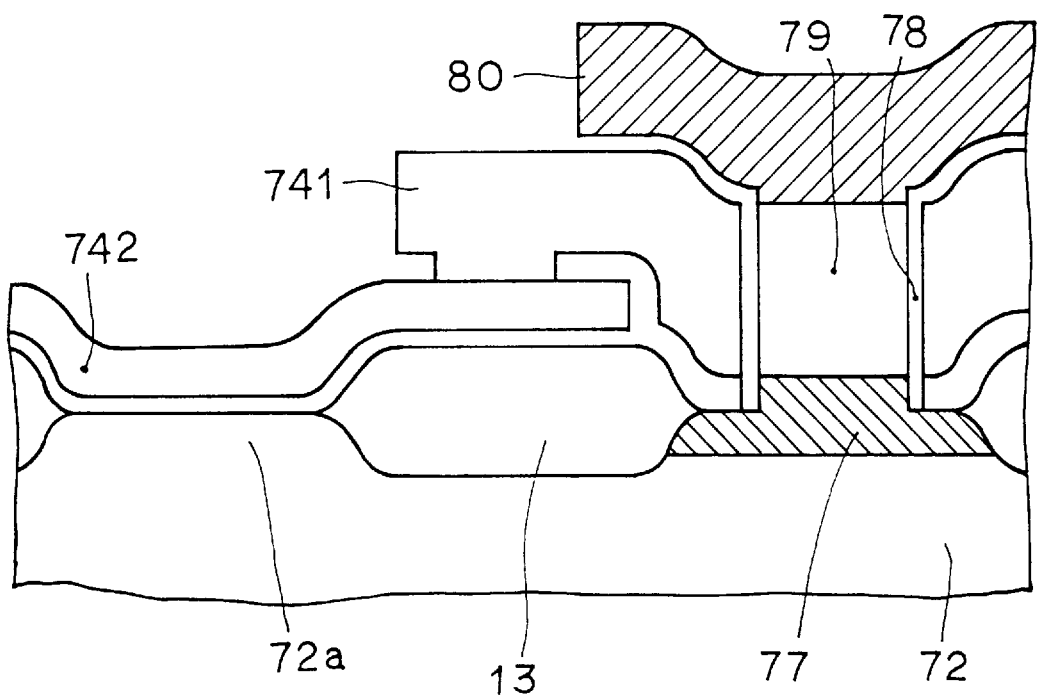
FIG. 87 is a cross sectional view of a device of a modification of the inverter circuit according to Embodiment 24.

As shown in FIG. 87, if a gate 741 of the contact hole transistor and a gate 742 of the MOS transistor are formed of different interconnection materials, the effects similar to those of this embodiment can be expected. In the figure, the same reference characters are given to portions the same as or corresponding to those shown in FIG. 85, and the description thereof will not be repeated.

Figure 88:
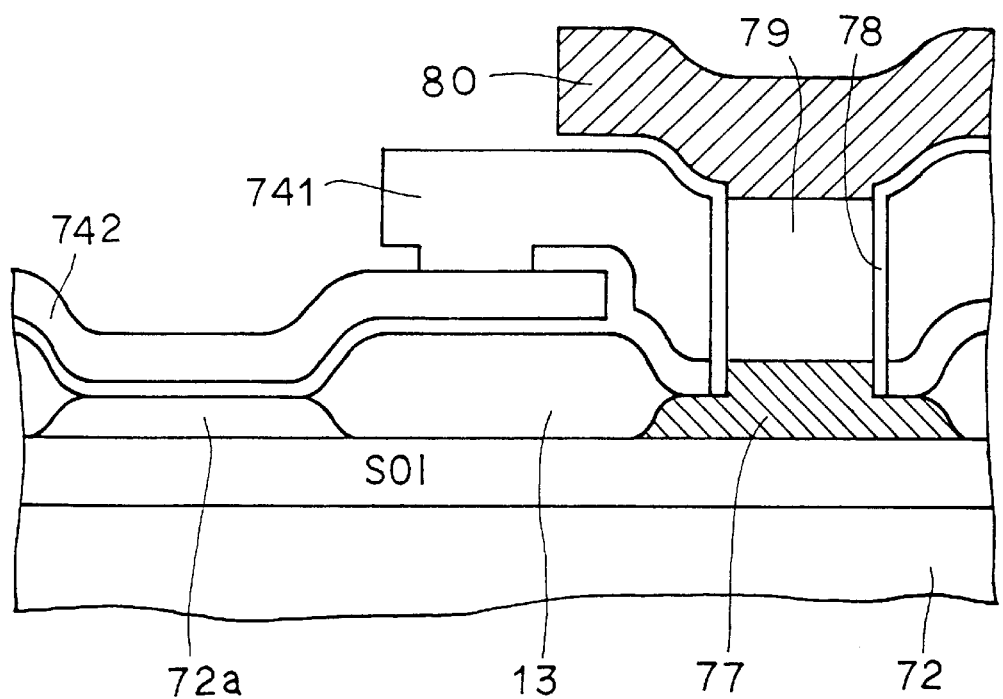
FIG. 88 is a cross sectional view of a further modification of the inverter circuit according to Embodiment 24.

If the MOS transistor is formed on the SOI, as shown in FIG. 88, effects similar to those of this embodiment can be expected. In the figure, the same reference characters are given to the same as or corresponding to those shown in FIG. 87. The description thereof will not be repeated.

Embodiment 25

This embodiment relates to an SRAM memory cell in which the contact hole transistor according to the present invention, that is, a vertical type surround gate MOSFET is used as a load transistor.

Figure 89:
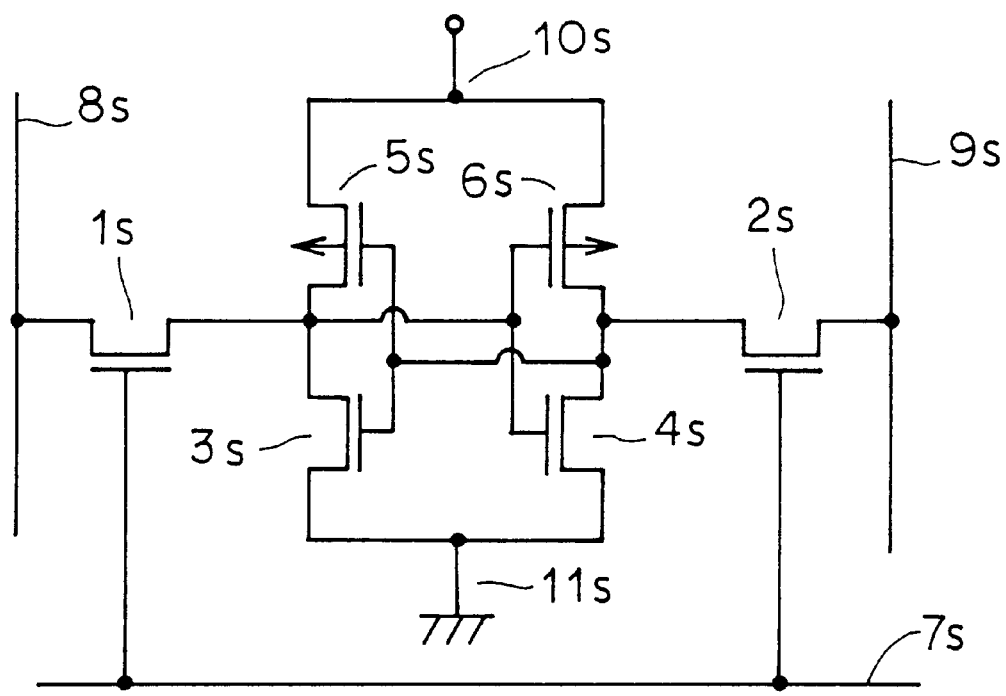
FIG. 89 is an equivalent circuit diagram of an SRAM memory cell according to Embodiment 25.

FIG. 89 is an equivalent circuit diagram of an SRAM memory cell according to this embodiment. The SRAM memory cell includes N type transistors 1s, 2s, 3s, 4s, and P type transistors 5s, 6s. N type transistors is, 2s are access transistors, and N type transistors 3s, 4s are driver transistors. P type transistors 5s, 6s are load transistors.

The SRAM memory cell includes a word line 7s, bit lines 8s, 9s, a Vcc 10s, and a GND 11s.

In this embodiment, load transistors 5s, 6s are formed of polysilicon thin film transistors (TFT).

Figure 90:
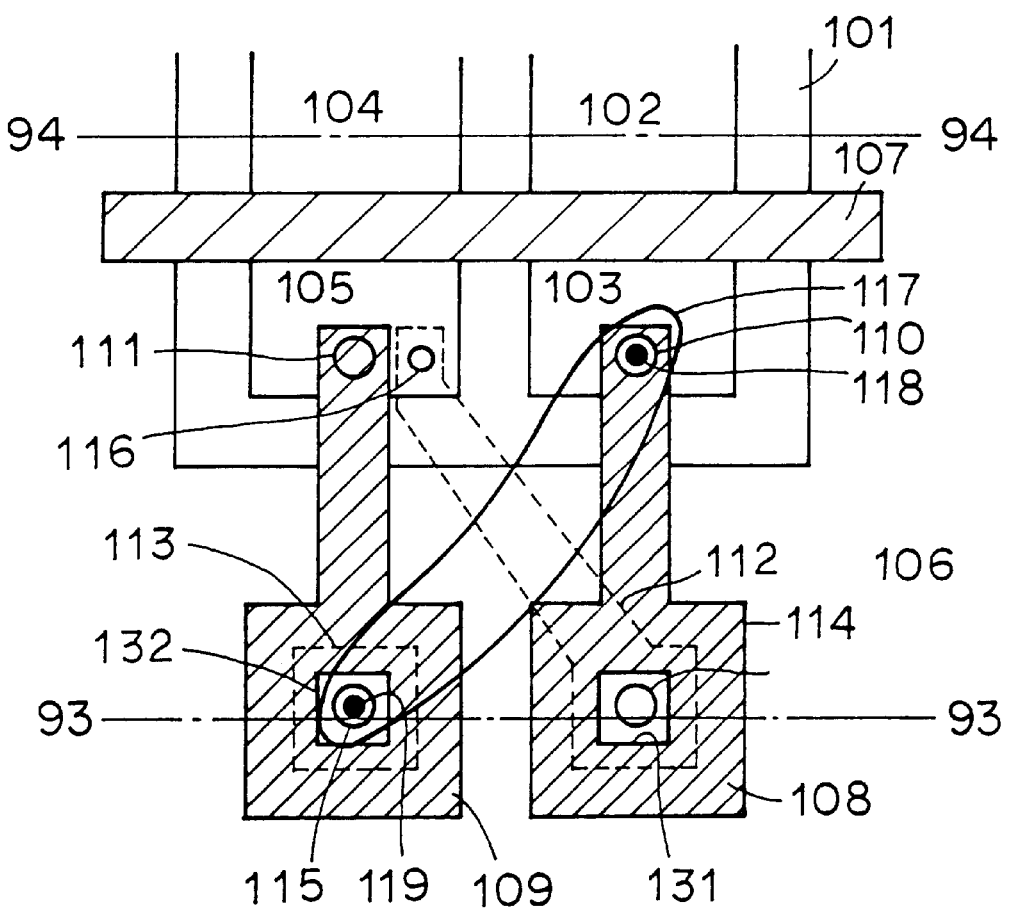
FIG. 90 is a layout diagram of the lower layer of the SRAM memory cell according to Embodiment 25.
Figure 91:
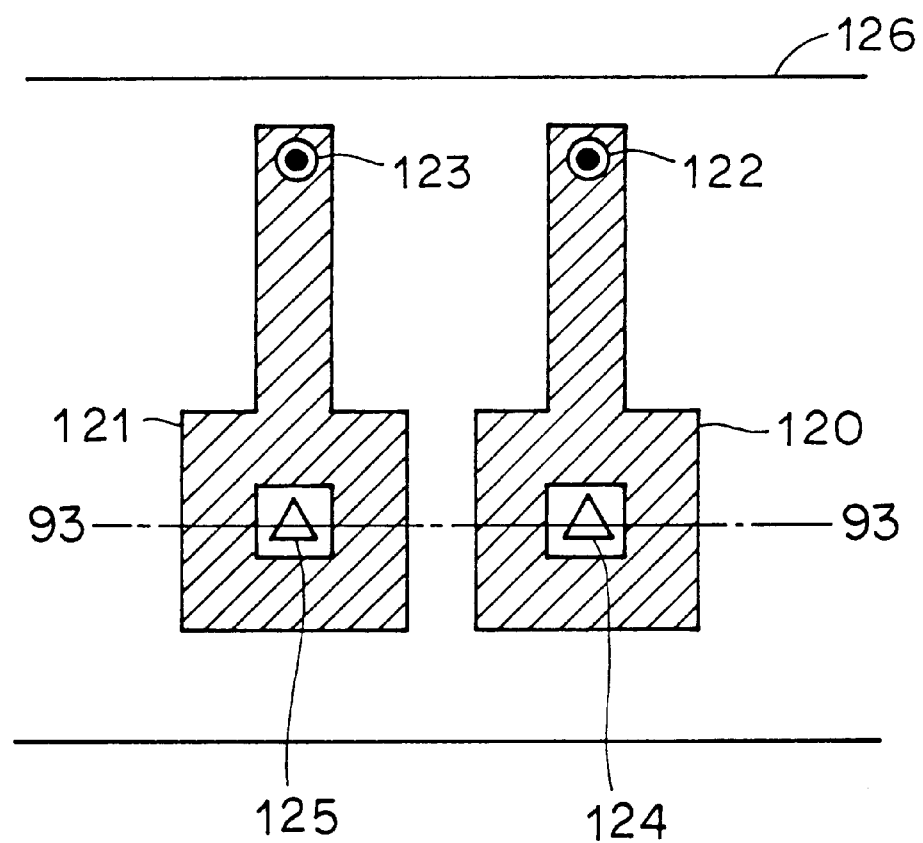
FIG. 91 is a layout diagram of the intermediate layer of the SRAM memory cell according to Embodiment 25.
Figure 92:
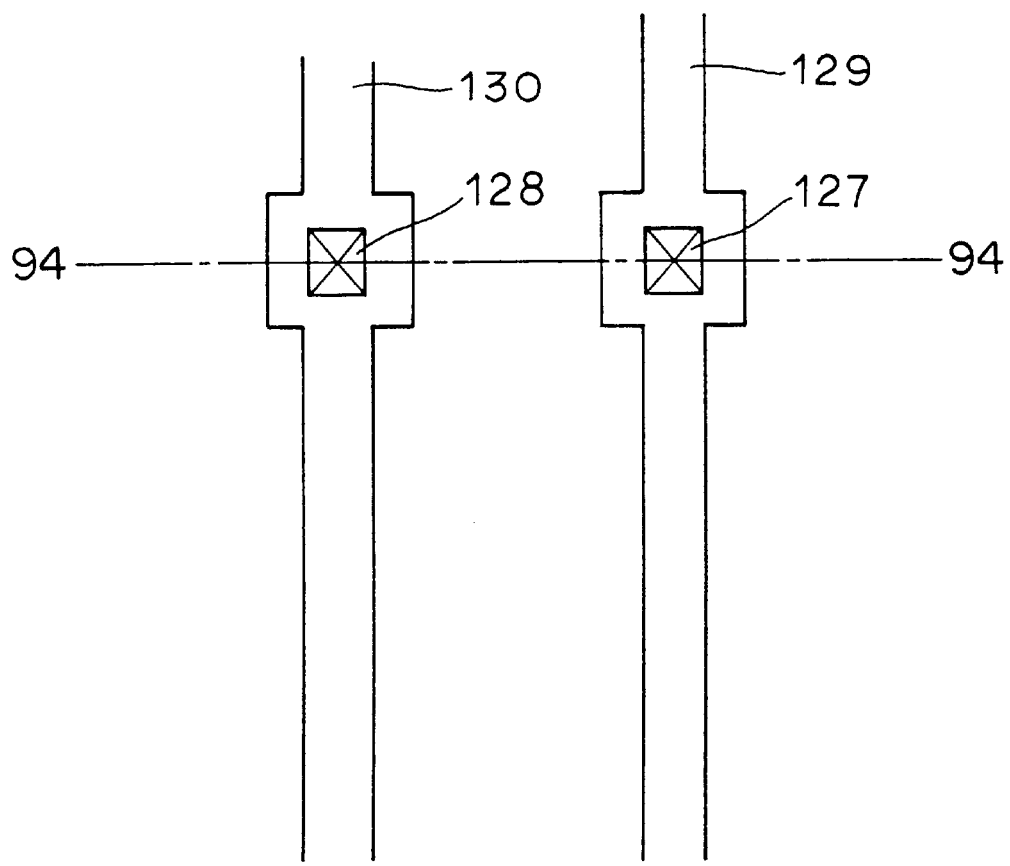
FIG. 92 is a layout diagram of the upper layer of the SRAM memory cell according to Embodiment 25.

FIGS. 90 to 92 are layout diagrams of a memory cell. FIGS. 90 to 92 are layout diagrams of a lower layer, an intermediate layer, and an upper layer, respectively.

Referring to FIG. 90, reference character 101 denotes an isolation region, and 102, 103, 104, 105, 106, 131, 132 denote active regions. 107, 108, 109 denote polysilicon of the first layer. 110, 111 denote a first direct contact connecting polysilicon of the first layer and the active layer. 112, 113 denote polysilicon of the second layer. 114, 115, 116 denote a second direct contact connecting polysilicon of the second layer and the active region. 117 denotes polysilicon of the third layer. 118, 119 denote a third direct contact connecting polysilicon of the second layer and polysilicon of the third layer.

Referring to FIG. 91, reference characters 120, 121 denote polysilicon of the fourth layer. 122, 123 denote a fourth direct contact connecting polysilicon of the second layer and polysilicon of the third layer. 126 denotes polysilicon of the fifth layer. 124, 125 denote a fifth direct contact connecting polysilicon of the third layer and polysilicon of the fifth layer.

Referring to FIG. 92, reference characters 129, 130 denote an aluminum interconnection or an other metal interconnection. 127, 128 denote a contact connecting the aluminum interconnection or the metal interconnection and the active regions.

Figure 93:
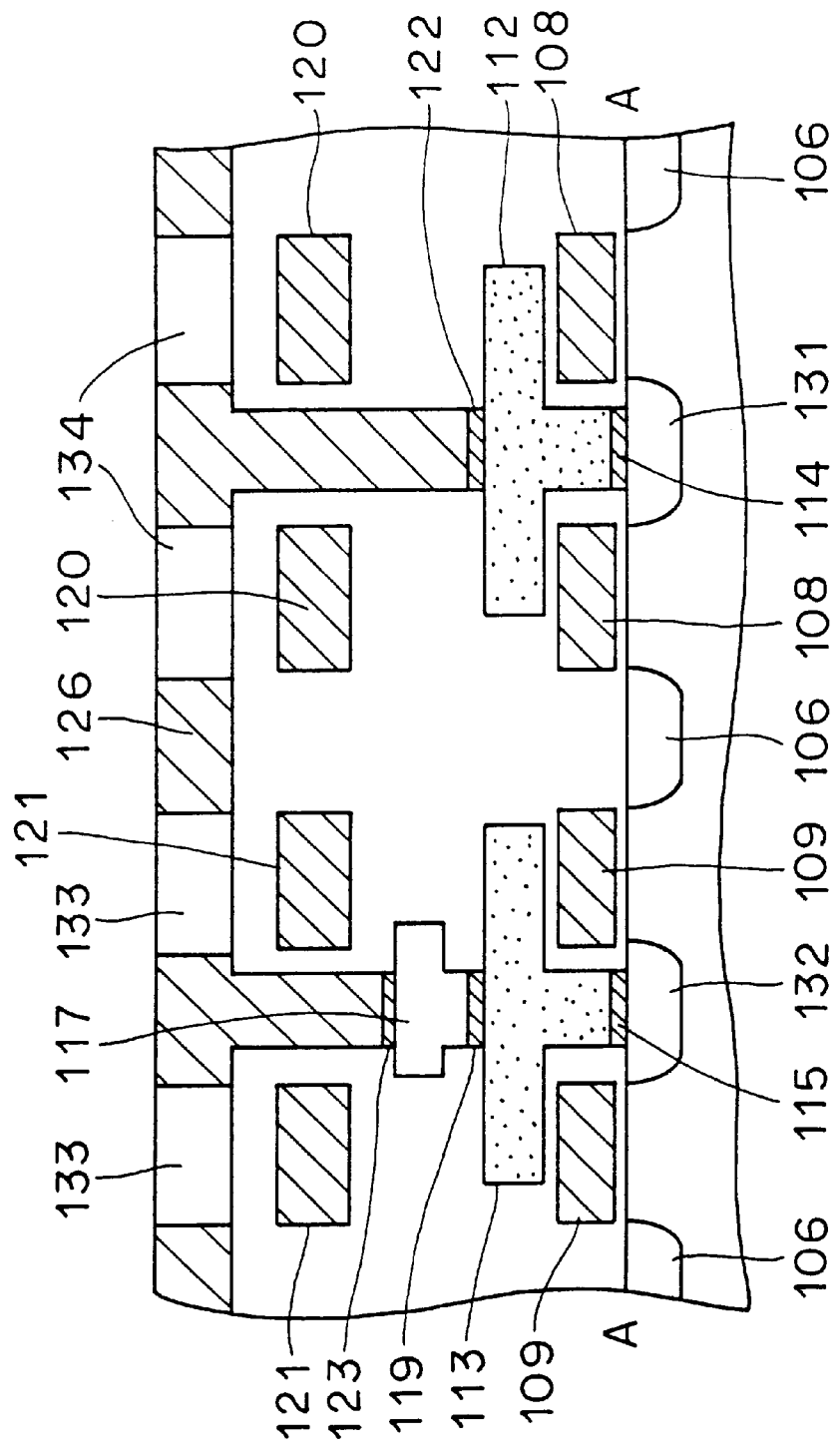
FIG. 93 is a cross sectional view taken along the lines A—A of FIGS. 90 to 92.
Figure 94:
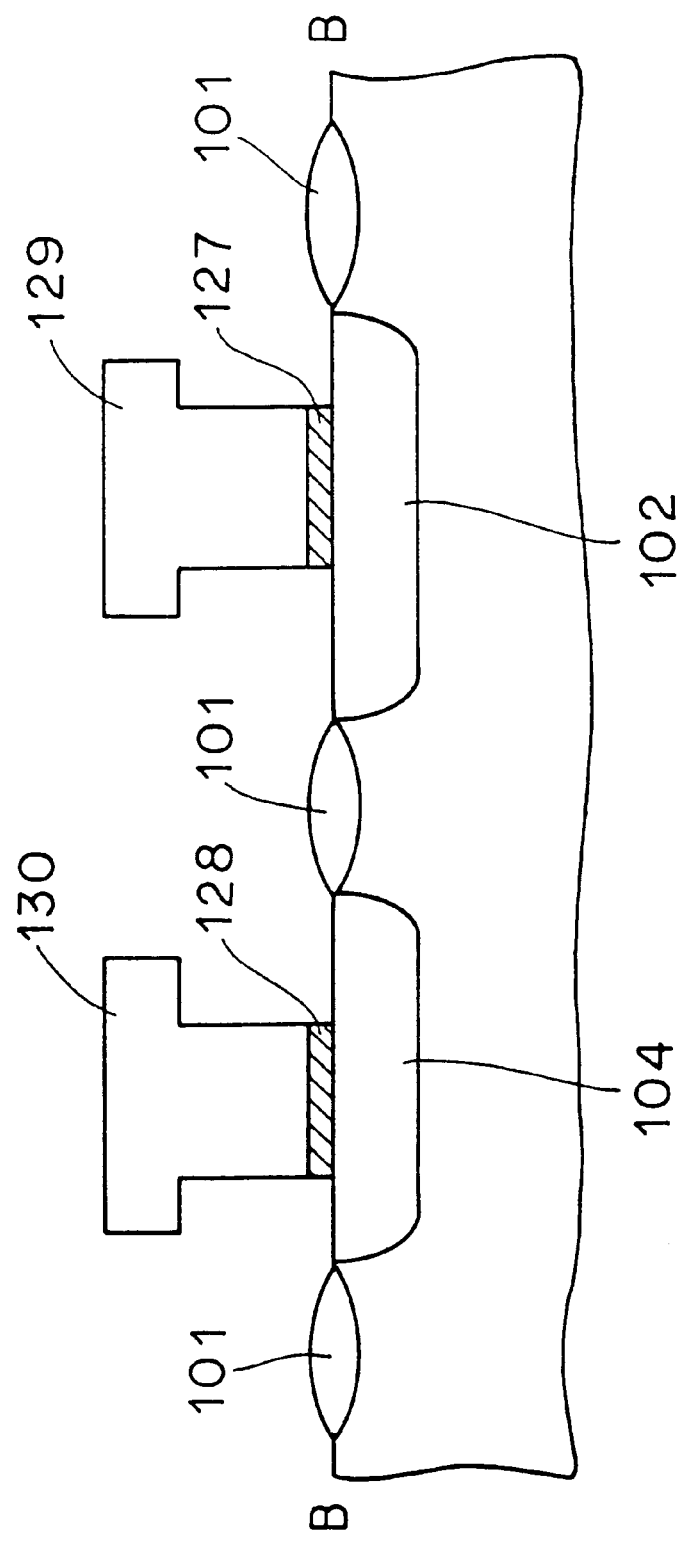
FIG. 94 is a cross sectional view taken along the lines B—B in FIGS. 90 to 92.

FIG. 93 is a cross sectional view taken along the line A—A in FIGS. 90 to 92. FIG. 94 is a cross sectional view taken along the line B—B in FIGS. 90 to 92. In these figures, 133, 134 denote a channel region of the load transistor.

Referring to FIGS. 93, 94 and 89, access transistor 1s is denoted by 102, 107, 103. Access transistor 2s is denoted by 104, 107, 105. Driver transistor 3s is denoted by 132, 109, 106. Driver transistor 4s is denoted by 131, 108, 106. Load transistor 5s is denoted by 126, 121, 113. Load transistor 6s is denoted by 126, 120, 112. Word line 7s is denoted by 107. Bit line 8s is denoted by 129. Bit line 9s is denoted by 130. Vcc 10 s is denoted by 126. GND 11s is denoted by 106.

Figure 95:
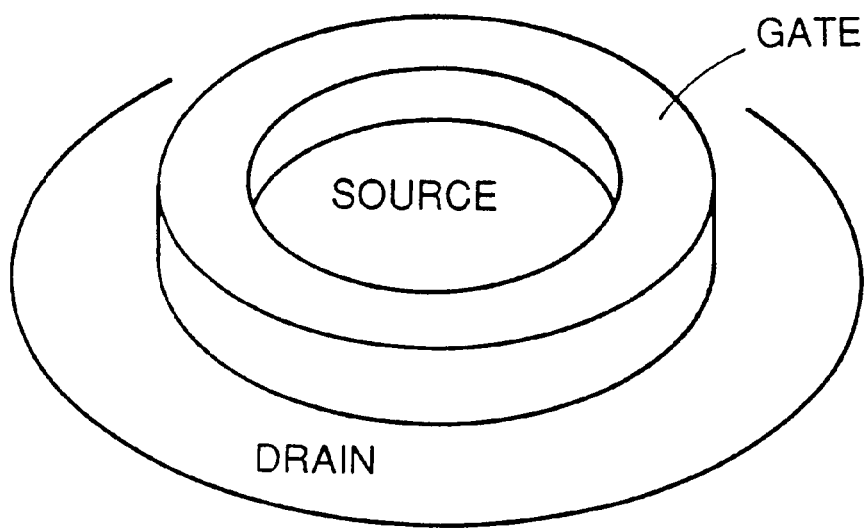
FIG. 95 is a perspective view of a field effect transistor used in Embodiment 25.

In this embodiment, gates 108, 109, 120, 121 of driver transistors 3s, 4s and load transistors 5s, 6s are formed in a ring shape as shown in FIG. 95. Therefore, it is possible to make the outside of the ring (gate) the source region of the transistor. As a result, it is possible to reduce the influence of source resistance.

By forming load transistors 5s, 6s of a vertical type surround gate MOSFET, it is possible to further reduce the area occupied by the transistors.

Embodiment 26

Figure 96:
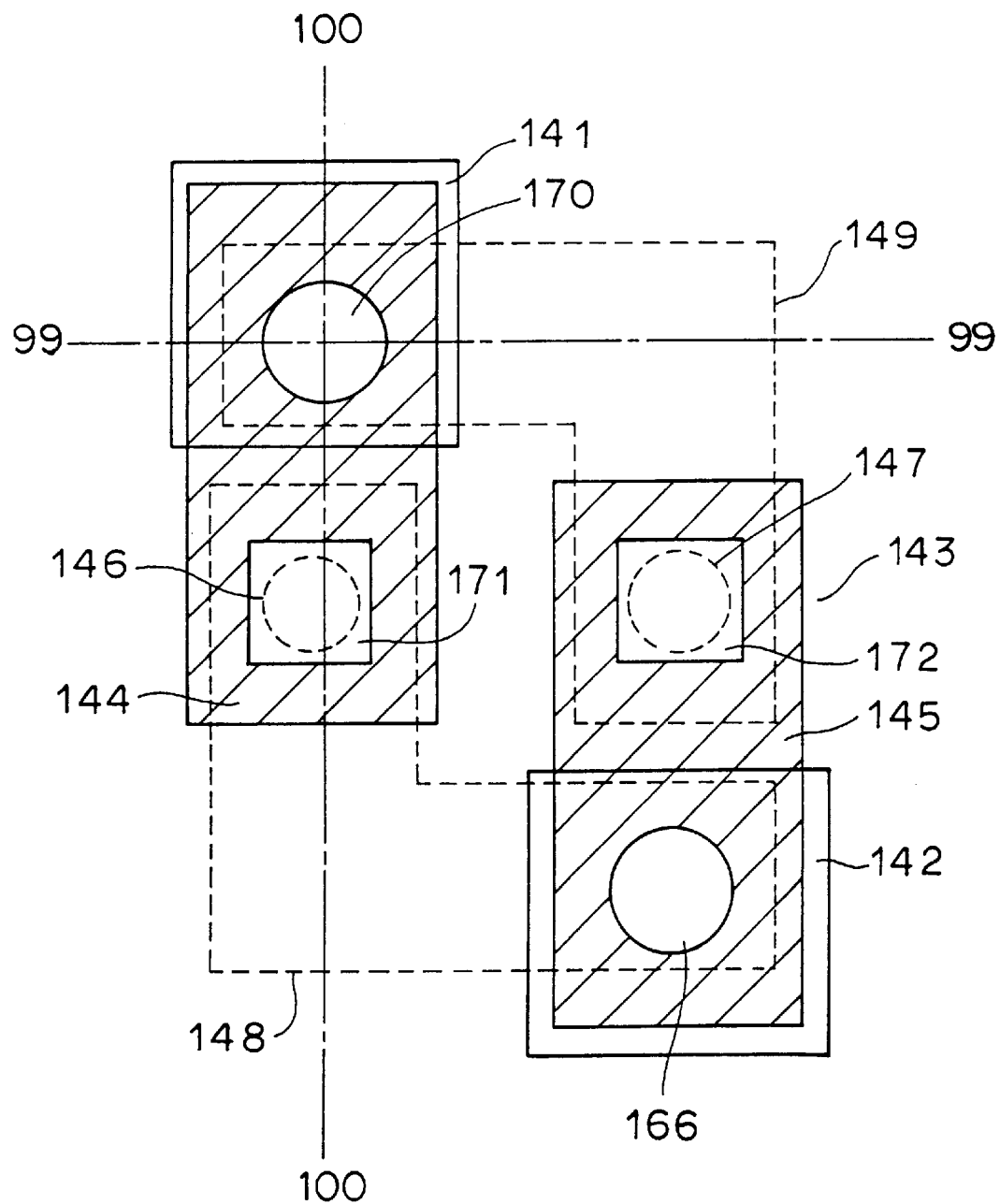
FIG. 96 is a layout diagram of the lower layer of an SRAM memory cell according to Embodiment 26.
Figure 97:
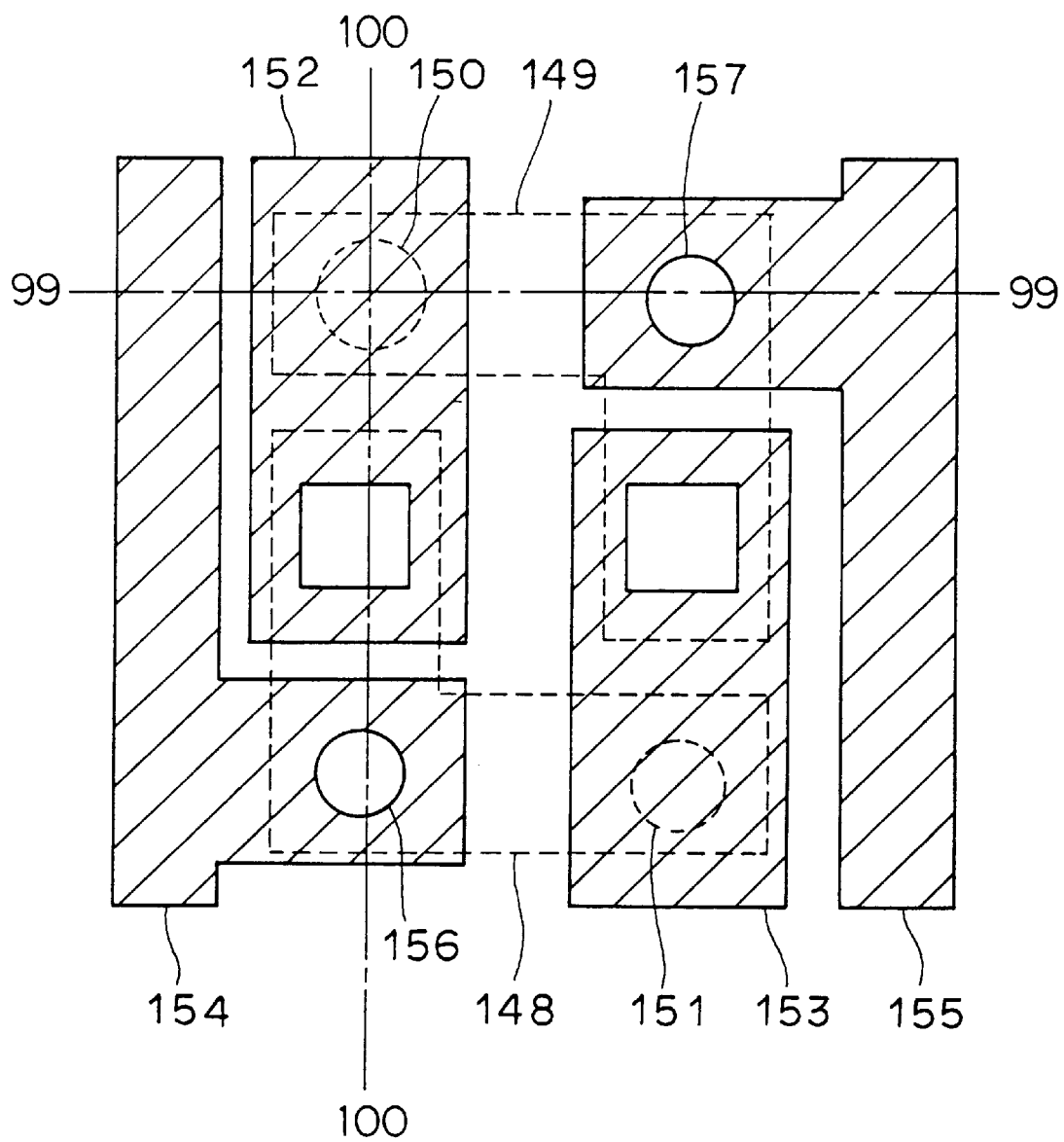
FIG. 97 is a layout diagram of the intermediate layer of the SRAM memory cell according to Embodiment 26.
Figure 98:
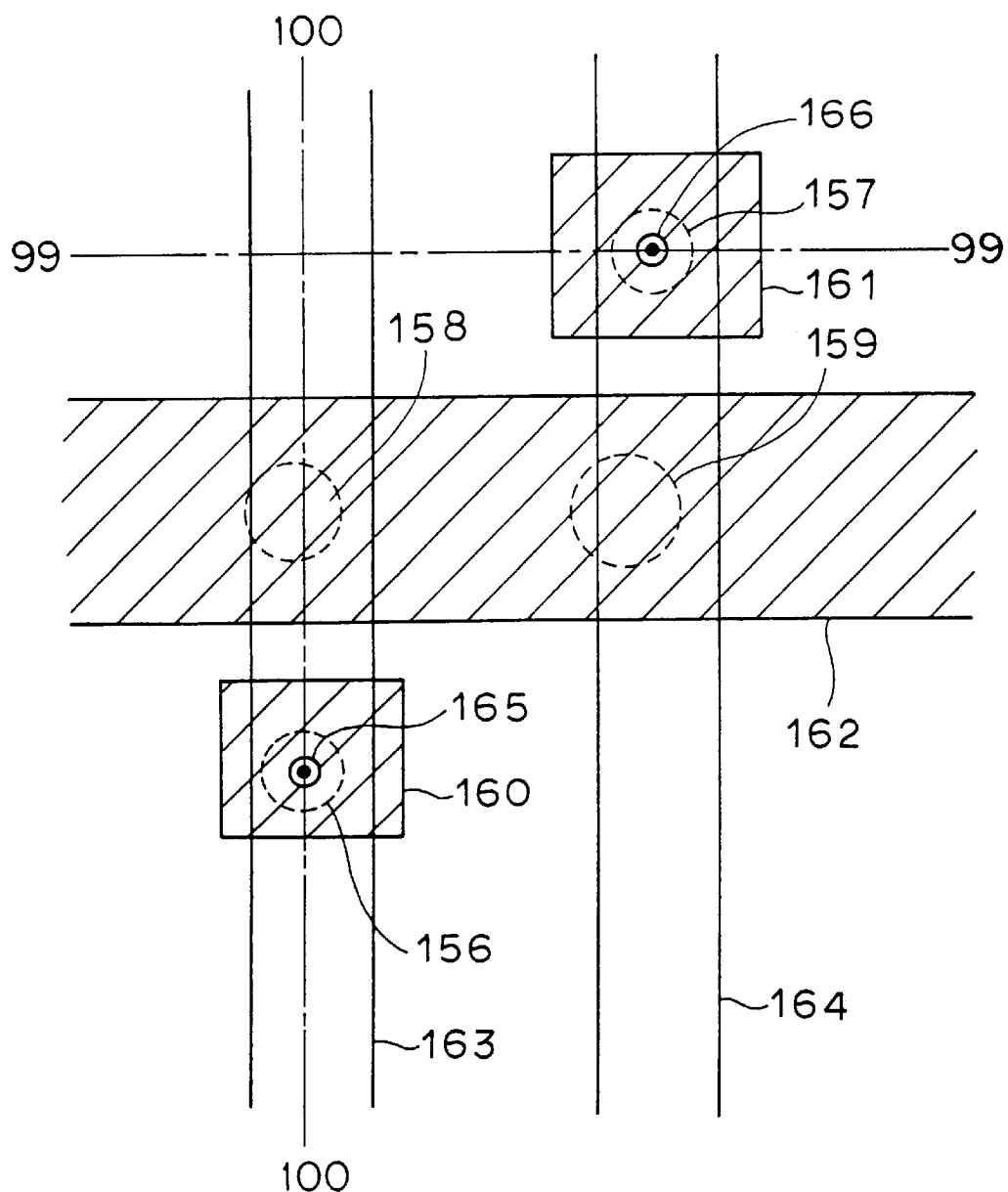
FIG. 98 is a layout diagram of the upper layer of the SRAM memory cell according to Embodiment 26.

This embodiment relates to a further embodiment of the SRAM memory cell. FIGS. 96 to 98 are layout diagrams of the SRAM memory cell according to this embodiment, showing a lower layer, an intermediate layer, and an upper layer, respectively.

Referring to FIG. 96, 141, 142 denote isolation regions, 143, 171, 172 active regions, and 144, 145 denote a first polysilicon layer. 148, 149 denote a second polysilicon layer. 146, 147 denote a second direct contact connecting the first polysilicon layer and the active region. 166, 170 denote a second direct contact connecting the first polysilicon layer and the second polysilicon layer.

Referring to FIG. 97, 152, 153, 154, 155 denote a third polysilicon layer. 150, 151, 156, 157 denote a third direct contact connecting the third polysilicon layer and the second polysilicon layer.

Referring to FIG. 98, 160, 161, 162 denote a fourth polysilicon layer. 156, 157, 158, 159 denote a fourth direct contact connecting the third polysilicon layer and the fourth polysilicon layer.

163, 164 denote an aluminum interconnection or a metal interconnection. 165, 166 denote a contact connecting the aluminum interconnection or the metal interconnection and the fourth polysilicon layer.

Figure 99:
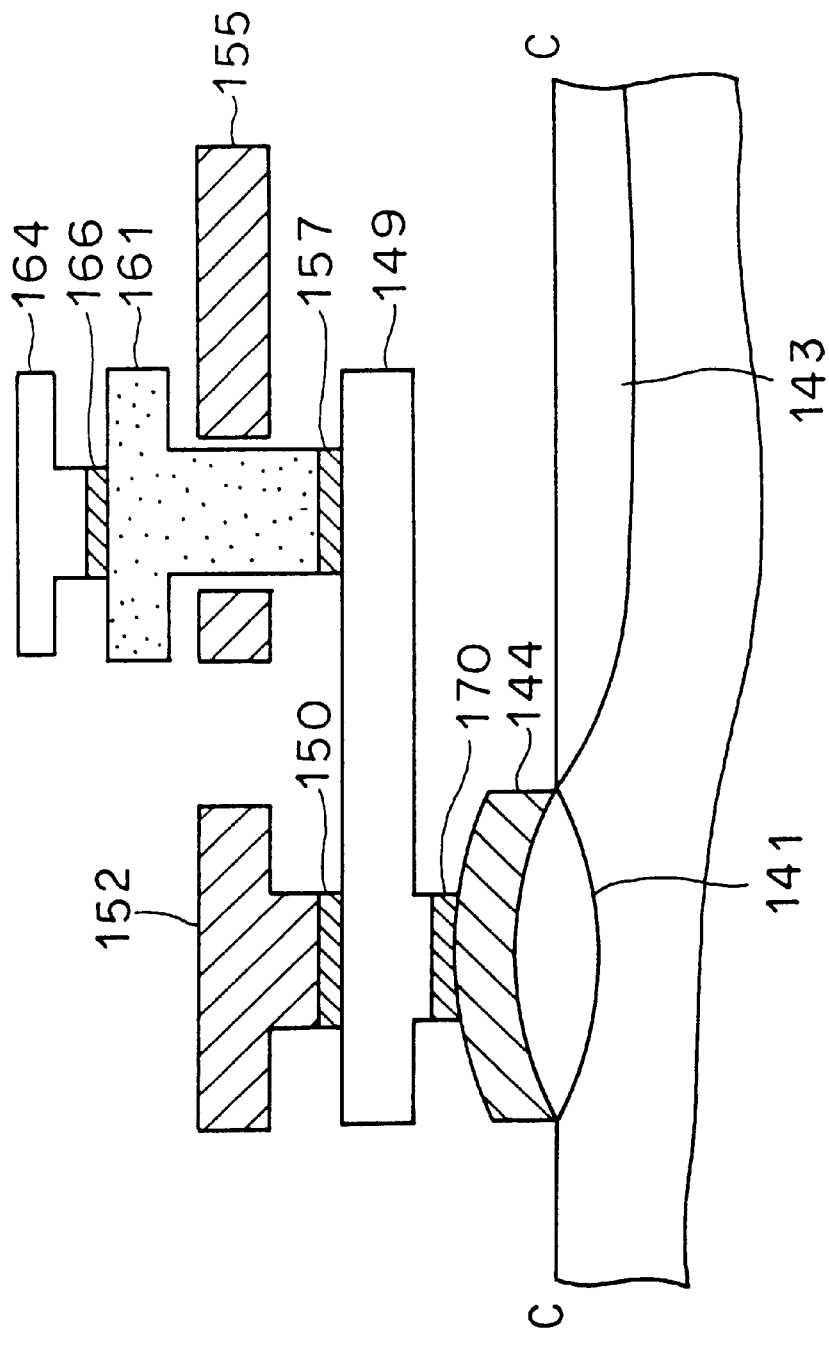
FIG. 99 is a cross sectional view taken along the lines C—C in FIGS. 96 to 98.
Figure 100:
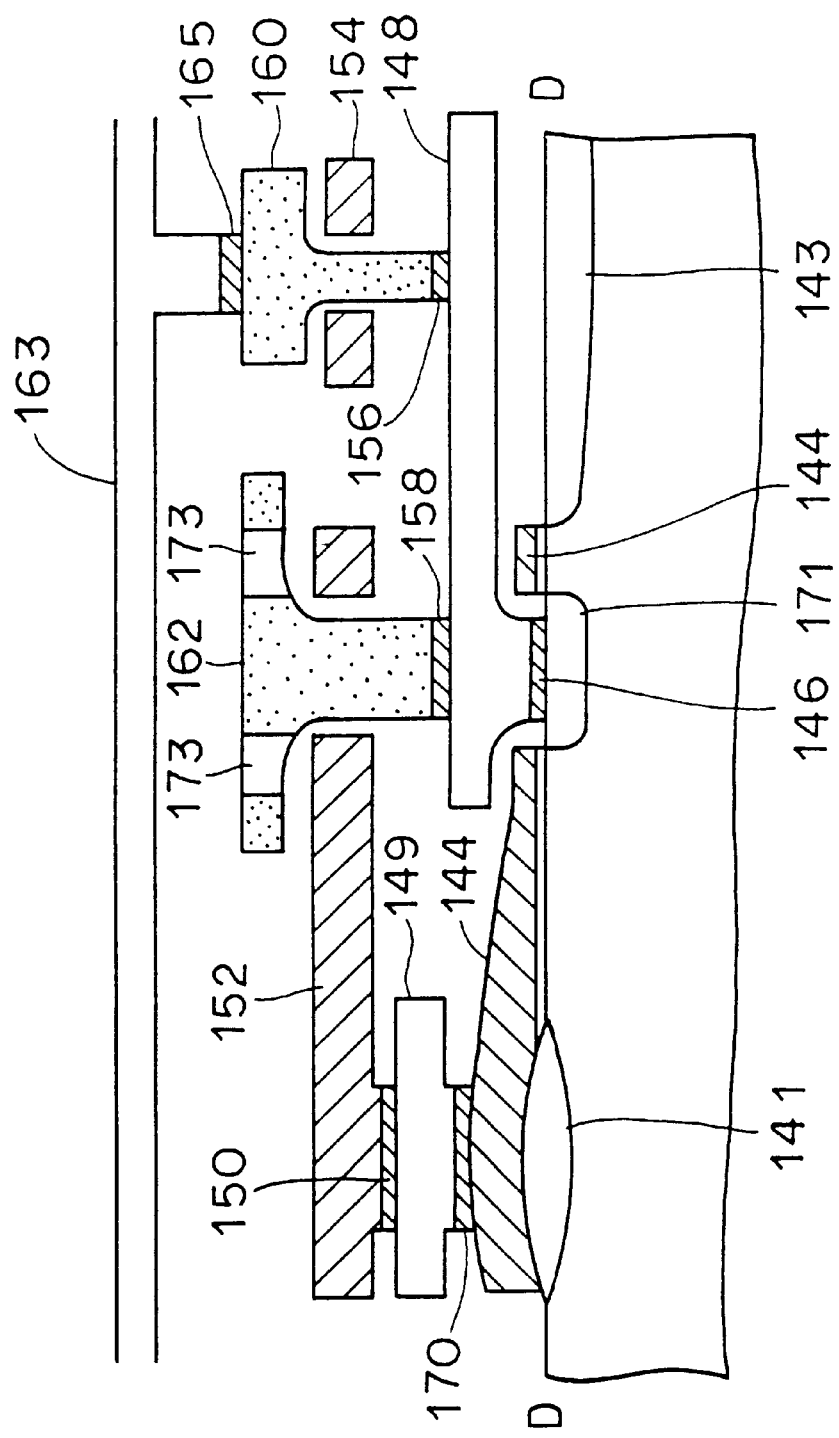
FIG. 100 is a cross sectional view taken along the lines D—D in FIGS. 96 to 98.
Figure 101:
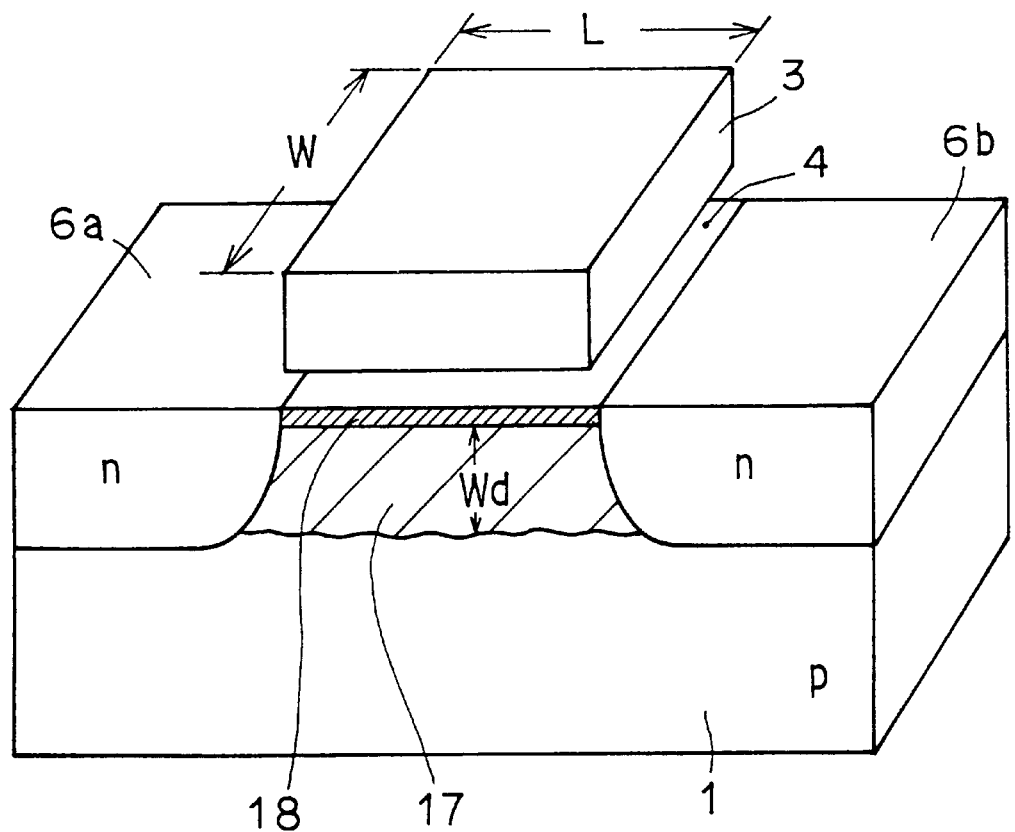
FIG. 101 is a schematic diagram of a conventional planar type MOSFET.
Figure 102:
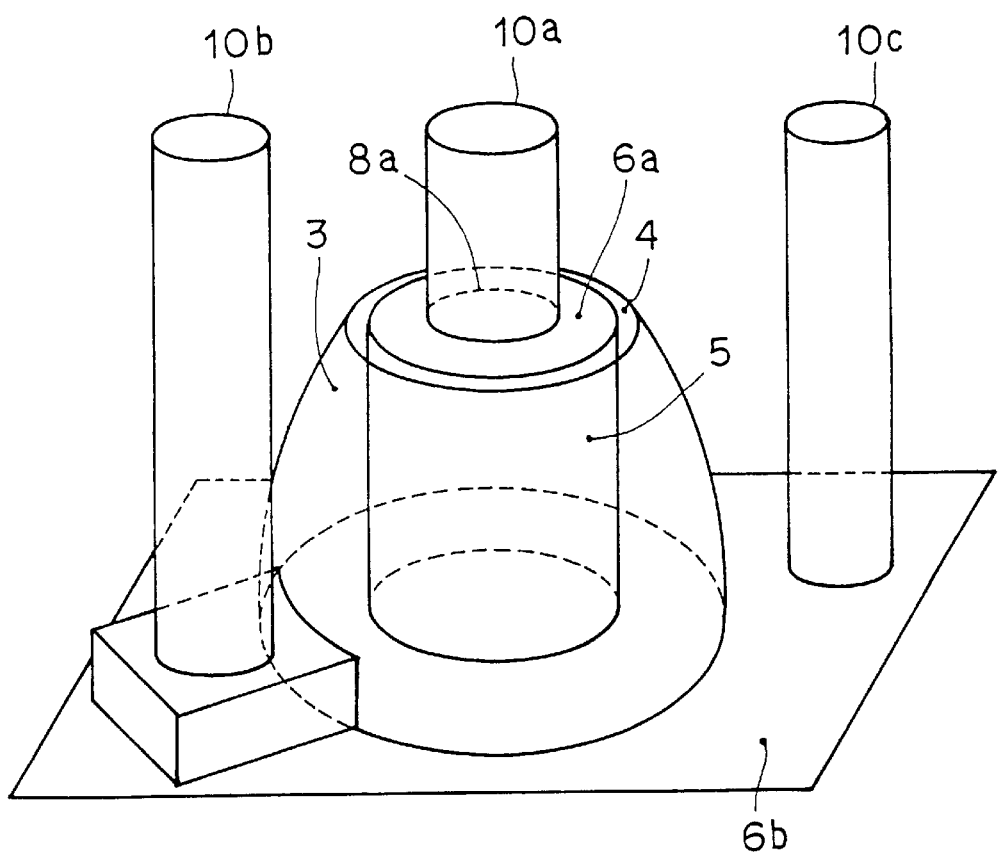
FIG. 102 is a perspective view extracting and illustrating main portions of a conventional vertical type surround gate MOSFET.
Figure 103:
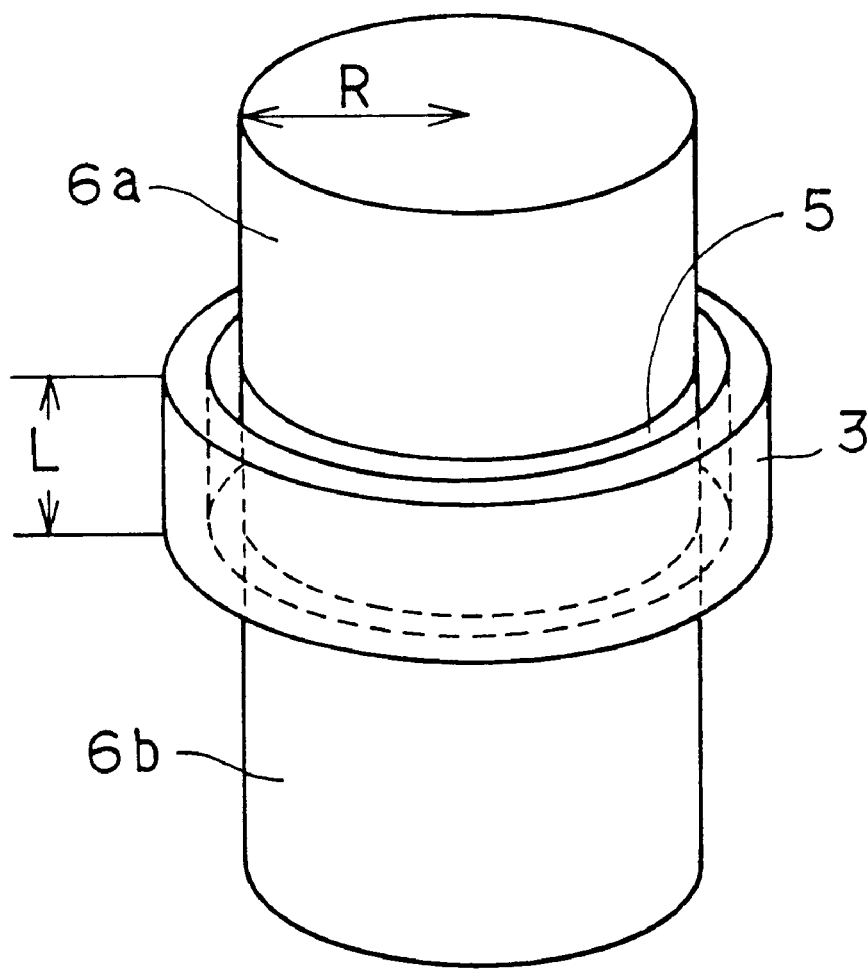
FIG. 103 is a simplified diagram of a transistor shown in FIG. 102.
Figure 104:
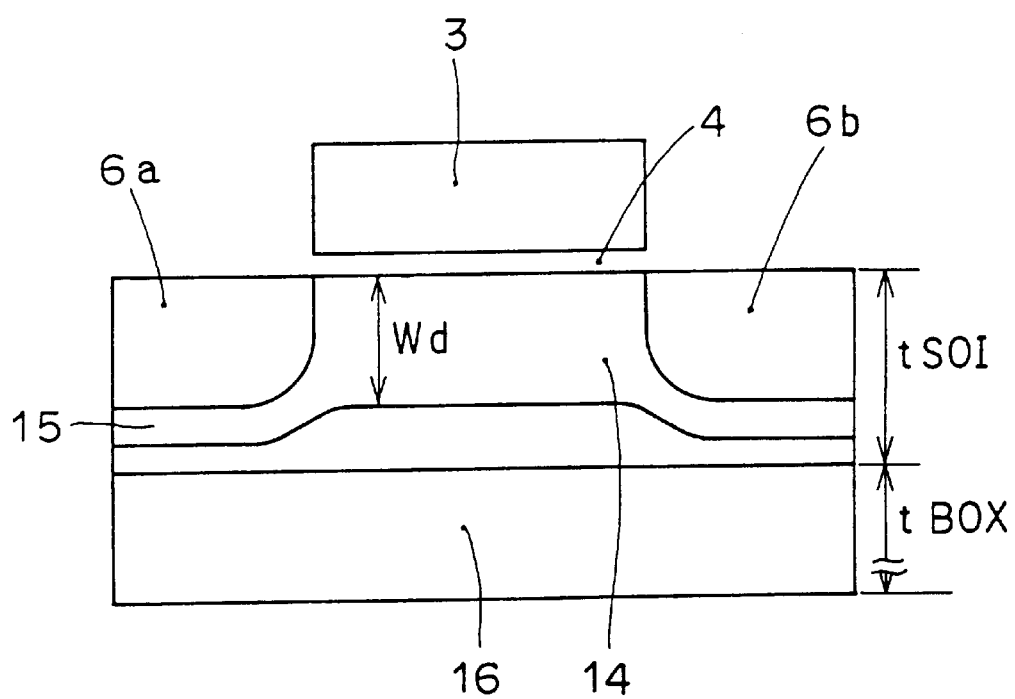
FIG. 104 is a cross sectional view of a conventional SOIMOSFET.
Figure 105:
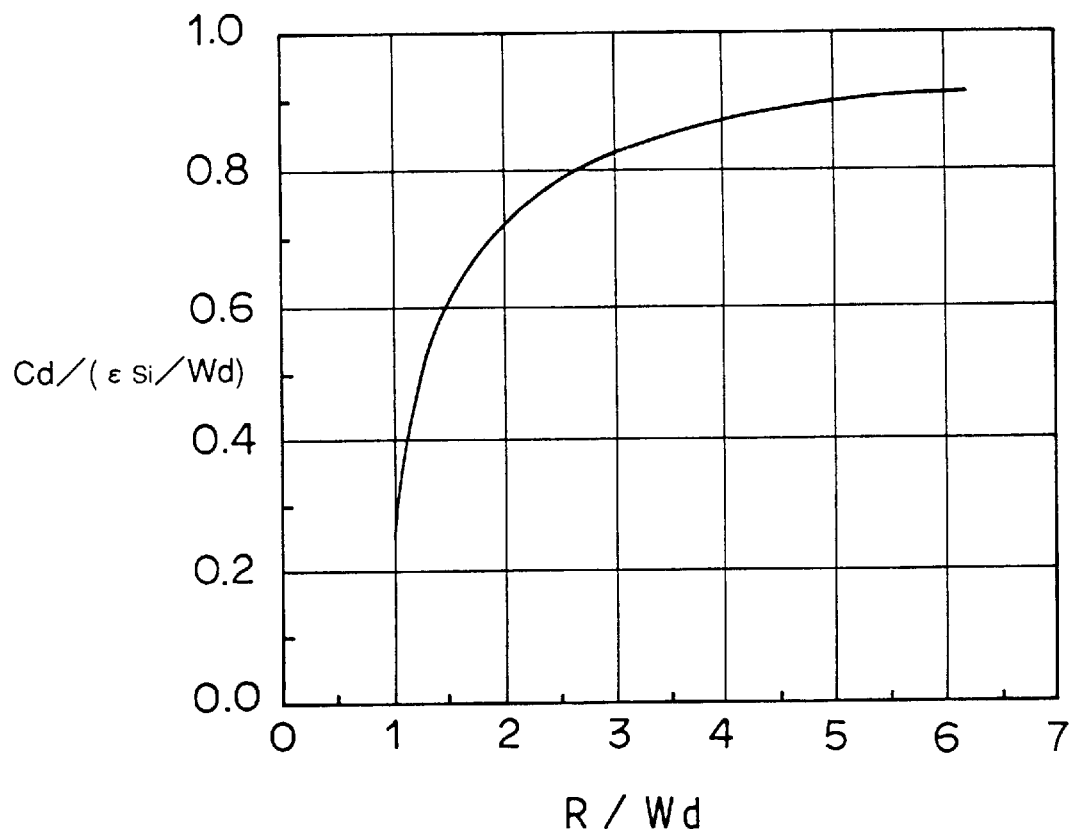
FIG. 105 is a graph showing the relationship between a radius R and a depletion layer capacitance Cd of the conventional vertical type surround gate MOSFET.
Figure 106:
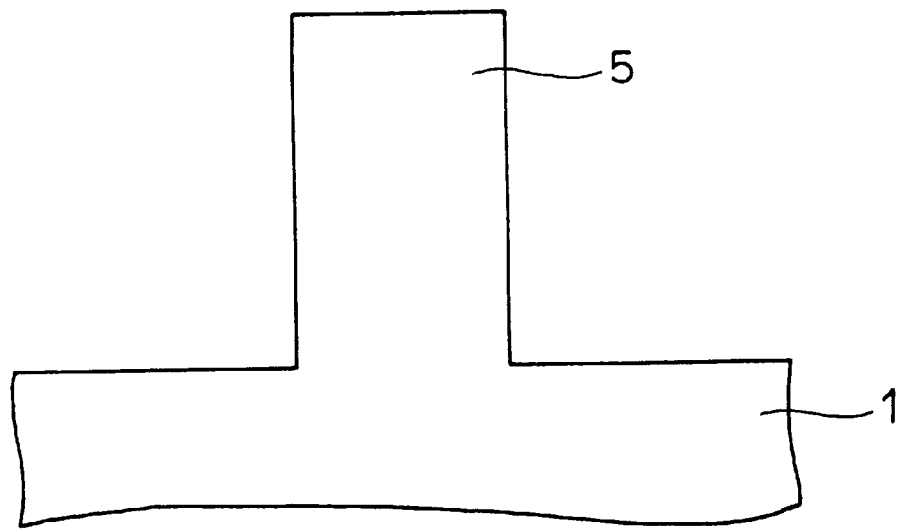
FIGS. 106 to 110 are partial cross sectional views of a semiconductor device in the first to the fifth steps of a method of manufacturing the conventional vertical type surround gate MOSFET.
Figure 107:
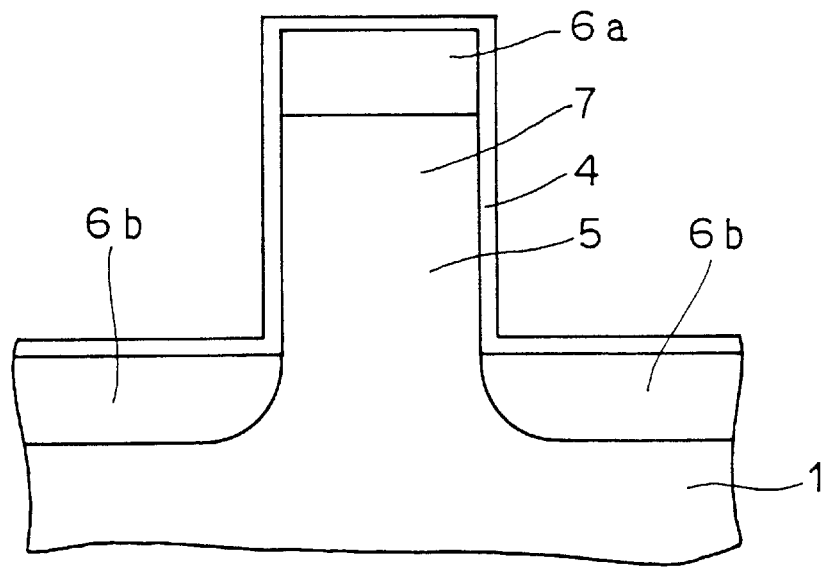
Figure 108:
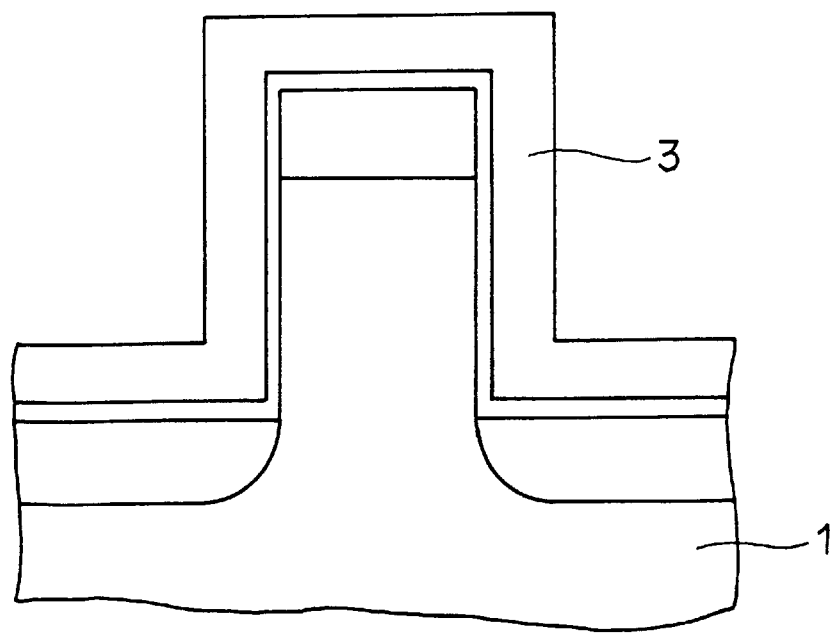
Figure 109:
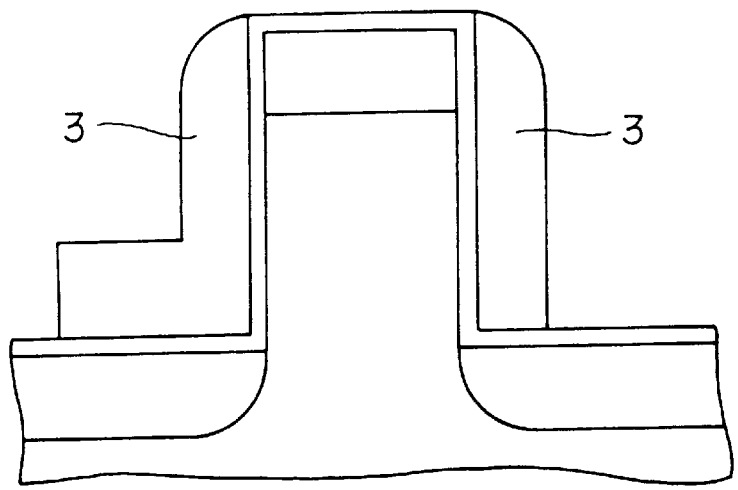
Figure 110:
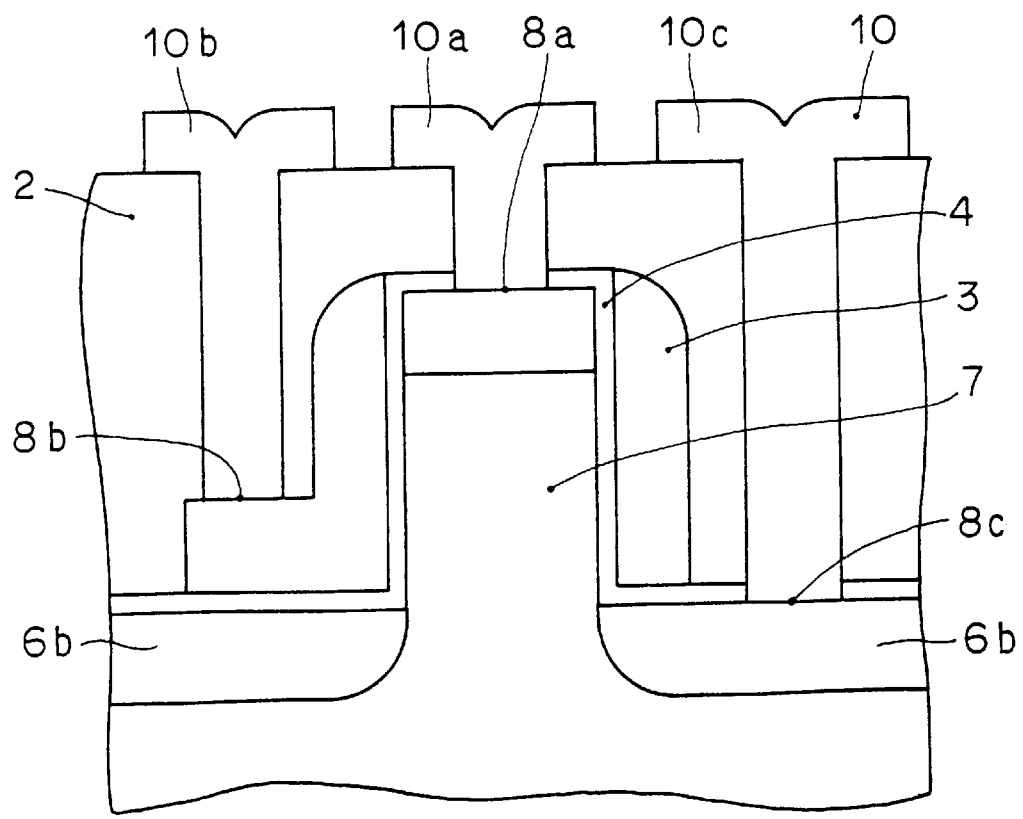
Figure 111:
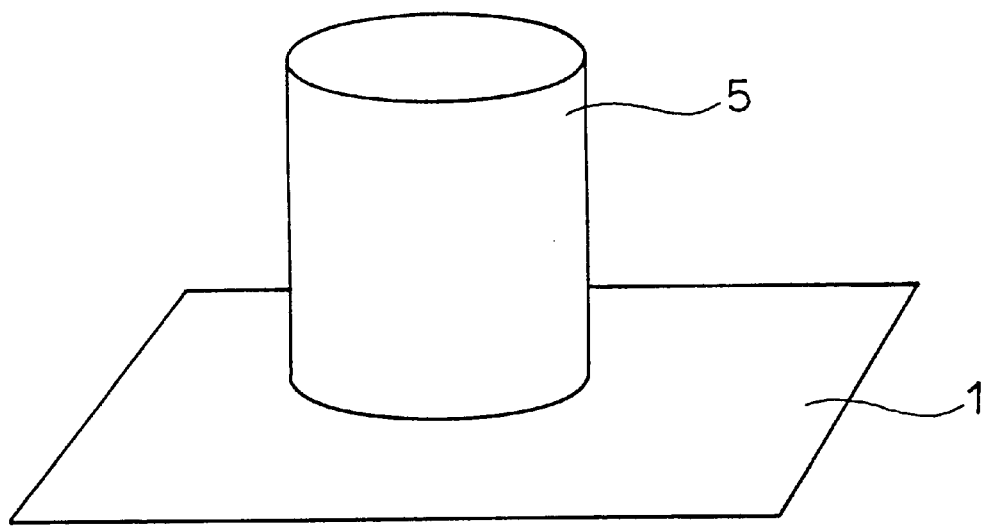
FIG. 111 is a perspective view of a plug-shaped silicon of the conventional vertical type surround gate MOSFET.

FIG. 99 is a cross sectional view taken along the line C—C in FIG. 96 to 98. FIG. 100 is a cross sectional view taken along the line D—D in FIGS. 96 to 98. Referring to these figures, 173 is a channel region of a polysilicon thin film transistor.

Referring to FIGS. 89, 99 and 100, access transistor 1s is formed of 161, 155, 149. Access transistor 2s is formed of 160, 154, 148. Driver transistor 3s is formed of 172, 145, 143. Driver transistor 4s is formed of 171, 144, 143s. Load transistor 5s is formed of 162, 153, 149. Load transistor 6s is formed of 162, 152, 148. Word line 7s is denoted by 154, 155, bit line 8s is denoted by 164, and bit line 9s is denoted by 163. Vcc 10s is denoted by 162. GND 11s is denoted by 143.

In this embodiment, the gates of driver transistors 3s, 4s and load transistors 5s, 6s (144s, 145s, 152s, 153s) are formed in a ring shape. Access transistors 1s, 2s are formed of a vertical type surround gate MOSFET.

It should be noted that load transistors 5s, 6s may be formed of a vertical type surround gate MOSFET.

As described above, according to a semiconductor device of the first aspect of the present invention, since a vertical shape surround gate is employed, an area occupied by the device is made small. As a result, MOSFET occupying a small area can be obtained.

According to a semiconductor device of the second aspect of the present invention, the thickness of a silicon thin film in a channel portion is equal to or less than the maximum depletion layer width. Therefore, it is possible to deplete the entire channel completely. As a result, the subthreshold current can be suppressed, which in turn enhances the circuit characteristic.

A semiconductor device according to the third aspect of the present invention has two gate electrodes. Therefore, it is possible to reduce the off current of the transistor and to improve the on current thereof.

A semiconductor device according to the fourth aspect of the present invention, that is, a dynamic random access memory (DRAM), uses a contact hole transistor. Therefore, the area occupied by the transistor is made small. As a result, it is possible to obtain a DRAM occupying a small area.

A semiconductor device according to the fifth and sixth aspects, of the present invention, that is, a DRAM, uses a contact hole transistor. Therefore, the area occupied by the device is made small. As a result, a DRAM occupying a small area can be obtained.

An inverter circuit according to the seventh aspect of the present invention uses a contact hole transistor. Therefore, the area occupied by the circuit is made small. As a result, an inverter circuit occupying a small area can be obtained.

Since an inverter circuit according to the eighth aspect of the present invention is formed on the field oxide film, it is possible to use the surface of the semiconductor substrate effectively. As a result, an inverter circuit of high integration density can be obtained.

In an inverter circuit according to the ninth aspect of the present invention, Vout is provided over the substrate. Therefore, an inverter circuit making contact easily and occupying a small area can be obtained. As a result, an inverter circuit of improved integration density can be obtained.

An inverter circuit according to the tenth aspect of the present invention is formed by using an SOI transistor and a contact hole transistor. Therefore, the area occupied by the circuit is made small. As a result, an inverter circuit occupying a small area can be obtained.

An inverter circuit according to the eleventh aspect of the present invention is formed by combination of an MOS transistor and a contact hole transistor. Therefore, the area occupied by the circuit is made small. As a result, an inverter circuit occupying a small area can be obtained.

According to a semiconductor device of the twelfth, thirteenth, and fourteenth aspects of the present invention, a static random access memory occupying a small area can be obtained.

In a method of manufacturing a semiconductor device according to the fifteenth aspect of the present invention, impurity implanted into the surface of a semiconductor layer is diffused in the semiconductor layer, and the impurity included in the first conductive layer is diffused from the first conductive layer to the semiconductor layer, whereby the other source/drain region and a channel region sandwiched by the other source/drain region and one source/drain region are formed in the semiconductor layer. Therefore, the source/drain region and the channel region can be formed simultaneously by one time thermal diffusion, resulting in efficient manufacture of a semiconductor device.

In a method of manufacturing a semiconductor device according to the sixteenth aspect of the present invention, the gate insulating film is formed by oxidation of the sidewall surface of the contact hole. Therefore, the step of patterning the gate insulating film is not needed, which in turn facilitates a method of forming the gate insulating film.

In a method of manufacturing a semiconductor device according to the seventeenth aspect of the present invention, the channel region is formed by epitaxial growth. Therefore, crystallization of the channel region is improved, which in turn enhances the transistor characteristic. Since the conductivity type of the semiconductor can be changed only by changing gas at the time of growth of the epitaxial layer, it is possible to simplify the process.

In a method of manufacturing a semiconductor device according the eighteenth aspect of the present invention, impurity of a first conductivity type is implanted into the surface of a semiconductor film with a rotational ion implantation method. Therefore, the impurity is implanted into the inner wall surface of the contact hole. By thermal diffusion of the impurity implanted into the inner wall surface, one source/drain region is formed. Therefore, a time required for the thermal diffusion for formation of one source/drain region can be shortened.

In a method of manufacturing a semiconductor device according to the nineteenth aspect of the present invention, impurity of a first conductivity type is implanted into the surface of the semiconductor film with a first insulating film used as a mask in a direction perpendicular to the substrate. Therefore, slight offset of the implantation angle will not cause impurity to be implanted into the channel portion. As a result, a semiconductor device can be obtained in which a leakage current between source and drain is not generated.

In a method of manufacturing a semiconductor device according to the twentieth aspect of the present invention, impurity of a first conductivity type is implanted into the surface of the semiconductor film after filling the contact hole with an insulating film so as to be in contact with the semiconductor film. Then, the impurity implanted into the surface of the semiconductor film is diffused in the semiconductor film, thereby forming the other source/drain region. The impurity is not implanted into the side portion of the semiconductor film. As a result, by heat treatment to be applied later, the impurity will not diffuse in the channel region, and the short channel effect is not caused. In addition, a leakage current between source/drain is not generated.

In a method of manufacturing a semiconductor device according to the twenty-first aspect of the present invention, a transistor having two gate electrodes can be formed. Therefore, it is possible to reduce the off current of the transistor and to improve the on current thereof.

In a method of manufacturing a semiconductor device according to the twenty-second aspect of the present invention, the source/drain, the channel, and the LDD portion are formed with a high energy ion implantation method. Therefore, they can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device controlling a flow of majority carriers by a voltage applied to a gate electrode, comprising:

a substrate having a main surface;

a first conductive layer of a first conductivity type provided in the main surface of said substrate and serving as one source/drain region;

a first interlayer insulating film provided on said substrate;

a first gate electrode provided on said first interlayer insulating film and having an upper surface and a lower surface;

a second interlayer insulating film provided on said first interlayer insulating film so as to cover said first gate electrode;

a contact hole provided so as to penetrate through said first interlayer insulating film, said first gate electrode, and said second interlayer insulating film for exposing a part of the surface of said first conductive layer;

a first gate insulating film covering a sidewall surface of said contact hole; and a silicon thin film provided in contact with said first conductive layer covering continuously an inner wall surface of said contact hole with said first gate insulating film interposed therebetween, and having a recessed portion in said contact hole, wherein said silicon thin film is divided into three portions of a cylindrical channel portion positioned in a portion surrounded by said first gate electrode, and a source region and a drain region sandwiching said channel portion from opposite sides, and the thickness of said silicon thin film in said channel portion is at most double of the maximum depletion layer width, said semiconductor device further comprising:

a second gate insulating film provided on said substrate so as to cover said recessed portion of said silicon thin film; and a second gate electrode filling said recessed portion of said silicon thin film and opposing said channel portion with said second gate insulating film interposed therebetween.

2. A semiconductor device storing information in a capacitor provided at a crossing point of a bit line and a word line, and formed of a storage node, a capacitor insulating film, and a cell plate electrode, using a gate transistor, comprising:

a substrate having a main surface;

a first conductive layer of a first conductivity type provided in the main surface of said substrate and serving as one of the source and drain regions;

a first interlayer insulating film provided on said substrate;

a gate electrode provided on said first interlayer insulating film and having an upper surface and a lower surface;

a second interlayer insulating film provided on said first interlayer insulating film so as to cover said gate electrode;

a first contact hole provided so as to penetrate through said first interlayer insulating film, said gate electrode, and said second interlayer insulating film for exposing a part of the surface of said first conductive layer;

a gate insulating film covering a sidewall surface of said first contact hole; and a silicon thin film provided in contact with said first conductive layer covering continuously an inner wall surface of said first contact hole with said gate insulating film interposed therebetween, and having a recessed portion having a bottom surface positioned at or lower than the lower surface of said gate electrode in said first contact hole, wherein said silicon thin film is divided into three portions of a cylindrical channel portion positioned in a portion surrounded by said gate electrode, one of the source and drain regions being positioned at a lower side of the channel portion and the other of the source and drain regions being positioned at an upper side of the channel portion, whereby the one and the other of the source and drain regions sandwich said channel portion from opposite sides, and the thickness of said silicon thin film in said channel portion is at most the maximum depletion layer width, said semiconductor device further comprising a third interlayer insulating film provided on said substrate so as to cover said silicon thin film;

a second contact hole provided in said third interlayer insulating film for exposing a part of the surface of said other of the source and drain regions;

said storage node provided in contact with said other of the source and drain regions and covering an inner wall surface of said second contact hole, wherein said capacitor insulating film is provided on said substrate so as to cover the surface of said storage node; and wherein said cell plate electrode is provided on said substrate so as to oppose said storage node with said capacitor insulating film interposed therebetween and to fill said second contact hole.

3. A semiconductor device having an inverter circuit, comprising:

a substrate;

a conductive layer provided on said substrate;

a first interlayer insulating film provided on said substrate so as to cover said conductive layer;

a gate electrode provided on said first interlayer insulating film and having an upper surface and a lower surface;

a second interlayer insulating film provided on said substrate so as to cover said gate electrode;

a first contact hole provided so as to penetrate through said first interlayer insulating film, said gate electrode, and said second interlayer insulating film for exposing one part of the surface of said conductive layer;

a second contact hole provided so as to penetrate through said first interlayer insulating film, said gate electrode, and said second interlayer insulating film for exposing another part of the surface of said conductive layer;

a first gate insulating film covering an inner wall surface of said first contact hole;

a second gate insulating film covering an inner wall surface of said second contact hole;

a first $p^+$ semiconductor layer formed on the surface of said conductive layer in contact with said one part thereof up to the lower surface of said gate electrode in said first contact hole, and serving as one of the first of the source and drain regions;

an $n^-$ semiconductor layer formed on the surface of said $p^+$ semiconductor layer in contact therewith up to the upper surface of said gate electrode in said first contact hole;

a second $p^+$ semiconductor layer provided on said $n^-$ semiconductor layer in contact with the surface of said $n^-$ semiconductor layer and serving as the other of said first of the source and drain regions;

a first $n^+$ semiconductor layer formed on the surface of said conductive layer in contact with said another part thereof up to the lower surface of said gate electrode in said second contact hole and serving as one of the second of the source and drain regions;

a $p^-$ semiconductor layer formed on the surface of said first $n^+$ semiconductor layer in contact therewith up to the upper surface of said gate electrode in said second contact hole; and a second $n^+$ semiconductor layer provided on said $p^-$ semiconductor layer in contact therewith and serving as the other of said second of the source and drain regions.

4. A semiconductor device having an inverter circuit, comprising:

a semiconductor substrate having a main surface;

a field oxide film formed in the main surface of said semiconductor substrate;

an $n^+$ impurity diffusion layer provided in the main surface of said semiconductor substrate and directly under said field oxide film;

a gate electrode provided on said field oxide film and having an upper surface and a lower surface;

an interlayer insulating film provided on said semiconductor substrate so as to cover said gate electrode;

a first contact hole provided so as to penetrate through said interlayer insulating film, said gate electrode, and said field oxide film for exposing one part of the surface of said $n^+$ impurity diffusion layer;

a second contact hole provided so as to penetrate through said interlayer insulating film, said gate electrode, and said field oxide film for exposing another part of the surface of said $n^+$ impurity diffusion layer;

a first gate insulating film covering an inner wall surface of said first contact hole;

a second gate insulating film covering an inner wall surface of said second contact hole;

a conductor film provided in contact with a surface of said $n^+$ impurity diffusion layer in said first contact hole;

a first $p^+$ semiconductor layer formed on the surface of said conductor film in contact therewith up to the lower surface of said gate electrode in said first contact hole and serving as one of the first of the source and drain regions;

an $n^-$ semiconductor layer formed on the surface of said first $p^+$ semiconductor layer in contact therewith up to the upper surface of said gate electrode in said first contact hole;

a second $p^+$ semiconductor layer provided on said $n^-$ semiconductor layer in contact therewith and serving as the other of said first of the source and drain regions;

a first $n^+$ semiconductor layer formed on the surface of said $n^+$ impurity diffusion layer in contact with said another part thereof up to the lower surface of said gate electrode in said second contact hole and serving as one of the second of the source and drain regions;

a p⁻ semiconductor layer formed on the surface of said first n⁺ semiconductor layer in contact therewith up to the upper surface of said gate electrode in said second contact hole; and a second n⁺ semiconductor layer provided on said p⁻ semiconductor layer in contact therewith and serving as the other of said second of said source and drain regions.

5. A semiconductor device serving as a logic circuit in a cooperative operation of a first transistor and a second transistor, comprising:

a substrate;

a SiO₂ layer provided on said substrate;

a semiconductor layer provided on said SiO₂ layer and having an upper surface and a lower surface;

a gate electrode of said first transistor provided on said semiconductor layer with an insulating film interposed therebetween;

a pair of source and drain regions of said first transistor provided in said semiconductor layer separately from each other on both sides of said gate electrode;

a contact hole provided at a position spaced from the gate electrode of said first transistor so as to penetrate through said insulating film, one of said source and drain regions, and said SiO₂ layer for exposing a part of the surface of said substrate;

a gate insulating film for said second transistor covering an inner wall surface of said contact hole;

one of source and drain regions of said second transistor formed on the surface of said substrate in contact therewith up to the lower surface of said semiconductor layer in said contact hole;

a channel layer of said second transistor formed on the surface of said one of said source and drain regions of said second transistor in contact therewith up to the upper surface of said semiconductor layer in said contact hole; and the other of said source and drain regions of said second transistor provided on the channel layer of said second transistor in contact therewith.

6. A semiconductor device having an inverter circuit using a first transistor and a second transistor, comprising:

a substrate;

a first insulating film provided on said substrate;

a gate electrode of said first transistor provided on said first insulating film and having an upper surface and a lower surface;

a second insulating film provided on said substrate so as to cover the gate electrode of said first transistor;

a contact hole provided so as to penetrate through the gate electrode of said first transistor and the first and second insulating films for exposing a part of the surface of said substrate;

one of the source and drain layers of said second transistor provided in the main surface of said substrate and directly below said contact hole;

a gate insulating film of said second transistor covering an inner wall surface of said contact hole;

a channel layer of said second transistor formed on the surface of said one of the source and drain layers of said second transistor in contact therewith up to the upper surface of said gate electrode in said contact hole; and another one of the source and drain layers of said second transistor provided on the channel layer of said second transistor in contact therewith.

* * * * *